US012681215B2

(12) United States Patent
Helander et al.

(10) Patent No.: US 12,681,215 B2
(45) Date of Patent: Jul. 14, 2026

(54) SILICON-CONTAINING COMPOUNDS FOR FORMING A PATTERNING COATING AND DEVICES INCORPORATING SAME

(71) Applicant: OTI LUMIONICS INC., Mississauga (CA)

(72) Inventors: Michael Helander, Mississauga (CA); Scott Nicholas Genin, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 371 days.

(21) Appl. No.: 18/311,206

(22) Filed: May 2, 2023

(65) Prior Publication Data

US 2024/0008353 A1 Jan. 4, 2024

Related U.S. Application Data

(63) Continuation of application No. PCT/IB2021/060182, filed on Nov. 3, 2021.

(Continued)

(51) Int. Cl.

*G02B 1/14* (2015.01)
*C08G 77/24* (2006.01)

(Continued)

(52) U.S. Cl.

CPC ............... *G02B 1/14* (2015.01); *C08G 77/24* (2013.01); *H10K 59/80515* (2023.02);

(Continued)

(58) Field of Classification Search

None

See application file for complete search history.

(56) References Cited

U.S. PATENT DOCUMENTS

2002/0119315 A1 8/2002 Aronowitz et al.
2004/0137241 A1 7/2004 Lin et al.

(Continued)

FOREIGN PATENT DOCUMENTS

CA 2074331 A1 1/1993
CA 2890253 A1 5/2014

(Continued)

OTHER PUBLICATIONS

International Search Report and Written Opinion for PCT Application No. PCT/IB2021/060182 dated Jan. 12, 2022.

(Continued)

*Primary Examiner* — Anthony Ho
(74) *Attorney, Agent, or Firm* — Foley & Lardner LLP

(57) ABSTRACT

A layered semiconductor device comprising a compound, the compound comprising a silicon-oxygen backbone and at least one fluorine-containing moiety attached to the silicon-oxygen backbone. The compound may comprise a unit represented by: formula (I) wherein R and R' each independently represents at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, substituted or unsubstituted fluoroaryl, or substituted or unsubstituted heteroaryl; and wherein at least one of R and R' is the fluorine-containing moiety.

42 Claims, 48 Drawing Sheets

Related U.S. Application Data

(60) Provisional application No. 63/109,304, filed on Nov. 3, 2020.

(51) Int. Cl.
*H10K 59/80* (2023.01)
*H10K 71/00* (2023.01)

(52) U.S. Cl.
CPC ..... *H10K 71/621* (2023.02); *H10K 59/80521* (2023.02); *H10K 59/80522* (2023.02)

(56) References Cited

U.S. PATENT DOCUMENTS

| | | | |
|---|---|---|---|
| 2007/0129473 | A1 | 6/2007 | Shin et al. |
| 2015/0048046 | A1 | 2/2015 | Dei et al. |

FOREIGN PATENT DOCUMENTS

| | | | |
|---|---|---|---|
| CN | 101299419 | A | 11/2008 |
| CN | 101617064 | A | 12/2009 |
| CN | 101730938 | A | 6/2010 |
| CN | 101932618 | A | 12/2010 |
| CN | 104037359 | A | 9/2014 |
| CN | 104769149 | A | 7/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 106206995 | A | 12/2016 |
| CN | 104672458 | B | 2/2017 |
| CN | 104558016 | B | 6/2017 |
| CN | 106992267 | A | 7/2017 |
| CN | 107564945 | A | 1/2018 |
| CN | 107808895 | A | 3/2018 |
| CN | 108376019 | A | 8/2018 |
| CN | 108389878 | A | 8/2018 |
| CN | 108418928 | A | 8/2018 |
| CN | 108630830 | A | 10/2018 |
| CN | 108767136 | A | 11/2018 |
| CN | 108881531 | A | 11/2018 |
| CN | 108900659 | A | 11/2018 |
| CN | 109299631 | A | 2/2019 |
| CN | 109461758 | A | 3/2019 |
| CN | 109599030 | A | 4/2019 |
| CN | 109742132 | A | 5/2019 |
| CN | 109817672 | A | 5/2019 |
| CN | 109817694 | A | 5/2019 |
| CN | 109830495 | A | 5/2019 |
| CN | 109920931 | A | 6/2019 |
| CN | 109950293 | A | 6/2019 |
| CN | 110112182 | A | 8/2019 |
| CN | 110144551 | A | 8/2019 |
| CN | 110265474 | A | 9/2019 |
| CN | 110391348 | A | 10/2019 |
| CN | 110416269 | A | 11/2019 |
| CN | 110429117 | A | 11/2019 |
| CN | 110444125 | A | 11/2019 |
| CN | 110459175 | A | 11/2019 |
| CN | 110473898 | A | 11/2019 |
| CN | 110473988 | A | 11/2019 |
| CN | 110491917 | A | 11/2019 |
| CN | 110491918 | A | 11/2019 |
| CN | 110492018 | A | 11/2019 |
| CN | 110518034 | A | 11/2019 |
| CN | 110570774 | A | 12/2019 |
| CN | 110634930 | A | 12/2019 |
| CN | 110718580 | A | 1/2020 |
| CN | 110727142 | A | 1/2020 |
| CN | 110752249 | A | 2/2020 |
| CN | 110767662 | A | 2/2020 |
| CN | 110767682 | A | 2/2020 |
| CN | 110767708 | A | 2/2020 |
| CN | 110767709 | A | 2/2020 |
| CN | 110767713 | A | 2/2020 |
| CN | 110767736 | A | 2/2020 |
| CN | 110767830 | A | 2/2020 |
| CN | 110767835 | A | 2/2020 |
| CN | 110767836 | A | 2/2020 |
| CN | 110767844 | A | 2/2020 |
| CN | 110780375 | A | 2/2020 |
| CN | 110783484 | A | 2/2020 |
| CN | 110783485 | A | 2/2020 |
| CN | 110783486 | A | 2/2020 |
| CN | 110828699 | A | 2/2020 |
| CN | 110867527 | A | 3/2020 |
| CN | 110914891 | A | 3/2020 |
| CN | 110923625 | A | 3/2020 |
| CN | 110928453 | A | 3/2020 |
| CN | 110956925 | A | 4/2020 |
| CN | 110989861 | A | 4/2020 |
| CN | 111009619 | A | 4/2020 |
| CN | 111020489 | A | 4/2020 |
| CN | 111029381 | A | 4/2020 |
| CN | 111029382 | A | 4/2020 |
| CN | 111046599 | A | 4/2020 |
| CN | 111048564 | A | 4/2020 |
| CN | 111142180 | A | 5/2020 |
| CN | 111155055 | A | 5/2020 |
| CN | 111180490 | A | 5/2020 |
| CN | 111223908 | A | 6/2020 |
| CN | 111261641 | A | 6/2020 |
| CN | 111292617 | A | 6/2020 |
| CN | 111293235 | A | 6/2020 |
| CN | 111293236 | A | 6/2020 |
| CN | 111312795 | A | 6/2020 |
| CN | 111341936 | A | 6/2020 |
| CN | 210668382 | U | 6/2020 |
| CN | 111403621 | A | 7/2020 |
| CN | 111524460 | A | 8/2020 |
| CN | 111524469 | A | 8/2020 |
| CN | 111584725 | A | 8/2020 |
| CN | 111584748 | A | 8/2020 |
| CN | 111640882 | A | 9/2020 |
| CN | 111668240 | A | 9/2020 |
| CN | 111682055 | A | 9/2020 |
| CN | 111682120 | A | 9/2020 |
| CN | 111725288 | A | 9/2020 |
| CN | 111739921 | A | 10/2020 |
| CN | 111739924 | A | 10/2020 |
| CN | 111755493 | A | 10/2020 |
| CN | 111755623 | A | 10/2020 |
| CN | 111799374 | A | 10/2020 |
| CN | 111834547 | A | 10/2020 |
| CN | 111862875 | A | 10/2020 |
| CN | 111863900 | A | 10/2020 |
| CN | 112159594 | A | 1/2021 |
| CN | 112661974 | A | 4/2021 |
| EP | 1 850 368 | A1 | 10/2007 |
| EP | 1 873 162 | A1 | 1/2008 |
| EP | 2 998 997 | A1 | 3/2016 |
| EP | 3 182 477 | A1 | 6/2017 |
| EP | 2 248 849 | B1 | 7/2017 |
| EP | 3 240 036 | A1 | 11/2017 |
| EP | 3 316 311 | A1 | 5/2018 |
| EP | 3 331 045 | A1 | 6/2018 |
| EP | 3 336 899 | A1 | 6/2018 |
| EP | 3 406 752 | A1 | 11/2018 |
| EP | 3 499 576 | A1 | 6/2019 |
| EP | 3 149 012 | B1 | 10/2020 |
| GB | 1 188 212 | A | 4/1970 |
| JP | H07-309880 | A | 11/1995 |
| JP | H08-050424 | A | 2/1996 |
| JP | 2004-352815 | A | 12/2004 |
| JP | 2007-188854 | A | 7/2007 |
| JP | 2010-258410 | A | 11/2010 |
| JP | 4655790 | B2 | 3/2011 |
| JP | 5233074 | B2 | 7/2013 |
| JP | 2013-219278 | A | 10/2013 |
| JP | 2017-154283 | A | 9/2017 |
| JP | 2020-050695 | A | 4/2020 |
| JP | 2020-151695 | A | 4/2020 |
| JP | 6786081 | B2 | 11/2020 |
| JP | 2022-153102 | A | 10/2022 |

(56) References Cited

FOREIGN PATENT DOCUMENTS

| | | | |
|---|---|---|---|
| KR | 10-20100054630 | A | 5/2010 |
| KR | 10-20100123735 | A | 11/2010 |
| KR | 10-20140062258 | A | 5/2014 |
| KR | 10-20150127368 | A | 11/2015 |
| KR | 101640772 | B1 | 7/2016 |
| KR | 10-20170030168 | A | 3/2017 |
| KR | 10-20170075865 | A | 7/2017 |
| KR | 10-2018-0050418 | | 5/2018 |
| KR | 10-2018-0075589 | | 7/2018 |
| KR | 10-20180115655 | A | 10/2018 |
| KR | 10-20180121304 | A | 11/2018 |
| KR | 10-20220135161 | A | 10/2022 |
| TW | 201929219 | A | 7/2019 |
| WO | WO-2011/012212 | A1 | 2/2011 |
| WO | WO-2011/049284 | A1 | 4/2011 |
| WO | WO-2011/107417 | A1 | 9/2011 |
| WO | WO-2016/056364 | A1 | 4/2016 |
| WO | WO-2017/072678 | A1 | 5/2017 |
| WO | WO-2018/206575 | A1 | 11/2018 |
| WO | WO-2019/002198 | A1 | 1/2019 |
| WO | WO-2019/006749 | A1 | 1/2019 |
| WO | WO-2019/047126 | A1 | 3/2019 |
| WO | WO-2019/062221 | A1 | 4/2019 |
| WO | WO-2019/062236 | A1 | 4/2019 |
| WO | WO-2019/088594 | A2 | 5/2019 |
| WO | WO-2019/141198 | A1 | 7/2019 |
| WO | WO-2019/147012 | A1 | 8/2019 |
| WO | WO-2019/178782 | A1 | 9/2019 |
| WO | WO-2019/199131 | A1 | 10/2019 |
| WO | WO-2019/199139 | A1 | 10/2019 |
| WO | WO-2019/199693 | A1 | 10/2019 |
| WO | WO-2019/200862 | A1 | 10/2019 |
| WO | WO-2019/233298 | A1 | 12/2019 |
| WO | WO-2019/242510 | A1 | 12/2019 |
| WO | WO-2020/029559 | A1 | 2/2020 |
| WO | WO-2020/029612 | A1 | 2/2020 |
| WO | WO-2020/029621 | A1 | 2/2020 |
| WO | WO-2020/045262 | A1 | 3/2020 |
| WO | WO-2020/052232 | A1 | 3/2020 |
| WO | WO-2020/057208 | A1 | 3/2020 |
| WO | WO-2020/079456 | A1 | 4/2020 |
| WO | WO-2020/105015 | A1 | 5/2020 |
| WO | WO-2020/134914 | A1 | 7/2020 |
| WO | WO-2020/191889 | A1 | 10/2020 |
| WO | WO-2020/192051 | A1 | 10/2020 |
| WO | WO-2020/195917 | A1 | 10/2020 |
| WO | WO-2020/199445 | A1 | 10/2020 |
| WO | WO-2020/226383 | A1 | 11/2020 |
| WO | WO-2020/261191 | A1 | 12/2020 |
| WO | WO-2022/101429 | A1 | 5/2022 |
| WO | WO-2022/192005 | A1 | 9/2022 |
| WO | WO-2022/203222 | A1 | 9/2022 |
| WO | WO-2022/203276 | A1 | 9/2022 |
| WO | WO-2022/203323 | A1 | 9/2022 |
| WO | WO-2022/229208 | A1 | 11/2022 |
| WO | WO-2023/278000 | A1 | 1/2023 |
| WO | WO-2023/013697 | A1 | 2/2023 |
| WO | WO-2023/043579 | A1 | 3/2023 |

OTHER PUBLICATIONS

KR Office Action on KR Appl. No. 10-2023-7018371 dated Jun. 27, 2025 (20 pages with English language translation).

Abroshan, H. et al. "66-3: Active Learning for the Design of Novel OLED Materials." SID Symposium Digest of Technical Papers. 53.1 (2022), pp. 885-888.

Alhadid A. et al., "Design of Deep Eutectic Systems: A Simple Approach for Preselecting Eutectic Mixture Constituents (Supplementary Material)", Molecules, 25.5 (2020): 1077 (4 pages).

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H.R. "Phosphorus-nitrogen Compounds", pp. 400-407, Academic Press (1972).

Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972): 4538-4545.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., Gayann S. McDonnell, and James L. Desorcie. "Ring expansion and equilibration in organophosphazenes and the relationship to polymerization." Inorganic chemistry 29.19 (1990): 3839-3844.

Allcock, Harry R., Michael L. Turner, and Karyn B. Visscher. "Synthesis of transannular-and spiro- substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]" Inorganic chemistry 31.21 (1992): 4354-4364.

Amano, Akio, et al. "49.4 L: Late-News Paper: Highly Transmissive One Side Emission OLED Panel for Novel Lighting Applications." SID Symposium Digest of Technical Papers. Vol. 44. No. 1. Oxford, UK: Blackwell Publishing Ltd, 2013, 689-692.

Aneta Wiatrowska, et al. "Ultra-Precise Deposition for Display Manufacturing: from Rapid Prototyping to Mass Production", The 21st international meeting on information display, Seoul, Korea (22 pages).

Aqra, Fathi, and Ahmed Ayyad. "Surface free energy of alkali and transition metal nanoparticles." Applied surface science 314 (2014): 308-313.

Araki, H. and Naka, K., "Syntheses and Properties of Dumbbell-Shaped POSS Derivatives Linked by Luminescent p-Conjugated Units", Polymer Chemistry, 50.20 (2012):4170-4181.

Araki, H. and Naka, K., "Syntheses and Properties of Star- and Dumbbell-Shaped POSS Derivatives Containing Isobutyl Groups", Polymer Journal, 44 (2012): 340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011): 6039-6045.

Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

Aubouy, Miguel, Manoel Manghi, and Elie Raphaël. "Interfacial properties of polymeric liquids." Physical Review Letters 84.21 (2000): 4858-4861.

Bae, J. et al. "Optically recoverable, deep ultraviolet (UV) stable and transparent sol-gel fluoro siloxane hybrid material for a Uv Led encapsulant." RSC advances 6.32 (2016): 26826-26834.

Baek, Seungin, et al. "74-2: Diffracted Image Retrieving with Deep Learning." SID Symposium Digest of Technical Papers. Vol. 51. No. 1. 2020 (3 pages).

Baradie, B. et al. "Synthesis and characterization of novel polysiloxane-grafted fluoropolymers." Canadian journal of chemistry 83.6-7 (2005): 553-558.

Barry, B., "Routes to Silsesquioxanes Functionalization - Capping of DDSQs for the Synthesis of Asymmetric POSS Compounds", Masters Thesis, Michigan State University (2019) (149 pages).

Bechtolsheim, C. V., V. Zaporojtchenko, and F. Faupel. "Interface structure and formation between gold and trimethylcyclohexane polycarbonate." Journal of materials research 14.9 (1999): 3538-3543.

Bertolucci, M. et al. "Wetting Behavior of Films of New Fluorinated Styrene - Siloxane Block Copolymers." Macromolecules 37.10 (2004): 3666-3672.

Besli, S. et al., "Bridged Cyclophosphazenes Resulting From Deprotonation Reactions of Cyclotriphophazenes Bearing a P-NH Group", Dalton Trans., 40.19 (2011):5307-5315.

(56) References Cited

OTHER PUBLICATIONS

Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F. Sputtering and Plasma Polymerization in Inert and Active Gas", Thin Solid Films, 41.3 (1977):329-339.
Blanchet, G.B., "Deposition of Amorphous Fluoropolymers Thin Films by Laser Ablation", Appl. Phys. Lett. 62 (1993):479-481.
Blanco, I., "The Rediscovery of Poss: A Molecule Rather than a Filler", Polymers, 10.8 (2018): 904- 914.
Boyne, D. et al., "Vacuum Thermal Evaporation of Polyaniline Doped with Camphor Sulfonic Acid", Journal of Vacuum Science & Technology A, 33.3 (2015):031510 (7 pages).
Brickley, J.F. et al., "Supramolecular Variations on a Molecular Theme: the Structural Diversity of Phosphazenes (RNH)6P3N3 in the Solid State", Dalton Trans., 7 (2003): 1235-1244.
Brown, Douglas E., et al. "Poly [(vinyloxy) cyclophosphazenes]." Macromolecules 34.9 (2001): 2870- 2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306- 314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023), pp. 942-944.
Camino, G. et al., "Polydimethylsiloxane Thermal Degradation Part 1. Kinetic Aspects", Polymer, 42.6 (2001): 2395-2402.
Chaiprasert, T. et al. "Vinyl-functionalized Janus ring siloxane: potential precursors to hybrid functional materials." Materials 14.8 (2021), 10 pages.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007): 1045-1074.
Chang, Li, et al. "A smart surface with switchable wettability by an ionic liquid." Nanoscale 9.18 (2017): 5822-5827.
Chen, G. K. J., and J. Chen. "Flexible displays: Flexible AMOLED manufacturing." Handbook of Visual Display Technology; Chen, J., Cranton, W., Fihn, M., Eds (2016), pp. 1359-1376.
Chen, W. et al., "Highly Thermal Stable Phenolic Resin Based on Double-Decker-Shaped POSS Nanocomposites for Supercapacitors", Polymers, 12.9 (2020):2151-2165.
Chen, Yu-Hung, et al. "58.2: High-Performance Large-Size OLED Tv with Ultra Hd Resolution." SID Symposium Digest of Technical Papers. Vol. 46. No. 1. 2015, pp. 869-871.
Ching, Suet Ying. "Plasmonic properties of silver-based alloy thin films." (2015). Open Access Theses and Dissertations. 194, 198 pages.
Ching, Suet Ying. "Plasmonic properties of silver-based alloy thin films." (2016).
Cho, H.U. et al. "17-1: Invited Paper: Enhancement of Current Efficiency for OLED Devices Using Meta-Heuristic Algorithm." SID Symposium Digest of Technical Papers. 52.1 (2021) pp. 204-205.
Cho, H.U. et al. "Enhancement of Current Efficiency for OLED Devices Using Meta-Heuristic Algorithm." 2021 Virtual Display Week International Symposium (2021) 19 pages.
Choi, B. K. et al. "48-1: Invited Paper: Next Generation Highly Efficient and Stable Phosphorescent Emitting Materials For OLEDs." SID Symposium Digest of Technical Papers 51.1 (2020), pp. 699-702.
Choi, B. K. et al. "Next Generation Highly Efficient and Stable Phosphorescent Emitting Materials For OLEDs." SID2020 Symposium (23 pages).
Choi, J. et al., "Light Extraction Enhancement in Flexible Organic Light-Emitting Diodes by a Light- Scattering Layer of Dewetted Ag Nanoparticles at Low Temperatures", App. Mater. Interfaces, 10 (2018):32373-32379.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010): 13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
David, Robert, Neumann, A. Wilhelm. "A Theory for the Surface Tensions and Contact Angles of HydrogenBonding Liquids." Langmuir 30.39 (2014): 11634-11639.
De Wilde, W., "Evaporation of Polytetrafluoroethylene by Electron Bombardment of the Bulk Material", Thin Solid Films, 24.1 (1974): 101-111.
Di Nicola, Giovanni, Gianluca Coccia, and Mariano Pierantozzi. "Surface tension of silanes: A new equation." Fluid Phase Equilibria 418 (2016): 88-93.
Dong, H. et al., "Surface Properties and Thermal Stability of a Novel Low-Surface-Energy Polybenzoxazine/Clay Nanocomposites", Polymer Composites, 33.8 (2012): 1313-1320.
Drelich, J. et al., "Hydrophilic and Superhydrophilic Surfaces and Materials", Soft Matter, 7.21 (2011): 9804-9828.
Dubrovskii, Vladimir. "Fundamentals of Nucleation Theory." Nucleation Theory and Growth of Nanostructures. Springer, Berlin, Heidelberg, 2014. 1-73.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019): 504-542.
Dutkiewicz, M. et al., "New Fluorocarbofunctional Spherosilicates: Synthesis and Characterization", Organometallics, 30.8 (2011):2149-2153.
Eguchi, Shingo, et al. "35-1: Strategy for Developing an Ultra-High-Luminance AMOLED Display." SID Symposium Digest of Technical Papers. Vol. 49. No. 1. 2018.
Eilers, H., et al. "Teflon AF/Ag nanocomposites with tailored optical properties." Journal of materials research 21.9 (2006): 2168-2171.
Ellison, A. H., H. W. Fox, and W. A. Zisman. "Wetting of fluorinated solids by hydrogen-bonding liquids." The Journal of Physical Chemistry 57.7 (1953): 622-627.
Emerton, Neil, David Ren, and Tim Large. "28-1: Image Capture Through TFT Arrays." SID Symposium Digest of Technical Papers. Vol. 51. No. 1. 2020.
Faupel, F., et al. "Nucleation, growth, interdiffusion, and adhesion of metal films on polymers." AIP Conference Proceedings. Vol. 491. No. 1. American Institute of Physics, 1999.
Feher, F.J. and Budzichowski, T.A., "Silasesquioxanes as Ligands in Inorganic and Organometallic Chemistry", Polyhedron, 14.22 (1995):3239-3253.
Feng, Zhengyu, et al. "28-3: Pixel Design for Transparent MicroLED Display with Low Blurring."?SID Symposium Digest of Technical Papers. Vol. 51. No. 1. 2020.
Flaningam, Ora L. "Vapor pressures of poly (dimethylsiloxane) oligomers." Journal of Chemical and engineering Data 31.3 (1986): 266-272.
Flores-Camacho, Jose Manuel, et al. "Growth and optical properties of Ag clusters deposited on poly (ethylene terephthalate)." Nanotechnology 22.27 (2011): 275710.

(56) References Cited

OTHER PUBLICATIONS

Forrest, James A. "Reductions of the glass transition temperature in thin polymer films: Probing the length scale of cooperative dynamics." Physical Review E 61.1 (2000): R53-6.
Fowkes, Frederick M. "Attractive Forces at Interfaces." Industrial and Engineering Chemistry 56. 12 (1964): 40-52.
Fox, H.W. et al., "Polyorganosiloxanes . . . Surface Active Properties", Ind. Eng. Chem., 39.11 (1947): 1401-1409.
Frey, Kurt, et al. "Implications of coverage-dependent O adsorption for catalytic No. oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34. 16 (2001): 5627-5634.
Furukawa, Yutaka, et al. "Fluorosilicone elastomer based on the poly [(3, 3, 3-trifluoropropyl) methyl- siloxane-co-(3, 3, 4, 4, 5, 5, 6, 6, 6-nonafluorohexyl) methylsiloxane]." Polymers for Advanced Technologies 13.1 (2002): 60-65.
Furukawa, Yutaka, et al. "Reactivity of cyclosiloxane with 3, 3, 4, 4, 5, 5, 6, 6, 6-nonafluorohexyl group and its application to fluorosilicone synthesis." Journal of applied polymer science 82.13 (2001): 3333-3340.
Fusella, Michael A., et al. "Plasmonic enhancement of stability and brightness in organic light-emitting devices." Nature 585.7825 (2020): 379-382.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012): 7520-7526.
Gao Y., "Microphase Separation of Stimulus-Responsive Block-co-Polypeptides on Surfaces", Master's thesis, Duke University (2018).
Gao, Lichao, and Thomas J. McCarthy. "Teflon is hydrophilic. Comments on definitions of hydrophobic, shear versus tensile hydrophobicity, and wettability characterization." Langmuir 24.17 (2008): 9183-9188.
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J et al., "An Overview of the Uses of Per- and Polyfluoroalkyl Substances (PFAS)- Electronic supplementary information 1", Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014): 1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003): 3607-3649.
Grytsenko, K. "Vacuum-deposited fluoropolymer films for organic electronics" International Symphosium on Plastics Electronics (Part of Semicon Europe - 2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016): 139-148.
Hadi, A., et al. "Accelerated Design and Optimization of Novel OLED Materials", The 21st international meeting on information display, Seoul, Korea.
Halls, M. D., et al. "An Innovation Platform for Optoelectronics: Synergistic Acceleration of de Novo Design Powered by Multiscale Simulations and Machine Learning", The 21st international meeting on information display, Seoul, Korea.
Handke, Bartosz, Lukasz Klita, and Wiktor Niemiec. "Self-assembly of dodecaphenyl POSS thin films." Surface Science 666 (2017): 70-75.
Heaney, James B. "Evaluation of commercially supplied silver coated Teflon for spacecraft temperature control usage." (1974).
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hoge, J. "Novel Benzoxazine Based System for Flame Retardant Aircraft Interior Prepreg Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hopkin, Hywel T., Edward A. Boardman, and Tim M. Smeeton. "36-4: Solution-Processed Transparent Top Electrode for Qd-Led." SID Symposium Digest of Technical Papers. Vol. 51. No. 1. 2020.
Hwang, S. et al., "ChemInform Abstract: Dendritic Macromolecules for Organic Light-Emitting Diodes", Chemical Society Reviews, 37.11 (2008):2543-2557.
Lacono, S. T. et al. "Fluorinated polyhedral oligomeric silsesquioxanes (F-POSS)", Defense Technical Information Center, (2010) url:https://apps.dtic.mil/sti/tr/pdf/ADA521393.pdf.
Lacono, S.T. et al., "Preparation of Composite Fluoropolymers with Enhanced Dewetting Using Fluorinated Silsesquioxanes as Drop-In Modifiers", J. Mater. Chem., 20.15 (2010): 2979-2984.
Lacono, Scott T., et al. "Facile synthesis of hydrophobic fluoroalkyl functionalized silsesquioxane nanostructures." Chemical communications 47 (2007): 4992-4994.
Lacono, Scott T., et al. Fluorinated Polyhedral Oligomeric Silsesquioxanes (F-Poss). Air Force Research Lab Edwards Afb Ca Propulsion Directorate, 2010.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009): 125-135.
Ikonnikov, D.A., "Controlling Multiple Diffraction with Quasiperiodic Gratings", Laser Phys. Lett., 16.12 (2019): 126202.
Imoto, H. et al., "Corner- and Side-Opened Cage Silsesquioxanes: Structural Effects on the Materials Properties", European Journal of Inorganic Chemistry, 2020.9 (2020): 737-742.
Imoto, H. et al., "Tripodal Polyhedral Oligomeric Silsesquioxanes as a Novel Class of Three- Dimensional Emulsifiers", Polymer Journal, 47 (2015):609-615.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1- yl)alkyl]acetamides", Russian Journal of Organic Chemistry, 52.11 (2016): 1558-1564.
Iwamori, S. et al., "Adsorption Properties of Fluorocarbon Thin Films Prepared by Physical Vapor Deposition Methods", Surface & Coatings Technology, 204: 16-17 (2010): 2803-2807.
Iwamori, S., "Adhesion and Friction Properties of Fluorocarbon Polymer Thin Films Coated onto Metal Substrates", Key Engineering Materials, 384 (2008): 311-320.
Jarvis, N.L. and Zisman, W.A., "Surface Chemistry of Fluorochemicals", Defense Technical Information Center (1965): 1-37.
Jiao, Zhiqiang, et al. "61-2: Weakening Micro-Cavity Effects in White Top-Emitting WOLEDs with Semitransparent Metal Top Electrode."?SID Symposium Digest of Technical Papers. Vol. 49. No. 1. 2018.
Jin, Y. et al. "Two-Tier Ensemble Deep Learning Model for Anomaly Detection in OLED Encapsulation Process" The 21st International Meeting on Information Display, Seoul, Korea (2021).

(56) References Cited

OTHER PUBLICATIONS

Jung, W. et al. "62-3: High Precise laser glass cutting for future display" Journal of the Society for Information Display 30.5 (2022): 462-470.
Jung, W. et al. "Extremely Precise Laser Glass Cutting Technology for Future Display", The 21st international meeting on information display, Seoul, Korea.
Kaesler, K., "The hidden defenders: Silane and siloxane impregnation protects construction materials", European coatings journal, 3 (2006): 36-41.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp.422-427.
Kato, Daimotsu, et al. "52.4 L Transmissive One-Side-Emission OLED Panel using Alignment-Free Cathode Patterning." SID Symposium Digest of Technical Papers. Vol. 46. No. 1. 2015.
Khanin, D. A., et al. "New hybrid materials based on cyclophosphazene and polysiloxane precursors: Synthesis and properties." Polymer 186 (2020): 122011.
Kim, Chiwoo, et al. "Fine metal mask material and manufacturing process for high-resolution active- matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, H. et al. "Reliability Characterization of Luminance Degradation of OLED Mobile Display Considering Color Difference Index Based on Usage Patterns." SID 2020 Symposium.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays."?SID Symposium Digest of Technical Papers. Vol. 51. No. 1. 2020.
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, S. et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Long lifetime Phosphorescent Blue" 2022 Display Week International Symposium, San Jose (2022).
Kim, S. et al. "Machine-Learning-Assisted Materials Discovery of Blue Emitter for a More Efficient and Durable OLED Device." 2021 Virtual Display Week International Symposium (2021).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kim, T. et al., "Electrical Injection and Transport in Teflon-Diluted Hole Transport Materials", Organic Electronics, 83 (2020): 105754.
Kim, Y. "Al & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kim, Y. et al. "17-2: Invited talk: Simulation Based Artificial Intelligence for Displays." 2021 Virtual Display Week International Symposium (2021).
Kisin, Srdjan. Adhesion changes at metal-polymer interfaces: Study of the copper-(acrylonitrile- butadiene-styrene) system. Diss. Dissertation, Technische Universiteit Eindhoven, 2007.
Kiskan, B., "Adapting Benzoxazine Chemistry for Unconventional Applications", Reactive and Functional Polymers, 129 (2018): 76-88.
Knight Jr, L. B., et al. "Unusual behavior of vaporized magnesium under low pressure conditions." The Journal of Physical Chemistry 79.12 (1975): 1183-1190.
Kobayashi, Hideki, and Michael J. Owen. "Surface tension of liquid polysiloxanes having fluorinated alkyl side-chains." Die Makromolekulare Chemie: Macromolecular Chemistry and Physics 194.6 (1993): 1785-1792.
Koh, K. et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005): 1264-1270.
Koma, N. et al. "44.2: Novel Front-light System Using Fine-pitch Patterned Oled." SID Symposium Digest of Technical Papers, 39: 655-658. 2008.
Kota, Arun K., Gibum Kwon, and Anish Tuteja. "The design and applications of superomniphobic surfaces." NPG Asia Materials 6.7 (2014): e109.
Kovacik, P. et al., "Vacuum-Deposited Planar Heterojunction Polymer Solar Cells", ACS Appl. Mater. Interfaces, 3.1 (2011): 11-15.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Lanoux, S. and Mas, R.H., "Reactions of the Hydrolyzed Phosphazene N3P3(OCH2CF3)5ONa", Phosphorus and Sulfur and the Related Elements, 26.2 (1986): 139-142.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. Vol. 46. No. 1. 2015.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J. et al. "55-2: Methods for Overcoming the Trade-off between Efficiency and Lifetime of Organic Light-Emitting Diodes: OLED Lifetime Simulation." SID2020 Symposium.
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, S. et al. "20-2: High Efficiency and Long Device Lifetime Green Organic Light Emitting Diodes using a Pt Complex." SID Symposium Digest of Technical Papers 51.1 (2020).
Lee, S. et al. "Highly Efficient and Long-lifetime Green OLED using a Pt Complex." 2020 Virtual Display Week International Symposium.

(56) References Cited

OTHER PUBLICATIONS

Lei, Hui, et al. "Fluorine-free low surface energy organic coating for anti-stain applications." Progress in Organic Coatings 103 (2017): 182-192.
Lei, Ying Duan, Frank Wania, and Dan Mathers. "Temperature-dependent vapor pressure of selected cyclic and linear polydimethylsiloxane oligomers." Journal of Chemical & Engineering Data 55.12 (2010): 5868-5873.
Li, L. et al., "Synthesis and Properties of Microporous Organic Polymers Based on Adamantane", Progress in Chemistry, 32 (2020): 190-203.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In-Ga-Zn-O Thin-Film Transistors with Hafnium-Induced Source/Drain Regions." SID Symposium Digest of Technical Papers. 54.1 (2023).
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, C. et al., "Mechanistic Studies on Ring-Opening Polymerization of Benzoxazines: A Mechanistically Based Catalyst Design", Macromolecules, 44.12 (2011): 4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Meng, et al. "Facile fabrication of superhydrophobic surface from fluorinated poss acrylate copolymer via one-step breath figure method and its anti-corrosion property." Polymers 11.12 (2019): 1953.
Liu, Yang, et al. "P-168: Top Emission WOLED for High Resolution Oled TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Liu, Z. et al., "Two-Dimensional Gratings of Hexagonal Holes for High Order Diffraction Suppression", Optics Express, 25.2 (2017): 1339-1349.
Lowe, R.D. et al., "Deposition of Dense Siloxane Monolayers from Water and Trimethoxyorganosilane Vapor", Langmuir, 27.16 (2011):9928-9935.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane-OH and Epoxy Resins", Journal of Applied Polymer Science, 106.6 (2007):4117-4123.
Lund, L. G., et al. "514. Phosphonitrilic derivatives. Part I. The preparation of cyclic and linear phosphonitrilic chlorides." Journal of the Chemical Society (Resumed) (1960): 2542-2547.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008): 4137-4140.
Mabry, Joseph M., et al. Ultrahydrophobic Fluorinated Polyhedral Oligomeric Silsesquioxanes (F- POSS)(Preprint). Air Force Research Lab Edwards AFB CA Propulsion Directorate, 2007.
Mackus, A.J.M et al. "From the bottom-up: toward area-selective atomic layer deposition with high selectivity" Chemistry of Materials 31.1 (2018): 2-12.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic -Superhydrophilic Surface", Scientific Reports, 8 (2018): 18018.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marzari, N. et al. "Electronic-structure methods for materials design." Nature materials 20.6 (2021): 736-749.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by Ink Jet Printing. OLEDs World Summit, Sep. 2020.
Mikhaylov, D.Y. and Budnikova, Y.H., "Fluoroalkylation of Organic Compounds", Russian Chemical Reviews, 82.9 (2013): 835-864.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Mugisawa, M. et al., "Synthesis and Application of Novel Fluoroalkyl End-Capped Cooligomers Having Adamantane as a Pendant Group", Colloid Polym Sci, 285 (2007): 737-744.
Murano, Sven, et al. "30.3: Invited Paper: AMOLED Manufacturing-Challenges and Solutions from a Material Makers Perspective." SID Symposium Digest of Technical Papers. Vol. 45. No. 1. 2014.
Murray, M. et al., "NMR Studies of Hydrolysis and Rearrangement Reactions of Cyclophosphazenes", Phosphorus, Sulfur, and Silicon and the Related Elements, 65.1-4 (1992): 83-86.
Nakamura, Daiki, et al. "68-4: Top-emission OLED Kawara-type Multidisplay with Auxiliary Electrode." SID Symposium Digest of Technical Papers. Vol. 49. No. 1. 2018.
Nason, T.C. et al., "Deposition of Amorphous Fluoropolymer Thin Films by Thermolysis of Teflon Amorphous Fluoropolymer", Appl. Phys. Lett. 60 (1992): 1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on -CF3 Alignment", Langmuir, 15 (1999): 4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohring, Milton. Materials science of thin films. Elsevier, 2001.
Oka, M. and Satoshi, H. "Synthesis of photoresponsive cyclic poly (dimethyl siloxane) s from monodisperse linear precursors" Reactive and functional polymers 158 (2021): 104800.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Olejnik, A. et al., "Silsesquioxanes in the Cosmetics Industry—Applications and Perspectives", Materials, 15.3 (2022): 1126-1143.
Owen, M. J. "A review of significant directions in fluorosiloxane coatings" Surface Coatings International Part B: Coatings Transactions 87:B2 (2004).

(56) References Cited

OTHER PUBLICATIONS

Pandharkar, Riddhish, et al. "A Computational Study of AIF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. Vol. 46. No. 1. 2015.
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Peters, Richard D., et al. "Using Self-Assembled Monolayers Exposed to X-rays To Control the Wetting Behavior of Thin Films of Diblock Copolymers." Langmuir 16.10 (2000): 4625-4631.
Pham, J.Q. and Green, P.F., "The Glass Transition of Thin Film Polymer/Polymer Blends: Interfacial Interactions and Confinement", J. Chem. Phys., 116.13 (2002):5801-5806.
Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.
Pu, T. et al., "Effects of Structure Parameters on High-Order Diffraction Suppression of Quasi-Periodic Gratings", Journal of the Optical Society of America B, 35.4 (2018): 711-717.
Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.
Ramirez, S.M. et al., "Incompletely Condensed Fluoroalkyl Silsesquioxanes and Derivatives: Precursors for Low Surface Energy Materials", J. Am. Chem. Soc. 133.50 (2011): 20084-20087.
Reichert, V.R. and Mathias, L.J., "Expanded Tetrahedral Molecules from 1,3,5,7-Tetraphenyladarnantane", Macromolecules, 27.24 (1994): 7015-7023.
Ren, Zhongjie, and Yan, Shouke. "Polysiloxanes for optoelectronic applications." Progress in Materials Science 83 (2016): 383-416.
Rey, Nadège, et al. "Dumbbell-Shaped T8-POSS with Functional Organic Linkers." European Journal of Inorganic Chemistry 2019. 27 (2019): 3148-3156.
Ribeiro, Paulo, David L. Andrews, and Maria Raposo, eds. Optics, Photonics and Laser Technology 2017. vol. 222. Springer, 2019.
Ringe, E., "Shapes, Plasmonic Properties, and Reactivity of Magnesium Nanoparticles", J. Phys, Chem. C, 124 (2020): 15665.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Roy, M.R., "Surface Properties of Hard Fluorinated Amorphous Carbon Films Deposited by Pulsed-DC Discharges", Doctoral Thesis, Universitat de Barcelona (2012).
Safonov, Alexey I., et al. "Deposition of thin composite films consisting of fluoropolymer and silver nanoparticles having surface plasmon resonance." Thin Solid Films 603 (2016): 313-316.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011): 1743-1754.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats- und Universitaetsbibliothek Dresden, 2014.
Seebauer, E.G. and Allen, C.E., "Estimating Surface Diffusion Coefficients", Progress in Surface Science, 49.3 (1995): 265-330.
Senchyk, A.G. et al., "1,2,4-Triazole Functionalized Adamantanes: a New Library of Polydentate Tectons for Designing Structures of Coordination Polymers", Dalton Trans., 41.28 (2012): 8675-8689.
Senchyk, G.A. et al., "Functionalized Adamantane Tectons Used in the Design of Mixed-Ligand Copper(II) 1,2,4-Triazolyl/ Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017):9325-9332.
Shen, Mingmin, et al. "Destabilization of Ag nanoislands on Ag (100) by adsorbed sulfur." The Journal of chemical physics 135.15 (2011): 154701.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, Lina, et al. "Two dimensional gratings of connected holes for high order diffraction suppression." Optics, Photonics and Laser Technology 2017 (2019): 55-74.
Shi, Shiming, et al. "56-1: Invited Paper: Research on Commercial Foldable AMOLED and Relevant Technologies."?SID Symposium Digest of Technical Papers. vol. 51. No. 1. 2020.
Shih, H. et al., "A Cross-Linkable Triphenylamine Derivative as a Hole Injection/Transporting Material in Organic Light-Emitting Diodes", Polym. Chem., 6 (2015): 6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Shin, Dong-Youn, and Inyoung Kim. "Self-patterning of fine metal electrodes by means of the formation of isolated silver nanoclusters embedded in polyaniline." Nanotechnology 20.41 (2009): 415301.
Silicone Fluids, p. 20, retrieved from <https://s3.amazonaws.com/gelest/product-brochures/Inert_Silicones.pdf> on Mar. 24, 2022.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.

(56) References Cited

OTHER PUBLICATIONS

Spelt, J. K., Neumann, A. W. "Solid Surface Tension: The Equation of State Approach and the Theory of Surface Tension Components. Theoretical and Conceptual Considerations." Langmuir 3 (1987): 588-591.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016): 10960-10965.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, J. et al. "Realizing Deep Blue Emission in Blue Phosphorescent Organic Light-Emitting Diodes", SID Symposium Digest of Technical Papers, 2020.
Sun, T. et al., "Reversible Switching between Superhydrophilicity and Superhydrophobicity", Angew. Chem. Int. Ed., 43.3 (2004):357-360.
Svorcik, V. et al., "Deposition of Polystyrene Films by Vacuum Evaporation", Journal of Materials Science Letters, 16 (1997): 1564-1566.
Syafiq, A., et al. "Superhydrophilic Smart Coating for Self-Cleaning Application on Glass Substrate." Journal of Nanomaterials 2018 (2018).
Takele, H. et al., "Plasmonic Properties of Ag Nanoclusters in Various Polymer Matrices", Nanotechnology, 17.14 (2006):3499-3505.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tao, C. et al., "Highly Icephobic Properties on Slippery Surfaces Formed From Polysiloxane and Fluorinated POSS", Progress in Organic Coatings, 103 (2017):48-59.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903.
Tokuchi. S. et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Topper, Tino, et al. "Tailoring the mass distribution and functional group density of dimethylsiloxane- based films by thermal evaporation." APL Materials 4.5 (2016): 056101.
Tsai, Yu-Hsiang, et al. "p. 202: A Flexible Transparent OLED Display with FlexUPTM Technology." SID Symposium Digest of Technical Papers. Vol. 48. No. 1. 2017.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films. "Journal of Materials Chemistry 20.43 (2010): 9623-9627.
Tuteja, A. et al., "Designing Superoleophobic Surfaces", Science, 318.5856 (2007): 1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by lonized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995): 2318-2324.
Usui, H., "Deposition of Polymeric Thin Films by lonization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Vampola, K. J. et al. "12-1: Through-OLED Display Ambient Color Sensing." Apple, Cupertino CA.
Van de Grampel, R.D., "Surfaces of Fluorinated Polymer Systems", Doctoral Thesis, Technische Universiteit Eindhoven (2002).
Varagnolo, Silvia, et al. "Embedded-grid silver transparent electrodes fabricated by selective metal condensation," Journal of Materials Chemistry C 8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vasilak, L. et al., "A statistical paradigm for organic optoelectronic devices: normal force testing for adhesion of OPVs and OLEDs", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3- Dimethyl-adamantane", ACS Omega, 5.26 (2020): 16085-16088.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, Hailiang, et al. "P-132: An Under-Display Camera Optical Structure for Full-Screen LCD." SID Symposium Digest of Technical Papers. vol. 51. No. 1. 2020.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017): 12782-12790.
Wang, M. et al., "Fluorene-containing Polyhedral Oligomericsilsesquioxanes Modified Hyperbranched Polymer For White Light-emitting Diodes With Ultra-high Color Rendering Index of 96," J. Solid State Chem., 298, 2021, p. 122122.
Wang, Y. et al., "Substrate Effect on the Melting Temperature of Thin Polyethylene Films", Physical Review Letters, 96.2 (2006):028303.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.

(56) References Cited

OTHER PUBLICATIONS

Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Teflon® AF Matrix (Pre-print version)", Thin Solid Films, 517.2 (2008):575-581.
Weigel, W.K. et al., "Direct Radical Functionalization Methods to Access Substituted Adamantanes and Diamondoids", Org. Biomol. Chem., 20 (2022): 10-36.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016): 106-113.
Wilcock, Donald F. "Vapor pressure-viscosity relations in methylpolysiloxanes." Journal of the American Chemical Society 68.4 (1946): 691-696.
Winget, P. et al. "57-1: Accelerating Next-Generation Display Materials Development with a Smart Digital Chemistry Platform." SID Symposium Digest of Technical Papers 54.1 (2023).
Wojtczak, L., "The Melting Point of Thin Films", Phys. Stat. Sol., 23.2 (1967): K163-K166.
Wolfgang Decker, Vast Films, Ltd. "Pattern Metallization: Selective Deposition of Metals on Polymer Films for Functional Applications" AIMCAL Fall Conference 2005.
Wu, Y. et al. "P-13.5: Investigation on Chromatic Dispersion of Reflection for CFOT Display" SID Symposium Digest of Technical Papers 54 (2023).
Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.
Xie, Changqing, et al. "Towards high-order diffraction suppression using two-dimensional quasi- periodic gratings." Optics, Photonics and Laser Technology 2017 (2019): 31-53.
Xie, J. et al., "Regioselective Synthesis of Methyl-Substituted Adamantanes for Promoting Oxidation Stability of High-Density Fuels", Energy Fuels, 34.4 (2020): 4516-4524.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009): 4740-4745.
Xu, Pengyun, et al. "Superhydrophobic ceramic coating: Fabrication by solution precursor plasma spray and investigation of wetting behavior." Journal of Colloid and Interface Science 523 (2018): 35-44.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yamada, Toshikazu, et al. "Nanoparticle chemisorption printing technique for conductive silver patterning with submicron resolution." Nature communications 7.1 (2016): 1-9.
Yang, H. et al., "Catalyst-Controlled C-H Functionalization of Adamantanes Using Selective H-Atom Transfer", ACS Catal., 9.6 (2019):5708-5715.
Yang, J. et al. "25-4: Methodology and Correlation of AI-Based Design for OLED Materials." SID Symposium Digest of Technical Papers 52.1 (2021).
Yang, J. et al. "25.4: Methodology and Correlation of AI-Based Design for OLED Materials." SID2021 Symposium.
Yang, Jun-Yu, et al. "32-3: AMOLED IR Drop Compensation for Channel Length Modulation." SID Symposium Digest of Technical Papers. vol. 51. No. 1. 2020.
Yao, Pan, et al. "Highly soluble and thermally stable copolyimides modified with trifluoromethyl and siloxane." Journal of Applied Polymer Science 132.13 (2015).
Yao, Y. et al. "p. 7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016): 320-327.
Yoo, D. et al. "Retrosynthesis Planning for Thermally Activated Delayed Fluorescence Molecules" The 21st International Meeting on Information Display, Seoul, Korea (2021).
Youn, S. et al. "73-4: Novel Materials and Structures for High Efficiency and Long Lifetime Green Phosphorescent OLEDs in Automotive Applications." SID 2022 Symposium.
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science 532 (2003): 300-305.
Zaporojtchenko, V., et al. "Determination of condensation coefficients of metals on polymer surfaces." Surface science 454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moire Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianzhan, et al. "Bio-inspired superhydrophilic coatings with high anti-adhesion against mineral scales." NPG Asia Materials 10.3 (2018): e471-e471.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018): 5641-5646.

(56) References Cited

OTHER PUBLICATIONS

Zhang, Yongjie, Mingshuai Fan, and Xiaopei Li. “Reaction of ”unreactive“ silicone: synthesis of long- chain alkyl fluorosilicone via a simple siloxane equilibration process.” Polymer Bulletin 77.6 (2020): 2855-2871.
Zhang, Zhenhua. “74-3: Image Deblurring of Camera Under Display by Deep Learning.”?SID Symposium Digest of Technical Papers. vol. 51. No. 1. 2020.
Zhao, Lei, Daqun Chen, and Weihua Hu. “Patterning of metal films on arbitrary substrates by using polydopamine as a UV-sensitive catalytic layer for electroless deposition.” Langmuir 32.21 (2016): 5285-5290.
Zhao, Xuan, et al. “P-233: Late-News-Poster: Color Shift Improvement of AMOLED Device with Color Filter.” SID Symposium Digest of Technical Papers. vol. 51. No. 1. 2020.
Zharkova, N. M., M. A. Kleinovskaya, and Yu K. Molokanov. “Evaporation of oligoorganic siloxanes under hgh vacuum.” Chemistry and Technology of Fuels and Oils 5.4 (1969): 257-261.
Zhu, C. et al. “A novel synthetic UV-curable fluorinated siloxane resin for low surface energy coating.” Polymers 10.9 (2018): 979.
Zibarov, A. et al., “AB5 Derivatives of Cyclotriphosphazene for the Synthesis of Dendrons and Their Applications”, Molecules, 26.13 (2021): 4017-4040.
JP Office Action for JP Appl. No. 2023-525450 dated Jan. 5, 2026 (11 pages).

$300_3$

SILICON-CONTAINING COMPOUNDS FOR FORMING A PATTERNING COATING AND DEVICES INCORPORATING SAME

RELATED APPLICATIONS

The present application is a continuation of International Patent Application No. PCT/IB2021/060182 filed 3 Nov. 2021, which claims the benefit of priority to: U.S. Provisional Patent Application No. 63/109,304 filed 3 Nov. 2020, the contents of which are incorporated herein by reference in their entirety.

TECHNICAL FIELD

The present disclosure relates to opto-electronic devices and in particular to a patterning coating, which may act as and/or be a nucleation-inhibiting coating (NIC), and a layered semiconductor device having a deposited material deposited thereon, patterned using a patterning coating, which may act as and/or be a nucleation-inhibiting coating (NIC) and/or such NIC.

BACKGROUND

In an opto-electronic device such as an organic light emitting diode (OLED), at least one semiconducting layer is disposed between a pair of electrodes, such as an anode and a cathode. The anode and cathode are electrically coupled with a power source and respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes and at least one semiconducting layer between them. In some non-limiting examples, the (sub-) pixels may be selectively driven by a driving circuit comprising a plurality of thin-film transistor (TFT) structures electrically coupled by conductive metal lines, in some non-limiting examples, within a substrate upon which the electrodes and the at least one semiconducting layer are deposited. Various layers and coatings of such panels are typically formed by vacuum-based deposition processes.

Such display panels may be used, by way of non-limiting example, in electronic devices such as mobile phones.

In some applications, there may be an aim to provide a conductive and/or electrode coating in a pattern for each (sub-) pixel of the panel across either, or both of, a lateral and a cross-sectional aspect thereof, by selective deposition of at least one thin film as a closed coating of the conductive coating to form a device feature, such as, without limitation, an electrode and/or a conductive element electrically coupled therewith, during the OLED manufacturing process.

One method for doing so, in some non-limiting applications, involves the interposition of a fine metal mask (FMM) during deposition of an electrode material and/or a conductive element electrically coupled therewith. However, materials typically used as electrodes have relatively high evaporation temperatures, which impact the ability to re-use the FMM and/or the accuracy of the pattern that may be achieved, with attendant increases in cost, effort, and complexity.

One method for doing so, in some non-limiting examples, involves depositing the electrode material and thereafter removing, including by a laser drilling process, unwanted regions thereof to form the pattern. However, the removal process often involves the creation and/or presence of debris, which may affect the yield of the manufacturing process.

Further, such methods may not be suitable for use in some applications and/or with some devices with certain topographical features.

In some non-limiting applications, there may be an aim to provide an improved mechanism for providing selective deposition of a conductive coating.

BRIEF DESCRIPTION OF THE DRAWINGS

Examples of the present disclosure will now be described by reference to the following figures, in which identical reference numerals in different figures indicate identical and/or in some non-limiting examples, analogous and/or corresponding elements and in which.

Figure 1:
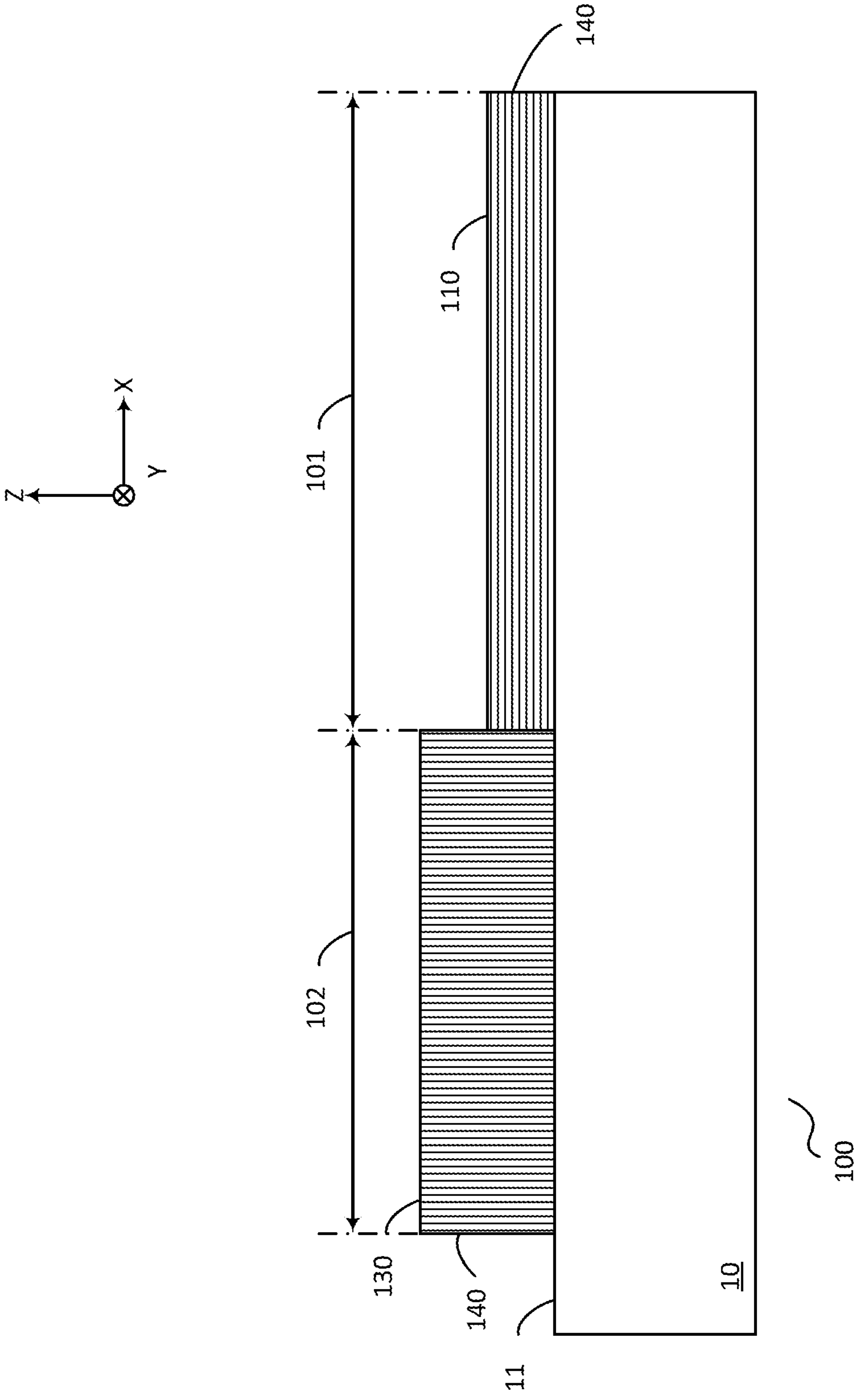
FIG. 1 is a simplified block diagram from a cross-sectional aspect, of an example device having a plurality of layers in a lateral aspect, formed by selective deposition of a patterning coating in a first portion of the lateral aspect, followed by deposition of a closed coating of deposited material in a second portion thereof, according to an example in the present disclosure.

In the present disclosure, a reference numeral having at least one numeric value (including without limitation, in subscript) and/or lower-case alphabetic character(s) (including without limitation, in lower-case) appended thereto, may be considered to refer to a particular instance, and/or subset thereof, of the element or feature described by the reference numeral. Reference to the reference numeral without reference to the appended value(s) and/or character(s) may, as the context dictates, refer generally to the element(s) or feature(s) described by the reference numeral, and/or to the set of all instances described thereby. Similarly, a reference numeral may have the letter "x" in the place of a numeric digit. Reference to such reference numeral may, as the context dictates, refer generally to the element(s) or feature(s) described by the reference numeral, where the character "x" is replaced by a numeric digit, and/or to the set of all instances described thereby.

In the present disclosure, for purposes of explanation and not limitation, specific details are set forth to provide a thorough understanding of the present disclosure, including, without limitation, particular architectures, interfaces and/or techniques. In some instances, detailed descriptions of well-known systems, technologies, components, devices, circuits, methods, and applications are omitted to not obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, to not obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses a layered semiconductor device comprising a compound, the compound comprising a silicon-oxygen backbone and at least one fluorine-containing moiety attached to the silicon-oxygen backbone. The compound may comprise a unit represented

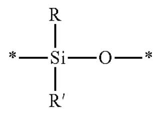

wherein R and R' each independently represents at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, substituted or unsubstituted fluoroaryl, or substituted or unsubstituted heteroaryl; and wherein at least one of R and R' is the fluorine-containing moiety.

According to a broad aspect, there is disclosed a layered semiconductor device comprising a compound, the compound comprising a silicon-oxygen backbone and at least one fluorine-containing moiety attached to the silicon-oxygen backbone.

In some non-limiting examples, the compound may comprise a unit represented by the following formula:

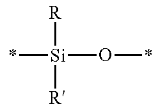

wherein R and R' each independently represents at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, substituted or unsubstituted fluoroaryl, or substituted or unsubstituted heteroaryl; and wherein at least one of R and R' is the fluorine-containing moiety.

In some non-limiting examples, the compound may be represented by the following formula:

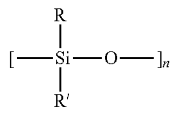

wherein R and R' each independently represents at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, substituted or unsubstituted fluoroaryl, or substituted or unsubstituted heteroaryl; wherein at least one of R and R' is the fluorine-containing moiety; and wherein n is an integer of at least 3.

In some non-limiting examples, n may be an integer of between about 6-30. In some non-limiting examples, the silicon-oxygen backbone may comprise a branching moiety. In some non-limiting examples, the silicon-oxygen backbone may comprise a cyclic structure.

In some non-limiting examples, the compound may be represented by the following formula:

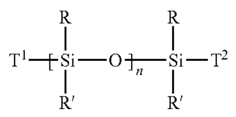

wherein $T^1$ and $T^2$ each independently represents at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, or substituted or unsubstituted heteroaryl; wherein R and R' each independently represents: at least one of substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, substituted or unsubstituted fluoroaryl, or substituted or unsubstituted heteroaryl; wherein at least one of R and R' is the fluorine-containing moiety; and wherein n is an integer of at least 3.

In some non-limiting examples, $T^1$ and $T^2$ may each independently represent at least one of: H, $CF_3$, $CF_2H$, and $CH_3$. In some non-limiting examples, the silicon-oxygen backbone may form a caged structure. In some non-limiting examples, the compound may be a silsesquioxane compound. In some non-limiting examples, the compound may be represented by the formula $(RSiO_{1.5})_v$, wherein v is an integer of between about 6-12, and R represents, upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, and wherein R, at least on one occurrence, is the fluorine-containing moiety. In some non-limiting examples, v may be an integer of at leas tone of 6, 8, 10, and 12.

In some non-limiting examples, the compound may be represented by at least one of: Formula (PO-1), (PO-2), and (PO-3):

(PO-1)

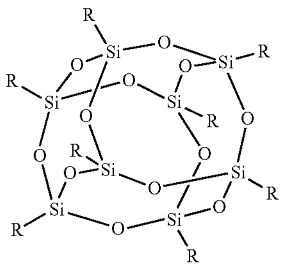

(PO-2)

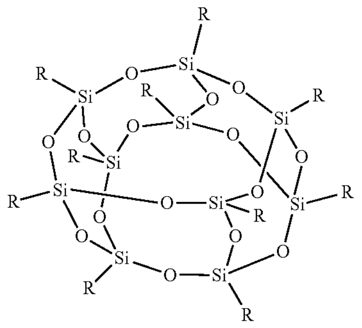

(PO-3)

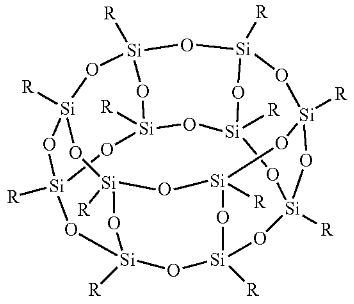

wherein in each formula, R represents, independently upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, or substituted or unsubstituted heteroaryl; and at least one R is the fluorine-containing moiety.

In some non-limiting examples, the fluorine-containing moiety may be at least one of: substituted or unsubstituted fluoroalkyl, substituted or unsubstituted fluoroalkoxy, substituted or unsubstituted fluoroalkylsiloxy, substituted or unsubstituted fluorocycloalkyl, substituted or unsubstituted fluoroaryl, and heteroaryl containing a fluorinated substituent.

In some non-limiting examples, the fluorine-containing moiety may be represented by the following formula:

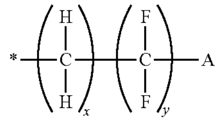

wherein x is an integer of between about 1-6; y is an integer of between about 1-12; and A is at least one of H or F.

In some non-limiting examples, y may be 1, and A may be F. In some non-limiting examples, the fluorine-containing moiety may comprise a $CH_2CF_3$ terminal group. In some non-limiting examples, the fluorine-containing moiety may comprise a fluoroalkyl moiety comprising no more than 6 continuous fluorinated carbon atoms. In some non-limiting examples, the compound may comprise a non-fluorinated moiety. In some non-limiting examples, the non-fluorinated moiety may be at least one of: substituted or unsubstituted alkyl, substituted or unsubstituted alkoxy, substituted or unsubstituted siloxy, substituted or unsubstituted cycloalkyl, substituted or unsubstituted aryl, or substituted or unsubstituted heteroaryl. In some non-limiting examples, the compound may have a molecular weight of between about 1,000-5,000 g/mol.

In some non-limiting examples, the device may comprise a patterning coating disposed on a first layer surface in a first portion of a lateral aspect of the device, and wherein the patterning coating comprises the compound. In some non-limiting examples, the surface energy of the patterning coating may be no more than about 20 dynes/cm. In some non-limiting examples, the refractive index of the patterning coating may be no more than about 1.4. In some non-limiting examples, the device may comprise an electrode coating disposed on a second layer surface in a second portion of the lateral aspect of the device. In some non-limiting examples, the electrode coating may comprise at least one of silver (Ag), ytterbium (Yb), magnesium (Mg), and any combination of any of these. In some non-limiting examples, the device may comprise a plurality of layers disposed on a surface of a substrate and configured such that at least one of the plurality of layers lies: (i) between the substrate and the patterning coating in the first portion, and (ii) between the substrate and the electrode coating in the second portion.

In some non-limiting examples, the at least one of the plurality of layers may comprise at least one semiconducting layer. In some non-limiting examples, the at least one semiconducting layer may comprise an electron transport layer (ETL). In some non-limiting examples, the at least one semiconducting layer may comprise an emissive layer (EML). In some non-limiting examples, the EML may lie between the ETL and the substrate.

In some non-limiting examples, the plurality of layers may comprise at least one first electrode disposed between the ETL and the substrate. In some non-limiting examples, the at least one first electrode may be an anode.

In some non-limiting examples, the device may comprise at least one second electrode. In some non-limiting examples, the at least one second electrode may comprise the electrode coating. In some non-limiting examples, the at least one second electrode may lie between the ETL and the patterning coating in the first portion. In some non-limiting examples, the at leas tone second electrode may be a cathode.

In some non-limiting examples, the second portion may comprise at least one emissive region. In some non-limiting examples, the first portion may comprise at least a part of a non-emissive region.

In some non-limiting examples, the device may further comprise a discontinuous coating disposed on the patterning coating. In some non-limiting examples, the discontinuous coating may comprise a plurality of islands. In some non-limiting examples, the electrode coating and the discontinuous coating may comprise at least one material in common. In some non-limiting examples, the discontinuous coating may cover less than about 25% of a surface of the patterning coating in the first portion.

DESCRIPTION

Layered Device

The present disclosure relates generally to layered semiconductor devices, and more specifically, to opto-electronic devices. An opto-electronic device may generally encompass any device that converts electrical signals into photons and vice versa. In some non-limiting examples, the layered semiconductor device, including without limitation, the opto-electronic device, may serve as a face, including without limitation, a display panel, of a user device.

Those having ordinary skill in the relevant art will appreciate that, while the present disclosure is directed to opto-electronic devices, the principles thereof may be applicable to any panel having a plurality of layers, including without limitation, at least one layer of conductive deposited material 331 (FIG. 3), including as a thin film, and in some non-limiting examples, through which electromagnetic (EM) signals may pass, entirely or partially, at a non-zero angle relative to a plane of at least one of the layers.

Turning now to FIG. 1, there may be shown a cross-sectional view of an example layered device 100. In some non-limiting examples, as shown in greater detail in FIG. 6, the device 100 may comprise a plurality of layers deposited upon a substrate 10.

A lateral axis, identified as the X-axis, may be shown, together with a longitudinal axis, identified as the Z-axis. A second lateral axis, identified as the Y-axis, may be shown as being substantially transverse to both the X-axis and the Z-axis. At least one of the lateral axes may define a lateral aspect of the device 100. The longitudinal axis may define a transverse aspect of the device 100.

The layers of the device 100 may extend in the lateral aspect substantially parallel to a plane defined by the lateral axes. Those having ordinary skill in the relevant art will appreciate that the substantially planar representation shown in FIG. 1 may be, in some non-limiting examples, an abstraction for purposes of illustration. In some non-limiting examples, there may be, across a lateral extent of the device 100, localized substantially planar strata of different thicknesses and dimension, including, in some non-limiting examples, the substantially complete absence of a layer, and/or layer(s) separated by non-planar transition regions (including lateral gaps and even discontinuities).

Thus, while for illustrative purposes, the device 100 may be shown in its cross-sectional aspect as a substantially stratified structure of substantially parallel planar layers, such device may illustrate locally, a diverse topography to define features, each of which may substantially exhibit the stratified profile discussed in the cross-sectional aspect.

In some non-limiting examples, a lateral aspect of an exposed layer surface 11 of the device 100 may comprise a first portion 101 and a second portion 102. In some non-limiting examples, the second portion 102 may comprise that part of the exposed layer surface 11 of the device 100 that lies beyond the first portion 101.

Patterning

In some non-limiting examples, in the first portion 101, a patterning coating 110, which may, in some non-limiting examples, be an NIC, comprising a patterning material 211, which in some non-limiting examples, may be an NIC material, may be selectively deposited as a closed coating 140 on the exposed layer surface 11 of an underlying layer, including without limitation, a substrate 10, of the device 100, only in the first portion 101. However, in the second portion 102, the exposed layer surface 11 of the underlying layer may be substantially devoid of a closed coating 140 of the patterning material 211.

Patterning Coating

The patterning coating 110 may comprise a patterning material 211. In some non-limiting examples, the patterning coating 110 may comprise a closed coating 140 of the patterning material 211.

The patterning coating 110 may provide an exposed layer surface 11 with a relatively low initial sticking probability (in some non-limiting examples, under the conditions identified in the dual QCM technique described by Walker et al.) against the deposition of deposited material 331, which, in some non-limiting examples, may be substantially less than the initial sticking probability against the deposition of the deposited material 331 of the exposed layer surface 11 of the underlying layer of the device 100, upon which the patterning coating 110 has been deposited.

Because of the low initial sticking probability of the patterning coating 110, and/or the patterning material 211, in some non-limiting examples, when deposited as a film, and/or coating in a form, and under similar circumstances to the deposition of the patterning coating 110 within the device 100, against the deposition of the deposited material 331, the first portion 101 comprising the patterning coating 110 may be substantially devoid of a closed coating 140 of the deposited material 331.

The patterning coating 110, and/or the patterning material 211, may comprise a compound containing a silicon-oxygen backbone and at least one fluorine-containing moiety attached to the silicon-oxygen backbone.

In some non-limiting examples, the patterning coating 110, and/or the patterning material 211, in some non-limiting examples, when deposited as a film, and/or coating in a form, and under similar circumstances to the deposition of the patterning coating 110 within the device 100, may have an initial sticking probability against the deposition of the deposited material 331, that is no more than at least one of about: 0.3, 0.2, 0.15, 0.1, 0.08, 0.05, 0.03, 0.02, 0.01, 0.008, 0.005, 0.003, 0.001, 0.0008, 0.0005, 0.0003, or 0.0001.

In some non-limiting examples, the patterning coating 110, and/or the patterning material 211, in some non-limiting examples, when deposited as a film, and/or coating in a form, and under similar circumstances to the deposition of the patterning coating 110 within the device 100, may have an initial sticking probability against the deposition of Ag, and/or Mg that is no more than at least one of about: 0.3, 0.2, 0.15, 0.1, 0.08, 0.05, 0.03, 0.02, 0.01, 0.008, 0.005, 0.003, 0.001, 0.0008, 0.0005, 0.0003, or 0.0001.

In some non-limiting examples, the patterning coating 110, and/or the patterning material 211, in some non-limiting examples, when deposited as a film, and/or coating in a form, and under similar circumstances to the deposition of the patterning coating 110 within the device 100, may have an initial sticking probability against the deposition of a deposited material 331 of at least one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, or 0.005-0.001.

In some non-limiting examples, the patterning coating 110, and/or the patterning material 211, in some non-limiting examples, when deposited as a film, and/or coating in a form, and under similar circumstances to the deposition of the patterning coating 110 within the device 100, may have an initial sticking probability against the deposition of a plurality of deposited materials 331 that is no more than a threshold value. In some non-limiting examples, such threshold value may be at least one of about: 0.3, 0.2, 0.18, 0.15, 0.13, 0.1, 0.08, 0.05, 0.03, 0.02, 0.01, 0.008, 0.005, 0.003, or 0.001.

In some non-limiting examples, the patterning coating 110, and/or the patterning material 211, in some non-limiting examples, when deposited as a film, and/or coating in a form, and under similar circumstances to the deposition of the patterning coating 110 within the device 100, may have an initial sticking probability that is less than such threshold value against the deposition of a plurality of deposited materials 331 selected from at least one of: Ag, Mg, Yb, cadmium (Cd), and zinc (Zn). In some further non-limiting examples, the patterning coating 110 may exhibit an initial sticking probability of or below such threshold value against the deposition of a plurality of deposited materials 331 selected from at least one of: Ag, Mg, and Yb.

In some non-limiting examples, the patterning coating 110, and/or the patterning material 211, in some non-limiting examples, when deposited as a film, and/or coating in a form, and under similar circumstances to the deposition of the patterning coating 110 within the device 100, may exhibit an initial sticking probability against the deposition of a first deposited material 331 of, or below, a first threshold value, and an initial sticking probability against the deposition of a second deposited material 331 of, or below, a second threshold value. In some non-limiting examples, the first deposited material 331 may be Ag, and the second deposited material 331 may be Mg. In some other non-limiting examples, the first deposited material 331 may be Ag, and the second deposited material 331 may be Yb. In some other non-limiting examples, the first deposited material 331 may be Yb, and the second deposited material 331 may be Mg. In some non-limiting examples, the first threshold value may exceed the second threshold value.

The silicon-oxygen backbone generally refers to a moiety containing at least one silicon (Si) atom and at least one oxygen (O) atom. In some non-limiting examples, the silicon-oxygen backbone may be a moiety comprising the at least one Si atom bonded to at least one O atom. In some non-limiting examples, the silicon-oxygen backbone may be a moiety comprising a siloxane group, in which the moiety comprises a Si—O—Si group. In some non-limiting examples, the silicon-oxygen backbone may be branched, such that it, by way of non-limiting example, may comprise at least one branching moiety attached to the backbone. In some non-limiting examples, the silicon-oxygen backbone may be cross-linked. In some other non-limiting examples, the silicon-oxygen backbone may be unbranched. In some non-limiting examples, the silicon-oxygen backbone may be a linear chain. In some non-limiting examples, the silicon-oxygen backbone may be cyclic.

In some non-limiting examples, the patterning coating may comprise an organic-inorganic hybrid material. The organic-inorganic hybrid material generally refers to a material that comprises both an organic component and an inorganic component. In some non-limiting examples, such organic-inorganic hybrid material may comprise an organic-inorganic hybrid compound that comprises an organic moiety and an inorganic moiety. Non-limiting examples of such organic-inorganic hybrid compounds include those in which an inorganic scaffold may be functionalized with at least one organic functional group. In some non-limiting examples, the silicon-oxygen backbone may correspond to the inorganic component of the organic-inorganic hybrid compound. In some non-limiting examples, an organic moiety, which by way of non-limiting example may be the fluorine-containing moiety, may correspond to the organic component of the organic-inorganic hybrid compound. In some non-limiting examples, the compound may be an organosilicon compound. Non-limiting examples of such organic-inorganic hybrid materials include those comprising at least one of: a siloxane group, a silsesquioxane group, and a polyhedral oligomeric silsesquioxane (POSS) group.

In some non-limiting examples, the compound of the patterning coating 110, and/or the patterning material 211, may comprise a unit represented by Formula (SU-1):

(SU-1)

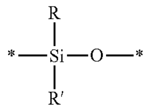

Wherein R and R' each independently represents, upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, or substituted or unsubstituted fluoroalkylsiloxy, substituted or unsubstituted cycloalkyl, substituted or unsubstituted fluorocycloalkyl, substituted or unsubstituted aryl, substituted or unsubstituted fluoroaryl, or substituted or unsubstituted heteroaryl, and wherein at least one of R and R' may be, or comprise, the fluorine-containing moiety. In some further non-limiting examples, R and R' each independently represents, upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted fluoroalkylsiloxy, substituted or unsubstituted cycloalkyl, or substituted or unsubstituted fluorocycloalkyl.

In some non-limiting examples, the compound of the patterning coating 110, and/or the patterning material 211, may be represented as $(RR'SiO)_n$ where n is an integer of at least 3, and R and R' each independently represents, upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, substituted or unsubstituted fluoroalkylsiloxy, substituted or unsubstituted cycloalkyl, substituted or unsubstituted fluorocycloalkyl, substituted or unsubstituted aryl, or substituted or unsubstituted heteroaryl, and wherein at least one of R and R' may be, or comprise, the fluorine-containing moiety. At least one of R and R' of the compound may be, or comprise, the fluorine-containing moiety. In some further non-limiting examples, R and R' each independently represents, upon each occurrence, at least one of substituted or unsubstituted alkyl, substituted or unsubstituted fluoroalkyl, substituted or unsubstituted alkoxy, substituted or unsubstituted fluoroalkoxy, substituted or unsubstituted fluoroalkylsiloxy, substituted or unsubstituted cycloalkyl, or substituted or unsubstituted fluorocycloalkyl. In some non-limiting examples, such compound may be represented by Formula (A-1):

(A-1)

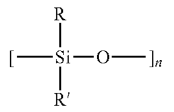

wherein n is an integer of at least 3. In some non-limiting examples, n may be at least one of between about: 6-30, 6-20, 6-18, 6-15, or 6-12.

In some non-limiting examples, the compound may further comprise terminal groups represented as $T^1$ and $T^2$ in Formula (A-2) below:

(A-2)

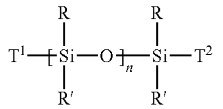

wherein the terminal group $T^1$ and $T^2$ each independently represents at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, substituted or unsubstituted fluoroalkylsiloxy, substituted or unsubstituted cycloalkyl, substituted or unsubstituted fluorocycloalkyl, substituted or unsubstituted aryl, or substituted or unsubstituted heteroaryl. Non-limiting examples of $T^1$ and $T^2$ include $CH_3$, $CF_2H$, and $CF_3$. In some non-limiting examples, n may be an integer of at least 3. In some non-limiting examples, n may be at least one of between about: 6-30, 6-20, 6-18, 6-15, or 6-12. In some non-limiting examples, at least one of the terminal groups $T^1$ and $T^2$ may comprise a cross-linking moiety. In some non-limiting examples, such cross-linking moiety may comprise at least one of: ether, silyl ether, siloxane, and carbon-carbon bonds.

In some non-limiting examples, the compound may comprise a silicon-oxygen backbone forming a cyclic structure. In some non-limiting examples, the compound according to Formula (A-1) may be formed as a cyclic structure, which may be represented by Formula (CA-1):

(CA-1)

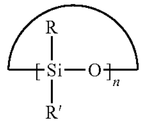

wherein the description of R, R', and n are provided above with respect to Formula (A-1). In some non-limiting examples according to Formula (CA-1), n may represent an integer of at least one of between about: 3-12, 3-8, or 3-6.

In non-limiting examples in which the compound may comprise a plurality of units of, by way of non-limiting example, Formula (SU-1), each R and R' may be independently selected upon each occurrence of R and R'. Accordingly, while not specifically described, it will be appreciated that a compound may comprise multiple units each comprising R and R', in which an R or R' group in a given unit may be identical to or different from another R or R' group in another unit. By way of non-limiting example, referring to Formula (A-1), a formula comprising different R and R' groups for different units may be expressed as $(R_1R_1'SiO)_p(R_2R_2'SiO)_q$ in which $R_1$, $R_1'$, $R_2$, and $R_2'$ are each independently selected according to the description of R and R' above, and p and q are integers that sum to n. As will be appreciated, compounds with additional units comprising other R and/or R' groups may be similarly described. It will be understood that such compounds and other compounds containing 2, 3, 4 or more different R and/or R' groups are encompassed by the general formula of $(RR'SiO)_n$, unless indicated otherwise.

In some non-limiting examples, the silicon-oxygen backbone may comprise at least one cross-linking moiety. In some non-limiting examples, such cross-linking moiety may comprise at least one of: ether, silyl ether, siloxane, and carbon-carbon bonds.

In some non-limiting examples, the compound of the patterning coating 110, and/or the patterning material 211, may be represented as $R_v(SiO_{1.5})_v$ or as $(RSiO_{1.5})_v$ wherein v is an integer of between about: 8-12 and R represents, independently and upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted siloxy, substituted or unsubstituted fluoroalkylsiloxy, substituted or unsubstituted cycloalkyl, substituted or unsubstituted fluorocycloalkyl, substituted or unsubstituted aryl, or substituted or unsubstituted heteroaryl. At least one R of the compound may be, or comprise, the fluorine-containing moiety. In some non-limiting examples, v is an integer of at least one of: 8, 10, or 12. In some non-limiting examples, the compound may be a polysilsesquioxane or a derivative thereof having a structure represented by the formula $[(RSiO_{1.5})_v]_{\Sigma\#}$, where v is an integer of between about: 8-12, the symbol Σ indicates the formation of a caged structure, and # indicates the number of silicon atoms included in such caged structure. In some non-limiting examples, # may be lesson more than v. In some non-limiting examples, v may be an integer of at least one of: 8, 10, or 12. In some non-limiting examples, the compound may be or comprise a polyhedral oligomeric silsesquioxane (POSS). In some non-limiting examples, R independently represents, upon each occurrence, at least one of: substituted or unsubstituted alkyl, substituted or unsubstituted fluoroalkyl, substituted or unsubstituted alkoxy, substituted or unsubstituted fluoroalkoxy, substituted or unsubstituted fluoroalkylsiloxy, substituted or unsubstituted cycloalkyl, or substituted or unsubstituted fluorocycloalkyl. In some non-limiting examples, all R groups within each molecular structure may be selected to be identical to one another. In some non-limiting examples, the POSS structures may be simply represented by the formula $(RSiO_{1.5})_v$.

Non-limiting examples of such compound include those represented by $(RSiO_{1.5})_8$, $(RSiO_{1.5})_{10}$, and $(RSiO_{1.5})_{12}$. The molecular structures of such compounds may be represented by Formulae (PO-1), (PO-2), and (PO-3) below.

(PO-1)

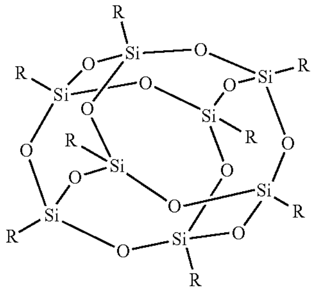

$(RSiO_{1.5})_8$ (PO-2)

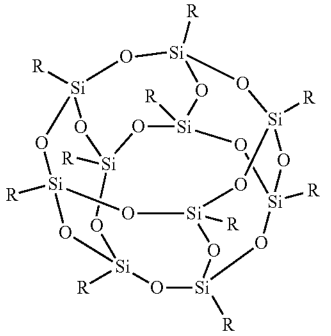

$(RSiO_{1.5})_{10}$ (PO-3)

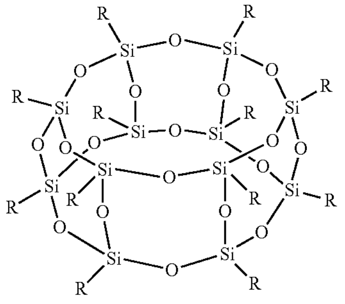

$(RSiO_{1.5})_{12}$

In each compound represented by Formula (PO-1), (PO-2), or (PO-3), at least one R group of the compound may be, or comprise, the fluorine-containing moiety.

It will be appreciated that the R group may be independently selected upon occurrence of each $(RSiO_{1.5})$ unit in some non-limiting examples. In some non-limiting examples, a compound of the formula $(RSiO_{1.5})_v$ which comprises two different R groups may also be represented according to the formula $(R^1SiO_{1.5})_w(R^2SiO_{1.5})_x$ in which w and x sum to v. It will be appreciated that such compound and other compounds containing 2, 3, 4 or more different R groups may also encompassed by the general formula of $(RSiO_{1.5})_v$.

In some non-limiting examples, the patterning coating may comprise a compound wherein a plurality of POSS units are bonded to each other via at least one cage linker moiety. In some non-limiting examples, the molecular structure of such compound may comprise a first POSS unit bonded to a second POSS unit via the at least one cage linker moiety. The first POSS unit and the second POSS unit may each independently be selected from one of: Formula (PO-1), Formula (PO-2), and Formula (PO-3). At least one R group from each of the first POSS unit and the second POSS unit may be replaced by the at least one cage linker moiety, which bonds the first POSS unit and the second POSS unit together. In some non-limiting examples, the at least one cage linker moiety may be, or comprise, at least one of: an ether, a substituted alkylene, an unsubstituted alkylene, a substituted fluoroalkylene, an unsubstituted fluoroalkylene, a substituted cycloalkylene, an unsubstituted cycloalkylene, a substituted siloxane, an unsubstituted siloxane, a substituted fluorosiloxane, an unsubstituted fluorosiloxane, a substituted fluoroalkylsiloxane, an unsubstituted fluoroalkylsiloxane, a substituted heteroarylene, and/or an unsubstituted heteroarylene. In some non-limiting examples, the first POSS unit and the second POSS unit may comprise the same number of Si atoms. In some non-limiting examples, the first POSS unit and the second POSS unit may comprise a common monomer unit. In some non-limiting examples, the first POSS unit and the second POSS unit may be substantially identical to each other.

In various non-limiting examples described herein, the fluorine-containing moiety may be at least one of: substituted or unsubstituted fluoroalkyl, substituted or unsubstituted fluoroalkoxy, substituted or unsubstituted fluoroalkylsiloxy, substituted or unsubstituted fluorocycloalkyl, substituted or unsubstituted fluoroaryl, or heteroaryl comprising a fluorinated substituent. Non-limiting examples of the fluorine-containing moiety include those comprising CF, $CF_2$, $CF_3$, and/or $CF_2H$ units therein. In some non-limiting examples, the fluorine-containing moiety may comprise a terminating group comprising $CF_3$, $CF_2H$, or $CH_3$ unit.

In some further non-limiting examples, the fluorine-containing moiety may be at least one of: substituted or unsubstituted fluoroalkyl, substituted or unsubstituted fluoroalkoxy, substituted or unsubstituted fluoroalkylsiloxy, or substituted or unsubstituted fluorocycloalkyl.

Non-limiting examples of substituted or unsubstituted fluoroalkyl include those derived by substituting at least one hydrogen atom of an alkyl group comprising, by way of non-limiting example, between about 1-15 carbon atoms, with a corresponding number of fluorine atoms. The substituted or unsubstituted fluoroalkyl may be branched or unbranched. In some non-limiting examples, the substituted or unsubstituted fluoroalkyl may be perfluorinated such that substantially all of the carbon atoms of the fluoroalkyl are fluorinated. In some non-limiting examples, the substituted or unsubstituted fluoroalkyl may comprise fluorinated carbon species (e.g. $CF_2$ and/or $CF_3$) as well as non-fluorinated carbon species ($CH_2$ and/or $CH_3$), Substituted fluoroalkyl include those derived by substituting one or more hydrogen and/or fluorine atoms of the fluoroalkyl with a corresponding number of substituent groups, which include without limitation, at least one of: alkyl, fluoroalkyl, alkoxy, fluoroalkoxy, cycloalkyl, fluorocycloalkyl, amine such as alkylamine and arylamine, aryl, fluoroaryl, and other groups comprising one or more heteroatoms.

In some non-limiting examples, the fluorine-containing moiety may be a fluoroalkyl of Formula (FL-1):

(FL-1)

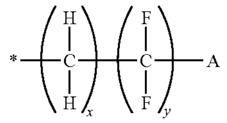

wherein x is an integer of between about: 1-6, y is an integer of between about: 1-12, and A is at least one of: H or F. In some non-limiting examples, x may be an integer of between about: 1-4, y may be an integer of between about: 3-10, and A may be at least one of: H or F. In some non-limiting examples, x may be at least one of: 1 or 2, y may be at least one of: 3, 4, 6, or 8, and A may be at least one of: H or F. In some non-limiting examples, x may be 2, y may be 1, and A may be at least one of: H or F. In some non-limiting examples x and y may sum to no more than at least one of: 15, 12, 10, or 8.

In some non-limiting examples, the fluorine-containing moiety may be a fluoroalkyl of Formula (FL-2):

(FL-2)

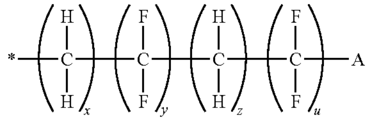

wherein x is an integer of between about: 1-6, y is an integer of between about: 1-6, z is an integer of between about: 1-6, u is an integer of between about: 1-6, and A is at least one of: H or F. In some non-limiting examples, x is an integer of between about: 1-3, y is an integer of between about: 1-6, z is an integer of between about: 1-3, and u is an integer of between about: 1-6. In some non-limiting examples, at least one of y and u may be no more than: 5, 4, or 3. In some non-limiting examples, the x, y, z, and u may sum to at least one of no more than: 15, 12, 10, or 8.

In some non-limiting examples, the fluorine-containing moiety may comprise a terminal group according to Formula (FL-3):

(FL-3)

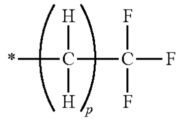

wherein p is an integer of between about: 1-6. By way of non-limiting example, Formula (FL-3) may correspond to the terminal group of at least one of: a fluoroalkyl or fluoroalkoxy. It has now been found by the inventors that compounds comprising a fluorine-containing moiety having a $CH_2CF_3$ terminal group may exhibit at least one property that may facilitate at least some applications relative to other similar compounds comprising a fluorine-containing moiety having a $CF_2CF_3$ terminal group or a $CF_2CF_2H$ terminal group.

Non-limiting examples of substituted or unsubstituted fluoroalkoxy include those derived by substituting at least one hydrogen atom of an alkoxy group comprising, for example between about: 1 to 15 carbon-atoms, with a corresponding number of fluorine atoms. Non-limiting examples of fluoroalkoxy include those derived by attaching an ether bridging group to at least one of the substituted or unsubstituted fluoroalkyl described above.

Non-limiting examples of substituted or unsubstituted fluoroalkylsiloxy include those derived by substituting at least one hydrogen atom of an alkylsiloxy group comprising, for example between about: 1-15 carbon atoms, with a corresponding number of fluorine atoms. Non-limiting examples of fluoroalkylsiloxy include those derived by attaching a siloxane bridge to at least one of the substituted or unsubstituted fluoroalkyl described above.

In some non-limiting examples, the fluorine-containing moiety may comprise a continuous fluorinated chain of carbon species with no more than 6 fluorinated carbon atoms. Non-limiting examples of such moiety includes at least one of: substituted or unsubstituted fluoroalkyl in which no more than 6 fluorinated carbon atoms form a continuous fluorinated chain, substituted or unsubstituted fluoroalkoxy in which no more than 6 fluorinated carbon atoms form a continuous fluorinated chain, and substituted or unsubstituted fluoroalkylsiloxy in which no more than 6 fluorinated carbon atoms form a continuous fluorinated chain. In some non-limiting examples, the fluorine-containing moiety may comprise a continuous fluorinated chain of carbon species with at least one of no more than: 5, 4, or 3 fluorinated carbon atoms.

In some non-limiting examples, the compound may comprise a non-fluorinated moiety. By way of non-limiting example, the compound may comprise a fluorine-containing moiety and a non-fluorinated moiety. The non-fluorinated moiety generally refers to moieties that do not contain F. Non-limiting examples of non-fluorinated moiety include at least one of: substituted or unsubstituted alkyl, substituted or unsubstituted alkoxy, substituted or unsubstituted siloxy, substituted or unsubstituted cycloalkyl, substituted or unsubstituted aryl, and substituted or unsubstituted heteroaryl, that do not contain fluorine. In some non-limiting examples, alkyl may comprise between about 1-15 C atoms, alkoxy may comprise between about 1-15 C atoms, siloxy may comprise between about 1-15 Si atoms, cycloalkyl may comprise between about 1-15 C atoms, aryl may comprise between about 1-15 C atoms, and heteroaryl may comprise between about 1-15 C atoms. It will be appreciated that at least one of the foregoing groups may further comprise the optional presence of at least one substituent, which may comprise additional atoms.

In some non-limiting examples, the compound may comprise a non-fluorinated moiety selected from Formula (AL-1) to (AL-43):

(AL-1)

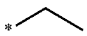

(AL-2)

(AL-3)

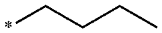

(AL-4)

(AL-5)

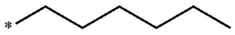

(AL-6)

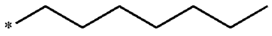

(AL-7)

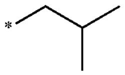

(AL-8)

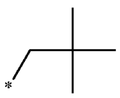

(AL-9)

-continued
(AL-10)
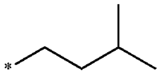
(AL-11)
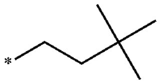
(AL-12)
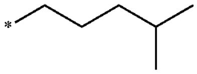
(AL-13)
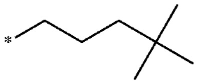
(AL-14)
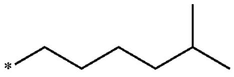
(AL-15)
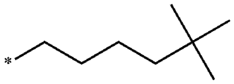
(AL-16)
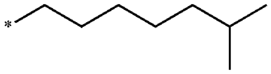
(AL-17)
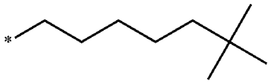
(AL-18)
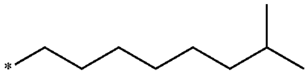
(AL-19)
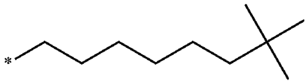
(AL-20)
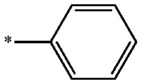
(AL-21)
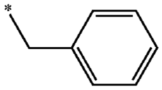
(AL-22)
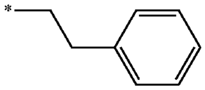
(AL-23)
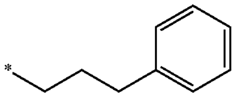
(AL-24)
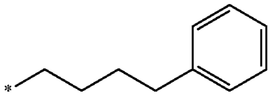
(AL-25)
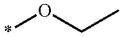
(AL-26)
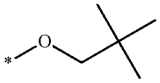
-continued
(AL-27)
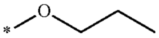
(AL-28)
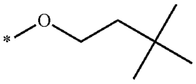
(AL-29)
(AL-30)
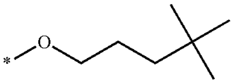
(AL-31)
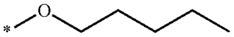
(AL-32)
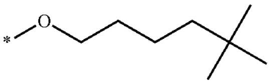
(AL-33)
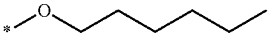
(AL-34)
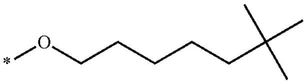
(AL-35)
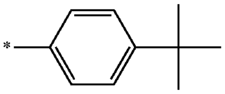
(AL-36)
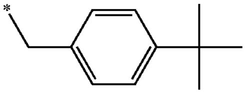
(AL-37)
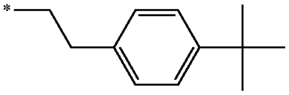
(AL-38)
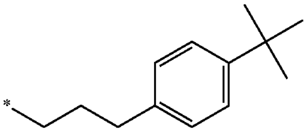
(AL-39)
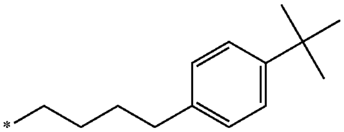
(AL-40)
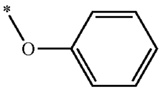
(AL-41)
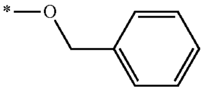
(AL-42)
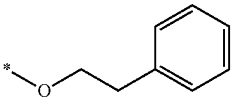

-continued (AL-43)

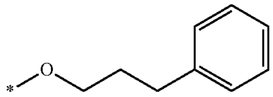

In some non-limiting examples, the compound may comprise at least one fluorine-containing moiety and at least one non-fluorinated moiety.

In some non-limiting examples, a majority of the R groups may be fluorine-containing moieties. In some non-limiting examples, the quotient of F atoms contained in the compound/Si atoms contained in the compound may be at least one of at least about: 0.5, 0.7, 1, 1.5, 2, 3, 5, 9, or 12. In some non-limiting examples, the quotient of the F atoms/Si atoms may be at least one of between about: 0.5-20, 0.5-15, 1-12, 1-10, 3-9, 1-5, or 1-3.

In some non-limiting examples, a majority of the R groups may be non-fluorinated moieties. In some non-limiting examples, the quotient of F atoms contained in the compound/Si atoms contained in the compound may be at least one of no more than about: 3, 2, 1.5, 1, 0.7, 0.5, 0.3, 0.25, or 0.2. In some non-limiting examples, the quotient of the F atoms/Si atoms may be at least one of between about: 0.2-3, 0.2-2, 0.2-1, or 0.5-1.

The term "majority" used in reference to the R groups herein will be understood to refer to at least one of at least about: 50%, 60%, 70%, 80%, or 90% of the R groups contained within a molecular structure. By way of non-limiting example, a majority of R groups of the compound according to Formula (PO-1) may correspond to at least one of 4, 5, 6, 7, or 8 of the R groups in the formula, a majority of the R groups of the compound according to Formula (PO-2) may correspond to at least one of 5, 6, 7, 8, 9, or 10 of the R groups in the formula, and a majority of the R groups of the compound according to Formula (PO-3) may correspond to at least one of 6, 7, 8, 9, 10, 11, or 12 of the R groups in the formula.

In some non-limiting examples, the compound may comprise a fluorine-containing moiety selected from Formula (F-1) to (F-164):

(F-1)

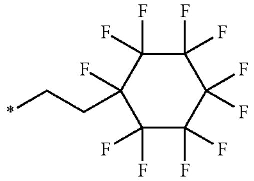

(F-2)

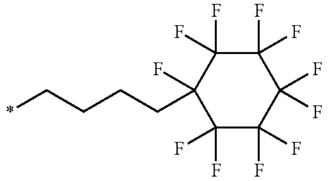

(F-3)

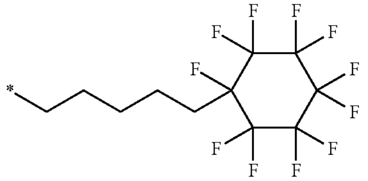

-continued (F-4)

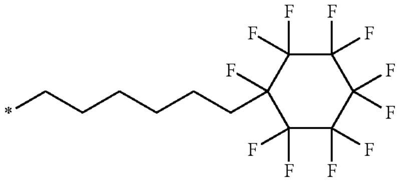

(F-5)

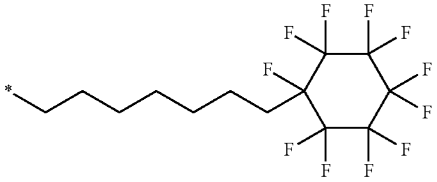

(F-6)

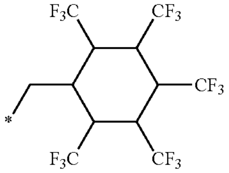

(F-7)

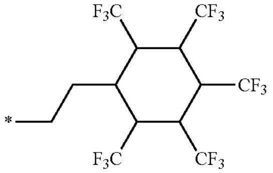

(F-8)

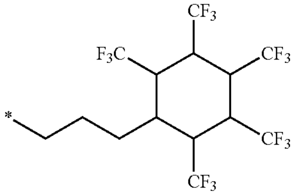

(F-9)

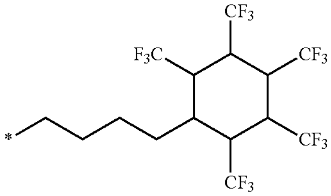

(F-10)

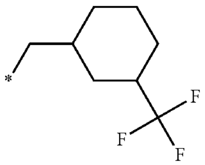

(F-11)

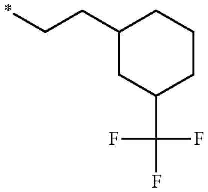

-continued
(F-12)
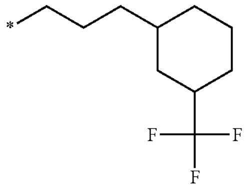
(F-13)
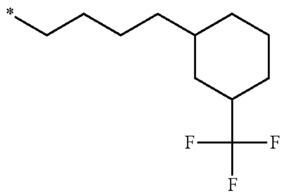
(F-14)
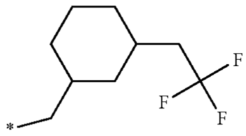
(F-15)
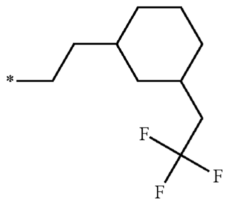
(F-16)
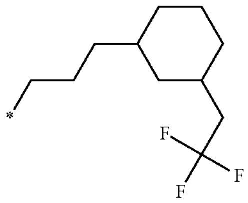
(F-17)
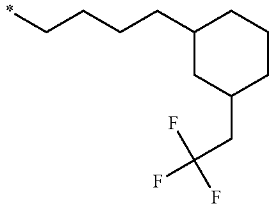
(F-18)
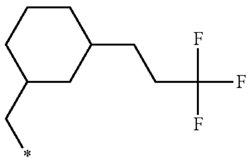
(F-19)
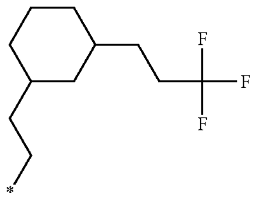
-continued
(F-20)
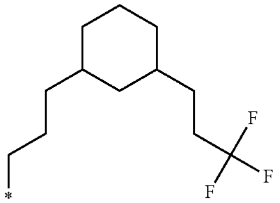
(F-21)
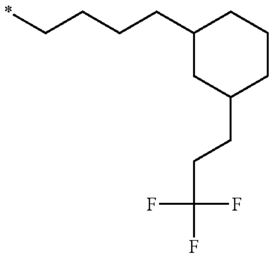
(F-22)
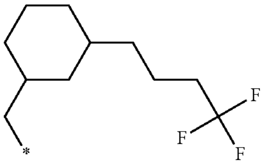
(F-23)
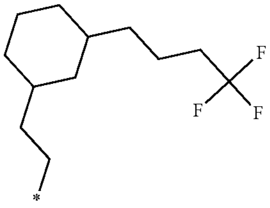
(F-24)
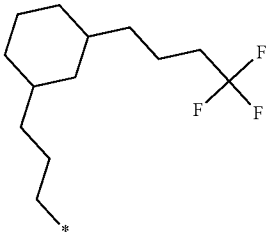
(F-25)
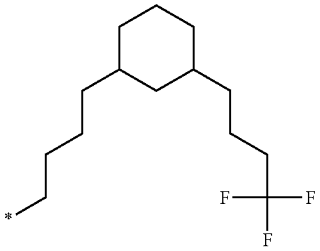
(F-26)
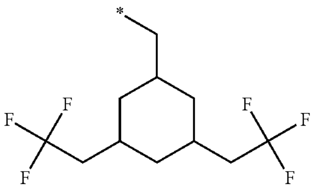

-continued
(F-27)
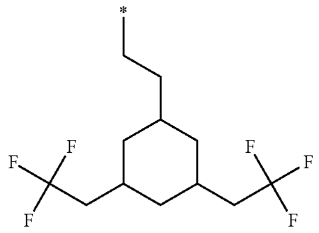
(F-28)
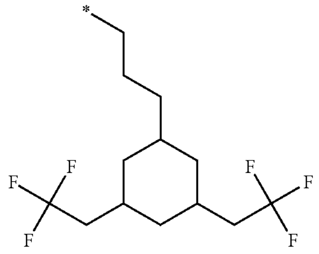
(F-29)
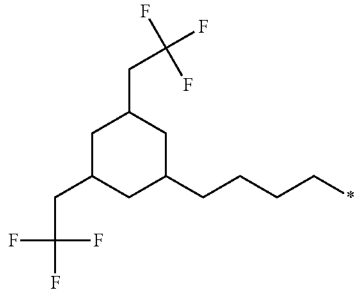
(F-30)
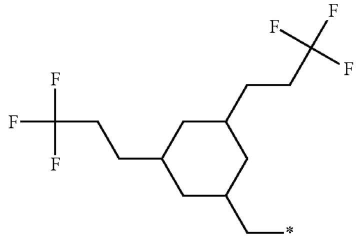
(F-31)
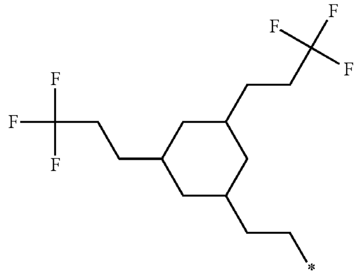
(F-32)
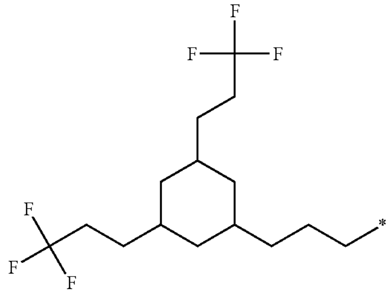
-continued
(F-33)
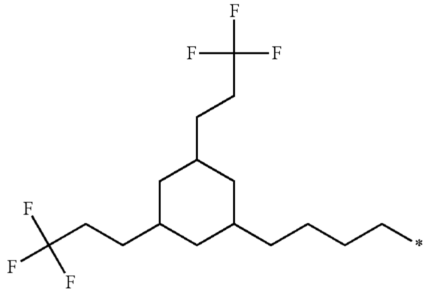
(F-34)
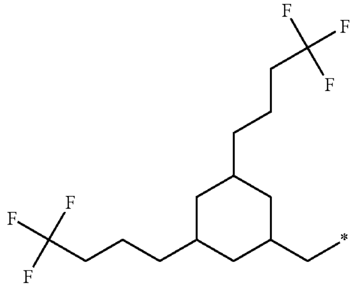
(F-35)
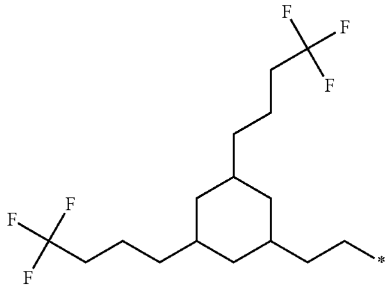
(F-36)
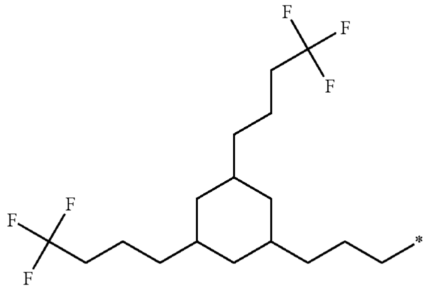
(F-37)
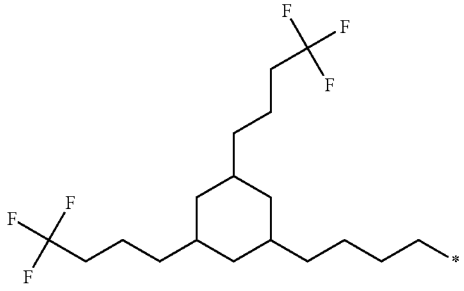
(F-38)
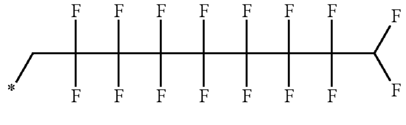

-continued
(F-39)
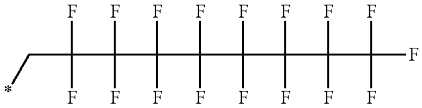
(F-40)
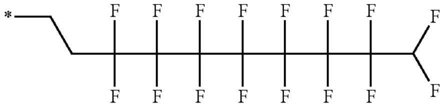
(F-41)
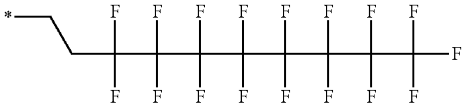
(F-42)
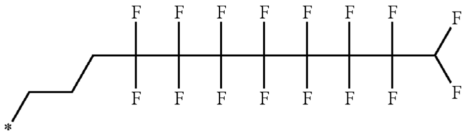
(F-43)
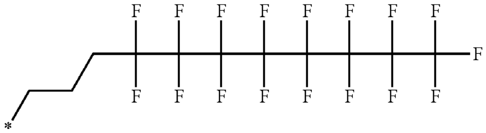
(F-44)
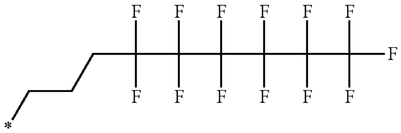
(F-45)
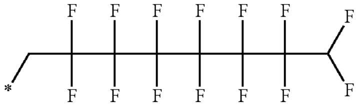
(F-46)
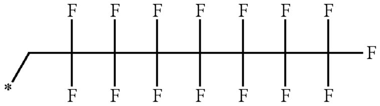
(F-47)
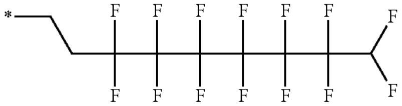
(F-48)
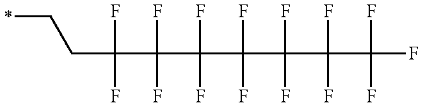
(F-49)
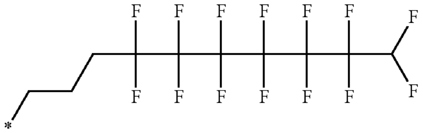
(F-50)
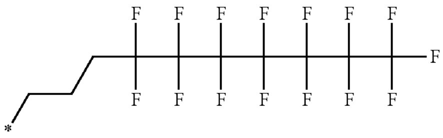
-continued
(F-51)
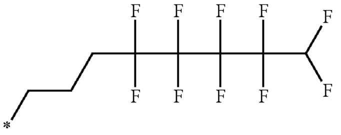
(F-52)
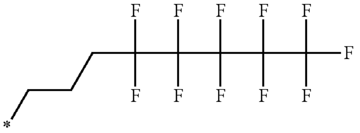
(F-53)
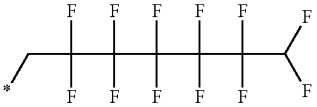
(F-54)
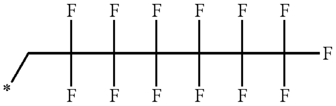
(F-55)
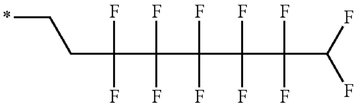
(F-56)
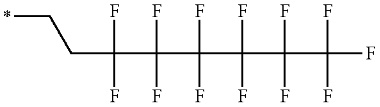
(F-57)
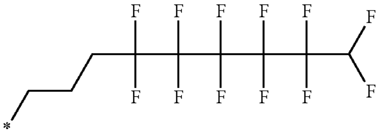
(F-58)
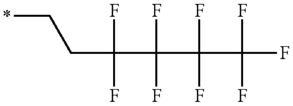
(F-59)
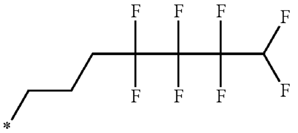
(F-60)
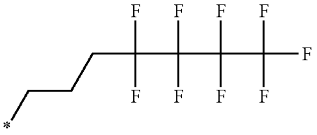
(F-61)
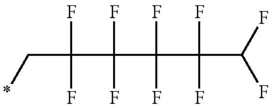
(F-62)
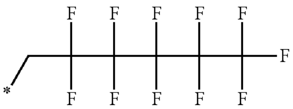

-continued
(F-63)
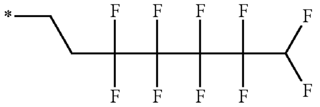
(F-64)
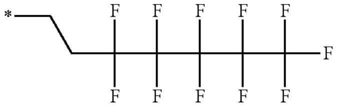
(F-65)
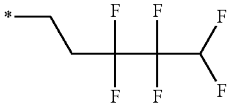
(F-66)
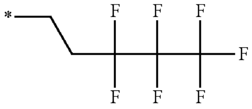
(F-67)
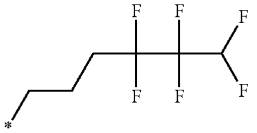
(F-68)
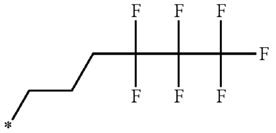
(F-69)
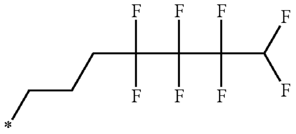
(F-70)
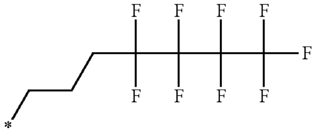
(F-71)
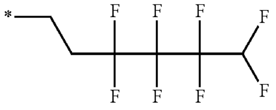
(F-72)
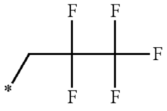
(F-73)
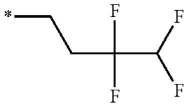
(F-74)
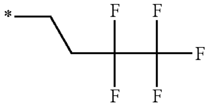
-continued
(F-75)
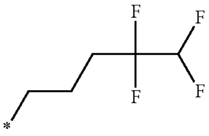
(F-76)
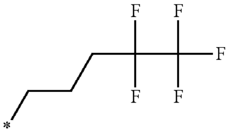
(F-77)
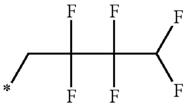
(F-78)
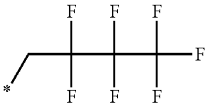
(F-79)
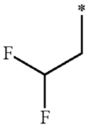
(F-80)
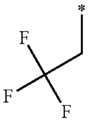
(F-81)
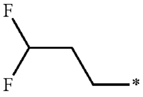
(F-82)
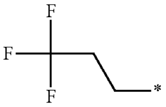
(F-83)
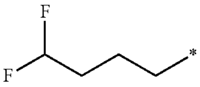
(F-84)
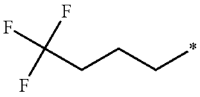
(F-85)
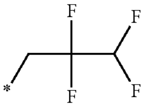
(F-86)
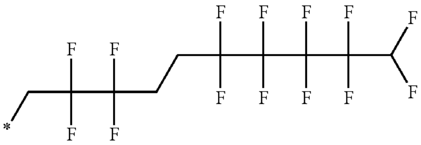

-continued
(F-87)
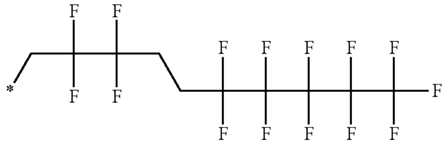
(F-88)
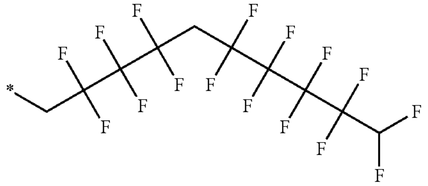
(F-89)
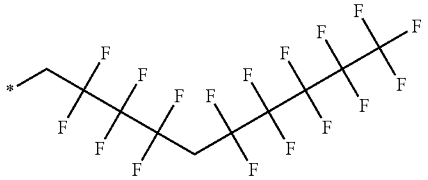
(F-90)
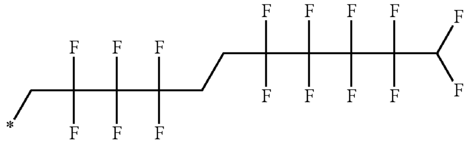
(F-91)
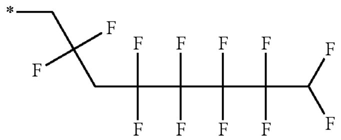
(F-92)
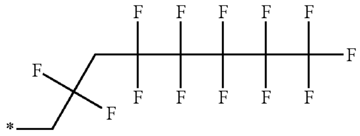
(F-93)
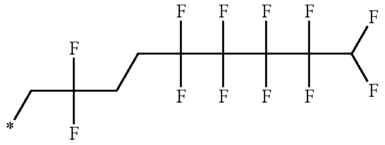
(F-94)
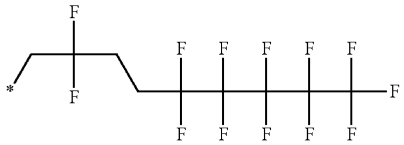
(F-95)
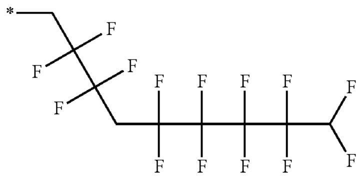
-continued
(F-96)
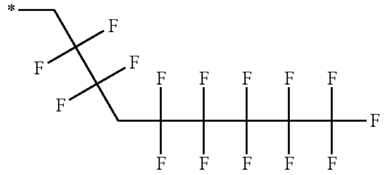
(F-97)
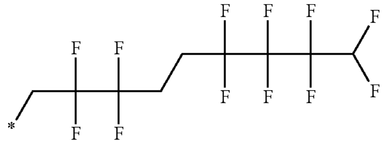
(F-98)
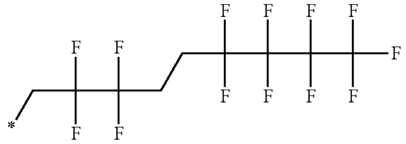
(F-99)
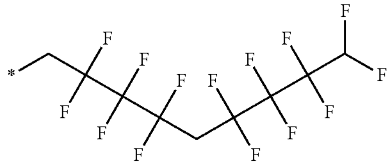
(F-100)
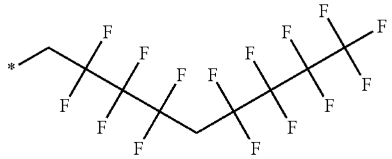
(F-101)
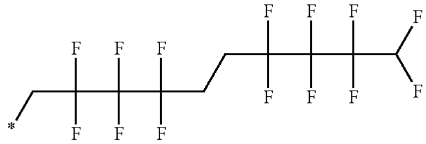
(F-102)
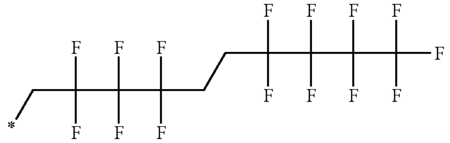
(F-103)
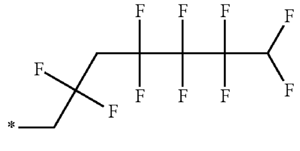
(F-104)
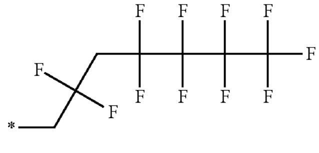
(F-105)
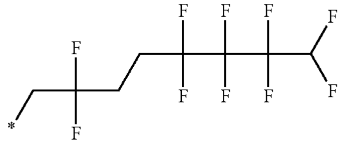

-continued
(F-106)
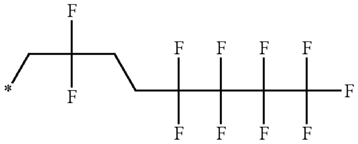
(F-107)
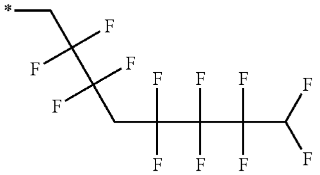
(F-108)
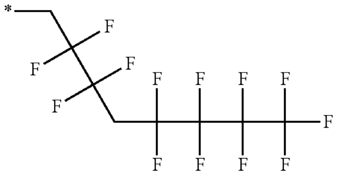
(F-109)
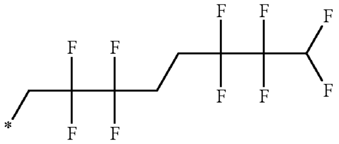
(F-110)
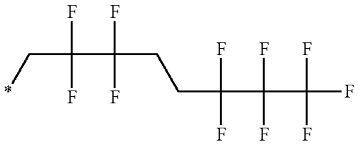
(F-111)
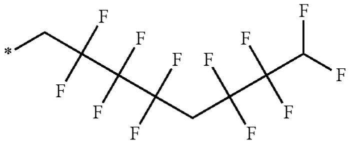
(F-112)
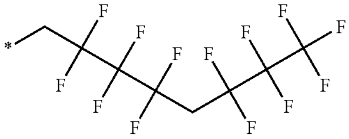
(F-113)
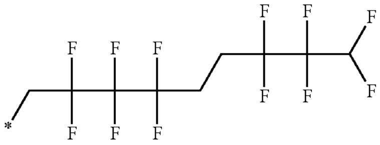
(F-114)
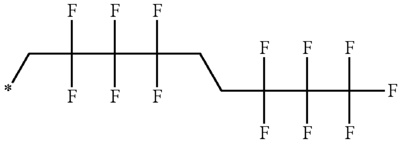
(F-115)
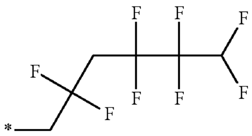
-continued
(F-116)
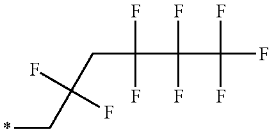
(F-117)
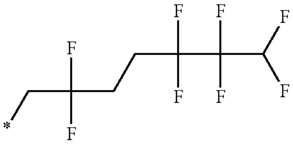
(F-118)
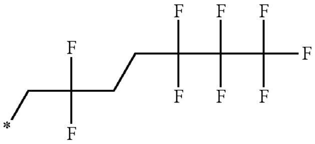
(F-119)
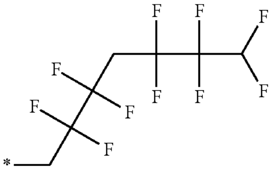
(F-120)
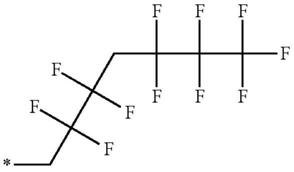
(F-121)
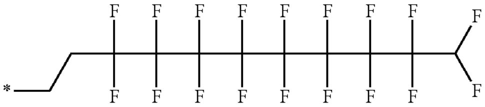
(F-122)
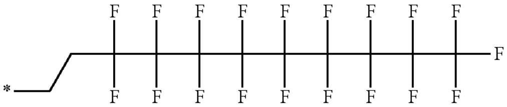
(F-123)
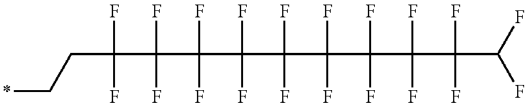
(F-124)
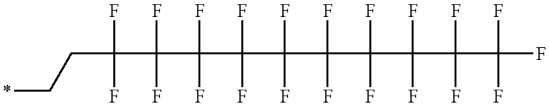
(F-125)
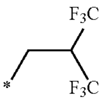
(F-126)
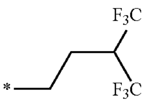

-continued
(F-127)
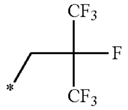
(F-128)
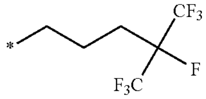
(F-129)
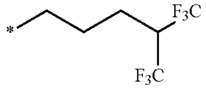
(F-130)
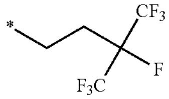
(F-131)
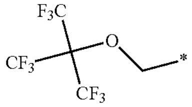
(F-132)
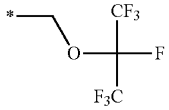
(F-133)
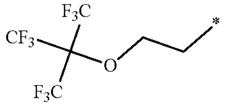
(F-134)
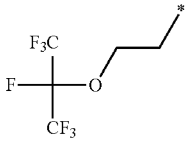
(F-135)
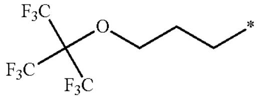
(F-136)
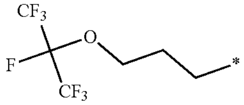
(F-137)
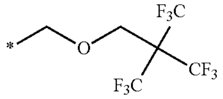
(F-138)
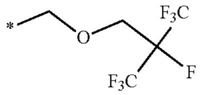
(F-139)
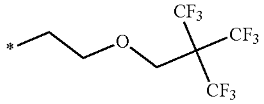
-continued
(F-140)
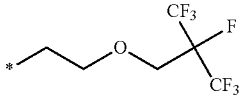
(F-141)
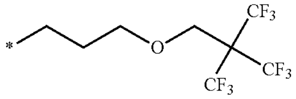
(F-142)
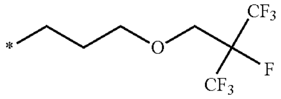
(F-143)
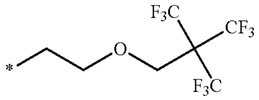
(F-144)
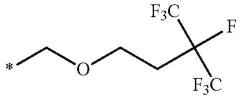
(F-145)
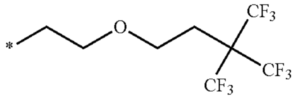
(F-146)
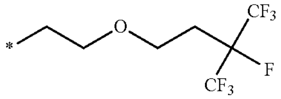
(F-147)
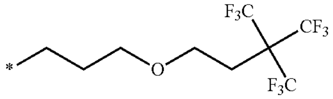
(F-148)
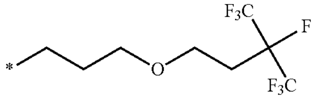
(F-149)
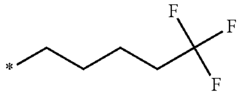
(F-150)
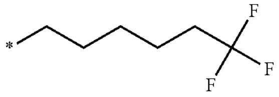
(F-151)
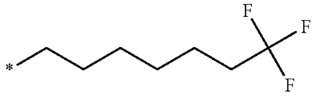
(F-152)
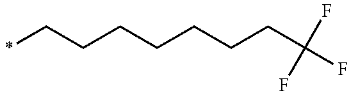
(F-153)
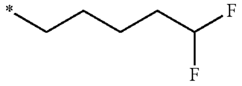

-continued (F-154)

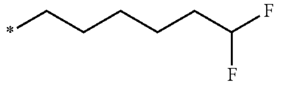

(F-155)

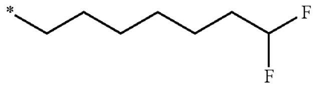

(F-156)

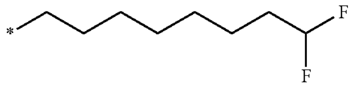

(F-157)

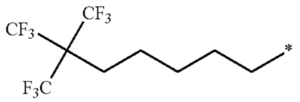

(F-158)

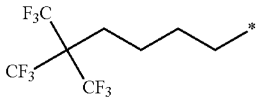

(F-159)

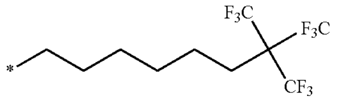

(F-160)

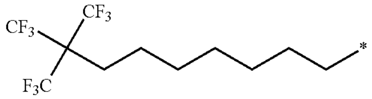

(F-161)

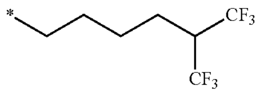

(F-162)

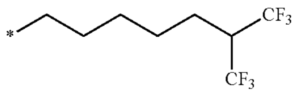

(F-163)

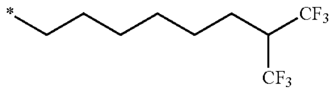

(F-164)

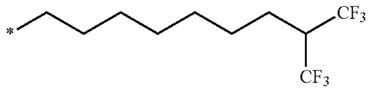

In various non-limiting examples described herein, molecular formulae showing fragment(s) or part(s) of a compound may comprise at least one bond connected to an asterisk (denoted by the symbol *), which is used to indicate the bonds to another atom (not shown) of the compound to which such fragment(s) or part(s) is attached. For example, referring to examples according to Formulae (PO-1), (PO-2), and (PO-3) above, the asterisk of Formula (F-1) to (F-164) may correspond to the Si atom to which the R group is attached.

In some non-limiting examples, the compound of Formula (PO-1), (PO-2), or (PO-3) may comprise the fluorine-containing moiety of any one of Formula (F-1) to (F-164). In some non-limiting examples, all R groups provided within the molecular structure according to Formula (PO-1), (PO-2), or (PO-3) may be identical to one another and may be selected from one of Formula (F-1) to (F-164). In some non-limiting examples, the compound of Formula (PO-1), (PO-2), or (PO-3) may comprise at least one fluorine-containing moiety of any one of Formula (F-1) to (F-164), and at least one non-fluorinated moiety. The at least one non-fluorinated moiety may be selected from any one of Formula (AL-1) to (AL-43).

In some non-limiting examples, the compound may comprise a moiety according to Formula (FM-1):

(FL-4)

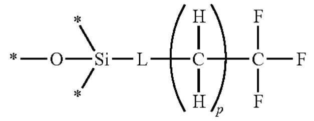

wherein p is an integer of between about 1-6, L represents a linking moiety, and each * indicates the bond to another atom (not shown) of the compound to which the moiety of Formula (FL-4) may be attached. In some non-limiting examples, the linking moiety, L, represents at least one of: O, a substituted alkylene, an unsubstituted alkylene, a substituted fluoroalkylene, an unsubstituted fluoroalkylene, a substituted cycloalkylene, an unsubstituted cycloalkylene, a substituted siloxane, an unsubstituted siloxane, a substituted fluorosiloxane, an unsubstituted fluorosiloxane, a substituted fluoroalkylsiloxane, an unsubstituted fluoroalkylsiloxane, a substituted heteroarylene, or an unsubstituted heteroarylene. By way of non-limiting example, the moiety of Formula (FM-1) may represent a part of a POSS structure. In some non-limiting examples, the part "-L-$(CH_2)_pCF_3$" may correspond to an R group of Formula (PO-1), (PO-2), or (PO-3).

In some non-limiting examples, the compound may comprise at least one chlorine atom as part of or in addition to the fluorine-containing moiety. In some non-limiting examples, the fluorine-containing moiety or the non-fluorinated moiety, by way of non-limiting example, of Formula (F-1) to (F-164) or Formula (AL-1) to (AL-43), may comprise at least one chlorine atom substituted thereon in lieu of at least one of H and/or F.

Where features or aspects of the present disclosure are described in terms of Markush groups, it will be appreciated by those having ordinary skill in the relevant art that the present disclosure may also be thereby described in terms of any individual member of sub-group of members of such Markush group.

In some non-limiting examples, the patterning coating may comprise a first patterning coating compound and a second patterning coating compound. In some non-limiting examples, the first patterning coating compound and the second patterning coating compound may be selected such that they possess at least one similar trait and/or property as one another. Non-limiting examples of such trait and/or property include: (1) the molecular structure of a monomer, a monomer backbone, and/or a functional group; (2) similarity in molecular structure based, by way of non-limiting example, on the Tanimoto coefficient; (3) the characteristic surface energies; (4) the refractive index; and/or (5) the molecular weight.

In some non-limiting examples, a similarity in molecular structures of two materials or molecules may be determined using the Tanimoto coefficient. In general, the Tanimoto coefficient, or T coefficient, represents a similarity score ranging between about: 0-1 between two molecular structures represented as bit arrays in which a T coefficient of 0 represents no similarity and 1 represents complete similarity. By way of non-limiting example, the 2-D or 3-D representation of each molecular structure may be compressed into a molecular fingerprint, which may be in the form of a binary bit string. The molecular fingerprints of the molecular structures may be used to determine the value of the T coefficient. Various methods for generating such molecular fingerprint are known, including but not limited to the PubChem Substructure Fingerprint.

In some non-limiting examples, the first patterning coating compound and the second patterning coating compound may have a relatively high degree of similarity to each other. By way of non-limiting example, the T coefficient between the first patterning coating compound and the second patterning coating compound may be at least one of at least about: 0.9, 0.95, or 0.99.

In some non-limiting examples, the first patterning coating compound and the second patterning coating compound comprise at least one monomer in common. In some non-limiting examples, the first patterning coating compound and the second patterning coating compound may comprise at least one R group in common. In some non-limiting examples, the first patterning coating compound and the second patterning coating compound may comprise at least one fluorine-containing moiety in common. In some non-limiting examples, the first patterning coating compound and the second patterning coating compound may each be independently represented by at least one of: Formula (PO-1), Formula (PO-2), and Formula (PO-3). In some non-limiting examples, the number of Si atoms contained in the first patterning coating compound and the second patterning coating compound may differ by at least one of two or four.

In some non-limiting examples, the patterning coating 110, and/or the patterning material 211, in some non-limiting examples, when deposited as a film, and/or coating in a form, and under circumstances similar to the deposition of the patterning coating 110 within the device 100 may have a transmittance for EM radiation of at least a threshold transmittance value, after being subjected to a vapor flux 332 (FIG. 3) of the deposited material 331, including without limitation, Ag.

In some non-limiting examples, such transmittance may be measured after exposing the exposed layer surface 11 of the patterning coating 110 and/or the patterning material 211, formed as a thin film, to a vapor flux 332 of the deposited material 331, including without limitation, Ag, under typical conditions that may be used for depositing an electrode of an opto-electronic device, which by way of non-limiting example, may be a cathode of an organic light-emitting diode (OLED) device.

In some non-limiting examples, the conditions for subjecting the exposed layer surface 11 to the vapor flux 332 of the deposited material 331, including without limitation, Ag, may be as follows: (i) vacuum pressure of about $10^{-4}$ Torr or $10^{-5}$ Torr; (ii) the vapor flux 332 of the deposited material 331, including without limitation, Ag being substantially consistent with a reference deposition rate of about 1 angstrom (A)/sec, which by way of non-limiting example, may be monitored and/or measured using a QCM; and (iii) the exposed layer surface 11 being subjected to the vapor flux 332 of the deposited material 331, including without limitation, Ag until a reference average layer thickness of about 15 nm is reached, and upon such reference average layer thickness being attained, the exposed layer surface 11 not being further subjected to the vapor flux 332 of the deposited material 331, including without limitation, Ag.

In some non-limiting examples, the exposed layer surface 11 being subjected to the vapor flux 332 of the deposited material 331, including without limitation, Ag may be substantially at room temperature (e.g. about 25° C.). In some non-limiting examples, the exposed layer surface 11 being subjected to the vapor flux 332 of the deposited material 331, including without limitation, Ag may be positioned about 65 cm away from an evaporation source by which the deposited material 331, including without limitation, Ag, is evaporated.

In some non-limiting examples, the threshold transmittance value may be measured at a wavelength in the visible spectrum. By way of non-limiting example, the threshold transmittance value may be measured at a wavelength of about 460 nm. In some non-limiting examples, the threshold transmittance value may be measured at a wavelength in the IR and/or NIR spectrum. By way of non-limiting example, the threshold transmittance value may be measured at a wavelength of at least one of about: 700 nm, 900 nm, or about 1000 nm. In some non-limiting examples, the threshold transmittance value may be expressed as a percentage of incident EM power that may be transmitted through a sample. In some non-limiting examples, the threshold transmittance value may be at least one of at least about: 60%, 65%, 70%, 75%, 80%, 85%, or 90%. By way of non-limiting example, the threshold transmittance value may be measured by preparing a sample in which the patterning coating 110 is deposited as a thin film over a substantially transparent substrate.

In some non-limiting examples, there may be a positive correlation between the initial sticking probability of the patterning coating 110, and/or the patterning material 211, in some non-limiting examples, when deposited as a film, and/or coating in a form, and under circumstances similar to the deposition of the patterning coating 110 within the device 100, against the deposition of the deposited material 331 and an average layer thickness of the deposited material 331 thereon.

It would be appreciated by a person having ordinary skill in the relevant art that high transmittance may generally indicate an absence of a closed coating 140 of the deposited material 331, which by way of non-limiting example, may be Ag. On the other hand, low transmittance may generally indicate presence of a closed coating 140 of the deposited material 331, including without limitation, Ag, Mg, and/or Yb, since metallic thin films, particularly when formed as a closed coating 140, may exhibit a high degree of absorption of EM radiation.

It may be further postulated that exposed layer surfaces 11 exhibiting low initial sticking probability with respect to the deposited material 331, including without limitation, Ag, Mg, and/or Yb, may exhibit high transmittance. On the other hand, exposed layer surfaces 11 exhibiting high sticking probability with respect to the deposited material 331, including without limitation, Ag, Mg, and/or Yb, may exhibit low transmittance.

A series of samples was fabricated to measure the transmittance of an example material, as well as to visually observe whether or not a closed coating 140 of Ag was formed on the exposed layer surface 11 of such example material. Each sample was prepared by depositing, on a glass substrate, an approximately 50 nm thick coating of an example material, then subjecting the exposed layer surface 11 of the coating to a vapor flux 332 of Ag at a rate of about 1 Å/sec until a reference layer thickness of about 15 nm was reached. Each sample was then visually analyzed and the transmittance through each sample was measured.

The molecular structures of the example materials used in the samples herein are set out in Table 1 below:
TABLE 1
| Material | Molecular Structure/Name |
|---|---|
| HT211 | 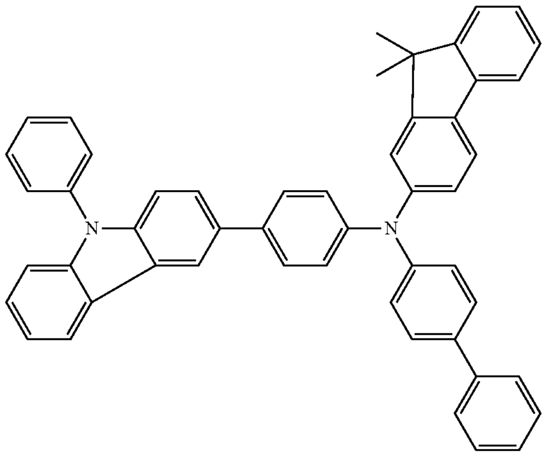 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] |
| HT01 | 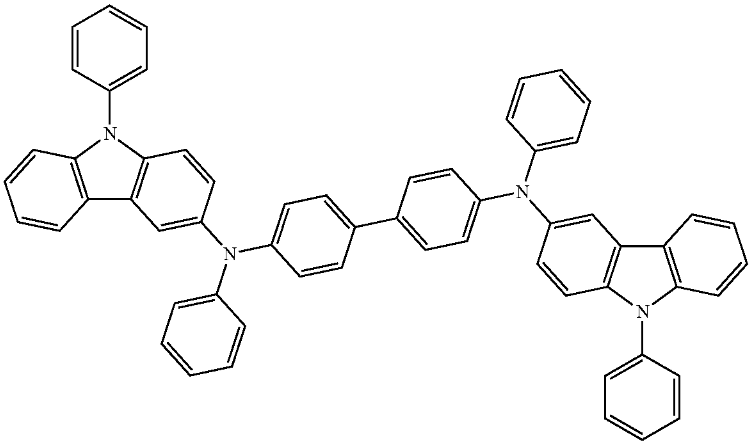 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1] |
| TAZ | 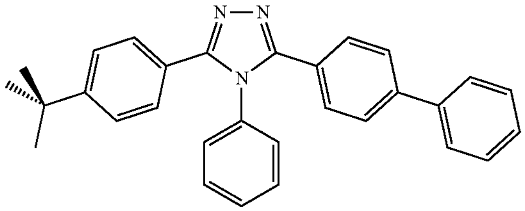 |
| BAlq | 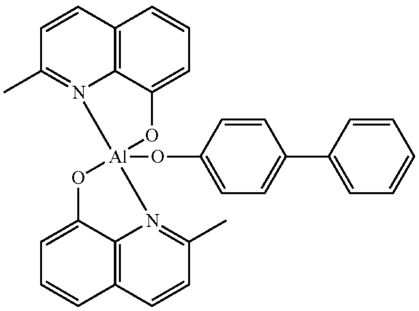 |

TABLE 1-continued
| Material | Molecular Structure/Name |
| --- | --- |
| Liq | 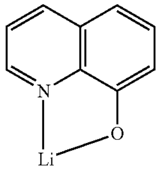 |
| Example Material 1 | 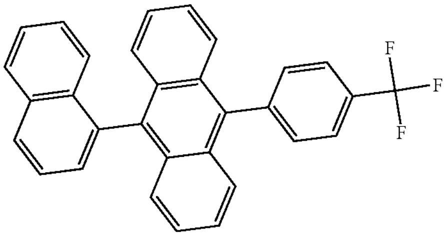 [SMILES: FC(F)(F)c1ccc(-c2c3ccccc3c(-c3cccc4ccccc34)c3ccccc23)cc1] |
| Example Material 2 | 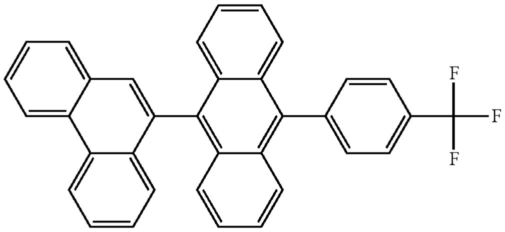 [SMILES: FC(F)(F)c1ccc(-c2c3ccccc3c(-c3cc4ccccc4c4ccccc34)c3ccccc23)cc1] |
| Example Material 3 | 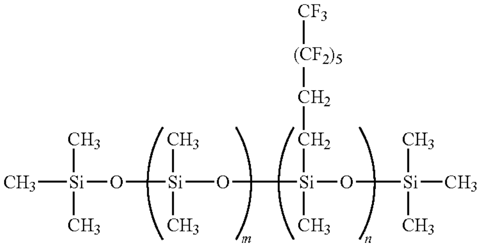 |
| Example Material 4 | 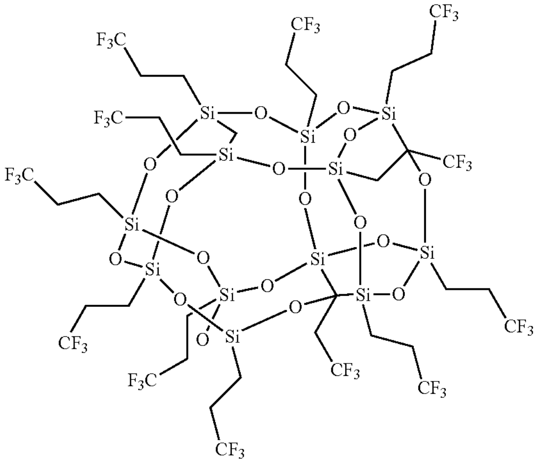 |

TABLE 1-continued

| Material | Molecular Structure/Name |
| --- | --- |
| Example Material 5 | 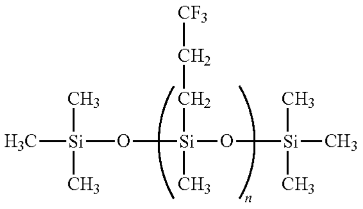 |

The samples in which a substantially closed coating 140 of Ag had formed were visually identified, and the presence of such coating in these samples was further confirmed by measurement of transmittance therethrough, which showed transmittance of no more than about 50% at a wavelength of about 460 nm.

The samples in which no closed coating 140 of Ag had formed were also identified, and the absence of such coating in these samples was further confirmed by measurement of transmittance therethrough, which showed transmittance in excess of about 70% at a wavelength of about 460 nm.

The results are summarized in Table 2 below:

TABLE 2

| Material | Closed Coating of Ag? |
| --- | --- |
| HT211 | Present |
| HT01 | Present |
| TAZ | Present |
| Balq | Present |
| Liq | Present |
| Example Material 1 | Present |
| Example Material 2 | Present |
| Example Material 3 | Not Present |
| Example Material 4 | Not Present |
| Example Material 5 | Not Present |

Based on the foregoing, it was found that the materials used in the first 7 samples in Tables 1 and 2 (HT211 to Example Material 2) may be less suitable for inhibiting the deposition of the deposited material 331 thereon, including without limitation, Ag, and/or Ag-containing materials.

On the other hand, it was found that Example Material 3 to Example Material 5 may be suitable, at least in some non-limiting applications, to act as a patterning coating 110 for inhibiting the deposition of the deposited material 331 thereon, including without limitation, Ag, and/or Ag-containing materials.

It has now been found, somewhat surprisingly, that at least some of the compounds described above exhibit a relatively low critical surface tension. It is postulated that low energy surfaces formed by such compounds may exhibit relatively low initial sticking probabilities, and may thus be particularly suitable for forming the patterning coating and/or patterning coating material. Without wishing to be bound by any particular theory, it may be postulated that, especially for low surface energy surfaces, the critical surface tension may positively correlate with the surface energy. For example, a surface exhibiting a relatively low critical surface tension may also exhibit a relatively low surface energy, and a surface exhibiting a relatively high critical surface tension may also exhibit a relatively high surface energy. According to some models of surface energy, the critical surface tension of a surface may equate to, or substantially equate to, the surface energy of such surface. In reference to Young's equation described above, a lower surface energy may result in a greater contact angle, θ, while also lowering the $\gamma_{SV}$, thus enhancing the likelihood of such surface having low wettability and low initial sticking probability with respect to the material for forming the conductive coating 130.

In some non-limiting examples, the surface of the NIC and/or patterning coating containing the compounds described herein may exhibit a surface energy of at least one of no more than about: 24 dynes/cm, 22 dynes/cm, 20 dynes/cm, 19 dynes/cm, 18 dynes/cm, 16 dynes/cm, 15 dynes/cm, 13 dynes/cm, 12 dynes/cm, 11 dynes/cm, 10 dynes/cm, 9 dynes/cm, 8 dynes/cm, or 7 dynes/cm. By way of non-limiting example, the surface values in various non-limiting examples herein may correspond to such values measured at around normal temperature and pressure (NTP), which may correspond to a temperature of 20° C., and an absolute pressure of 1 atm. In some non-limiting examples, the critical surface tension of a surface may be determined according to the Zisman method, as further detailed in W. A. Zisman, Advances in Chemistry 43 (1964), P. 1-51.

In some non-limiting examples, the surface energy may be at least one of at least about: 6 dynes/cm, 7 dynes/cm, or 8 dynes/cm.

In some non-limiting examples, the surface energy may be at least one of between about: 10-20 dynes/cm, or 13-19 dynes/cm.

Without wishing to be bound by any particular theory, it may be postulated that materials that form a surface having a surface energy lower than, by way of non-limiting example, about 13 dynes/cm, may be less suitable as a patterning material 211 in certain applications, as such materials may exhibit relatively poor adhesion to layer(s) surrounding such materials, exhibit a low melting point, and/or exhibit a low sublimation temperature.

By way of non-limiting example, a series of samples was fabricated to measure the critical surface tension of the surfaces formed by the various materials. The results of the measurement are summarized in Table 3 below:

TABLE 3

| Material | Critical Surface Tension (dynes/cm) |
| --- | --- |
| HT211 | 25.6 |
| HT01 | >24 |
| TAZ | 22.4 |
| BAlq | 25.9 |
| Liq | 24 |
| Example Material 1 | 26.3 |
| Example Material 2 | 24.8 |
| Example Material 3 | <20 |
| Example Material 4 | <20 |
| Example Material 5 | 18.9 |

Based on the foregoing measurement of the critical surface tension in Table 3 and the previous observation regarding the presence or absence of a substantially closed coating 140 of Ag, it was found that materials that form low surface energy surfaces when deposited as a coating, which by way of non-limiting example, may be those having a critical surface tension of at least one of between about: 13-20 dynes/cm, or 13-19 dynes/cm, may be suitable for forming the patterning coating 110 to inhibit deposition of a deposited material 331 thereon, including without limitation, Ag, and/or Ag-containing materials.

It has also now been found, somewhat surprisingly, that patterning coating 110 formed by a compound exhibiting a relatively low surface energy may also exhibit a relatively low refractive index, n.

In some non-limiting examples, the refractive index, n, of the patterning coating 110 may be no more than about 1.7. For example, the refractive index of the patterning coating 110 may be at least one of no more than about: 1.6, 1.5, 1.4, or 1.3. In some non-limiting examples, n of the patterning coating 110 may be at least one of between about: 1.2-1.6, 1.2-1.5, or 1.25-1.45. As further described in various non-limiting examples above, the patterning coating 110 exhibiting a relatively low refractive index may enhance the optical properties and/or performance of the device, for example, by enhancing the outcoupling of EM radiation emitted by the opto-electronic device.

In some non-limiting examples, the patterning coating 110, and/or the patterning material 211 may exhibit a surface energy of no more than about 25 dynes/cm and a refractive index of no more than about 1.45. In some non-limiting examples, the patterning coating 110, and/or the patterning material 211 may comprise a material exhibiting a surface energy of no more than about 20 dynes/cm and a refractive index of no more than about 1.4.

In some non-limiting examples, the patterning coating 110 may be substantially transparent and/or light-transmissive. By way of non-limiting example, the patterning coating 110 may exhibit an extinction coefficient, K, of at least one of no more than about: 0.1, 0.08, 0.05, 0.03, or 0.01 in the visible light spectrum. In some non-limiting examples, the patterning coating 110 may not exhibit EM radiation absorption at any wavelength corresponding to the visible spectrum.

It will be appreciated that the refractive index and/or extinction coefficient values described herein may correspond to such value(s) measured at a wavelength in the visible spectrum. In some non-limiting examples, the refractive index and/or extinction coefficient value may correspond to a value measured at wavelength(s) of about 456 nm which may correspond to a peak emission wavelength of a B(lue) sub-pixel 1343, about 528 nm which may correspond to a peak emission wavelength of a G(reen) sub-pixel 1342, and/or about 624 nm which may correspond to a peak emission wavelength of a R(ed) sub-pixel 1341. In some non-limiting examples, the refractive index and/or extinction coefficient value described herein may correspond to a value measured at a wavelength of about 589 nm, which approximately corresponds to the Fraunhofer D-line.

In some non-limiting examples, the patterning coating 110, and/or the patterning material 211, in some non-limiting examples, when deposited as a film, and/or coating in a form, and under circumstances similar to the deposition of the patterning coating 110 within the device 100, may have a low refractive index.

In some non-limiting examples, the patterning coating 110, and/or the patterning material 211, in some non-limiting examples, when deposited as a film, and/or coating in a form, and under circumstances similar to the deposition of the patterning coating 110 within the device 100, may have a refractive index for EM radiation at a wavelength of 550 nm that may be no more than at least one of about: 1.55, 1.5, 1.45, 1.43, 1.4, 139, 1.37, 1.35, 1.32, or 1.3.

In some non-limiting examples, the molecular weight of the compound may be no more than about 5,000 g/mol. By way of non-limiting example, the molecular weight of the compound may be at least one of no more than about: 4,500 g/mol, 4,000 g/mol, 3,500 g/mol, or 3,000 g/mol.

In some non-limiting examples, the molecular weight of the compound may be at least about 1,000 g/mol. By way of non-limiting example, the molecular weight of the compound may be at least one of at least about: 1,100 g/mol, 1,200 g/mol, 1,300 g/mol, 1,500 g/mol, or 1,700 g/mol.

In some non-limiting examples, the molecular weight of the compound may be at least one of between about: 1,000-3,000 g/mol, 1,100-3,000 g/mol, 1,100-2,500 g/mol, or 1,100-2,000 g/mol.

In some non-limiting examples, the patterning coating 110, and/or the patterning material 211, in some non-limiting examples, when deposited as a film, and/or coating in a form, and under circumstances similar to the deposition of the patterning coating 110 within the device 100, may have a glass transition temperature that is no more than at least one of about: 300° C., 150° C., 130° C., 30° C., 0° C., −30° C., or −50° C. In some non-limiting examples, the patterning coating 110, and/or the patterning material 211, in some non-limiting examples, when deposited as a film, and/or coating in a form, and under circumstances similar to the deposition of the patterning coating 110 within the device 100, may not exhibit glass transition at temperatures of between −30° C. and 130° C.

In some non-limiting examples, the patterning coating 110 and/or the compound thereof may have a melting temperature greater than about 90° C., 100° C., 110° C., 120° C., 140° C., 150° C., or about 180° C.

In some non-limiting examples, the patterning material 211 may have a sublimation temperature of at least one of between about: 100-320° C., 100-300° C., 120-300° C., 100-250° C., 140-280° C., 120-230° C., 130-220° C., 140-210° C., 140-200° C., 150-250° C., or 140-190° C. In some non-limiting examples, such sublimation temperature may allow the patterning material 211 to be readily deposited as a coating using PVD.

The sublimation temperature of a material may be determined using various methods apparent to those having ordinary skill in the relevant art, including without limitation, by heating the material under high vacuum in a crucible and by determining a temperature that may be attained to:

- observe commencement of the deposition of the material onto a surface on a QCM mounted a fixed distance from the crucible;
- observe a specific deposition rate, by way of non-limiting example, 0.1 Å/sec, onto a surface on a QCM mounted a fixed distance from the crucible; and/or
- reach a threshold vapor pressure of the material, by way of non-limiting example, about $10^{-4}$ or $10^{-5}$ Torr.

In some non-limiting examples, the sublimation temperature of a material may be determined by heating the material in an evaporation source under a high vacuum environment, by way of non-limiting example, about $10^{-4}$ Torr, and by determining a temperature that may be attained to cause the material to evaporate, thus generating a vapor flux sufficient to cause deposition of the material, by way of non-limiting example, at a deposition rate of about 0.1 Å/sec onto a surface on a QCM mounted a fixed distance from the source.

In some non-limiting examples, the QCM may be mounted about 65 cm away from the crucible for the purpose of determining the sublimation temperature.

Without wishing to be bound by any particular theory, it may be postulated that such compounds may exhibit at least one property that maybe suitable for forming a coating, and/or layer having: (i) a relatively high melting point, by way of non-limiting example, of at least 100° C., (ii) a relatively low surface energy, and/or (iii) a substantially amorphous structure, when deposited, by way of non-limiting example, using vacuum-based thermal evaporation processes.

In some non-limiting examples, the patterning coating 110 may be disposed in a pattern that may be defined by at least one region therein that may be substantially devoid of a closed coating 140 of the patterning coating 110. In some non-limiting examples, the at least one region may separate the patterning coating 110 into a plurality of discrete fragments thereof. In some non-limiting examples, the plurality of discrete fragments of the patterning coating 110 may be physically spaced apart from one another in the lateral aspect thereof. In some non-limiting examples, the plurality of the discrete fragments of the patterning coating 110 may be arranged in a regular structure, including without limitation, an array or matrix, such that in some non-limiting examples, the discrete fragments of the patterning coating 110 may be configured in a repeating pattern.

In some non-limiting examples, at least one of the plurality of the discrete fragments of the patterning coating 110 may each correspond to an emissive region 1001.

In some non-limiting examples, an aperture ratio of the emissive regions 1001 may be no more than at least one of about: 50%, 40%, 30%, or 20%.

In some non-limiting examples, the patterning coating 110 may be formed as a single monolithic coating.

In some non-limiting examples, the patterning coating 110 may have and/or provide, including without limitation, because of the patterning material 211 used and/or the deposition environment, at least one nucleation site for the deposited material 331.

In some non-limiting examples, the patterning coating 110 may be doped, covered, and/or supplemented with another material that may act as a seed or heterogeneity, to act as such a nucleation site for the deposited material 331. In some non-limiting examples, such other material may comprise an NPC 520 material. In some non-limiting examples, such other material may comprise an organic material, such as by way of non-limiting example, a polycyclic aromatic compound, and/or a material comprising a non-metallic element such as, without limitation, at least one of: O, S, N, or C, whose presence might otherwise be a contaminant in the source material, equipment used for deposition, and/or the vacuum chamber environment. In some non-limiting examples, such other material may be deposited in a layer thickness that is a fraction of a monolayer, to avoid forming a closed coating 140 thereof. Rather, the monomers of such other material may tend to be spaced apart in the lateral aspect so as form discrete nucleation sites for the deposited material.

In some non-limiting examples, the patterning coating 110 may act as an optical coating. In some non-limiting examples, the patterning coating 110 may modify at least one property, and/or characteristic of EM radiation (including without limitation, in the form of photons) emitted by the device 100. In some non-limiting examples, the patterning coating 110 may exhibit a degree of haze, causing emitted EM radiation to be scattered. In some non-limiting examples, the patterning coating 110 may comprise a crystalline material for causing EM radiation transmitted therethrough to be scattered. Such scattering of EM radiation may facilitate enhancement of the outcoupling of EM radiation from the device in some non-limiting examples. In some non-limiting examples, the patterning coating 110 may initially be deposited as a substantially non-crystalline, including without limitation, substantially amorphous, coating, whereupon, after deposition thereof, the patterning coating 110 may become crystallized and thereafter serve as an optical coupling.

In some non-limiting examples, there may be an aim to provide a patterning coating 110 for causing formation of a discontinuous layer 440 of at least one particle structure 441, upon the patterning coating 110 being subjected to a vapor flux 332 of a deposited material 331. In at least some applications, the patterning coating 110 may exhibit a sufficiently low initial sticking probability such that a closed coating 140 of the deposited material 331 may be formed in the second portion 102, which may be substantially devoid of the patterning coating 110, while the discontinuous layer 440 of at least one particle structure 441 having at least one characteristic may be formed in the first portion 101 on the patterning coating 110. In some non-limiting examples, there may be an aim to form a discontinuous layer 440 of at least one particle structure 441 of a deposited material 331, which may be, by way of non-limiting example, of a metal or metal alloy, in the second portion 102, while depositing a closed coating 140 of the deposited material 331 having a thickness of, for example, no more than at least one of about: 100 nm, 50 nm, 25 nm, or 15 nm. In some non-limiting examples, a relative amount of the deposited material 331 deposited as a discontinuous layer 440 of at least one particle structure 441 in the first portion 101 may correspond to at least one of between about: 1-50%, 2-25%, 5-20%, or 7-10% of the amount of the deposited material 331 deposited as a closed coating 140 in the second portion 102, which by way of non-limiting example may correspond to a thickness of no more than at least one of about: 100 nm, 75 nm, 50 nm, 25 nm, or 15 nm.

Deposited Layer

In some non-limiting examples, in the second portion 102 of the lateral aspect of the device 100, a deposited layer 130 comprising a deposited material 331 may be disposed as a closed coating 140 on an exposed layer surface 11 of an underlying layer, including without limitation, the substrate 10.

In some non-limiting examples, the deposited layer 130 may comprise a deposited material 331.

In some non-limiting examples, the deposited material 331 may comprise an element selected from at least one of: potassium (K), sodium (Na), lithium (Li), barium (Ba), cesium (Cs), Yb, Ag, gold (Au), Cu, aluminum (Al), Mg, Zn, Cd, tin (Sn), or yttrium (Y). In some non-limiting examples, the element may comprise at least one of: K, Na, Li, Ba, Cs, Yb, Ag, Au, Cu, Al, and/or Mg. In some non-limiting examples, the element may comprise at least one of: Cu, Ag, and/or Au. In some non-limiting examples, the element may be Cu. In some non-limiting examples, the element may be Al. In some non-limiting examples, the element may comprise at least one of: Mg, Zn, Cd, or Yb. In some non-limiting examples, the element may comprise at least one of: Mg, Ag, Al, Yb, or Li. In some non-limiting examples, the element may comprise at least one of: Mg, Ag, or Yb. In some non-limiting examples, the element may comprise at least one of: Mg, or Ag. In some non-limiting examples, the element may be Ag.

In some non-limiting examples, the deposited material 331 may be and/or comprise a pure metal. In some non-limiting examples, the deposited material 331 may be at least one of: pure Ag or substantially pure Ag. In some non-limiting examples, the substantially pure Ag may have a purity of at least one of at least about: 95%, 99%, 99.9%, 99.99%, 99.999%, or 99.9995%. In some non-limiting examples, the deposited material 331 may be at least one of: pure Mg or substantially pure Mg. In some non-limiting examples, the substantially pure Mg may have a purity of at least one of at least about: 95%, 99%, 99.9%, 99.99%, 99.999%, or 99.9995%.

In some non-limiting examples, the deposited material 331 may comprise an alloy. In some non-limiting examples, the alloy may be at least one of: an Ag-containing alloy, an Mg-containing alloy, or an AgMg-containing alloy. In some non-limiting examples, the AgMg-containing alloy may have an alloy composition that may range from about 1:10 (Ag:Mg) to about 10:1 by volume.

In some non-limiting examples, the deposited material 331 may comprise other metals in place of, and/or in combination with, Ag. In some non-limiting examples, the deposited material 331 may comprise an alloy of Ag with at least one other metal. In some non-limiting examples, the deposited material 331 may comprise an alloy of Ag with at least one of: Mg, or Yb. In some non-limiting examples, such alloy may be a binary alloy having a composition between about 5-95 vol. % Ag, with the remainder being the other metal. In some non-limiting examples, the deposited material 331 may comprise Ag and Mg. In some non-limiting examples, the deposited material 331 may comprise an Ag:Mg alloy having a composition between about 1:10-10:1 by volume. In some non-limiting examples, the deposited material 331 may comprise Ag and Yb. In some non-limiting examples, the deposited material 331 may comprise a Yb:Ag alloy having a composition between about 1:20-10:1 by volume. In some non-limiting examples, the deposited material 331 may comprise Mg and Yb. In some non-limiting examples, the deposited material 331 may comprise an Mg:Yb alloy. In some non-limiting examples, the deposited material 331 may comprise Ag, Mg, and Yb. In some non-limiting examples, the deposited layer 130 may comprise an Ag:Mg:Yb alloy.

In some non-limiting examples, the deposited layer 130 may comprise at least one additional element. In some non-limiting examples, such additional element may be a non-metallic element. In some non-limiting examples, the non-metallic element may be at least one of: O, S, N, or C. It will be appreciated by those having ordinary skill in the relevant art that, in some non-limiting examples, such additional element(s) may be incorporated into the deposited layer 130 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the deposited layer 130. In some non-limiting examples, a concentration of the non-metallic element in the deposited material 331 may be no more than at least one of about: 1%, 0.1%, 0.01%, 0.001%, 0.0001%, 0.00001%, 0.000001%, or 0.0000001%. In some non-limiting examples, the deposited layer 130 may have a composition in which a combined amount of O and C therein may be no more than at least one of about: 10%, 5%, 1%, 0.1%, 0.01%, 0.001%, 0.0001%, 0.00001%, 0.000001%, or 0.0000001%.

It has now been found, somewhat surprisingly, that reducing a concentration of certain non-metallic elements in the deposited layer 130, particularly in cases wherein the deposited layer 130 may be substantially comprised of metal(s), and/or metal alloy(s), may facilitate selective deposition of the deposited layer 130. Without wishing to be bound by any particular theory, it may be postulated that certain non-metallic elements, such as, by way of non-limiting example, O, or C, when present in the vapor flux 332 of the deposited layer 130, and/or in the deposition chamber, and/or environment, may be deposited onto the surface of the patterning coating 110 to act as nucleation sites for the metallic element(s) of the deposited layer 130. It may be postulated that reducing a concentration of such non-metallic elements that could act as nucleation sites may facilitate reducing an amount of deposited material 331 deposited on the exposed layer surface 11 of the patterning coating 110.

In some non-limiting examples, the deposited material 331 may be deposited on a metal-containing underlying layer. In some non-limiting examples, the deposited material 331 and the underlying layer thereunder may comprise a common metal.

In some non-limiting examples, the deposited layer 130 may comprise a plurality of layers of the deposited material 331. In some non-limiting examples, the deposited material 331 of a first one of the plurality of layers may be different from the deposited material 331 of a second one of the plurality of layers. In some non-limiting examples, the deposited layer 130 may comprise a multilayer coating. In some non-limiting examples, such multilayer coating may be at least one of: Yb/Ag, Yb/Mg, Yb/Mg:Ag, Yb/Yb:Ag, Yb/Ag/Mg, or Yb/Mg/Ag.

In some non-limiting examples, the deposited material 331 may comprise a metal having a bond dissociation energy, of no more than at least one of about: 300 kJ/mol, 200 kJ/mol, 165 kJ/mol, 150 kJ/mol, 100 kJ/mol, 50 kJ/mol, or 20 kJ/mol.

In some non-limiting examples, the deposited material 331 may comprise a metal having an electronegativity that is no more than at least one of about: 1.4, 1.3, or 1.2.

In some non-limiting examples, a sheet resistance of the deposited layer 130 may generally correspond to a sheet resistance of the deposited layer 130, measured or determined in isolation from other components, layers, and/or parts of the device 100. In some non-limiting examples, the deposited layer 130 may be formed as a thin film. Accordingly, in some non-limiting examples, the characteristic sheet resistance for the deposited layer 130 may be determined, and/or calculated based on the composition, thickness, and/or morphology of such thin film. In some non-limiting examples, the sheet resistance may be no more than at least one of about: 10Ω/□, 5Ω/□, 1Ω/□, 0.5Ω/□, 0.2Ω/□, or 0.1Ω/□.

In some non-limiting examples, the deposited layer 130 may be disposed in a pattern that may be defined by at least one region therein that is substantially devoid of a closed coating 140 of the deposited layer 130. In some non-limiting examples, the at least one region may separate the deposited layer 130 into a plurality of discrete fragments thereof. In some non-limiting examples, each discrete fragment of the deposited layer 130 may be a distinct second portion 102. In some non-limiting examples, the plurality of discrete fragments of the deposited layer 130 may be physically spaced apart from one another in the lateral aspect thereof. In some non-limiting examples, at least two of such plurality of discrete fragments of the deposited layer 130 may be electrically coupled. In some non-limiting examples, at least two of such plurality of discrete fragments of the deposited layer 130 may be each electrically coupled with a common conductive layer or coating, including without limitation, the underlying surface, to allow the flow of electrical current between them. In some non-limiting examples, at least two of such plurality of discrete fragments of the deposited layer 130 may be electrically insulated from one another.

Selective Deposition Using Patterning Coatings

Figure 2:
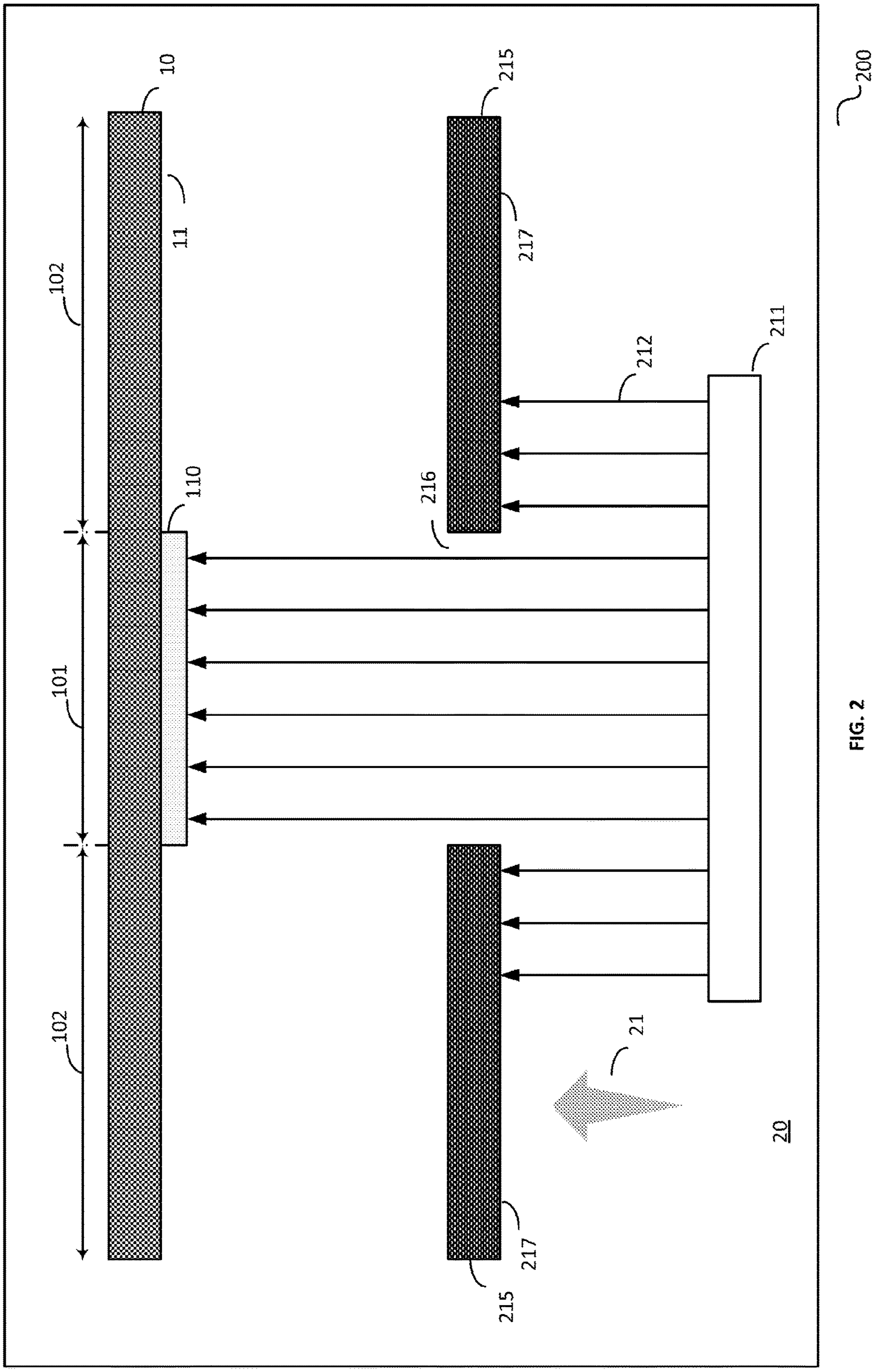
FIG. 2 is a schematic diagram showing an example process for depositing a patterning coating in a pattern on an exposed layer surface of an underlying layer in an example version of the device of FIG. 1, according to an example in the present disclosure.

FIG. 2 is an example schematic diagram illustrating a non-limiting example of an evaporative deposition process, shown generally at 200, in a chamber 20, for selectively depositing a patterning coating 110 onto a first portion 101 of an exposed layer surface 11 of the underlying layer.

In the process 200, a quantity of a patterning material 211 is heated under vacuum, to evaporate, and/or sublime the patterning material 211. In some non-limiting examples, the patterning material 211 may comprise entirely, and/or substantially, a material used to form the patterning coating 110. In some non-limiting examples, such material may comprise an organic material.

An evaporated flux 212 of the patterning material 211 may flow through the chamber 20, including in a direction indicated by arrow 21, toward the exposed layer surface 11. When the evaporated flux 212 is incident on the exposed layer surface 11, the patterning coating 110 may be formed thereon.

In some non-limiting examples, as shown in the figure for the process 200, the patterning coating 110 may be selectively deposited only onto a portion, in the example illustrated, the first portion 101, of the exposed layer surface 11, by the interposition, between the evaporated flux 212 and the exposed layer surface 11, of a shadow mask 215, which in some non-limiting examples, may be an FMM. In some non-limiting examples, such a shadow mask 215 may, in some non-limiting examples, be used to form relatively small features, with a feature size on the order of tens of microns or smaller.

The shadow mask 215 may have at least one aperture 216 extending therethrough such that a part of the evaporated flux 212 passes through the aperture 216 and may be incident on the exposed layer surface 11 to form the patterning coating 110. Where the evaporated flux 212 does not pass through the aperture 216 but is incident on the surface 217 of the shadow mask 215, it is precluded from being disposed on the exposed layer surface 11 to form the patterning coating 110. In some non-limiting examples, the shadow mask 215 may be configured such that the evaporated flux 212 that passes through the aperture 216 may be incident on the first portion 101 but not the second portion 102. The second portion 102 of the exposed layer surface 11 may thus be substantially devoid of the patterning coating 110. In some non-limiting examples (not shown), the patterning material 211 that is incident on the shadow mask 215 may be deposited on the surface 217 thereof.

Accordingly, a patterned surface may be produced upon completion of the deposition of the patterning coating 110.

Figure 3:
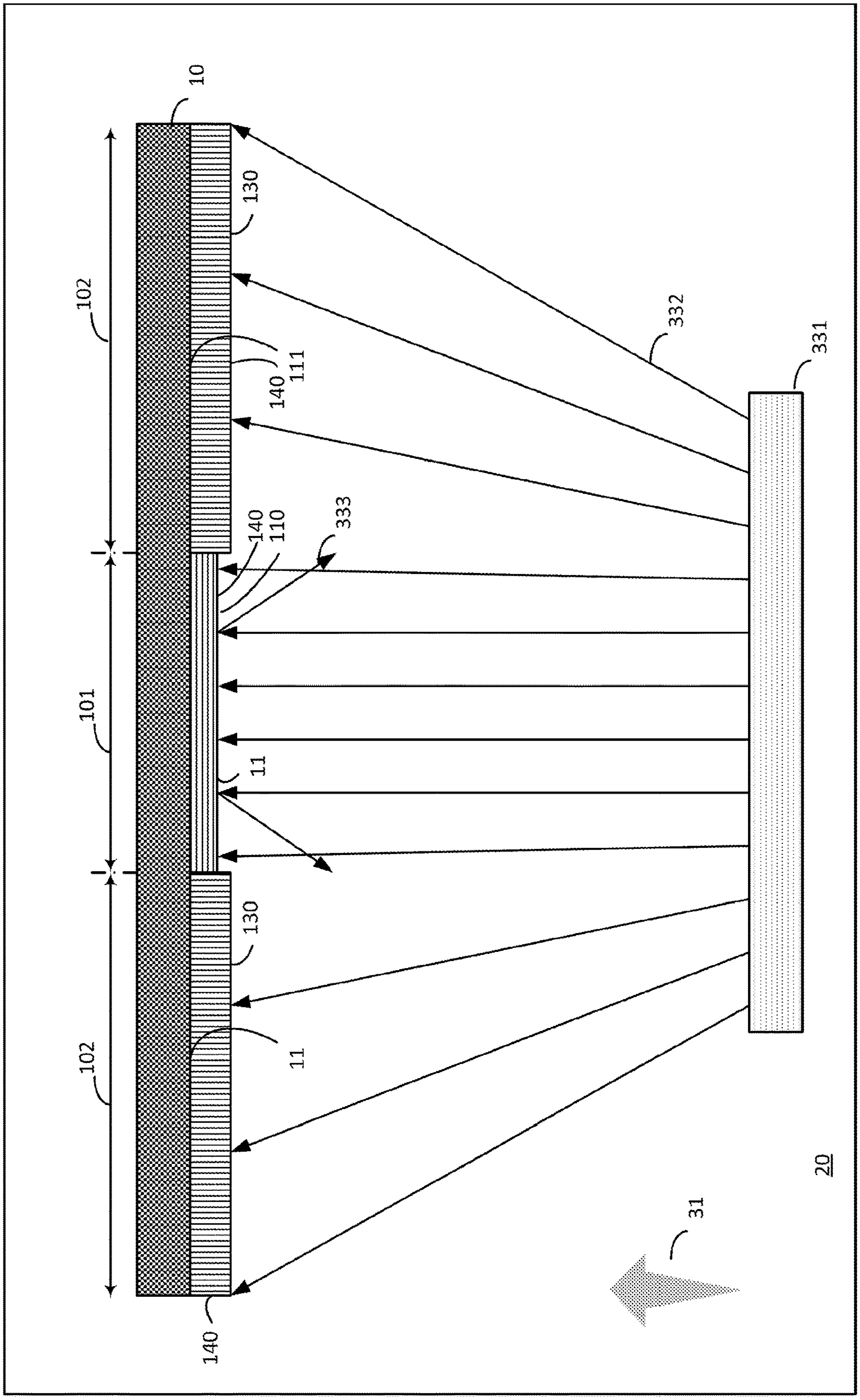
FIG. 3 is a schematic diagram showing an example process for depositing a deposited material in the second portion on an exposed layer surface that comprises the deposited pattern of the patterning coating of FIG. 2, where the patterning coating is a nucleation-inhibiting coating (NIC)

FIG. 3 is an example schematic diagram illustrating a non-limiting example of a result of an evaporative process, shown generally at $\mathbf{300}_a$, in a chamber 20, for selectively depositing a closed coating 140 of a deposited layer 130 onto the second portion 102 of an exposed layer surface 11 of the underlying layer that is substantially devoid of the patterning coating 110 that was selectively deposited onto the first portion 101, including without limitation, by the evaporative process 200 of FIG. 2.

In some non-limiting examples, the deposited layer 130 may be comprised of a deposited material 331, in some non-limiting examples, comprising at least one metal. It will be appreciated by those having ordinary skill in the relevant art that typically, a vaporization temperature of an organic material is low relative to the vaporization temperature of metals, such as may be employed as a deposited material 331.

Thus, in some non-limiting examples, there may be fewer constraints in employing a shadow mask 215 to selectively deposit a patterning coating 110 in a pattern, relative to directly patterning the deposited layer 130 using such shadow mask 215.

Once the patterning coating 110 has been deposited on the first portion 101 of the exposed layer surface 11 of the underlying layer, a closed coating 140 of the deposited material 331 may be deposited, on the second portion 102 of the exposed layer surface 11 that is substantially devoid of the patterning coating 110, as the deposited layer 130.

In the process $\mathbf{300}_a$, a quantity of the deposited material 331 may be heated under vacuum, to evaporate, and/or sublime the deposited material 331. In some non-limiting examples, the deposited material 331 may comprise entirely, and/or substantially, a material used to form the deposited layer 130.

An evaporated flux 332 of the deposited material 331 may be directed inside the chamber 20, including in a direction indicated by arrow 31, toward the exposed layer surface 11 of the first portion 101 and of the second portion 102. When the evaporated flux 332 is incident on the second portion 102 of the exposed layer surface 11, a closed coating 140 of the deposited material 331 may be formed thereon as the deposited layer 130.

In some non-limiting examples, deposition of the deposited material 331 may be performed using an open mask and/or mask-free deposition process.

It will be appreciated by those having ordinary skill in the relevant art that, contrary to that of a shadow mask 215, the feature size of an open mask may be generally comparable to the size of a device 100 being manufactured.

It will be appreciated by those having ordinary skill in the relevant art that, in some non-limiting examples, the use of an open mask may be omitted. In some non-limiting examples, an open mask deposition process described herein may alternatively be conducted without the use of an open mask, such that an entire target exposed layer surface 11 may be exposed.

Indeed, as shown in FIG. 3, the evaporated flux 332 may be incident both on an exposed layer surface 11 of the patterning coating 110 across the first portion 101 as well as the exposed layer surface 11 of the underlying layer across the second portion 102 that is substantially devoid of the patterning coating 110.

Since the exposed layer surface 11 of the patterning coating 110 in the first portion 101 may exhibit a relatively low initial sticking probability against the deposition of the deposited material 331 relative to the exposed layer surface 11 of the underlying layer in the second portion 102, the deposited layer 130 may be selectively deposited substantially only on the exposed layer surface 11, of the underlying layer in the second portion 102, that is substantially devoid of the patterning coating 110. By contrast, the evaporated flux 332 incident on the exposed layer surface 11 of the patterning coating 110 across the first portion 101 may tend to not be deposited (as shown 333), and the exposed layer surface 11 of the patterning coating 110 across the first portion 101 may be substantially devoid of a closed coating 140 of the deposited layer 130.

In some non-limiting examples, an initial deposition rate, of the evaporated flux 332 on the exposed layer surface 11 of the underlying layer in the second portion 102, may exceed at least one of about: 200 times, 550 times, 900 times, 1,000 times, 1,500 times, 1,900 times, or 2,000 times an initial deposition rate of the evaporated flux 332 on the exposed layer surface 11 of the patterning coating 110 in the first portion 101.

Thus, the combination of the selective deposition of a patterning coating 110 in FIG. 2 using a shadow mask 215 and the open mask and/or mask-free deposition of the deposited material 331 may result in a version $300_a$ of the device 100 shown in FIG. 3.

After selective deposition of the patterning coating 110 across the first portion 101, a closed coating 140 of the deposited material 331 may be deposited over the device $300_a$ as the deposited layer 130, in some non-limiting examples, using an open mask and/or a mask-free deposition process, but may remain substantially only within the second portion 102, which is substantially devoid of the patterning coating 110.

The patterning coating 110 may provide, within the first portion 101, an exposed layer surface 11 with a relatively low initial sticking probability, against the deposition of the deposited material 331, and that is substantially less than the initial sticking probability, against the deposition of the deposited material 331, of the exposed layer surface 11 of the underlying material of the device $300_a$ within the second portion 102.

Thus, the first portion 101 may be substantially devoid of a closed coating 140 of the deposited material 331.

While the present disclosure contemplates the patterned deposition of the patterning coating 110 by an evaporative deposition process, involving a shadow mask 215, those having ordinary skill in the relevant art will appreciate that, in some non-limiting examples, this may be achieved by any suitable deposition process, including without limitation, a micro-contact printing process.

While the present disclosure contemplates the patterning coating 110 being an NIC, those having ordinary skill in the relevant art will appreciate that, in some non-limiting examples, the patterning coating 110 may be an NPC 520. In such examples, the portion (such as, without limitation, the first portion 101) in which the NPC 520 has been deposited may, in some non-limiting examples, have a closed coating 140 of the deposited material 331, while the other portion (such as, without limitation, the second portion 102) may be substantially devoid of a closed coating 140 of the deposited material 331.

In some non-limiting examples, an average layer thickness of the patterning coating 110 and of the deposited layer 130 deposited thereafter may be varied according to a variety of parameters, including without limitation, a given application and given performance characteristics. In some non-limiting examples, the average layer thickness of the patterning coating 110 may be comparable to, and/or substantially no more than an average layer thickness of the deposited layer 130 deposited thereafter. Use of a relatively thin patterning coating 110 to achieve selective patterning of a deposited layer 130 may be suitable to provide flexible devices 100. In some non-limiting examples, a relatively thin patterning coating 110 may provide a relatively planar surface on which a barrier coating or other thin film encapsulation (TFE) layer 1350, may be deposited. In some non-limiting examples, providing such a relatively planar surface for application of such barrier coating 1050 may increase adhesion thereof to such surface.

Edge Effects

Patterning Coating Transition Region

Figure 4A:
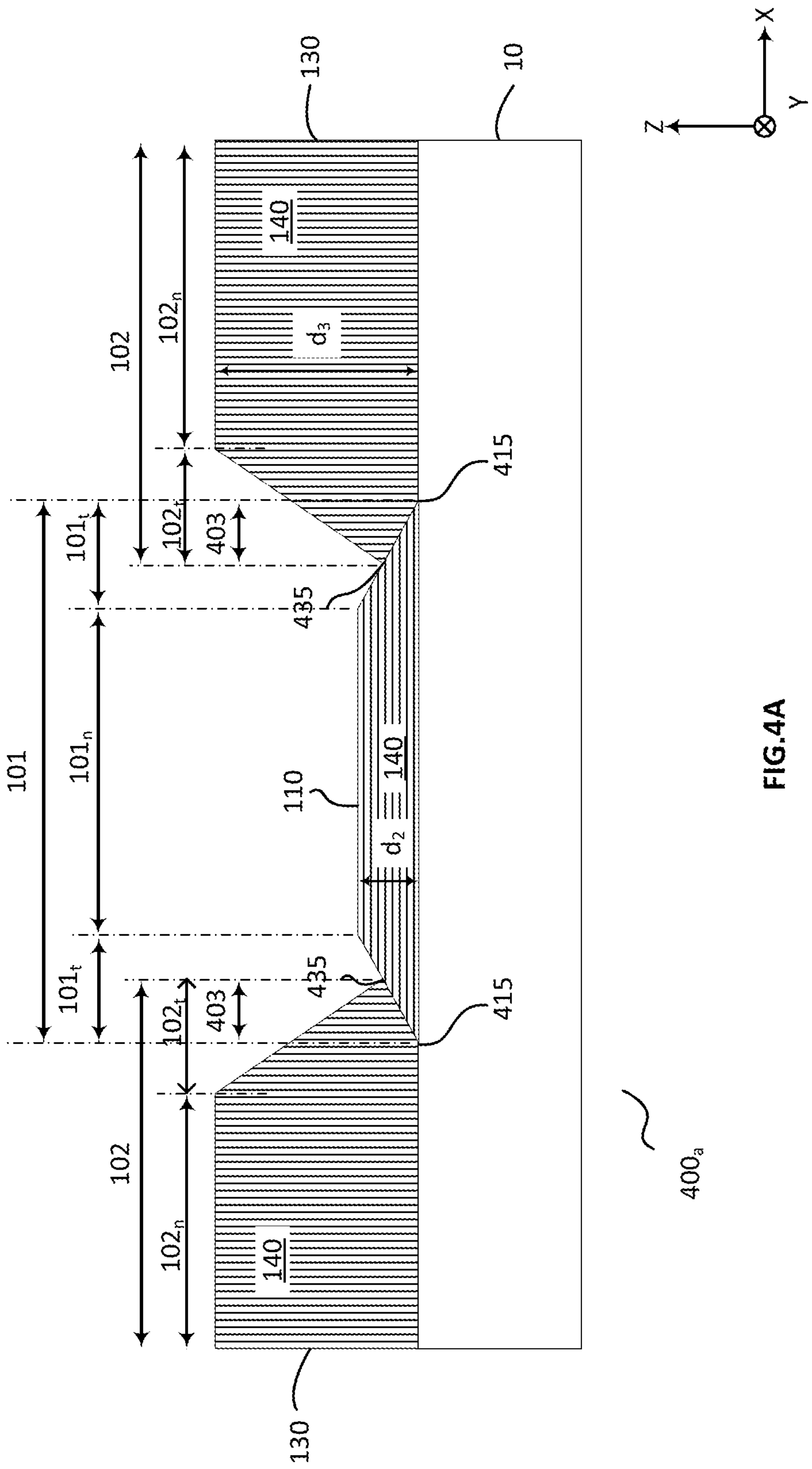
FIG. 4A is a schematic diagram illustrating an example version of the device of FIG. 1 in a cross-sectional view.
Figure 4B:
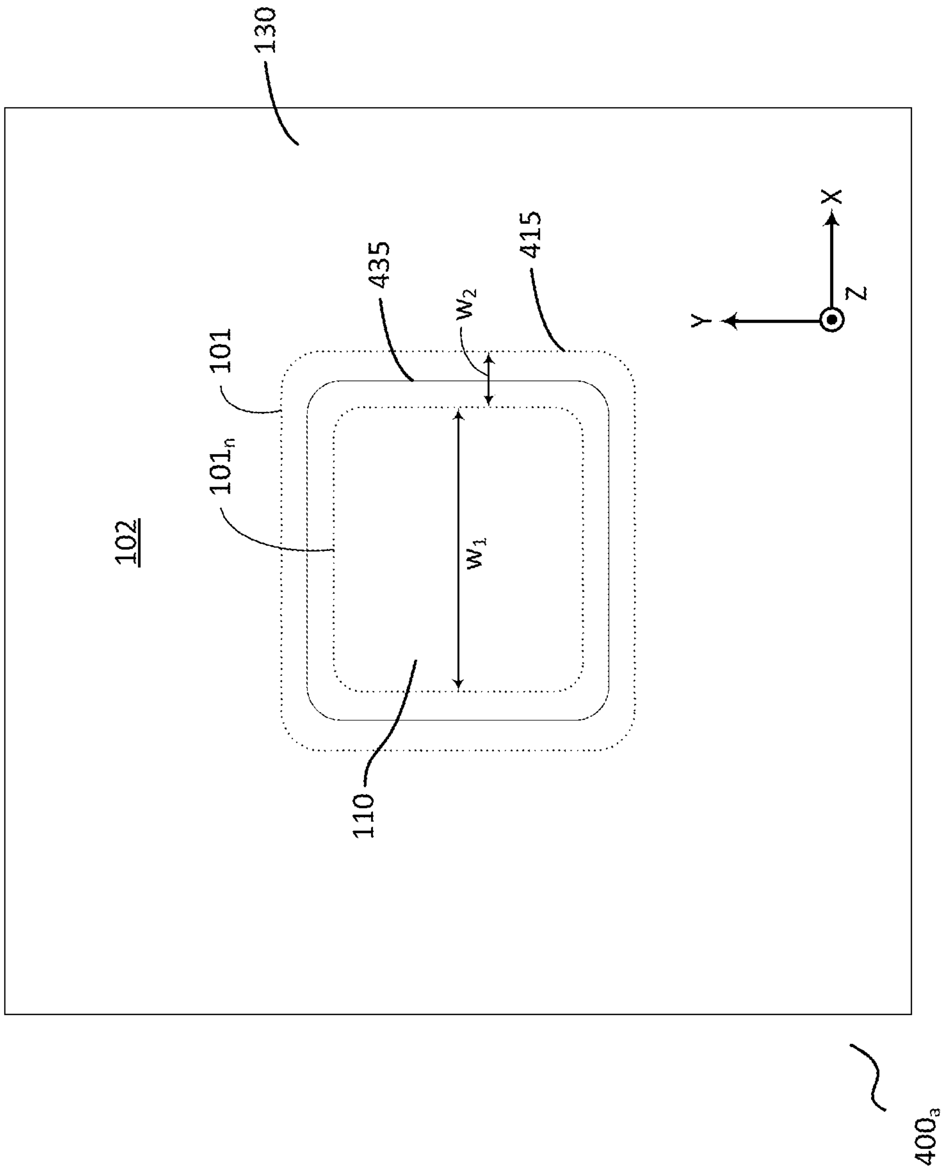
FIG. 4B is a schematic diagram illustrating the device of FIG. 4A in a complementary plan view.

Turning to FIG. 4A, there may be shown a version $400_a$ of the device 100 of FIG. 1 that may show in exaggerated form, an interface between the patterning coating 110 in the first portion 101 and the deposited layer 130 in the second portion 102. FIG. 4B may show the device $400_a$ in plan.

As may be better seen in FIG. 4B, in some non-limiting examples, the patterning coating 110 in the first portion 101 may be surrounded on all sides by the deposited layer 130 in the second portion 102, such that the first portion 101 may have a boundary that is defined by the further extent or edge 415 of the patterning coating 110 in the lateral aspect along each lateral axis. In some non-limiting examples, the patterning coating edge 415 in the lateral aspect may be defined by a perimeter of the first portion 101 in such aspect.

In some non-limiting examples, the first portion 101 may comprise at least one patterning coating transition region $101_t$, in the lateral aspect, in which a thickness of the patterning coating 110 may transition from a maximum thickness to a reduced thickness. The extent of the first portion 101 that does not exhibit such a transition may be identified as a patterning coating non-transition part $101_n$ of the first portion 101. In some non-limiting examples, the patterning coating 110 may form a substantially closed coating 140 in the patterning coating non-transition part $101_n$ of the first portion 101.

In some non-limiting examples, the patterning coating transition region $101_t$ may extend, in the lateral aspect, between the patterning coating non-transition part $101_n$ of the first portion 101 and the patterning coating edge 415.

In some non-limiting examples, in plan, the patterning coating transition region $101_t$ may surround, and/or extend along a perimeter of, the patterning coating non-transition part $101_n$ of the first portion 101.

In some non-limiting examples, along at least one lateral axis, the patterning coating non-transition part $101_n$ may occupy the entirety of the first portion 101, such that there is no patterning coating transition region $101_t$ between it and the second portion 102.

As illustrated in FIG. 4A, in some non-limiting examples, the patterning coating 110 may have an average film thickness $d_2$ in the patterning coating non-transition part $101_n$ of the first portion 101 that may be in a range of at least one of between about: 1-100 nm, 2-50 nm, 3-30 nm, 4-20 nm, 5-15 nm, 5-10 nm, or 1-10 nm. In some non-limiting examples, the average film thickness $d_2$ of the patterning coating 110 in the patterning coating non-transition part $101_n$ of the first portion 101 may be substantially the same, or constant, thereacross. In some non-limiting examples, an average film thickness $d_2$ of the patterning coating 110 may remain, within the patterning coating non-transition part $101_n$, within at least one of about: 95%, or 90% of the average film thickness $d_2$ of the patterning coating 110.

In some non-limiting examples, the average film thickness $d_2$ may be between about 1-100 nm. In some non-limiting examples, the average film thickness $d_2$ may be no more than at least one of about: 80 nm, 60 nm, 50 nm, 40 nm, 30 nm, 20 nm, 15 nm, or 10 nm. In some non-limiting examples, the average film thickness $d_2$ of the patterning coating 110 may exceed at least one of about: 3 nm, 5 nm, or 8 nm.

In some non-limiting examples, the average film thickness $d_2$ of the patterning coating 110 in the patterning coating non-transition part $101_n$ of the first portion 101 may be no more than about 10 nm. Without wishing to be bound by any particular theory, it has been found, somewhat surprisingly, that a non-zero average film thickness $d_2$ of the patterning coating 110 that is no more than about 10 nm may, at least in some non-limiting examples, provide certain advantages for achieving, by way of non-limiting example, enhanced patterning contrast of the deposited layer 130, relative to a patterning coating 110 having an average film thickness $d_2$ in the patterning coating non-transition part 101$_n$ of the first portion 101 in excess of 10 nm.

In some non-limiting examples, the patterning coating 110 may have a patterning coating thickness that decreases from a maximum to a minimum within the patterning coating transition region 101$_t$. In some non-limiting examples, the maximum may be at, and/or proximate to, a boundary between the patterning coating transition region 101$_t$ and the patterning coating non-transition part 101$_n$ of the first portion 101. In some non-limiting examples, the minimum may be at, and/or proximate to, the patterning coating edge 415. In some non-limiting examples, the maximum may be the average film thickness $d_2$ in the patterning coating non-transition part 101$_n$ of the first portion 101. In some non-limiting examples, the maximum may be no more than at least one of about: 95% or 90% of the average film thickness $d_2$ in the patterning coating non-transition part 101$_n$ of the first portion 101. In some non-limiting examples, the minimum may be in a range of between about 0-0.1 nm.

In some non-limiting examples, a profile of the patterning coating thickness in the patterning coating transition region 101$_t$ may be sloped, and/or follow a gradient. In some non-limiting examples, such profile may be tapered. In some non-limiting examples, the taper may follow a linear, non-linear, parabolic, and/or exponential decaying profile.

In some non-limiting examples, the patterning coating 110 may completely cover the underlying surface in the patterning coating transition region 101$_t$. In some non-limiting examples, at least a part of the underlying layer may be left uncovered by the patterning coating 110 in the patterning coating transition region 101$_t$. In some non-limiting examples, the patterning coating 110 may comprise a substantially closed coating 140 in at least a part of the patterning coating transition region 101$_t$ and/or at least a part of the patterning coating non-transition part 101$_n$.

In some non-limiting examples, the patterning coating 110 may comprise a discontinuous layer 440 in at least a part of the patterning coating transition region 101$_t$ and/or at least a part of the patterning coating non-transition part 101$_n$.

In some non-limiting examples, at least a part of the patterning coating 110 in the first portion 101 may be substantially devoid of a closed coating 140 of the deposited layer 130. In some non-limiting examples, at least a part of the exposed layer surface 11 of the first portion 101 may be substantially devoid of a closed coating 140 of the deposited layer 130 or of the deposited material 331.

In some non-limiting examples, along at least one lateral axis, including without limitation, the X-axis, the patterning coating non-transition part 101$_n$ may have a width of $w_1$, and the patterning coating transition region 101$_t$ may have a width of $w_2$. In some non-limiting examples, the patterning coating non-transition part 101$_n$ may have a cross-sectional area that, in some non-limiting examples, may be approximated by multiplying the average film thickness $d_2$ by the width $w_1$. In some non-limiting examples, the patterning coating transition region 101$_t$ may have a cross-sectional area that, in some non-limiting examples, may be approximated by multiplying an average film thickness across the patterning coating transition region 101$_t$ by the width $w_1$.

In some non-limiting examples, $w_1$ may exceed $w_2$. In some non-limiting examples, a quotient of $w_1/w_2$ may be at least one of at least about: 5, 10, 20, 50, 100, 500, 1,000, 1,500, 5,000, 10,000, 50,000, or 100,000.

In some non-limiting examples, at least one of w1 and w2 may exceed the average film thickness $d_1$ of the underlying layer.

In some non-limiting examples, at least one of $w_1$ and $w_2$ may exceed $d_2$. In some non-limiting examples, both $w_1$ and $w_2$ may exceed $d_2$. In some non-limiting examples, $w_1$ and $w_2$ both may exceed $d_1$, and $d_1$ may exceed $d_2$.

Deposited Layer Transition Region

As may be better seen in FIG. 4B, in some non-limiting examples, the patterning coating 110 in the first portion 101 may be surrounded by the deposited layer 130 in the second portion 102 such that the second portion 102 has a boundary that is defined by the further extent or edge 435 of the deposited layer 130 in the lateral aspect along each lateral axis. In some non-limiting examples, the deposited layer edge 435 in the lateral aspect may be defined by a perimeter of the second portion 102 in such aspect.

In some non-limiting examples, the second portion 102 may comprise at least one deposited layer transition region 102$_t$, in the lateral aspect, in which a thickness of the deposited layer 130 may transition from a maximum thickness to a reduced thickness. The extent of the second portion 102 that does not exhibit such a transition may be identified as a deposited layer non-transition part 102$_n$ of the second portion 102. In some non-limiting examples, the deposited layer 130 may form a substantially closed coating 140 in the deposited layer non-transition part 102$_n$ of the second portion 102.

In some non-limiting examples, in plan, the deposited layer transition region 102$_t$ may extend, in the lateral aspect, between the deposited layer non-transition part 102$_n$ of the second portion 102 and the deposited layer edge 435.

In some non-limiting examples, in plan, the deposited layer transition region 102$_t$ may surround, and/or extend along a perimeter of, the deposited layer non-transition part 102$_n$ of the second portion 102.

In some non-limiting examples, along at least one lateral axis, the deposited layer non-transition part 102$_n$ of the second portion 102 may occupy the entirety of the second portion 102, such that there is no deposited layer transition region 102$_t$ between it and the first portion 101.

As illustrated in FIG. 4A, in some non-limiting examples, the deposited layer 130 may have an average film thickness $d_3$ in the deposited layer non-transition part 102$_n$ of the second portion 102 that may be in a range of at least one of between about: 1-500 nm, 5-200 nm, 5-40 nm, 10-30 nm, or 10-100 nm. In some non-limiting examples, $d_3$ may exceed at least one of about: 10 nm, 50 nm, or 100 nm. In some non-limiting examples, the average film thickness $d_3$ of the deposited layer 130 in the deposited layer non-transition part 102$_t$ of the second portion 102 may be substantially the same, or constant, thereacross.

In some non-limiting examples, $d_3$ may exceed the average film thickness $d_1$ of the underlying layer.

In some non-limiting examples, a quotient $d_3/d_1$ may be at least one of at least about: 1.5, 2, 5, 10, 20, 50, or 100. In some non-limiting examples, the quotient $d_3/d_1$ may be in a range of at least one of between about: 0.1-10, or 0.2-40.

In some non-limiting examples, $d_3$ may exceed an average film thickness $d_2$ of the patterning coating 110.

In some non-limiting examples, a quotient $d_3/d_2$ may be at least one of at least about: 1.5, 2, 5, 10, 20, 50, or 100. In some non-limiting examples, the quotient $d_3/d_2$ may be in a range of at least one of between about: 0.2-10, or 0.5-40.

In some non-limiting examples, $d_3$ may exceed $d_2$ and $d_2$ may exceed $d_1$. In some other non-limiting examples, $d_3$ may exceed $d_1$ and $d_1$ may exceed $d_2$.

In some non-limiting examples, a quotient $d_2/d_1$ may be between at least one of about: 0.2-3, or 0.1-5.

In some non-limiting examples, along at least one lateral axis, including without limitation, the X-axis, the deposited layer non-transition part 102$_n$ of the second portion 102 may have a width of $w_3$. In some non-limiting examples, the deposited layer non-transition part 102$_n$ of the second portion 102 may have a cross-sectional area $a_3$ that, in some non-limiting examples, may be approximated by multiplying the average film thickness $d_3$ by the width $w_3$.

In some non-limiting examples, $w_3$ may exceed the width $w_1$ of the patterning coating non-transition part 101$_n$. In some non-limiting examples, $w_1$ may exceed $w_3$.

In some non-limiting examples, a quotient $w_1/w_3$ may be in a range of at least one of between about: 0.1-10, 0.2-5, 0.3-3, or 0.4-2. In some non-limiting examples, a quotient $w_3/w_1$ may be at least one of at least about: 1, 2, 3, or 4.

In some non-limiting examples, $w_3$ may exceed the average film thickness $d_3$ of the deposited layer 130.

In some non-limiting examples, a quotient $w_3/d_3$ may be at least one of at least about: 10, 50, 100, or 500. In some non-limiting examples, the quotient $w_3/d_3$ may be no more than about 100,000.

In some non-limiting examples, the deposited layer 130 may have a thickness that decreases from a maximum to a minimum within the deposited layer transition region 102$_t$. In some non-limiting examples, the maximum may be at, and/or proximate to, the boundary between the deposited layer transition region 102$_t$ and the deposited layer non-transition part 102$_n$ of the second portion 102. In some non-limiting examples, the minimum may be at, and/or proximate to, the deposited layer edge 435. In some non-limiting examples, the maximum may be the average film thickness $d_3$ in the deposited layer non-transition part 102$_n$ of the second portion 102. In some non-limiting examples, the minimum may be in a range of between about 0-0.1 nm. In some non-limiting examples, the minimum may be the average film thickness $d_3$ in the deposited layer non-transition part 102$_n$ of the second portion 102.

In some non-limiting examples, a profile of the thickness in the deposited layer transition region 102$_t$ may be sloped, and/or follow a gradient. In some non-limiting examples, such profile may be tapered. In some non-limiting examples, the taper may follow a linear, non-linear, parabolic, and/or exponential decaying profile.

Figure 4C:
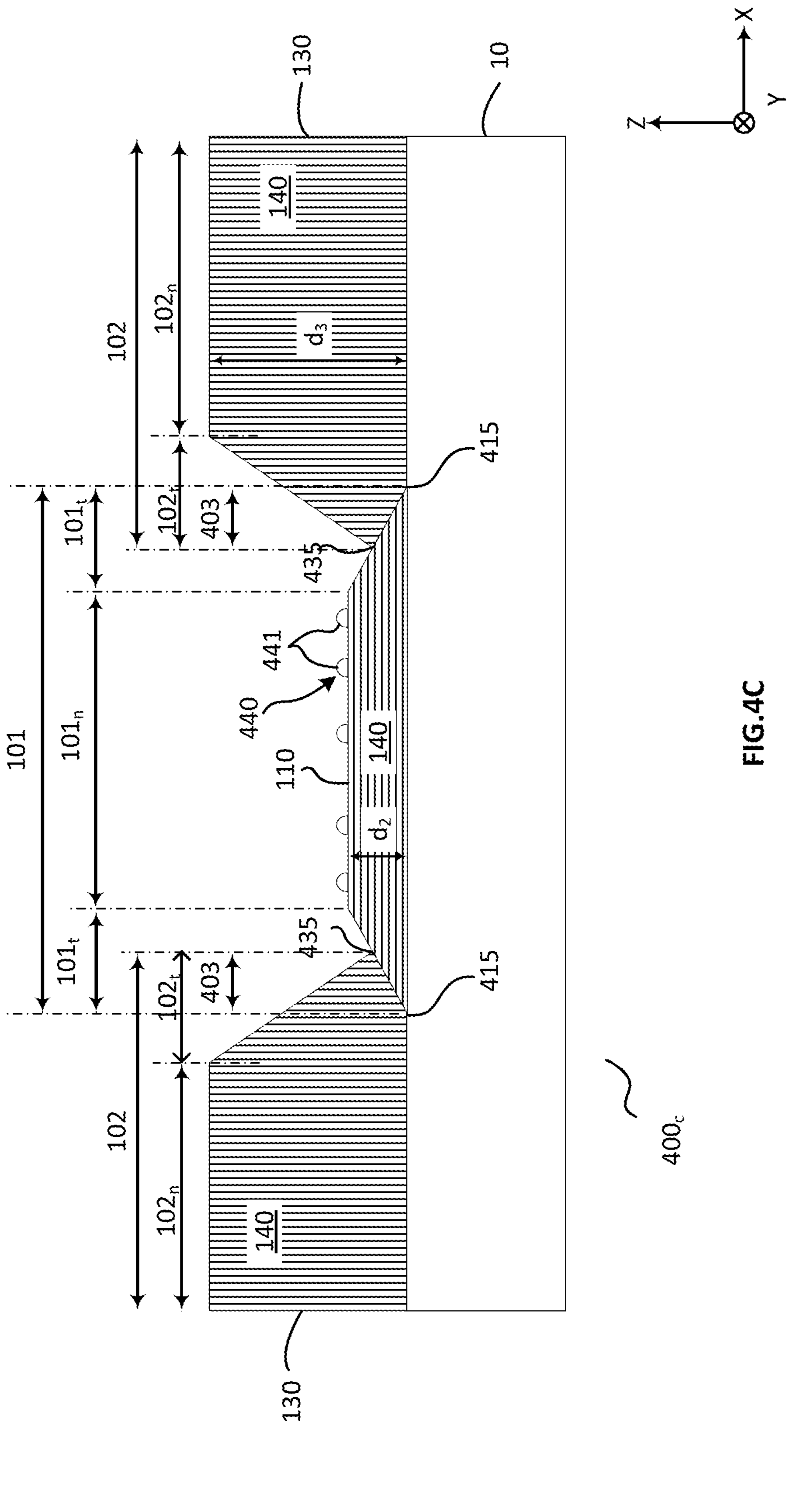
FIG. 4C is a schematic diagram illustrating an example version of the device of FIG. 1 in a cross-sectional view.
Figure 4D:
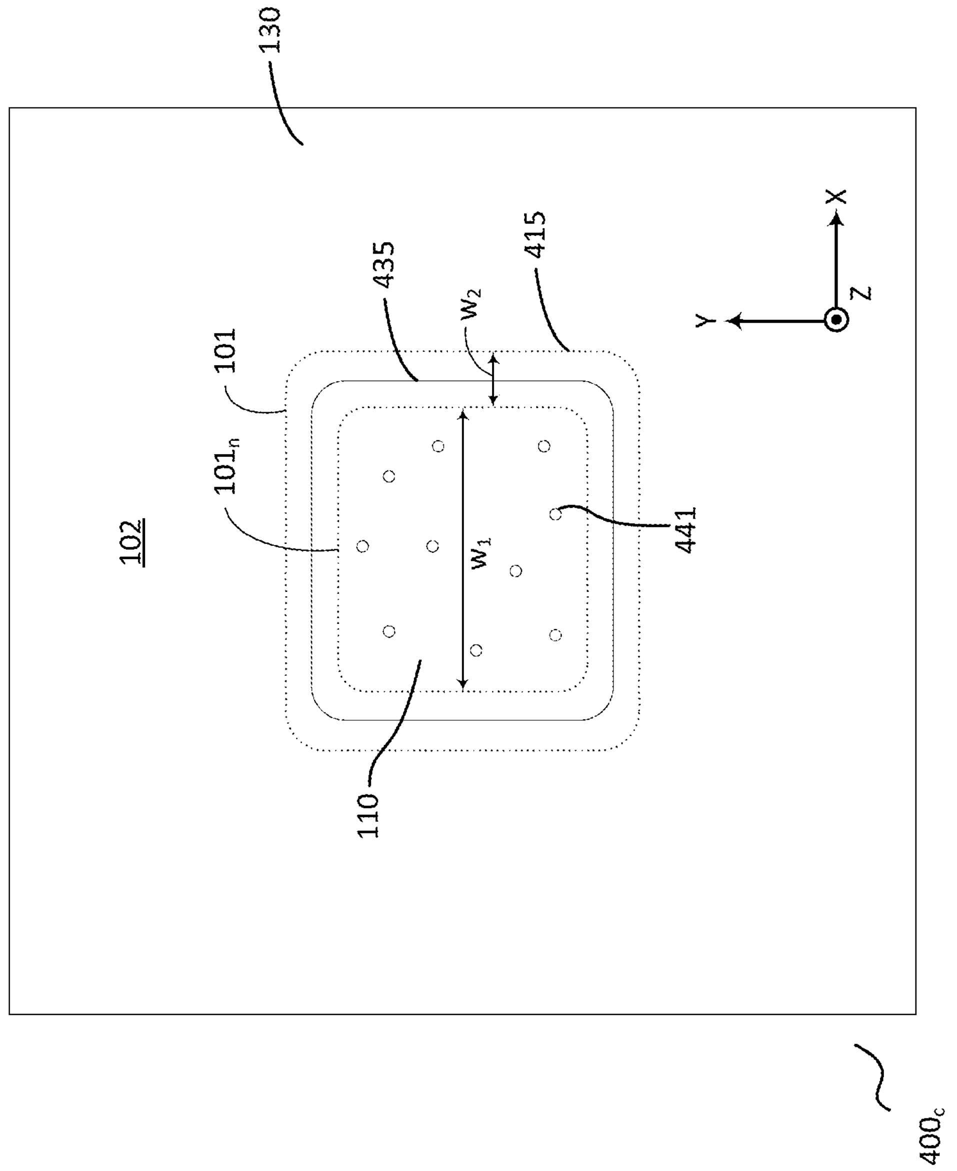
FIG. 4D is a schematic diagram illustrating the device of FIG. 4C in a complementary plan view.
Figure 4E:
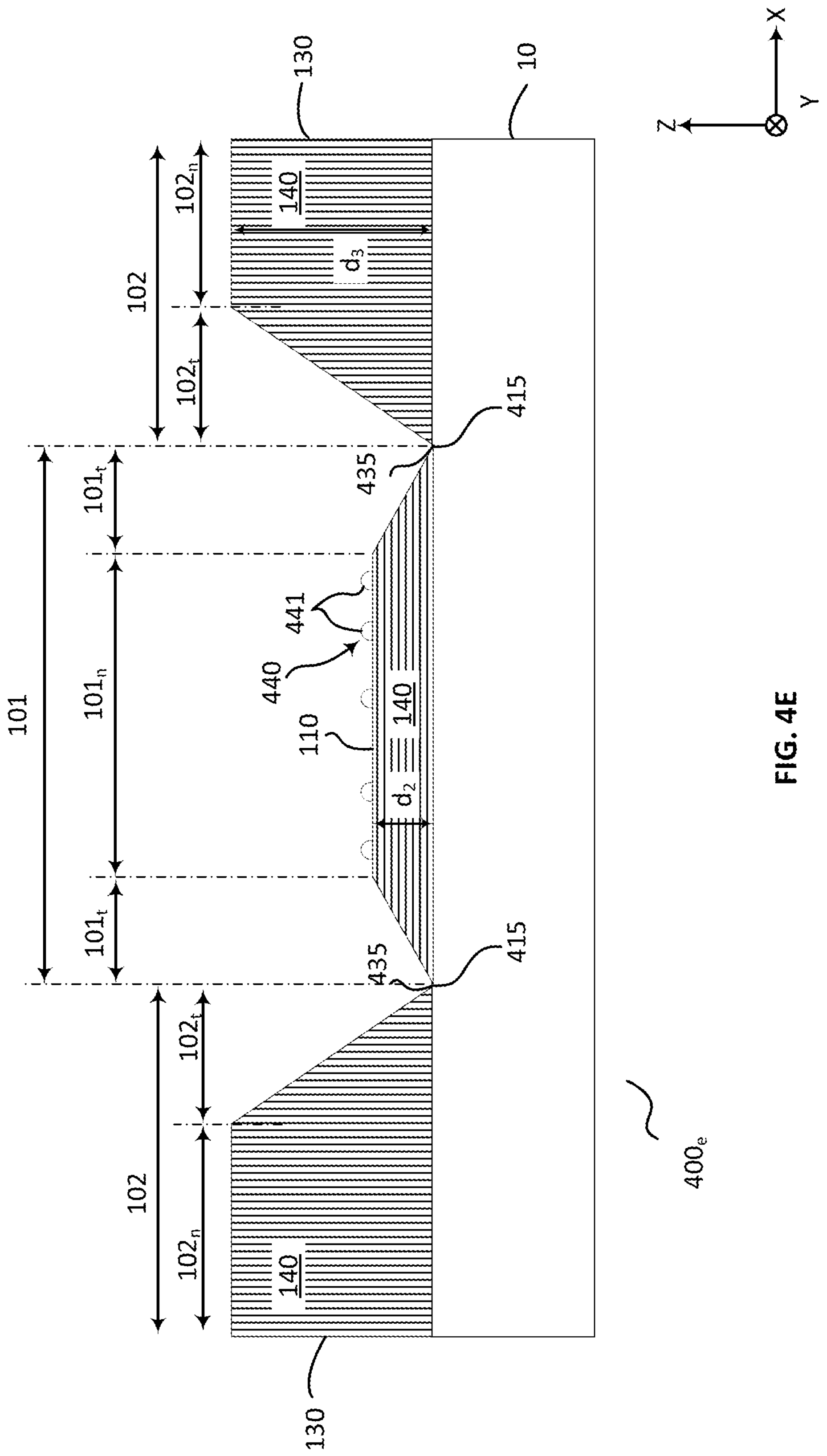
FIG. 4E is a schematic diagram illustrating an example of the device of FIG. 1 in a cross-sectional view.

In some non-limiting examples, as shown by way of non-limiting example in the example version 400$_e$ in FIG. 4E of the device 100, the deposited layer 130 may completely cover the underlying surface in the deposited layer transition region 102$_t$. In some non-limiting examples, the deposited layer 130 may comprise a substantially closed coating 140 in at least a part of the deposited layer transition region 102$_t$. In some non-limiting examples, at least a part of the underlying surface may be uncovered by the deposited layer 130 in the deposited layer transition region 102$_t$.

In some non-limiting examples, the deposited layer 130 may comprise a discontinuous layer 440 in at least a part of the deposited layer transition region 102$_t$.

Those having ordinary skill in the relevant art will appreciate that, while not explicitly illustrated, the patterning material 211 may also be present to some extent at an interface between the deposited layer 130 and an underlying layer. Such material may be deposited as a result of a shadowing effect, in which a deposited pattern is not identical to a pattern of a mask and may, in some non-limiting examples, result in some evaporated patterning material 211 being deposited on a masked part of a target exposed layer surface 11. By way of non-limiting example, such material may form as particle structures 441 and/or as a thin film having a thickness that may be substantially no more than an average thickness of the patterning coating 110.

Overlap

In some non-limiting examples, the deposited layer edge 435 may be spaced apart, in the lateral aspect from the patterning coating transition region 101$_t$ of the first portion 101, such that there is no overlap between the first portion 101 and the second portion 102 in the lateral aspect.

In some non-limiting examples, at least a part of the first portion 101 and at least a part of the second portion 102 may overlap in the lateral aspect. Such overlap may be identified by an overlap portion 403, such as may be shown by way of non-limiting example in FIG. 4A, in which at least a part of the second portion 102 overlaps at least a part of the first portion 101.

Figure 4F:
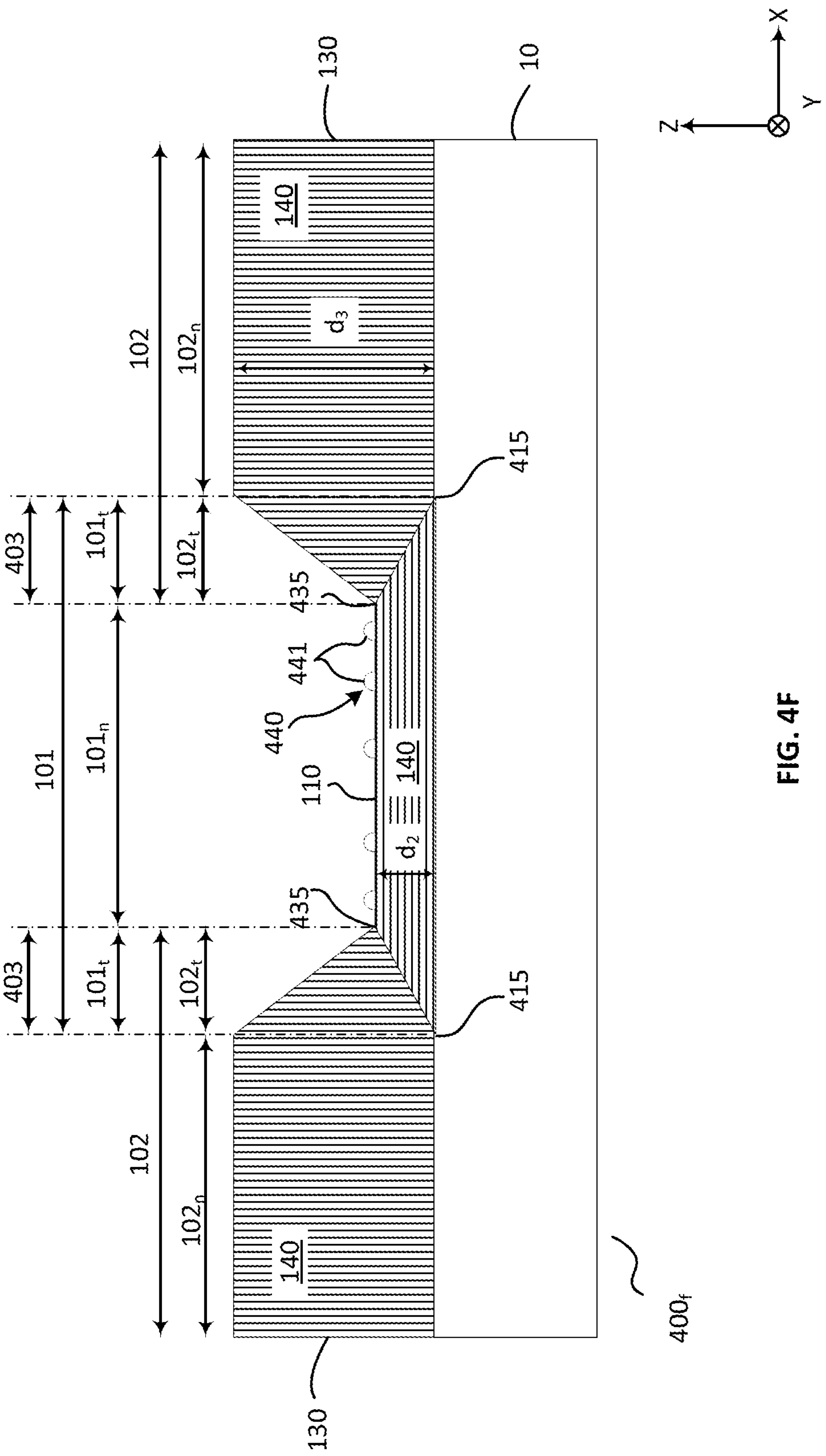
FIG. 4F is a schematic diagram illustrating an example of the device of FIG. 1 in a cross-sectional view.

In some non-limiting examples, as shown by way of non-limiting example in FIG. 4F, at least a part of the deposited layer transition region 102$_t$ may be disposed over at least a part of the patterning coating transition region 101$_t$. In some non-limiting examples, at least a part of the patterning coating transition region 101$_t$ may be substantially devoid of the deposited layer 130, and/or the deposited material 331. In some non-limiting examples, the deposited material 331 may form a discontinuous layer 440 on an exposed layer surface 11 of at least a part of the patterning coating transition region 101$_t$.

Figure 4G:
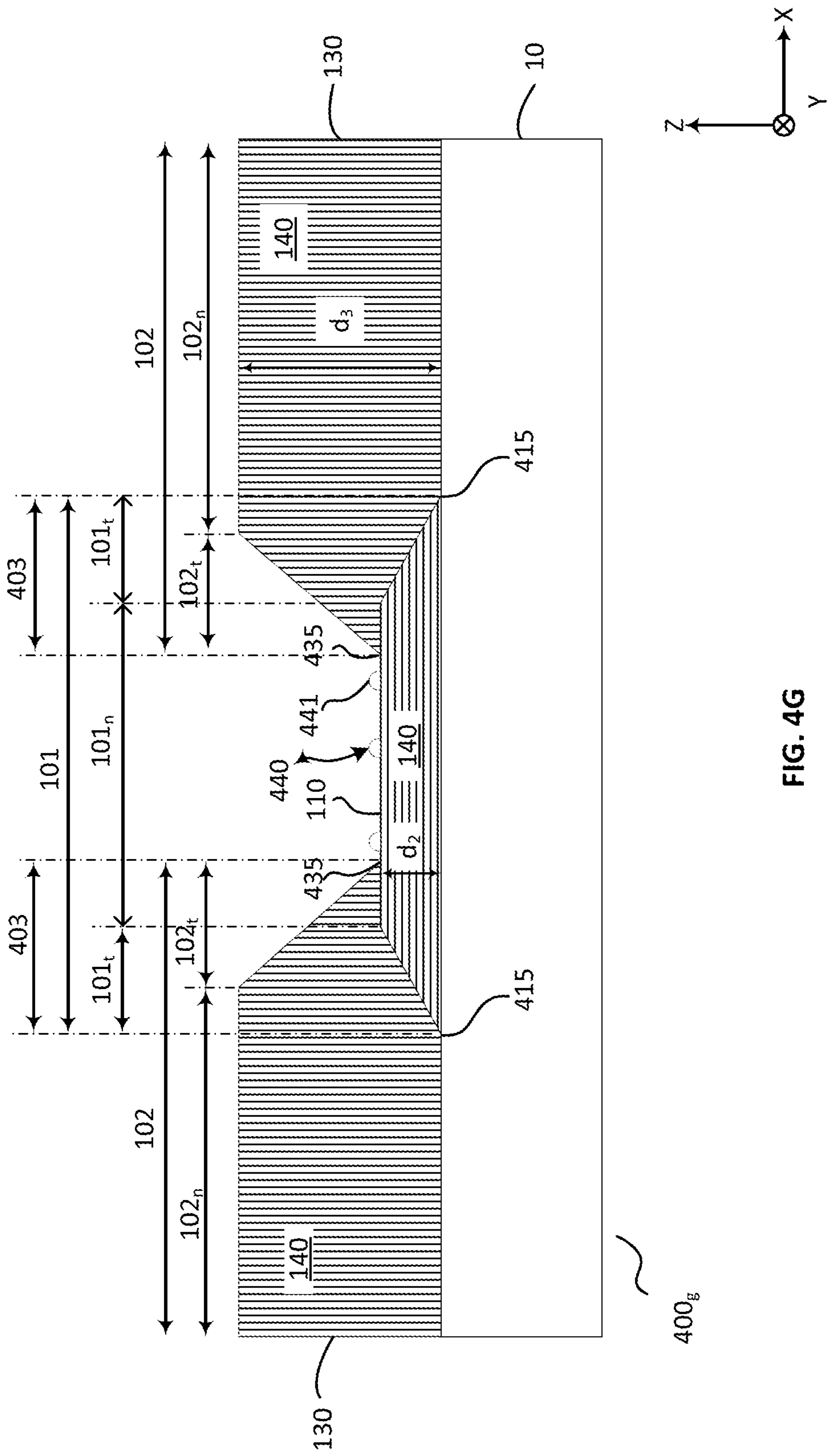
FIG. 4G is a schematic diagram illustrating an example of the device of FIG. 1 in a cross-sectional view.

In some non-limiting examples, as shown by way of non-limiting example in FIG. 4G, at least a part of the deposited layer transition region 102$_t$ may be disposed over at least a part of the patterning coating non-transition part 101$_n$ of the first portion 101.

Although not shown, those having ordinary skill in the relevant art will appreciate that, in some non-limiting examples, the overlap portion 403 may reflect a scenario in which at least a part of the first portion 101 overlaps at least a part of the second portion 102.

Thus, in some non-limiting examples, at least a part of the patterning coating transition region 101$_t$ may be disposed over at least a part of the deposited layer transition region 102$_t$. In some non-limiting examples, at least a part of the deposited layer transition region 102$_t$ may be substantially devoid of the patterning coating 110, and/or the patterning material 211. In some non-limiting examples, the patterning material 211 may form a discontinuous layer 440 on an exposed layer surface of at least a part of the deposited layer transition region 102$_t$.

In some non-limiting examples, at least a part of the patterning coating transition region 101$_t$ may be disposed over at least a part of the deposited layer non-transition part 102$_n$ of the second portion 102.

In some non-limiting examples, the patterning coating edge 415 may be spaced apart, in the lateral aspect, from the deposited layer non-transition part 102$_n$ of the second portion 102.

In some non-limiting examples, the deposited layer 130 may be formed as a single monolithic coating across both the deposited layer non-transition part 102$_n$ and the deposited layer transition region 102$_t$ of the second portion 102.

Edge Effects of Patterning Coatings and Deposited Layers

FIGS. 5A-5I describe various potential behaviours of patterning coatings 110 at a deposition interface with deposited layers 130.

Figure 5A:
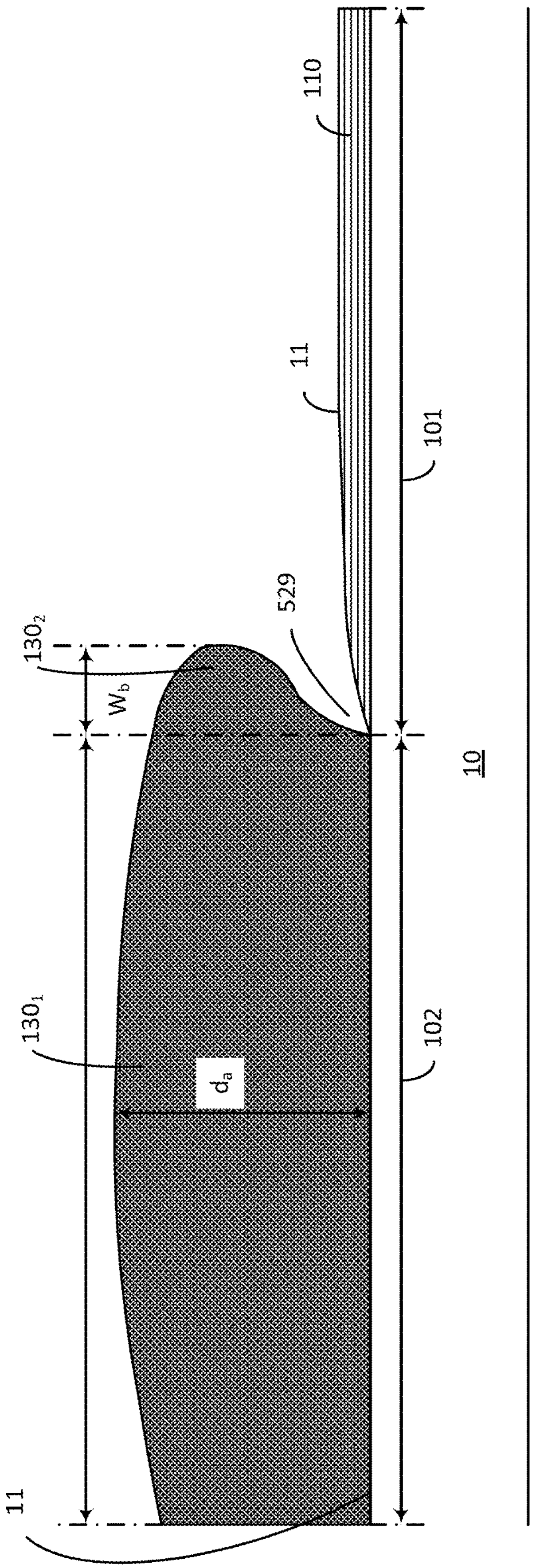
FIGS. 5A-5I are schematic diagrams that show various potential behaviours of an NIC at a deposition interface with a deposited layer in an example version of the device of FIG. 1, according to various examples in the present disclosure.

Turning to FIG. 5A, there may be shown a first example of a part of an example version 500 of the device 100 at a patterning coating deposition boundary. The device 500 may comprise a substrate 10 having an exposed layer surface 11. A patterning coating 110 may be deposited over a first portion 101 of the exposed layer surface 11. A deposited layer 130 may be deposited over a second portion 102 of the exposed layer surface 11. As shown, by way of non-limiting example, the first portion 101 and the second portion 102 may be distinct and non-overlapping parts of the exposed layer surface 11.

The deposited layer 130 may comprise a first part $\mathbf{130}_1$ and a second part $\mathbf{130}_2$. As shown, by way of non-limiting example, the first part $\mathbf{130}_1$ of the deposited layer 130 may substantially cover the second portion 102 and the second part $\mathbf{130}_2$ of the deposited layer 130 may partially project over, and/or overlap a first part of the patterning coating 110.

In some non-limiting examples, since the patterning coating 110 may be formed such that its exposed layer surface 11 exhibits a relatively low initial sticking probability against deposition of the deposited material 331, there may be a gap 529 formed between the projecting, and/or overlapping second part $\mathbf{130}_2$ of the deposited layer 130 and the exposed layer surface 11 of the patterning coating 110. As a result, the second part $\mathbf{130}_2$ may not be in physical contact with the patterning coating 110 but may be spaced-apart therefrom by the gap 529 in a cross-sectional aspect. In some non-limiting examples, the first part $\mathbf{130}_1$ of the deposited layer 130 may be in physical contact with the patterning coating 110 at an interface, and/or boundary between the first portion 101 and the second portion 102.

In some non-limiting examples, the projecting, and/or overlapping second part $\mathbf{130}_2$ of the deposited layer 130 may extend laterally over the patterning coating 110 by a comparable extent as an average layer thickness $d_a$ of the first part $\mathbf{130}_1$ of the deposited layer 130. By way of non-limiting example, as shown, a width $w_b$ of the second part $\mathbf{130}_2$ may be comparable to the average layer thickness $d_a$ of the first part $\mathbf{130}_1$. In some non-limiting examples, a ratio of a width $w_b$ of the second part $\mathbf{130}_2$ by an average layer thickness $d_a$ of the first part $\mathbf{130}_1$ may be in a range of at least one of between about: 1:1-1:3, 1:1-1:1.5, or 1:1-1:2. While the average layer thickness $d_a$ may in some non-limiting examples be relatively uniform across the first part $\mathbf{130}_1$, in some non-limiting examples, the extent to which the second part $\mathbf{130}_2$ may project, and/or overlap with the patterning coating 110 (namely $w_b$) may vary to some extent across different parts of the exposed layer surface 11.

Figure 5B:
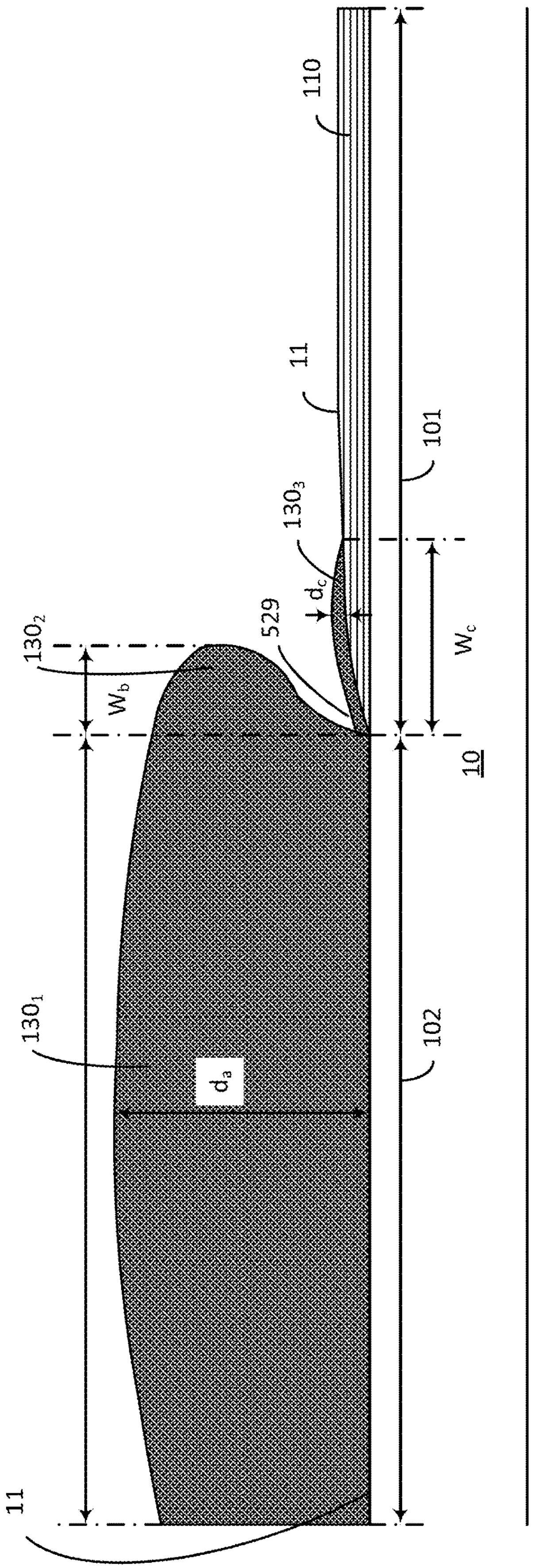

Turning now to FIG. 5B, the deposited layer 130 may be shown to include a third part $\mathbf{130}_3$ disposed between the second part $\mathbf{130}_2$ and the patterning coating 110. As shown, the second part $\mathbf{130}_2$ of the deposited layer 130 may extend laterally over and is longitudinally spaced apart from the third part $\mathbf{130}_3$ of the deposited layer 130 and the third part $\mathbf{130}_3$ may be in physical contact with the exposed layer surface 11 of the patterning coating 110. An average layer thickness $d_c$ of the third part $\mathbf{130}_3$ of the deposited layer 130 may be no more than, and in some non-limiting examples, substantially less than, the average layer thickness $d_a$ of the first part $\mathbf{130}_1$ thereof. In some non-limiting examples, a width $w_c$ of the third part $\mathbf{130}_3$ may exceed the width $w_b$ of the second part $\mathbf{130}_2$. In some non-limiting examples, the third part $\mathbf{130}_3$ may extend laterally to overlap the patterning coating 110 to a greater extent than the second part $\mathbf{130}_2$. In some non-limiting examples, a ratio of a width $w_c$ of the third part $\mathbf{130}_3$ by an average layer thickness $d_a$ of the first part $\mathbf{130}_1$ may be in a range of at least one of between about: 1:2-3:1, or 1:1.2-2.5:1. While the average layer thickness $d_a$ may in some non-limiting examples be relatively uniform across the first part $\mathbf{130}_1$, in some non-limiting examples, the extent to which the third part $\mathbf{130}_3$ may project, and/or overlap with the patterning coating 110 (namely $w_c$) may vary to some extent across different parts of the exposed layer surface 11.

In some non-limiting examples, the average layer thickness $d_c$ of the third part $\mathbf{130}_3$ may not exceed about 5% of the average layer thickness $d_a$ of the first part $\mathbf{130}_1$. By way of non-limiting example, $d_c$ may be no more than at least one of about: 4%, 3%, 2%, 1%, or 0.5% of $d_a$. Instead of, and/or in addition to, the third part $\mathbf{130}_3$ being formed as a thin film, as shown, the deposited material 331 of the deposited layer 130 may form as particle structures 441 on a part of the patterning coating 110. By way of non-limiting example, such particle structures 441 may comprise features that are physically separated from one another, such that they do not form a continuous layer.

Figure 5C:
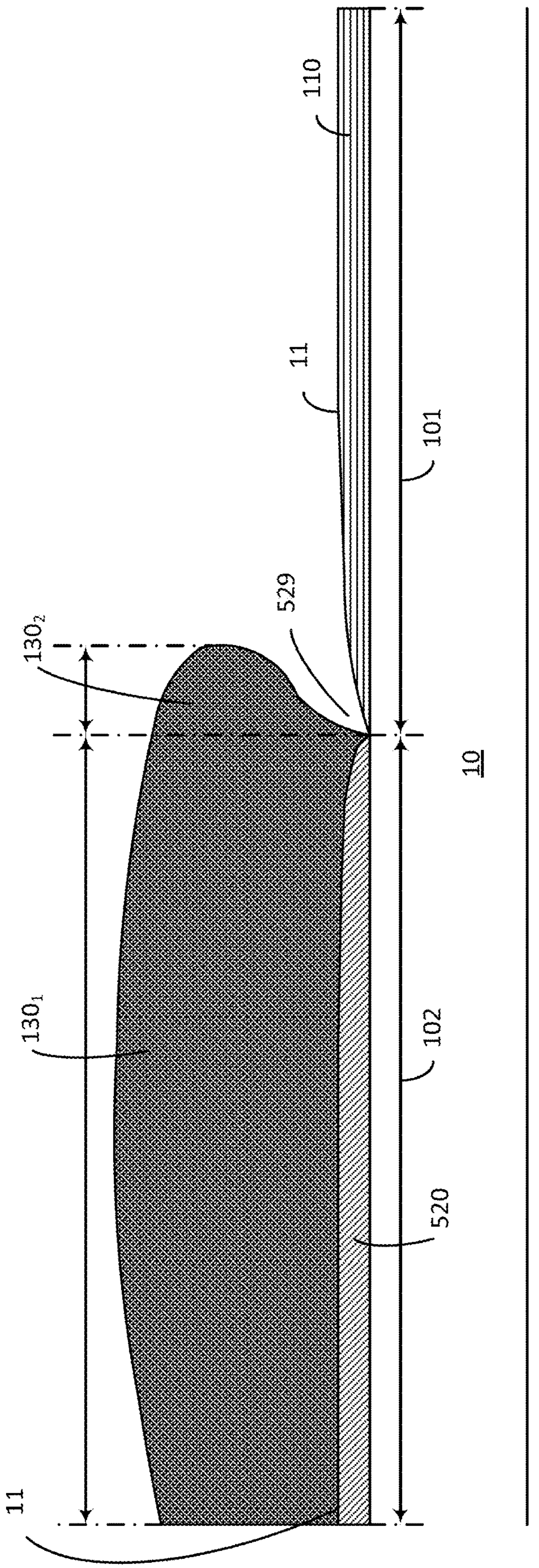

Turning now to FIG. 5C, an NPC 520 may be disposed between the substrate 10 and the deposited layer 130. The NPC 520 may be disposed between the first part $\mathbf{130}_1$ of the deposited layer 130 and the second portion 102 of the substrate 10. The NPC 520 is illustrated as being disposed on the second portion 102 and not on the first portion 101, where the patterning coating 110 has been deposited. The NPC 520 may be formed such that, at an interface, and/or boundary between the NPC 520 and the deposited layer 130, a surface of the NPC 520 may exhibit a relatively high initial sticking probability against deposition of the deposited material 331. As such, the presence of the NPC 520 may promote the formation, and/or growth of the deposited layer 130 during deposition.

Figure 5D:
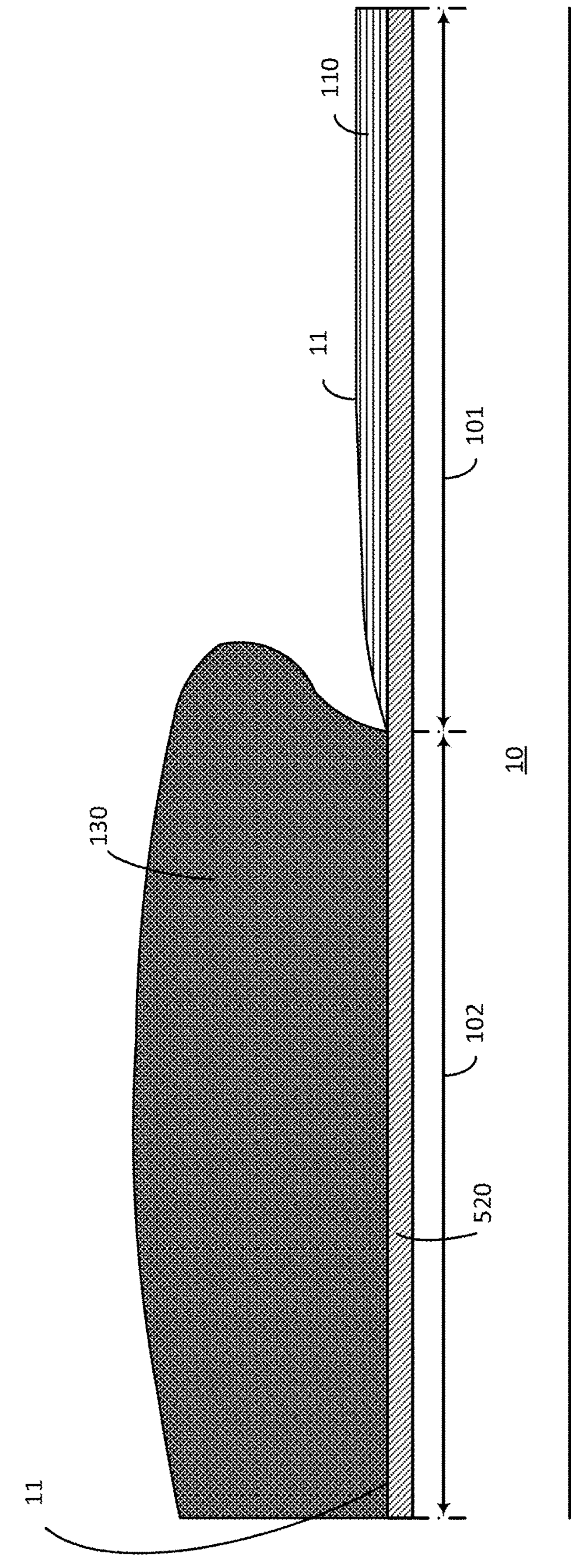

Turning now to FIG. 5D, the NPC 520 may be disposed on both the first portion 101 and the second portion 102 of the substrate 10 and the patterning coating 110 may cover a part of the NPC 520 disposed on the first portion 101. Another part of the NPC 520 may be substantially devoid of the patterning coating 110 and the deposited layer 130 may cover such part of the NPC 520.

Figure 5E:
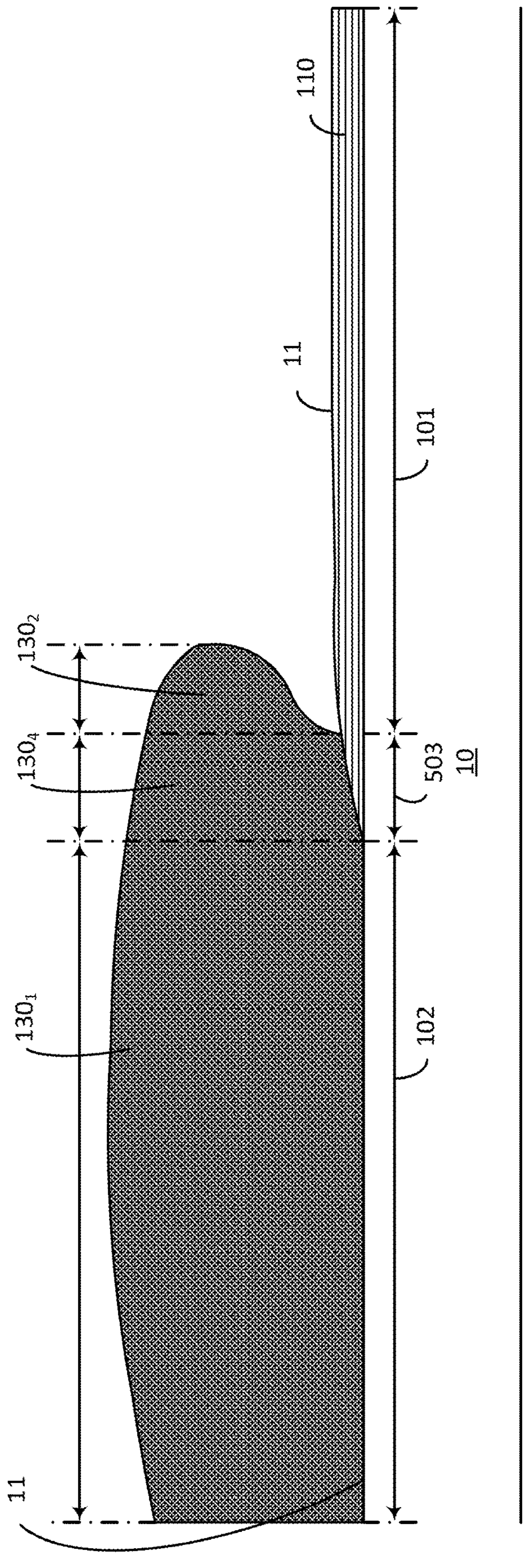

Turning now to FIG. 5E, the deposited layer 130 may be shown to partially overlap a part of the patterning coating 110 in a third portion 503 of the substrate 10. In some non-limiting examples, in addition to the first part $\mathbf{130}_1$ and the second part $\mathbf{130}_2$, the deposited layer 130 may further include a fourth part 1304. As shown, the fourth part 1304 of the deposited layer 130 may be disposed between the first part $\mathbf{103}_1$ and the second part $\mathbf{130}_2$ of the deposited layer 130 and the fourth part 1304 may be in physical contact with the exposed layer surface 11 of the patterning coating 110. In some non-limiting examples, the overlap in the third portion 503 may be formed as a result of lateral growth of the deposited layer 130 during an open mask and/or mask-free deposition process. In some non-limiting examples, while the exposed layer surface 11 of the patterning coating 110 may exhibit a relatively low initial sticking probability against deposition of the deposited material 331, and thus a probability of the material nucleating on the exposed layer surface 11 may be low, as the deposited layer 130 grows in thickness, the deposited layer 130 may also grow laterally and may cover a subset of the patterning coating 110 as shown.

Figure 5F:
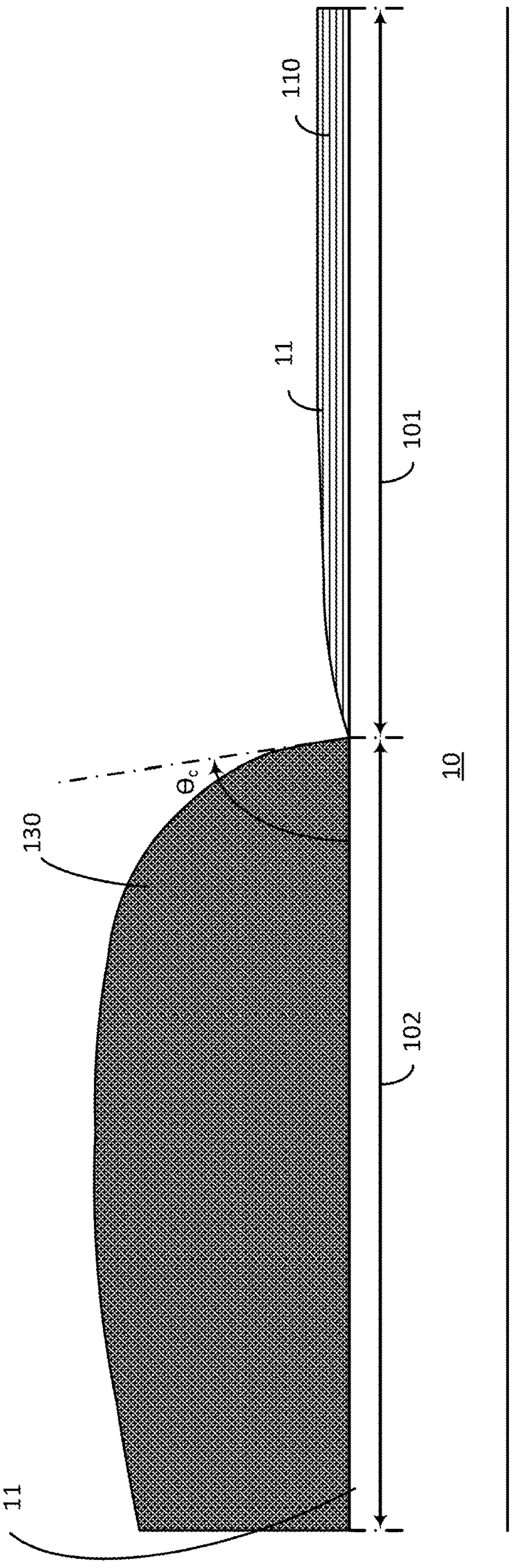

Turning now to FIG. 5F the first portion 101 of the substrate 10 may be coated with the patterning coating 110 and the second portion 102 adjacent thereto may be coated with the deposited layer 130. In some non-limiting examples, it has been observed that conducting an open mask and/or mask-free deposition of the deposited layer 130 may result in the deposited layer 130 exhibiting a tapered cross-sectional profile at, and/or near an interface between the deposited layer 130 and the patterning coating 110.

In some non-limiting examples, an average layer thickness of the deposited layer 130 at, and/or near the interface may be less than an average film thickness $d_3$ of the deposited layer 130. While such tapered profile may be shown as being curved, and/or arched, in some non-limiting examples, the profile may, in some non-limiting examples be substantially linear, and/or non-linear. By way of non-limiting example, an average film thickness $d_3$ of the deposited layer 130 may decrease, without limitation, in a substantially linear, exponential, and/or quadratic fashion in a region proximal to the interface.

It has been observed that a contact angle $\theta_c$ of the deposited layer 130 at, and/or near the interface between the deposited layer 130 and the patterning coating 110 may vary, depending on properties of the patterning coating 110, such as a relative initial sticking probability. It may be further postulated that the contact angle $\theta_c$ of the nuclei may, in some non-limiting examples, dictate the thin film contact angle of the deposited layer 130 formed by deposition. Referring to FIG. 5F by way of non-limiting example, the contact angle $\theta_c$ may be determined by measuring a slope of a tangent of the deposited layer 130 at and/or near the interface between the deposited layer 130 and the patterning coating 110. In some non-limiting examples, where the cross-sectional taper profile of the deposited layer 130 may be substantially linear, the contact angle $\theta_c$ may be determined by measuring the slope of the deposited layer 130 at, and/or near the interface. As will be appreciated by those having ordinary skill in the relevant art, the contact angle $\theta_c$ may be generally measured relative to a non-zero angle of the underlying layer. In the present disclosure, for purposes of simplicity of illustration, the patterning coating 110 and the deposited layer 130 may be shown deposited on a planar surface. However, those having ordinary skill in the relevant art will appreciate that the patterning coating 110 and the deposited layer 130 may be deposited on non-planar surfaces.

Figure 5G:
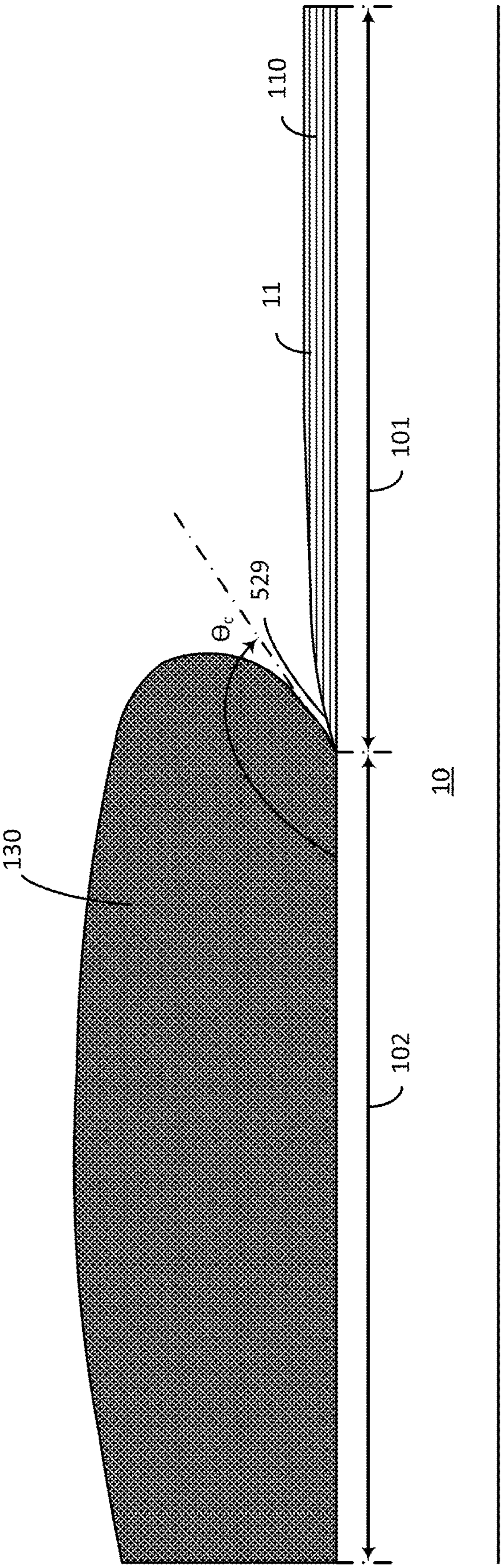

In some non-limiting examples, the contact angle $\theta_c$ of the deposited layer 130 may exceed about 90°. Referring now to FIG. 5G, by way of non-limiting example, the deposited layer 130 may be shown as including a part extending past the interface between the patterning coating 110 and the deposited layer 130 and may be spaced apart from the patterning coating 110 by a gap 529. In such non-limiting scenario, the contact angle $\theta_c$ may, in some non-limiting examples, exceed 90°.

In some non-limiting examples, it may be advantageous to form a deposited layer 130 exhibiting a relatively high contact angle $\theta_c$. By way of non-limiting example, the contact angle $\theta_c$ may exceed at least one of about: 10°, 15°, 20°, 25°, 30°, 35°, 40°, 50°, 70°, 75°, or 80°. By way of non-limiting example, a deposited layer 130 having a relatively high contact angle $\theta_c$ may allow for creation of finely patterned features while maintaining a relatively high aspect ratio. By way of non-limiting example, there may be an aim to form a deposited layer 130 exhibiting a contact angle $\theta_c$ greater than about 90°. By way of non-limiting example, the contact angle $\theta_c$ may exceed at least one of about: 90°, 95°, 100°, 105°, 110° 120°, 130°, 135°, 140°, 145°, 150°, or 170°.

Figure 5H:
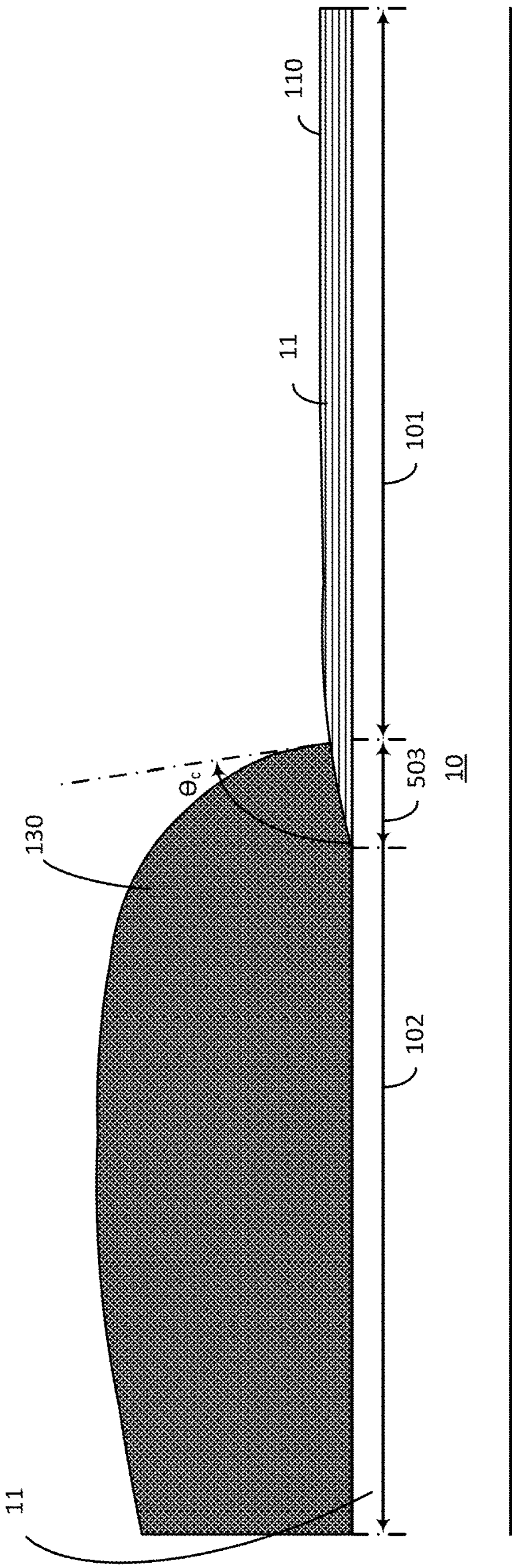
Figure 5I:
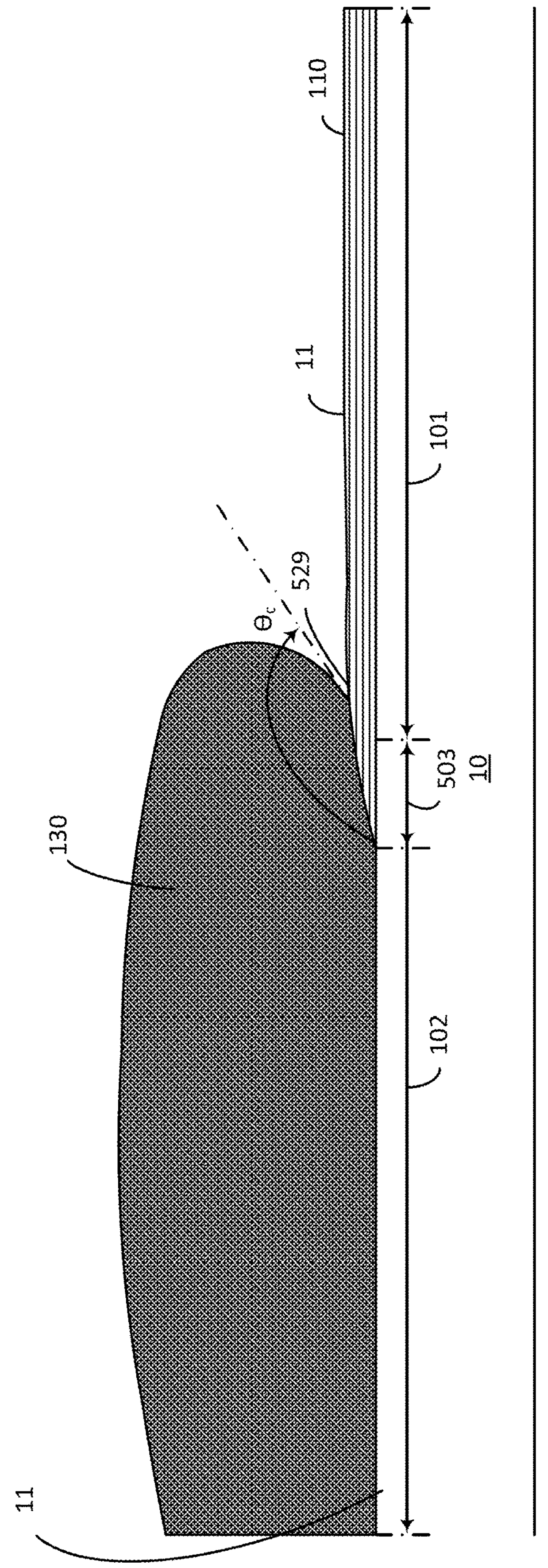

Turning now to FIGS. 5H-5I, the deposited layer 130 may partially overlap a part of the patterning coating 110 in the third portion 503 of the substrate 10, which may be disposed between the first portion 101 and the second portion 102 thereof. As shown, the subset of the deposited layer 130 partially overlapping a subset of the patterning coating 110 may be in physical contact with the exposed layer surface 11 thereof. In some non-limiting examples, the overlap in the third portion 503 may be formed because of lateral growth of the deposited layer 130 during an open mask and/or mask-free deposition process. In some non-limiting examples, while the exposed layer surface 11 of the patterning coating 110 may exhibit a relatively low initial sticking probability against deposition of the deposited material 331 and thus the probability of the material nucleating on the exposed layer surface 11 is low, as the deposited layer 130 grows in thickness, the deposited layer 130 may also grow laterally and may cover a subset of the patterning coating 110.

In the case of FIGS. 5H-5I, the contact angle $\theta_c$ of the deposited layer 130 may be measured at an edge thereof near the interface between it and the patterning coating 110, as shown. In FIG. 5I, the contact angle $\theta_c$ may exceed about 90°, which may in some non-limiting examples result in a subset of the deposited layer 130 being spaced apart from the patterning coating 110 by the gap 529.

Particle Structure

A nanoparticle (NP) is a particle structure 441 of matter whose predominant characteristic size is of nanometer (nm) scale, generally understood to be between about: 1-300 nm. At nm scale, NPs of a given material may possess unique properties (including without limitation, optical, chemical, physical, and/or electrical) relative to the same material in bulk form.

These properties may be exploited when a plurality of NPs is formed into a layer of a layered semiconductor device, including without limitation, an opto-electronic device, to improve its performance.

Current mechanisms for introducing such a layer of NPs into a device have some drawbacks.

First, typically, such NPs are formed into a close-packed layer, and/or dispersed into a matrix material, of such device. Consequently, the thickness of such an NP layer may be typically much thicker than the characteristic size of the NPs themselves. The thickness of such NP layer may impart undesirable characteristics in terms of device performance, device stability, device reliability, and/or device lifetime that may reduce or even obviate any perceived advantages provided by the unique properties of NPs.

Second, techniques to synthesize NPs, in and for use in such devices may introduce large amounts of carbon (C), oxygen (O), and/or sulfur (S) through various mechanisms.

By way of non-limiting example, wet chemical methods may be typically used to introduce NPs that have a precisely controlled characteristic size, size distribution, shape, surface coverage, configuration, and/or deposited density into a device. However, such methods typically employ an organic capping group (such as the synthesis of citrate-capped silver (Ag) NPs) to stabilize the NPs, but such organic capping groups introduce C, O, and/or S, into the synthesized NPs.

Still further, an NP layer deposited from solution may typically comprise C, O, and/or S, because of the solvents used in deposition.

Additionally, these elements may be introduced as contaminants during the wet chemical process and/or the deposition of the NP layer.

However introduced, the presence of a high amount of C, O, and/or S, in the NP layer of such a device, may erode the performance, stability, reliability, and/or lifetime of such device.

Third, when depositing an NP layer from solution, as the employed solvents dry, the NP layer tends to have non-uniform properties across the NP layer, and/or between different patterned regions of such layer. In some non-limiting examples, an edge of a given NP layer may be considerably thicker or thinner than an internal region of such NP layer, which disparities may adversely impact the device performance, stability, reliability, and/or lifetime.

Fourth, while there are other methods and/or processes, beyond wet chemical synthesis and solution deposition processes, of synthesizing and/or depositing NPs, including without limitation, a vacuum-based process such as, without limitation, PVD, existing methods tend to provide poor control of the characteristic size, size distribution, shape, surface coverage, configuration, deposited density, and/or dispersity of the NPs deposited thereby. By way of non-limiting example, in a conventional PVD process, the NPs tend to form a close-packed film as their size increases. As a result, methods such as conventional PVD methods are generally not well-suited to form an NP layer of large disperse NPs with low surface coverage. Rather, the poor control of characteristic size, size distribution, shape, surface coverage, configuration, and/or deposited density, imparted by such conventional methods may result in poor device performance, stability, reliability, and/or lifetime.

In some non-limiting examples, such as may be shown in FIG. 4C, there may be at least one particle, including without limitation, a nanoparticle (NP), an island, a plate, a disconnected cluster, and/or a network (collectively particle structure 441) disposed on an exposed layer surface 11 of an underlying layer. In some non-limiting examples, the underlying layer may be the patterning coating 110 in the first portion 101. In some non-limiting examples, the at least one particle structure 441 may be disposed on an exposed layer surface 11 of the patterning coating 110. In some non-limiting examples, there may be a plurality of such particle structures 441.

In some non-limiting examples, the at least one particle structure 441 may comprise a particle material. In some non-limiting examples, the particle material may be the same as the deposited material 331 in the deposited layer.

In some non-limiting examples, the particle material in the discontinuous layer 440 in the first portion 101, the deposited material 331 in the deposited layer 130, and/or a material of which the underlying layer thereunder may be comprised, may comprise a common metal.

In some non-limiting examples, the particle material may comprise an element selected from at least one of: K, Na, Li, Ba, Cs, Yb, Ag, Au, Cu, Al, Mg, Zn, Cd, Sn, or Y. In some non-limiting examples, the element may comprise at least one of: K, Na, Li, Ba, Cs, Yb, Ag, Au, Cu, Al, or Mg. In some non-limiting examples, the element may comprise at least one of: Cu, Ag, or Au. In some non-limiting examples, the element may be Cu. In some non-limiting examples, the element may be Al. In some non-limiting examples, the element may comprise at least one of: Mg, Zn, Cd, or Yb. In some non-limiting examples, the element may comprise at least one of: Mg, Ag, Al, Yb, or Li. In some non-limiting examples, the element may comprise at least one of: Mg, Ag, or Yb. In some non-limiting examples, the element may comprise at least one of: Mg, or Ag. In some non-limiting examples, the element may be Ag.

In some non-limiting examples, the particle material may comprise a pure metal. In some non-limiting examples, the at least one particle structure 441 may be a pure metal. In some non-limiting examples, the at least one particle structure 441 may be at least one of: pure Ag or substantially pure Ag. In some non-limiting examples, the substantially pure Ag may have a purity of at least one of at least about: 95%, 99%, 99.9%, 99.99%, 99.999%, or 99.9995%. In some non-limiting examples, the at least one particle structure 441 may be at least one of: pure Mg or substantially pure Mg. In some non-limiting examples, the substantially pure Mg may have a purity of at least one of at least about: 95%, 99%, 99.9%, 99.99%, 99.999%, or 99.9995%.

In some non-limiting examples, the at least one particle structure 441 may comprise an alloy. In some non-limiting examples, the alloy may be at least one of: an Ag-containing alloy, an Mg-containing alloy, or an AgMg-containing alloy. In some non-limiting examples, the AgMg-containing alloy may have an alloy composition that may range from about 1:10 (Ag:Mg) to about 10:1 by volume.

In some non-limiting examples, the particle material may comprise other metals in place of, or in combination with Ag. In some non-limiting examples, the particle material may comprise an alloy of Ag with at least one other metal. In some non-limiting examples, the particle material may comprise an alloy of Ag with at least one of: Mg, or Yb. In some non-limiting examples, such alloy may be a binary alloy having a composition of between about: 5-95 vol. % Ag, with the remainder being the other metal. In some non-limiting examples, the particle material may comprise Ag and Mg. In some non-limiting examples, the particle material may comprise an Ag:Mg alloy having a composition of between about 1:10-10:1 by volume. In some non-limiting examples, the particle material may comprise Ag and Yb. In some non-limiting examples, the particle material may comprise a Yb:Ag alloy having a composition of between about 1:20-10:1 by volume. In some non-limiting examples, the particle material may comprise Mg and Yb. In some non-limiting examples, the particle material may comprise an Mg:Yb alloy. In some non-limiting examples, the particle material may comprise an Ag:Mg:Yb alloy.

In some non-limiting examples, the at least one particle structure 441 may comprise at least one additional element. In some non-limiting examples, such additional element may be a non-metallic element. In some non-limiting examples, the non-metallic material may be at least one of: O, S, N, or C. It will be appreciated by those having ordinary skill in the relevant art that, in some non-limiting examples, such additional element(s) may be incorporated into the at least one particle structure 441 as a contaminant, due to the presence of such additional element(s) in the source material, equipment used for deposition, and/or the vacuum chamber environment. In some non-limiting examples, such additional element(s) may form a compound together with other element(s) of the at least one particle structure 441. In some non-limiting examples, a concentration of the non-metallic element in the particle material may be no more than at least one of about: 1%, 0.1%, 0.01%, 0.001%, 0.0001%, 0.00001%, 0.000001%, or 0.0000001%. In some non-limiting examples, the at least one particle structure 441 may have a composition in which a combined amount of O and C therein is no more than at least one of about: 10%, 5%, 1%, 0.1%, 0.01%, 0.001%, 0.0001%, 0.00001%, 0.000001%, or 0.0000001%.

The at least one particle 441 take advantage of plasmonics, a branch of nanophotonics, which studies the resonant interaction of EM radiation with metals. Those having ordinary skill in the relevant art will appreciate that metal NPs may exhibit LSP excitations and/or coherent oscillations of free electrons, whose optical response may be tailored by varying a characteristic size, size distribution, shape, surface coverage, configuration, deposited density, and/or composition of the nanostructures. Such optical response, in respect of particle structures 441, may include absorption of EM radiation incident thereon, thereby reducing reflection thereof and/or shifting to a lower or higher wavelength ((sub-) range) of the EM spectrum, including without limitation, the visible spectrum, and/or a sub-range thereof.

It has also been reported that arranging certain metal NPs near a medium having relatively low refractive index, may shift the absorption spectrum of such NPs to a lower wavelength (sub-) range (blue-shifted).

Accordingly, it may be further postulated that disposing particle material, in some non-limiting examples, as a discontinuous layer 440 of at least one particle structure 441 on an exposed layer surface 11 of an underlying layer, such that the at least one particle structure 441 is in physical contact with the underlying layer, may, in some non-limiting examples, favorably shift the absorption spectrum of the particle material, including without limitation, blue-shift, such that it does not substantially overlap with a wavelength range of the EM spectrum of EM radiation being emitted by and/or transmitted at least partially through the device 100.

In some non-limiting examples, a peak absorption wavelength of the at least one particle structure 441 may be less than a peak wavelength of the EM radiation being emitted by and/or transmitted at least partially through the device 100. By way of non-limiting example, the particle material may exhibit a peak absorption at a wavelength (range) that is at least one of no more than about: 470 nm, 460 nm, 455 nm, 450 nm, 445 nm, 440 nm, 430 nm, 420 nm, or 400 nm.

It has now been found, somewhat surprisingly, that providing particle material, including without limitation, in the form of at least one particle structure 441, including without limitation, those comprised of a metal, within and/or proximate to the at least one low(er)-index coating, may further impact the absorption and/or transmittance of EM radiation passing through the device 100, including without limitation, in the first direction, in at least a wavelength (sub-) range of the EM spectrum, including without limitation, the visible spectrum, and/or a sub-range thereof, passing in the first direction from and/or through the at least one low(er)-index layer(s), the at least one particle structure(s) 441, and across the index interface.

In some non-limiting examples, absorption may be reduced, and/or transmittance may be facilitated, in at least a wavelength (sub-) range of the EM spectrum, including without limitation, the visible spectrum, and/or a sub-range thereof.

In some non-limiting examples, the absorption may be concentrated in an absorption spectrum that is a wavelength (sub-) range of the EM spectrum, including without limitation, the visible spectrum, and/or a sub-range thereof.

In some non-limiting examples, the absorption spectrum may be blue-shifted and/or shifted to a higher wavelength (sub-) range (red-shifted), including without limitation, to a wavelength (sub-) range of the EM spectrum, including without limitation, the visible spectrum, and/or a sub-range thereof, and/or to a wavelength (sub-) range of the EM spectrum that lies, at least in part, beyond the visible spectrum.

Those having ordinary skill in the relevant art will appreciate that in some non-limiting examples, a plurality of layers of at least one particle 441 may be disposed on one another, whether or not separated by additional layers, with varying lateral aspects and having different absorption spectra. In this fashion, the absorption of certain regions of the device may be tuned according to one or more desired absorption spectra.

In some non-limiting examples, the presence of the at least one particle structure 441, including without limitation, NPs, including without limitation, in a discontinuous layer 440, on an exposed layer surface 11 of the patterning coating 110 may affect some optical properties of the device 100.

In some non-limiting examples, such plurality of particle structures 441 may form a discontinuous layer 440.

Without wishing to be limited to any particular theory, it may be postulated that, while the formation of a closed coating 140 of the particle material may be substantially inhibited by and/or on the patterning coating 110, in some non-limiting examples, when the patterning coating 110 is exposed to deposition of the particle material thereon, some vapor monomers of the particle material may ultimately form at least one particle structure 441 of the particle material thereon.

In some non-limiting examples, at least some of the particle structures 441 may be disconnected from one another. In other words, in some non-limiting examples, the discontinuous layer 440 may comprise features, including particle structures 441, that may be physically separated from one another, such that the particle structures 441 do not form a closed coating 140. Accordingly, such discontinuous layer 440 may, in some non-limiting examples, thus comprise a thin disperse layer of particle material formed as particle structures 441, inserted at, and/or substantially across the lateral extent of, an interface between the patterning coating 110 and at least one covering layer in the device 100.

In some non-limiting examples, at least one of the particle structures 441 of particle material may be in physical contact with an exposed layer surface 11 of the patterning coating 110. In some non-limiting examples, substantially all of the particle structures 441 of particle material may be in physical contact with the exposed layer surface 11 of the patterning coating 110.

Without wishing to be bound by any particular theory, it has been found, somewhat surprisingly, that the presence of such a thin, disperse discontinuous layer 440 of particle material, including without limitation, at least one particle structure 441, including without limitation, metal particle structures 441, on an exposed layer surface 11 of the patterning coating 110, may exhibit at least one varied characteristic and concomitantly, varied behaviour, including without limitation, optical effects and properties of the device 100, as discussed herein. In some non-limiting examples, such effects and properties may be controlled to some extent by judicious selection of at least one of: the characteristic size, size distribution, shape, surface coverage, configuration, deposited density, and/or dispersity of the particle structures 441 on the patterning coating 110.

In some non-limiting examples, the particle structures 441 may be controllably selected so as to have a characteristic size, length, width, diameter, height, size distribution, shape, surface coverage, configuration, deposited density, dispersity, and/or composition to achieve an effect related to an optical response exhibited by the particle structures 441.

Those having ordinary skill in the relevant art will appreciate that, having regard to the mechanism by which materials are deposited, due to possible stacking and/or clustering of monomers and/or atoms, an actual size, height, weight, thickness, shape, profile, and/or spacing thereof, the at least one particle structure 441 may be, in some non-limiting examples, substantially non-uniform. Additionally, although the at least one particle structure 441 are illustrated as having a given profile, this is intended to be illustrative only, and not determinative of any size, height, weight, thickness, shape, profile, and/or spacing thereof.

In some non-limiting examples, the at least one particle structure 441 may have a characteristic dimension of no more than about 200 nm. In some non-limiting examples, the at least one particle structure 441 may have a characteristic diameter that may be at least one of between about: 1-200 nm, 1-160 nm, 1-100 nm, 1-50 nm, or 1-30 nm.

In some non-limiting examples, the at least one particle structure 441 may be, and/or comprise discrete metal plasmonic islands or clusters.

In some non-limiting examples, the at least one particle structure 441 may comprise a particle material.

In some non-limiting examples, such particle structures 441 may be formed by depositing a scant amount, in some non-limiting examples, having an average layer thickness that may be on the order of a few, or a fraction of an angstrom, of a particle material on an exposed layer surface 11 of the underlying layer. In some non-limiting examples, the exposed layer surface 11 may be of a nucleation-promoting coating (NPC) 520 (FIG. 5C).

In some non-limiting examples, the particle material may comprise at least one of Ag, Yb, and/or magnesium (Mg).

In some non-limiting examples, the formation of at least one of: the characteristic size, size distribution, shape, surface coverage, configuration, deposited density, and/or dispersity of such discontinuous layer 440 may be controlled, in some non-limiting examples, by judicious selection of at least one of: at least one characteristic of the patterning material 211, an average film thickness $d_2$ of the patterning coating 110, the introduction of heterogeneities in the patterning coating 110, and/or a deposition environment, including without limitation, a temperature, pressure, duration, deposition rate, and/or deposition process for the patterning coating 110.

In some non-limiting examples, the formation of at least one of the characteristic size, size distribution, shape, surface coverage, configuration, deposited density, and/or dispersity of such discontinuous layer 440 may be controlled, in some non-limiting examples, by judicious selection of at least one of: at least one characteristic of the particle material (which may be the deposited material 331), an extent to which the patterning coating 110 may be exposed to deposition of the particle material (which, in some non-limiting examples may be specified in terms of a thickness of the corresponding discontinuous layer 440), and/or a deposition environment, including without limitation, a temperature, pressure, duration, deposition rate, and/or method of deposition for the particle material.

In some non-limiting examples, the discontinuous layer 440 may be deposited in a pattern across the lateral extent of the patterning coating 110.

In some non-limiting examples, the discontinuous layer 440 may be disposed in a pattern that may be defined by at least one region therein that is substantially devoid of the at least one particle structure 441.

In some non-limiting examples, the characteristics of such discontinuous layer 440 may be assessed, in some non-limiting examples, somewhat arbitrarily, according to at least one of several criteria, including without limitation, a characteristic size, size distribution, shape, configuration, surface coverage, deposited distribution, dispersity, and/or a presence, and/or extent of aggregation instances of the particle material, formed on a part of the exposed layer surface 11 of the underlying layer.

In some non-limiting examples, an assessment of the discontinuous layer 440 according to such at least one criterion, may be performed on, including without limitation, by measuring, and/or calculating, at least one attribute of the discontinuous layer 440, using a variety of imaging techniques, including without limitation, at least one of: transmission electron microscopy (TEM), atomic force microscopy (AFM), and/or scanning electron microscopy (SEM).

Those having ordinary skill in the relevant art will appreciate that such an assessment of the discontinuous layer 440 may depend, to a greater, and/or lesser extent, by the extent, of the exposed layer surface 11 under consideration, which in some non-limiting examples may comprise an area, and/or region thereof. In some non-limiting examples, the discontinuous layer 440 may be assessed across the entire extent, in a first lateral aspect, and/or a second lateral aspect that is substantially transverse thereto, of the exposed layer surface 11. In some non-limiting examples, the discontinuous layer 440 may be assessed across an extent that comprises at least one observation window applied against (a part of) the discontinuous layer 440.

In some non-limiting examples, the at least one observation window may be located at at least one of: a perimeter, interior location, and/or grid coordinate of the lateral aspect of the exposed layer surface 11. In some non-limiting examples, a plurality of the at least one observation windows may be used in assessing the discontinuous layer 440.

In some non-limiting examples, the observation window may correspond to a field of view of an imaging technique applied to assess the discontinuous layer 440, including without limitation, at least one of: TEM, AFM, and/or SEM. In some non-limiting examples, the observation window may correspond to a given level of magnification, including without limitation, at least one of: 2.00 μm, 1.00 μm, 500 nm, or 200 nm.

In some non-limiting examples, the assessment of the discontinuous layer 440, including without limitation, at least one observation window used, of the exposed layer surface 11 thereof, may involve calculating, and/or measuring, by any number of mechanisms, including without limitation, manual counting, and/or known estimation techniques, which may, in some non-limiting examples, may comprise curve, polygon, and/or shape fitting techniques.

In some non-limiting examples, the assessment of the discontinuous layer 440, including without limitation, at least one observation window used, of the exposed layer surface 11 thereof, may involve calculating, and/or measuring an average, median, mode, maximum, minimum, and/or other probabilistic, statistical, and/or data manipulation of a value of the calculation, and/or measurement.

In some non-limiting examples, one of the at least one criterion by which such discontinuous layer 440 may be assessed, may be a surface coverage of the particle material on such (part of the) discontinuous layer 440. In some non-limiting examples, the surface coverage may be represented by a (non-zero) percentage coverage by such particle material of such (part of the) discontinuous layer 440. In some non-limiting examples, the percentage coverage may be compared to a maximum threshold percentage coverage.

In some non-limiting examples, a (part of a) discontinuous layer 440 having a surface coverage that may be substantially no more than the maximum threshold percentage coverage, may result in a manifestation of different optical characteristics that may be imparted by such part of the discontinuous layer 440, to EM radiation passing therethrough, whether transmitted entirely through the device 100, and/or emitted thereby, relative to EM radiation passing through a part of the discontinuous layer 440 having a surface coverage that substantially exceeds the maximum threshold percentage coverage.

In some non-limiting examples, one measure of a surface coverage of an amount of an electrically conductive material on a surface may be a (EM radiation) transmittance, since in some non-limiting examples, electrically conductive materials, including without limitation, metals, including without limitation: Ag, Mg, or Yb, attenuate, and/or absorb EM radiation.

Those having ordinary skill in the relevant art will appreciate that in some non-limiting examples, surface coverage may be understood to encompass one or both of particle size, and deposited density. Thus, in some non-limiting examples, a plurality of these three criteria may be positively correlated. Indeed, in some non-limiting examples, a criterion of low surface coverage may comprise some combination of a criterion of low deposited density with a criterion of low particle size.

In some non-limiting examples, one of the at least one criterion by which such discontinuous layer 440 may be assessed, may be a characteristic size of the constituent particle structures 441.

In some non-limiting examples, the at least one particle structure 441 of the discontinuous layer 440, may have a characteristic size that is no more than a maximum threshold size. Non-limiting examples of the characteristic size may include at least one of: height, width, length, and/or diameter.

In some non-limiting examples, substantially all of the particle structures 441, of the discontinuous layer 440 may have a characteristic size that lies within a specified range.

In some non-limiting examples, such characteristic size may be characterized by a characteristic length, which in some non-limiting examples, may be considered a maximum value of the characteristic size. In some non-limiting examples, such maximum value may extend along a major axis of the particle structure 441. In some non-limiting examples, the major axis may be understood to be a first dimension extending in a plane defined by the plurality of lateral axes. In some non-limiting examples, a characteristic width may be identified as a value of the characteristic size of the particle structure 441 that may extend along a minor axis of the particle structure 441. In some non-limiting examples, the minor axis may be understood to be a second dimension extending in the same plane but substantially transverse to the major axis.

In some non-limiting examples, the characteristic length of the at least one particle structure 441, along the first dimension, may be no more than the maximum threshold size.

In some non-limiting examples, the characteristic width of the at least one particle structure 441, along the second dimension, may be no more than the maximum threshold size.

In some non-limiting examples, a size of the constituent particle structures 441, in the (part of the) discontinuous layer 440, may be assessed by calculating, and/or measuring a characteristic size of such at least one particle structure 441, including without limitation, a mass, volume, length of a diameter, perimeter, major, and/or minor axis thereof.

In some non-limiting examples, one of the at least one criterion by which such discontinuous layer 440 may be assessed, may be a deposited density thereof.

In some non-limiting examples, the characteristic size of the particle structure 441 may be compared to a maximum threshold size.

In some non-limiting examples, the deposited density of the particle structures 441 may be compared to a maximum threshold deposited density.

In some non-limiting examples, at least one of such criteria may be quantified by a numerical metric. In some non-limiting examples, such a metric may be a calculation of a dispersity D that describes the distribution of particle (area) sizes in a deposited layer 130 of particle structures 441, in which:

$$D = \frac{\overline{S_s}}{\overline{S_n}} \tag{1}$$

where:

$$\overline{S_s} = \frac{\sum_{i=1}^{n} S_i^2}{\sum_{i=1}^{n} S_i},\ \overline{S_n} = \frac{\sum_{i=1}^{n} S_i}{n}, \tag{2}$$

n is the number of particle structures 441 in a sample area, $S_i$ is the (area) size of the $I^{th}$ particle structure 441, $\overline{S}_n$ is the number average of the particle (area) sizes and $\overline{S}_s$ is the (area) size average of the particle (area) sizes.

Those having ordinary skill in the relevant art will appreciate that the dispersity is roughly analogous to a polydispersity index (PDI) and that these averages are roughly analogous to the concepts of number average molecular weight and weight average molecular weight familiar in organic chemistry, but applied to an (area) size, as opposed to a molecular weight of a sample particle structure 441.

Those having ordinary skill in the relevant will also appreciate that while the concept of dispersity may, in some non-limiting examples, be considered a three-dimensional volumetric concept, in some non-limiting examples, the dispersity may be considered to be a two-dimensional concept. As such, the concept of dispersity may be used in connection with viewing and analyzing two-dimensional images of the deposited layer 130, such as may be obtained by using a variety of imaging techniques, including without limitation, at least one of: TEM, AFM and/or SEM. It is in such a two-dimensional context, that the equations set out above are defined.

In some non-limiting examples, the dispersity and/or the number average of the particle (area) size and the (area) size average of the particle (area) size may involve a calculation of at least one of: the number average of the particle diameters and the (area) size average of the particle diameters:

$$\overline{d_n} = 2\sqrt{\frac{\overline{S_n}}{\pi}},\ \overline{d_s} = 2\sqrt{\frac{\overline{S_s}}{\pi}} \tag{3}$$

In some non-limiting examples, the particle material, including without limitation as particle structures 441, of the at least one deposited layer 130, may be deposited by a mask-free and/or open mask deposition process.

In some non-limiting examples, the particle structures 441 may have a substantially round shape. In some non-limiting examples, the particle structures 441 may have a substantially spherical shape.

For purposes of simplification, in some non-limiting examples, it may be assumed that a longitudinal extent of each particle structure 441 may be substantially the same (and, in any event, may not be directly measured from a plan view SEM image) so that the (area) size of the particle structure 441 may be represented as a two-dimensional area coverage along the pair of lateral axes. In the present disclosure, a reference to an (area) size may be understood to refer to such two-dimensional concept, and to be differentiated from a size (without the prefix "area") that may be understood to refer to a one-dimensional concept, such as a linear dimension.

Indeed, in some early investigations, it appears that, in some non-limiting examples, the longitudinal extent, along the longitudinal axis, of such particle structures 441, may tend to be small relative to the lateral extent (along at least one of the lateral axes), such that the volumetric contribution of the longitudinal extent thereof may be much less than that of such lateral extent. In some non-limiting examples, this may be expressed by an aspect ratio (a ratio of a longitudinal extent to a lateral extent) that may be no more than 1. In some non-limiting examples, such aspect ratio may be at least one of about: 1:10, 1:20, 1:50, 1:75, or 1:300.

In this regard, the assumption set out above (that the longitudinal extent is substantially the same and can be ignored) to represent the particle structure 441 as a two-dimensional area coverage may be appropriate.

Those having ordinary skill in the relevant art will appreciate, having regard to the non-determinative nature of the deposition process, especially in the presence of defects, and/or anomalies on the exposed layer surface 11 of the underlying material, including without limitation, heterogeneities, including without limitation, at least one of: a step edge, a chemical impurity, a bonding site, a kink, and/or a contaminant thereon, and consequently the formation of particle structures 441 thereon, the non-uniform nature of coalescence thereof as the deposition process continues, and in view of the uncertainty in the size, and/or position of observation windows, as well as the intricacies and variability inherent in the calculation, and/or measurement of their characteristic size, spacing, deposited density, degree of aggregation, and the like, there may be considerable variability in terms of the features, and/or topology within observation windows.

In the present disclosure, for purposes of simplicity of illustration, certain details of particle materials, including without limitation, thickness profiles, and/or edge profiles of layer(s) have been omitted.

Those having ordinary skill in the relevant art will appreciate that certain metal NPs, whether or not as part of a discontinuous layer 440 of particle material, including without limitation, at least one particle structure 441, may exhibit surface plasmon (SP) excitations, and/or coherent oscillations of free electrons, with the result that such NPs may absorb, and/or scatter light in a range of the EM spectrum, including without limitation, the visible spectrum, and/or a sub-range thereof. The optical response, including without limitation, the (sub-)range of the EM spectrum over which absorption may be concentrated (absorption spectrum), refractive index, and/or extinction coefficient, of such localized SP (LSP) excitations, and/or coherent oscillations, may be tailored by varying properties of such NPs, including without limitation, at least one of: a characteristic size, size distribution, shape, surface coverage, configuration, deposition density, dispersity, and/or property, including without limitation, material, and/or degree of aggregation, of the nanostructures, and/or a medium proximate thereto.

Such optical response, in respect of photon-absorbing coatings, may include absorption of photons incident thereon, thereby reducing reflection. In some non-limiting examples, the absorption may be concentrated in a range of the EM spectrum, including without limitation, the visible spectrum, and/or a sub-range thereof. While the at least one particle 441 may absorb EM radiation incident thereon from beyond the layered semiconductor device 100, thus reducing reflection, those having ordinary skill in the relevant art will appreciate that, in some non-limiting examples, the at least one particle 441 may absorb EM radiation incident thereon that is emitted by the device 100. In some non-limiting examples, employing a photon-absorbing layer as part of an opto-electronic device may reduce reliance on a polarizer therein.

It has been reported in Fusella et al., "Plasmonic enhancement of stability and brightness in organic light-emitting devices", *Nature* 2020, 585, at 379-382 ("Fusella et al."), that the stability of an OLED device may be enhanced by incorporating an NP-based outcoupling layer above the cathode layer to extract energy from the plasmon modes. The NP-based outcoupling layer was fabricated by spin-casting cubic Ag NPs on top of an organic layer on top of a cathode. However, since most commercial OLED devices are fabricated using vacuum-based processing, spin-casting from solution may not constitute an appropriate mechanism for forming such an NP-based outcoupling layer above the cathode.

It has been discovered that such an NP-based outcoupling layer above the cathode may be fabricated in vacuum (and thus, may be suitable for use in a commercial OLED fabrication process), by depositing a metal particle material in a discontinuous layer 440 onto a patterning coating 110, which in some non-limiting examples, may be, and/or be deposited on, the cathode. Such process may avoid the use of solvents or other wet chemicals that may cause damage to the OLED device, and/or may adversely impact device reliability.

In some non-limiting examples, the presence of such a discontinuous layer 440 of particle material, including without limitation, at least one particle structure 441, may contribute to enhanced extraction of EM radiation, performance, stability, reliability, and/or lifetime of the device.

In some non-limiting examples, the existence, in a layered device 100, of at least one discontinuous layer 440, on, and/or proximate to the exposed layer surface 11 of a patterning coating 110, and/or, in some non-limiting examples, and/or proximate to the interface of such patterning 110 with at least one covering layer, may impart optical effects to EM signals, including without limitation, photons, emitted by the device, and/or transmitted therethrough.

Those having ordinary skill in the relevant art will appreciate that, while a simplified model of the optical effects is presented herein, other models, and/or explanations may be applicable.

In some non-limiting examples, the presence of such a discontinuous layer 440 of the particle material, including without limitation, at least one particle structure 441, may reduce, and/or mitigate crystallization of thin film layers, and/or coatings disposed adjacent in the longitudinal aspect, including without limitation, the patterning coating 110, and/or at least one covering layer, thereby stabilizing the property of the thin film(s) disposed adjacent thereto, and, in some non-limiting examples, reducing scattering. In some non-limiting examples, such thin film may be, and/or comprise at least one layer of an outcoupling, and/or encapsulating coating 1350 of the device, including without limitation, a capping layer (CPL).

In some non-limiting examples, the presence of such a discontinuous layer 440 of particle material, including without limitation, at least one particle structure 441, may provide an enhanced absorption in at least a part of the UV spectrum. In some non-limiting examples, controlling the characteristics of such particle structures 441, including without limitation, at least one of: characteristic size, size distribution, shape, surface coverage, configuration, deposited density, dispersity, particle material, and refractive index, of the particle structures 441, may facilitate controlling the degree of absorption, wavelength range and peak wavelength of the absorption spectrum, including in the UV spectrum. Enhanced absorption of EM radiation in at least a part of the UV spectrum may be advantageous, for example, for improving device performance, stability, reliability, and/or lifetime.

In some non-limiting examples, the optical effects may be described in terms of its impact on the transmission, and/or absorption wavelength spectrum, including a wavelength range, and/or peak intensity thereof.

Additionally, while the model presented may suggest certain effects imparted on the transmission, and/or absorption of photons passing through such discontinuous layer 440, in some non-limiting examples, such effects may reflect local effects that may not be reflected on a broad, observable basis.

Opto-Electronic Device

Figure 6:
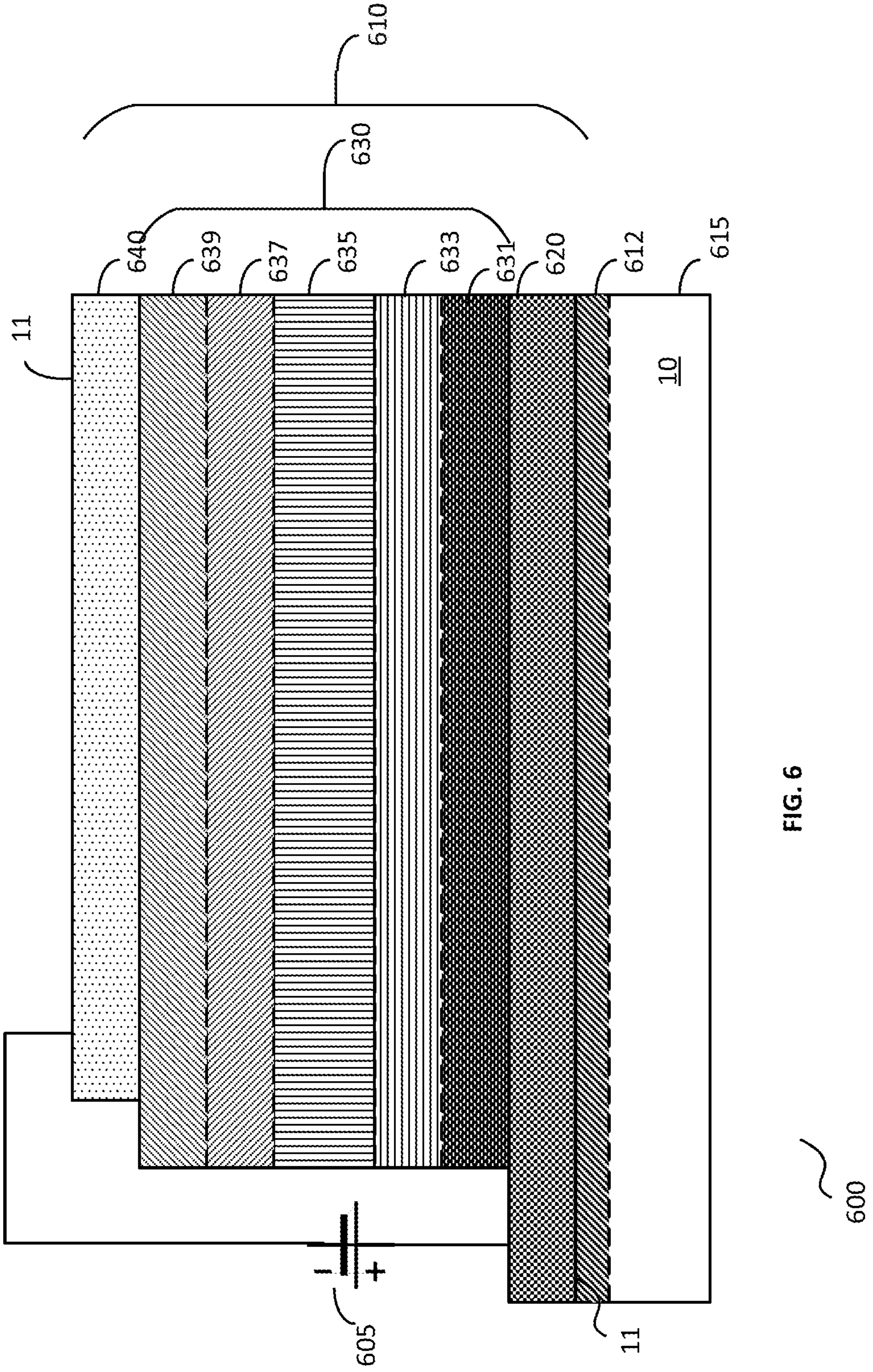
FIG. 6 is a block diagram from a cross-sectional aspect, of an example electro-luminescent device according to an example in the present disclosure.

FIG. 6 is a simplified block diagram from a cross-sectional aspect, of an example electro-luminescent device 600 according to the present disclosure. In some non-limiting examples, the device 600 is an OLED.

The device 600 may comprise a substrate 10, upon which a frontplane 610, comprising a plurality of layers, respectively, a first electrode 620, at least one semiconducting layer 630, and a second electrode 640, are disposed. In some non-limiting examples, the frontplane 610 may provide mechanisms for photon emission, and/or manipulation of emitted photons.

In some non-limiting examples, the deposited layer 130 and the underlying layer may together form at least a part of at least one of the first electrode 620 and the second electrode 640 of the device 600. In some non-limiting examples, the deposited layer 130 and the underlying layer thereunder may together form at least a part of a cathode of the device 600.

In some non-limiting examples, the device 600 may be electrically coupled with a power source 605. When so coupled, the device 600 may emit photons as described herein.

Substrate

In some examples, the substrate 10 may comprise a base substrate 612. In some examples, the base substrate 612 may be formed of material suitable for use thereof, including without limitation, an inorganic material, including without limitation, Si, glass, metal (including without limitation, a metal foil), sapphire, and/or other inorganic material, and/or an organic material, including without limitation, a polymer, including without limitation, a polyimide, and/or an Si-based polymer. In some examples, the base substrate 612 may be rigid or flexible. In some examples, the substrate 10 may be defined by at least one planar surface. In some non-limiting examples, the substrate 10 may have at least one surface that supports the remaining frontplane 610 components of the device 600, including without limitation, the first electrode 620, the at least one semiconducting layer 630, and/or the second electrode 640.

In some non-limiting examples, such surface may be an organic surface, and/or an inorganic surface.

In some examples, the substrate 10 may comprise, in addition to the base substrate 612, at least one additional organic, and/or inorganic layer (not shown nor specifically described herein) supported on an exposed layer surface 11 of the base substrate 612.

In some non-limiting examples, such additional layers may comprise, and/or form at least one organic layer, which may comprise, replace, and/or supplement at least one of the at least one semiconducting layers 630.

In some non-limiting examples, such additional layers may comprise at least one inorganic layer, which may comprise, and/or form at least one electrode, which in some non-limiting examples, may comprise, replace, and/or supplement the first electrode 620, and/or the second electrode 640.

In some non-limiting examples, such additional layers may comprise, and/or be formed of, and/or as a backplane 615. In some non-limiting examples, the backplane 615 may contain power circuitry, and/or switching elements for driving the device 600, including without limitation, electronic TFT structure(s) 701, and/or component(s) thereof, that may be formed by a photolithography process, which may not be provided under, and/or may precede the introduction of a low pressure (including without limitation, a vacuum) environment.

Backplane and TFT Structure(s) Embodied Therein

In some non-limiting examples, the backplane 615 of the substrate 10 may comprise at least one electronic, and/or opto-electronic component, including without limitation, transistors, resistors, and/or capacitors, such as which may support the device 600 acting as an active-matrix, and/or a passive matrix device. In some non-limiting examples, such structures may be a thin-film transistor (TFT) structure 701.

Non-limiting examples of TFT structures 701 include top-gate, bottom-gate, n-type and/or p-type TFT structures 701. In some non-limiting examples, the TFT structure 701 may incorporate any at least one of amorphous silicon (a-Si), indium gallium zinc oxide (IGZO), and/or low-temperature polycrystalline silicon (LTPS).

First Electrode

The first electrode 620 may be deposited over the substrate 10. In some non-limiting examples, the first electrode 620 may be electrically coupled with a terminal of the power source 605, and/or to ground. In some non-limiting examples, the first electrode 620 may be so coupled through at least one driving circuit which in some non-limiting examples, may incorporate at least one TFT structure 701 in the backplane 615 of the substrate 10.

In some non-limiting examples, the first electrode 620 may comprise an anode, and/or a cathode. In some non-limiting examples, the first electrode 620 may be an anode.

In some non-limiting examples, the first electrode 620 may be formed by depositing at least one thin conductive film, over (a part of) the substrate 10. In some non-limiting examples, there may be a plurality of first electrodes 620, disposed in a spatial arrangement over a lateral aspect of the substrate 10. In some non-limiting examples, at least one of such at least one first electrodes 620 may be deposited over (a part of) a TFT insulating layer 709 disposed in a lateral aspect in a spatial arrangement. If so, in some non-limiting examples, at least one of such at least one first electrodes 620 may extend through an opening of the corresponding TFT insulating layer 709 to be electrically coupled with an electrode of the TFT structures 701 in the backplane 615.

In some non-limiting examples, the at least one first electrode 620, and/or at least one thin film thereof, may comprise various materials, including without limitation, at least one metallic material, including without limitation, Mg, Al, calcium (Ca), Zn, Ag, Cd, Ba, or Yb, or combinations of any plurality thereof, including without limitation, alloys containing any of such materials, at least one metal oxide, including without limitation, a TCO, including without limitation, ternary compositions such as, without limitation, fluorine tin oxide (FTO), indium zinc oxide (IZO), or ITO, or combinations of any plurality thereof, or in varying proportions, or combinations of any plurality thereof in at least one layer, any at least one of which may be, without limitation, a thin film.

Second Electrode

The second electrode 640 may be deposited over the at least one semiconducting layer 630. In some non-limiting examples, the second electrode 640 may be electrically coupled with a terminal of the power source 605, and/or with ground. In some non-limiting examples, the second electrode 640 may be so coupled through at least one driving circuit, which in some non-limiting examples, may incorporate at least one TFT structure 701 in the backplane 615 of the substrate 10.

In some non-limiting examples, the second electrode 640 may comprise an anode, and/or a cathode. In some non-limiting examples, the second electrode 640 may be a cathode.

In some non-limiting examples, the second electrode 640 may be formed by depositing a deposited layer 130, in some non-limiting examples, as at least one thin film, over (a part of) the at least one semiconducting layer 630. In some non-limiting examples, there may be a plurality of second electrodes 640, disposed in a spatial arrangement over a lateral aspect of the at least one semiconducting layer 630.

In some non-limiting examples, the at least one second electrode 640 may comprise various materials, including without limitation, at least one metallic materials, including without limitation, Mg, Al, Ca, Zn, Ag, Cd, Ba, or Yb, or combinations of any plurality thereof, including without limitation, alloys containing any of such materials, at least one metal oxides, including without limitation, a TCO, including without limitation, ternary compositions such as, without limitation, FTO, IZO, or ITO, or combinations of any plurality thereof, or in varying proportions, or zinc oxide (ZnO), or other oxides containing indium (In), or Zn, or combinations of any plurality thereof in at least one layer, and/or at least one non-metallic materials, any at least one of which may be, without limitation, a thin conductive film. In some non-limiting examples, for a Mg:Ag alloy, such alloy composition may range between about 1:9-9:1 by volume.

In some non-limiting examples, the deposition of the second electrode 640 may be performed using an open mask and/or a mask-free deposition process.

In some non-limiting examples, the second electrode 640 may comprise a plurality of such layers, and/or coatings. In some non-limiting examples, such layers, and/or coatings may be distinct layers, and/or coatings disposed on top of one another.

In some non-limiting examples, the second electrode 640 may comprise a Yb/Ag bi-layer coating. By way of non-limiting example, such bi-layer coating may be formed by depositing a Yb coating, followed by an Ag coating. In some non-limiting examples, a thickness of such Ag coating may exceed a thickness of the Yb coating.

In some non-limiting examples, the second electrode 640 may be a multilayer electrode 640 comprising at least one metallic layer, and/or at least one oxide layer.

In some non-limiting examples, the second electrode 640 may comprise a fullerene and Mg.

By way of non-limiting example, such coating may be formed by depositing a fullerene coating followed by an Mg coating. In some non-limiting examples, a fullerene may be dispersed within the Mg coating to form a fullerene-containing Mg alloy coating. Non-limiting examples of such coatings are described in United States Patent Application Publication No. 2015/0287846 published 8 Oct. 2015, and/or in PCT International Application No. PCT/IB2017/054970 filed 15 Aug. 2017 and published as WO2018/033860 on 22 Feb. 2018.

Semiconducting Layer

In some non-limiting examples, the at least one semiconducting layer 630 may comprise a plurality of layers 631, 633, 635, 637, 639, any of which may be disposed, in some non-limiting examples, in a thin film, in a stacked configuration, which may include, without limitation, at least one of a hole injection layer (HIL) 631, a hole transport layer (HTL) 633, an emissive layer (EML) 635, an electron transport layer (ETL) 637, and/or an electron injection layer (EIL) 639.

In some non-limiting examples, the at least one semiconducting layer 630 may form a "tandem" structure comprising a plurality of EMLs 635. In some non-limiting examples, such tandem structure may also comprise at least one charge generation layer (CGL).

Those having ordinary skill in the relevant art will readily appreciate that the structure of the device 600 may be varied by omitting, and/or combining at least one of the semiconductor layers 631, 633, 635, 637, 639.

Further, any of the layers 631, 633, 635, 637, 639 of the at least one semiconducting layer 630 may comprise any number of sub-layers. Still further, any of such layers 631, 633, 635, 637, 639, and/or sub-layer(s) thereof may comprise various mixture(s), and/or composition gradient(s). In addition, those having ordinary skill in the relevant art will appreciate that the device 600 may comprise at least one layer comprising inorganic, and/or organometallic materials and may not be necessarily limited to devices comprised solely of organic materials. By way of non-limiting example, the device 600 may comprise at least one QD.

In some non-limiting examples, the HIL 631 may be formed using a hole injection material, which may facilitate injection of holes by the anode.

In some non-limiting examples, the HTL 633 may be formed using a hole transport material, which may, in some non-limiting examples, exhibit high hole mobility.

In some non-limiting examples, the ETL 637 may be formed using an electron transport material, which may, in some non-limiting examples, exhibit high electron mobility.

In some non-limiting examples, the EIL 639 may be formed using an electron injection material, which may facilitate injection of electrons by the cathode.

In some non-limiting examples, the EML 635 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter, and/or a plurality of any combination of these.

In some non-limiting examples, the device 600 may be an OLED in which the at least one semiconducting layer 630 comprises at least an EML 635 interposed between conductive thin film electrode 620, 640, whereby, when a potential difference is applied across them, holes may be injected into the at least one semiconducting layer 630 through the anode and electrons may be injected into the at least one semiconducting layer 630 through the cathode, migrate toward the EML 635 and combine to emit EM radiation in the form of photons.

In some non-limiting examples, the device 600 may be an electro-luminescent QD device in which the at least one semiconducting layer 630 may comprise an active layer comprising at least one QD. When current may be provided by the power source 605 to the first electrode 620 and second electrode 640, photons may be emitted from the active layer comprising the at least one semiconducting layer 630 between them.

Those having ordinary skill in the relevant art will readily appreciate that the structure of the device 600 may be varied by the introduction of at least one additional layer (not shown) at appropriate position(s) within the at least one semiconducting layer 630 stack, including without limitation, a hole blocking layer (HBL) (not shown), an electron blocking layer (EBL) (not shown), an additional charge transport layer (CTL) (not shown), and/or an additional charge injection layer (CIL) (not shown).

In some non-limiting examples, including where the OLED device 600 comprises a lighting panel, an entire lateral aspect of the device 600 may correspond to a single emissive element. As such, the substantially planar cross-sectional profile shown in FIG. 6 may extend substantially along the entire lateral aspect of the device 600, such that EM radiation is emitted from the device 600 substantially along the entirety of the lateral extent thereof. In some non-limiting examples, such single emissive element may be driven by a single driving circuit of the device 600.

In some non-limiting examples, including where the OLED device 600 comprises a display module, the lateral aspect of the device 600 may be sub-divided into a plurality of emissive regions 1001 of the device 600, in which the cross-sectional aspect of the device structure 600, within each of the emissive region(s) 1001, may cause EM radiation to be emitted therefrom when energized.

Emissive Regions

Figure 7:
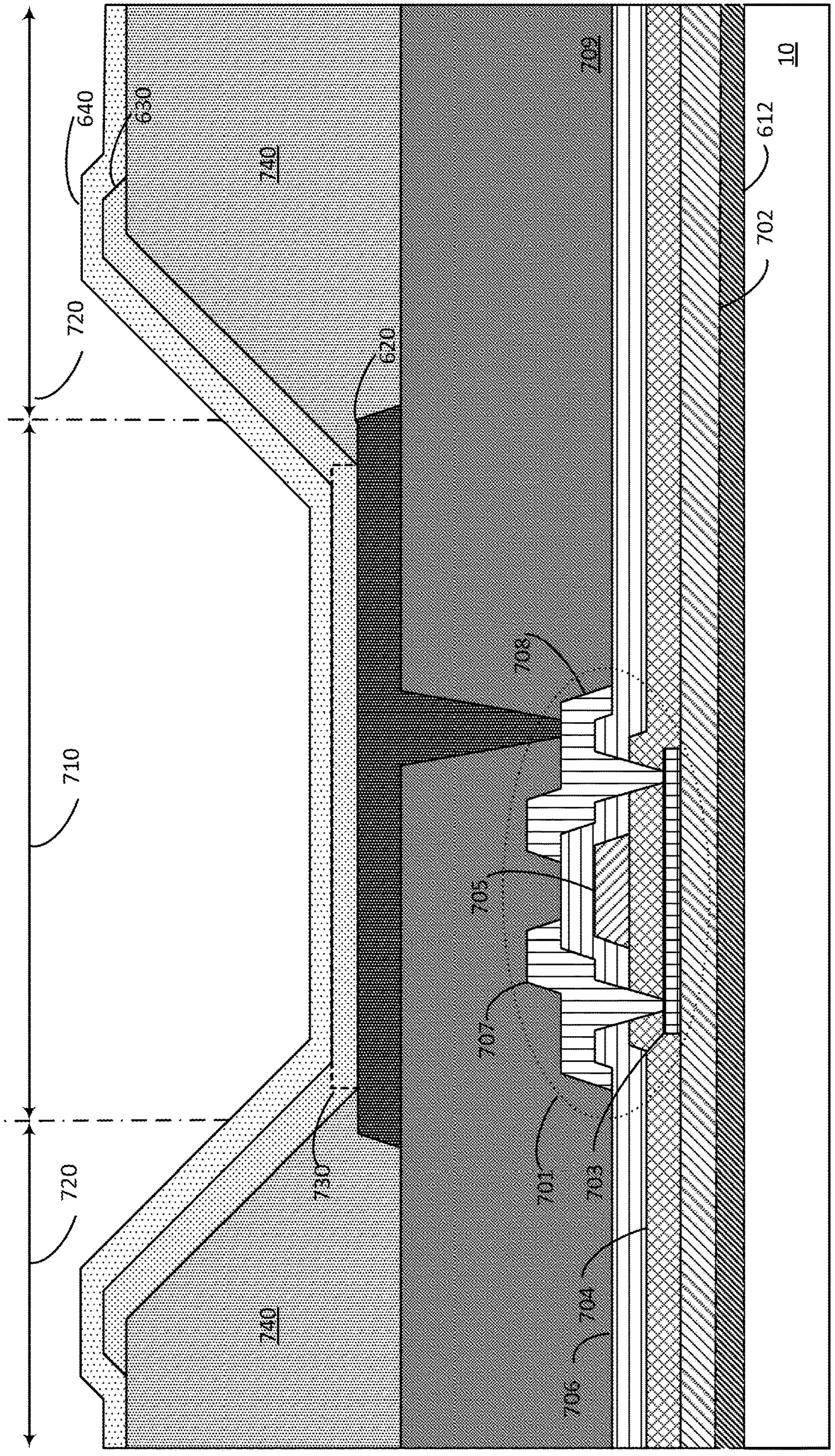
FIG. 7 is a cross-sectional view of the device of FIG. 6.

In some non-limiting examples, such as may be shown by way of non-limiting example in FIG. 7, an active region 730 of an emissive region 1001 may be defined to be bounded, in the transverse aspect, by the first electrode 620 and the second electrode 640, and to be confined, in the lateral aspect, to an emissive region 1001 defined by the first electrode 620 and the second electrode 640. Those having ordinary skill in the relevant art will appreciate that the lateral aspect 710 of the emissive region 1001, and thus the lateral boundaries of the active region 730, may not correspond to the entire lateral aspect of either, or both, of the first electrode 620 and the second electrode 640. Rather, the lateral aspect 710 of the emissive region 1001 may be substantially no more than the lateral extent of either of the first electrode 620 and the second electrode 640. By way of non-limiting example, parts of the first electrode 620 may be covered by the PDL(s) 740 and/or parts of the second electrode 640 may not be disposed on the at least one semiconducting layer 630, with the result, in either, or both, scenarios, that the emissive region 1001 may be laterally constrained.

In some non-limiting examples, individual emissive regions 1001 of the device 600 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by at least one feature thereof, including without limitation, a wavelength of EM radiation emitted by the emissive region 1001 thereof, a shape of such emissive region 1001, a dimension (along either, or both of, the first, and/or second lateral direction(s)), an orientation (relative to either, and/or both of the first, and/or second lateral direction(s)), and/or a spacing (relative to either, or both of, the first, and/or second lateral direction(s)) from a previous element in the pattern. In some non-limiting examples, the pattern may repeat in either, or both of, the first and/or second lateral direction(s).

In some non-limiting examples, each individual emissive region 1001 of the device 600 may be associated with, and driven by, a corresponding driving circuit within the backplane 615 of the device 600, for driving an OLED structure for the associated emissive region 1001. In some non-limiting examples, including without limitation, where the emissive regions 1001 may be laid out in a regular pattern extending in both the first (row) lateral direction and the second (column) lateral direction, there may be a signal line in the backplane 615, corresponding to each row of emissive regions 1001 extending in the first lateral direction and a signal line, corresponding to each column of emissive regions 1001 extending in the second lateral direction. In such a non-limiting configuration, a signal on a row selection line may energize the respective gates of the switching TFT structure(s) 701 electrically coupled therewith and a signal on a data line may energize the respective sources of the switching TFT structure(s) 701 electrically coupled therewith, such that a signal on a row selection line/data line pair may electrically couple and energise, by the positive terminal of the power source 605, the anode of the OLED structure of the emissive region 1001 associated with such pair, causing the emission of a photon therefrom, the cathode thereof being electrically coupled with the negative terminal of the power source 605.

In some non-limiting examples, each emissive region 1001 of the device 600 may correspond to a single display pixel 1810. In some non-limiting examples, each pixel 1810 may emit light at a given wavelength spectrum. In some non-limiting examples, the wavelength spectrum may correspond to a colour in, without limitation, the visible spectrum.

In some non-limiting examples, each emissive region 1001 of the device 600 may correspond to a sub-pixel **134*x* of a display pixel 1810. In some non-limiting examples, a plurality of sub-pixels 134*x* may combine to form, or to represent, a single display pixel 1810**.

In some non-limiting examples, a single display pixel 1810 may be represented by three sub-pixels **134*x*. In some non-limiting examples, the three sub-pixels 134*x* may be denoted as, respectively, R(ed) sub-pixels 1341, G(reen) sub-pixels 1342, and/or B(lue) sub-pixels 1343. In some non-limiting examples, a single display pixel 1810 may be represented by four sub-pixels 134*x*, in which three of such sub-pixels 134*x* may be denoted as R(ed), G(reen) and B(lue) sub-pixels 134*x* and the fourth sub-pixel 134*x* may be denoted as a W(hite) sub-pixel 134*x*. In some non-limiting examples, the emission spectrum of the EM radiation emitted by a given sub-pixel 134$x$ may correspond to the colour by which the sub-pixel 134**$x$ is denoted. In some non-limiting examples, the wavelength of the EM radiation may not correspond to such colour, but further processing may be performed, in a manner apparent to those having ordinary skill in the relevant art, to transform the wavelength to one that does so correspond.

Since the wavelength of sub-pixels 134$x$ of different colours may be different, the optical characteristics of such sub-pixels 134$x$ may differ, especially if a common electrode 620, 640 having a substantially uniform thickness profile may be employed for sub-pixels 134$x$ of different colours.

When a common electrode 620, 640 having a substantially uniform thickness may be provided as the second electrode 640 in a device 600, the optical performance of the device 600 may not be readily be fine-tuned according to an emission spectrum associated with each (sub-) pixel 1810/134$x$. The second electrode 640 used in such OLED devices 600 may in some non-limiting examples, be a common electrode 620, 640 coating a plurality of (sub-) pixels 1810/134$x$. By way of non-limiting example, such common electrode 620, 640 may be a relatively thin conductive film having a substantially uniform thickness across the device 600. While efforts have been made in some non-limiting examples, to tune the optical microcavity effects associated with each (sub-) pixel 1810/134$x$ color by varying a thickness of organic layers disposed within different (sub-) pixel(s) 1810/134$x$, such approach may, in some non-limiting examples, provide a significant degree of tuning of the optical microcavity effects in at least some cases. In addition, in some non-limiting examples, such approach may be difficult to implement in an OLED display production environment.

As a result, the presence of optical interfaces created by numerous thin-film layers and coatings with different refractive indices, such as may in some non-limiting examples be used to construct opto-electronic devices including without limitation OLED devices 600, may create different optical microcavity effects for sub-pixels 134$x$ of different colours.

Some factors that may impact an observed microcavity effect in a device 600 include, without limitation, a total path length (which in some non-limiting examples may correspond to a total thickness (in the longitudinal aspect) of the device 600 through which EM radiation emitted therefrom will travel before being outcoupled) and the refractive indices of various layers and coatings.

In some non-limiting examples, modulating a thickness of an electrode 620, 640 in and across a lateral aspect 710 of emissive region(s) 1001 of a (sub-) pixel 1810/134$x$ may impact the microcavity effect observable. In some non-limiting examples, such impact may be attributable to a change in the total optical path length.

In some non-limiting examples, a change in a thickness of the electrode 620, 640 may also change the refractive index of EM radiation passing therethrough, in some non-limiting examples, in addition to a change in the total optical path length. In some non-limiting examples, this may be particularly the case where the electrode 620, 640 may be formed of at least one deposited layer 130.

In some non-limiting examples, the optical properties of the device 600, and/or in some non-limiting examples, across the lateral aspect 710 of emissive region(s) 1001 of a (sub-) pixel 1810/134$x$ that may be varied by modulating at least one optical microcavity effect, may include, without limitation, the emission spectrum, the intensity (including without limitation, luminous intensity), and/or angular distribution of emitted EM radiation, including without limitation, an angular dependence of a brightness, and/or color shift of the emitted EM radiation.

In some non-limiting examples, a sub-pixel 134$x$ may be associated with a first set of other sub-pixels 134$x$ to represent a first display pixel 1810 and also with a second set of other sub-pixels 134$x$ to represent a second display pixel 1810, so that the first and second display pixels 1810 may have associated therewith, the same sub-pixel(s) 134$x$.

The pattern, and/or organization of sub-pixels 134$x$ into display pixels 1810 continues to develop. All present and future patterns, and/or organizations are considered to fall within the scope of the present disclosure.

Non-Emissive Regions

In some non-limiting examples, the various emissive regions 1001 of the device 600 may be substantially surrounded and separated by, in at least one lateral direction, at least one non-emissive region 1002, in which the structure, and/or configuration along the cross-sectional aspect, of the device structure 600 shown, without limitation, in FIG. 6, may be varied, to substantially inhibit EM radiation to be emitted therefrom. In some non-limiting examples, the non-emissive regions 1002 may comprise those regions in the lateral aspect, that are substantially devoid of an emissive region 1001.

Thus, as shown in the cross-sectional view of FIG. 7, the lateral topology of the various layers of the at least one semiconducting layer 630 may be varied to define at least one emissive region 1001, surrounded (at least in one lateral direction) by at least one non-emissive region 1002.

In some non-limiting examples, the emissive region 1001 corresponding to a single display (sub-) pixel 1810/134$x$ may be understood to have a lateral aspect 710, surrounded in at least one lateral direction by at least one non-emissive region 1002 having a lateral aspect 720.

A non-limiting example of an implementation of the cross-sectional aspect of the device 600 as applied to an emissive region 1001 corresponding to a single display (sub-) pixel 1810/134$x$ of an OLED display 600 will now be described. While features of such implementation are shown to be specific to the emissive region 1001, those having ordinary skill in the relevant art will appreciate that in some non-limiting examples, more than one emissive region 1001 may encompass common features.

In some non-limiting examples, the first electrode 620 may be disposed over an exposed layer surface 11 of the device 600, in some non-limiting examples, within at least a part of the lateral aspect 710 of the emissive region 1001. In some non-limiting examples, at least within the lateral aspect 710 of the emissive region 1001 of the (sub-) pixel(s) 1810/134$x$, the exposed layer surface 11, may, at the time of deposition of the first electrode 620, comprise the TFT insulating layer 709 of the various TFT structures 701 that make up the driving circuit for the emissive region 1001 corresponding to a single display (sub-) pixel 1810/134$x$.

In some non-limiting examples, the TFT insulating layer 709 may be formed with an opening extending therethrough to permit the first electrode 620 to be electrically coupled with one of the TFT electrodes 705, 707, 708, including, without limitation, as shown in FIG. 7, the TFT drain electrode 708.

Those having ordinary skill in the relevant art will appreciate that the driving circuit comprises a plurality of TFT structures 701. In FIG. 7, for purposes of simplicity of illustration, only one TFT structure 701 may be shown, but it will be appreciated by those having ordinary skill in the relevant art, that such TFT structure 701 may be representative of such plurality thereof and/or at least one component thereof, that comprise the driving circuit.

In a cross-sectional aspect, the configuration of each emissive region 1001 may, in some non-limiting examples, be defined by the introduction of at least one PDL 740 substantially throughout the lateral aspects 720 of the surrounding non-emissive region(s) 1002. In some non-limiting examples, the PDLs 740 may comprise an insulating organic, and/or inorganic material.

In some non-limiting examples, the PDLs 740 may be deposited substantially over the TFT insulating layer 709, although, as shown, in some non-limiting examples, the PDLs 740 may also extend over at least a part of the deposited first electrode 620, and/or its outer edges.

In some non-limiting examples, as shown in FIG. 7, the cross-sectional thickness, and/or profile of the PDLs 740 may impart a substantially valley-shaped configuration to the emissive region 1001 of each (sub-) pixel 1810/134*x* by a region of increased thickness along a boundary of the lateral aspect 720 of the surrounding non-emissive region 1002 with the lateral aspect of the surrounded emissive region 1001, corresponding to a (sub-) pixel 1810/134*x*.

In some non-limiting examples, the profile of the PDLs 740 may have a reduced thickness beyond such valley-shaped configuration, including without limitation, away from the boundary between the lateral aspect 720 of the surrounding non-emissive region 1002 and the lateral aspect 710 of the surrounded emissive region 1001, in some non-limiting examples, substantially well within the lateral aspect 720 of such non-emissive region 1002.

While the PDL(s) 740 have been generally illustrated as having a linearly sloped surface to form a valley-shaped configuration that define the emissive region(s) 1001 surrounded thereby, those having ordinary skill in the relevant art will appreciate that in some non-limiting examples, at least one of the shape, aspect ratio, thickness, width, and/or configuration of such PDL(s) 740 may be varied. By way of non-limiting example, a PDL 740 may be formed with a more steep or more gradually sloped part. In some non-limiting examples, such PDL(s) 740 may be configured to extend substantially normally away from a surface on which it is deposited, that may cover at least one edges of the first electrode 620. In some non-limiting examples, such PDL(s) 740 may be configured to have deposited thereon at least one semiconducting layer 630 by a solution-processing technology, including without limitation, by printing, including without limitation, ink-jet printing.

In some non-limiting examples, the at least one semiconducting layer 630 may be deposited over the exposed layer surface 11 of the device 600, including at least a part of the lateral aspect 710 of such emissive region 1001 of the (sub-) pixel(s) 1810/134*x*. In some non-limiting examples, at least within the lateral aspect 710 of the emissive region 1001 of the (sub-) pixel(s) 1810/134*x*, such exposed layer surface 11, may, at the time of deposition of the at least one semiconducting layer 630 (and/or layers 631, 633, 635, 637, 639 thereof), comprise the first electrode 620.

In some non-limiting examples, the at least one semiconducting layer 630 may also extend beyond the lateral aspect 710 of the emissive region 1001 of the (sub-) pixel(s) 1810/134*x* and at least partially within the lateral aspects 720 of the surrounding non-emissive region(s) 1002. In some non-limiting examples, such exposed layer surface 11 of such surrounding non-emissive region(s) 1002 may, at the time of deposition of the at least one semiconducting layer 630, comprise the PDL(s) 740.

In some non-limiting examples, the second electrode 640 may be disposed over an exposed layer surface 11 of the device 600, including at least a part of the lateral aspect 710 of the emissive region 1001 of the (sub-) pixel(s) 1810/134*x*. In some non-limiting examples, at least within the lateral aspect of the emissive region 1001 of the (sub-) pixel(s) 1810/134*x*, such exposed layer surface 11, may, at the time of deposition of the second electrode 640, comprise the at least one semiconducting layer 630.

In some non-limiting examples, the second electrode 640 may also extend beyond the lateral aspect 710 of the emissive region 1001 of the (sub-) pixel(s) 1810/134*x* and at least partially within the lateral aspects 720 of the surrounding non-emissive region(s) 1002. In some non-limiting examples, such exposed layer surface 11 of such surrounding non-emissive region(s) 1002 may, at the time of deposition of the second electrode 640, comprise the PDL(s) 740.

In some non-limiting examples, the second electrode 640 may extend throughout substantially all or a substantial part of the lateral aspects 720 of the surrounding non-emissive region(s) 1002.

Selective Deposition of Patterned Electrode

In some non-limiting examples, the ability to achieve selective deposition of the deposited material 331 in an open mask and/or mask-free deposition process by the prior selective deposition of a patterning coating 110, may be employed to achieve the selective deposition of a patterned electrode 620, 640, 1150, and/or at least one layer thereof, of an opto-electronic device, including without limitation, an OLED device 600, and/or a conductive element electrically coupled therewith.

In this fashion, the selective deposition of a patterning coating 110 in FIG. 7 using a shadow mask 215, and the open mask and/or mask-free deposition of the deposited material 331, may be combined to effect the selective deposition of at least one deposited layer 130 to form a device feature, including without limitation, a patterned electrode 620, 640, 1150, and/or at least one layer thereof, and/or a conductive element electrically coupled therewith, in the device 600 shown in FIG. 6, without employing a shadow mask 215 within the deposition process for forming the deposited layer 130. In some non-limiting examples, such patterning may permit, and/or enhance the transmissivity of the device 600.

A number of non-limiting examples of such patterned electrode 620, 640, 1150, and/or at least one layer thereof, and/or a conductive element electrically coupled therewith, to impart various structural and/or performance capabilities to such devices 600 will now be described.

As a result of the foregoing, there may be an aim to selectively deposit, across the lateral aspect 710 of the emissive region 1001 of a (sub-) pixel 1810/134*x*, and/or the lateral aspect 720 of the non-emissive region(s) 1002 surrounding the emissive region 1001, a device feature, including without limitation, at least one of the first electrode 620, the second electrode 640, the auxiliary electrode 1150, and/or a conductive element electrically coupled therewith, in a pattern, on an exposed layer surface 11 of a frontplane 610 of the device 600. In some non-limiting examples, the first electrode 620, the second electrode 640, and/or the auxiliary electrode 1150, may be deposited in at least one of a plurality of deposited layers 130.

Figure 8:
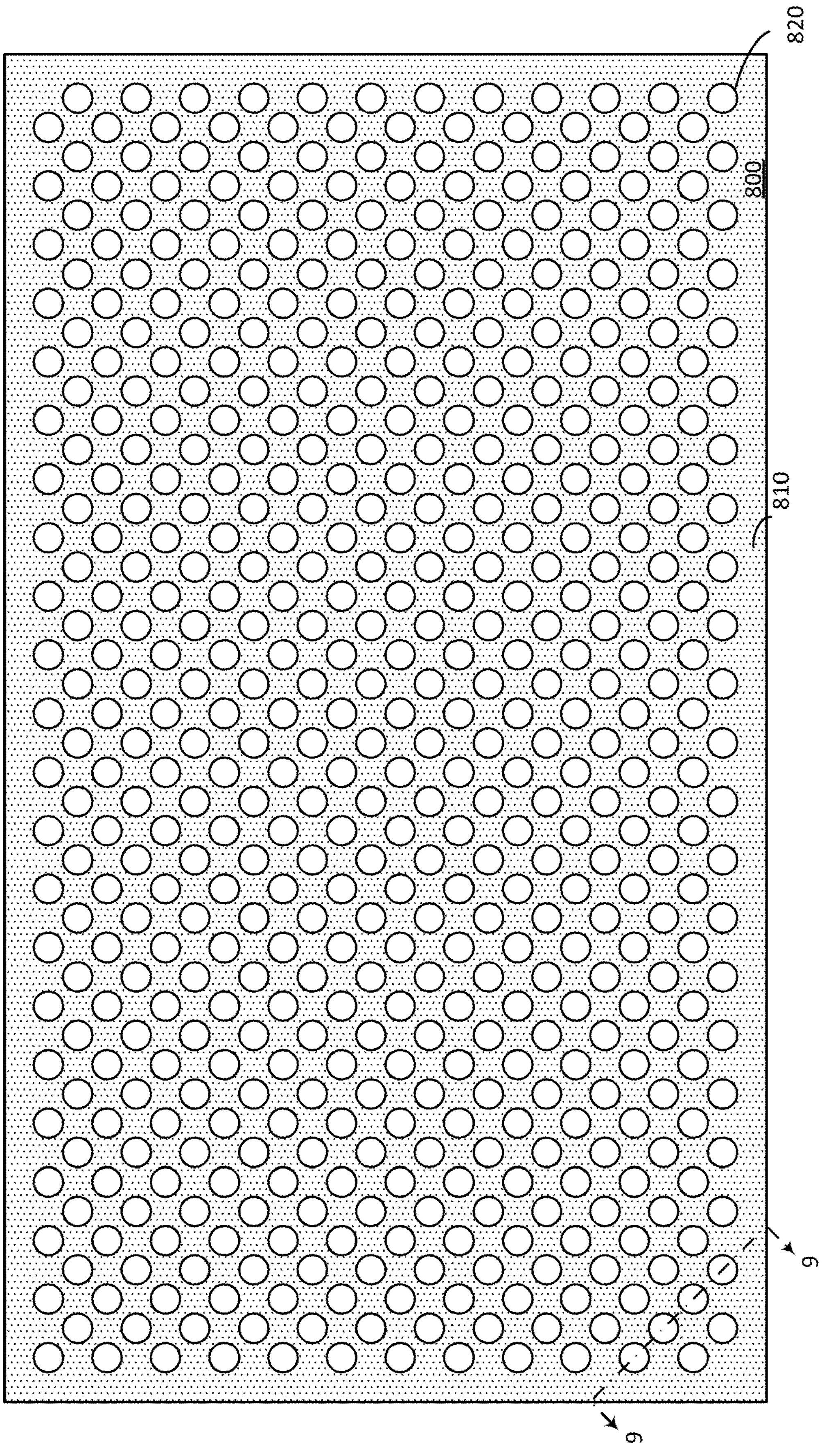
FIG. 8 is a schematic diagram illustrating, in plan, an example patterned electrode suitable for use in a version of the device of FIG. 6, according to an example in the present disclosure.

FIG. 8 may show an example patterned electrode 800 in plan, in the figure, the second electrode 640 suitable for use in an example version 900 (FIG. 9) of the device 600. The electrode 800 may be formed in a pattern 810 that comprises a single continuous structure, having or defining a patterned plurality of apertures 820 therewithin, in which the apertures 820 may correspond to regions of the device 900 where there is no cathode.

In the figure, by way of non-limiting example, the pattern 810 may be disposed across the entire lateral extent of the device 900, without differentiation between the lateral aspect(s) 710 of emissive region(s) 1001 corresponding to (sub-) pixel(s) 1810/134*x* and the lateral aspect(s) 720 of non-emissive region(s) 1002 surrounding such emissive region(s) 1001. Thus, the example illustrated may correspond to a device 900 that may be substantially transmissive relative to EM radiation incident on an external surface thereof, such that a substantial part of such externally-incident EM radiation may be transmitted through the device 900, in addition to the emission (in a top-emission, bottom-emission, and/or double-sided emission) of EM radiation generated internally within the device 900 as disclosed herein.

The transmittivity of the device 900 may be adjusted, and/or modified by altering the pattern 810 employed, including without limitation, an average size of the apertures 820, and/or a spacing, and/or density of the apertures 820.

Figure 9:
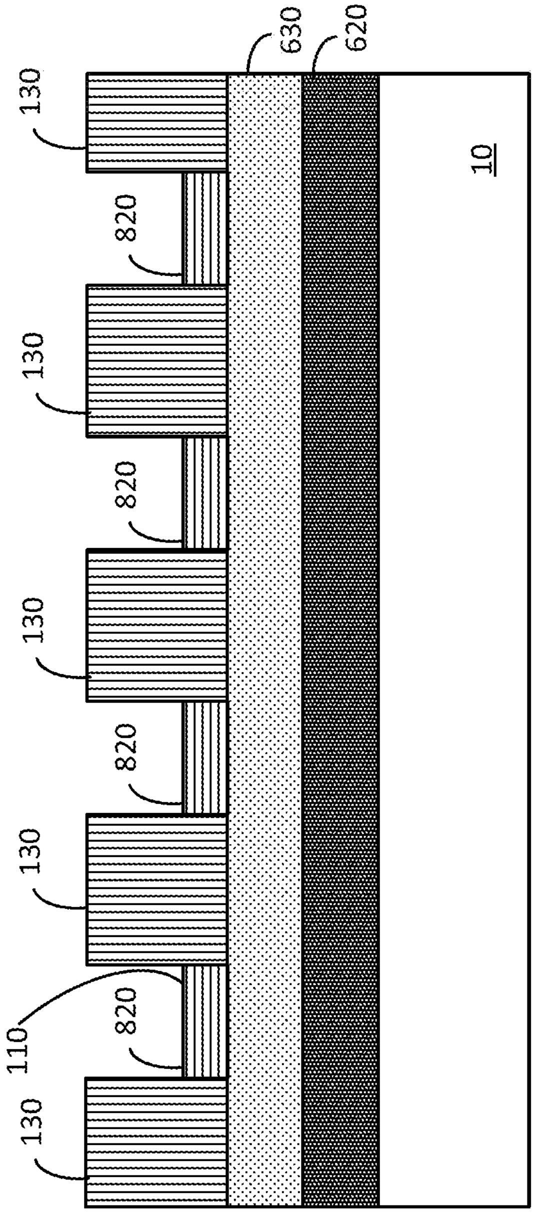
FIG. 9 is a schematic diagram illustrating an example cross-sectional view of the device of FIG. 8 taken along line 9-9.

Turning now to FIG. 9, there may be shown a cross-sectional view of the device 900, taken along line 9-9 in FIG. 8. In the figure, the device 900 may be shown as comprising the substrate 10, the first electrode 620 and the at least one semiconducting layer 630.

A patterning coating 110 may be selectively disposed in a pattern substantially corresponding to the pattern 810 on the exposed layer surface 11 of the underlying layer.

A deposited layer 130 suitable for forming the patterned electrode 800, which in the figure is the second electrode 640, may be disposed on substantially all of the exposed layer surface 11 of the underlying layer, using an open mask and/or a mask-free deposition process. The underlying layer may comprise both regions of the patterning coating 110, disposed in the pattern 810, and regions of the at least one semiconducting layer 630, in the pattern 810 where the patterning coating 110 has not been deposited. In some non-limiting examples, the regions of the patterning coating 110 may correspond substantially to a first portion 101 comprising the apertures 820 shown in the pattern 810.

Because of the nucleation-inhibiting properties of those regions of the pattern 810 where the patterning coating 110 was disposed (corresponding to the apertures 820), the deposited material 331 disposed on such regions may tend to not remain, resulting in a pattern of selective deposition of the deposited layer 130, that may correspond substantially to the remainder of the pattern 810, leaving those regions of the first portion 101 of the pattern 810 corresponding to the apertures 820 substantially devoid of a closed coating 140 of the deposited layer 130.

In other words, the deposited layer 130 that will form the cathode may be selectively deposited substantially only on a second portion 102 comprising those regions of the at least one semiconducting layer 630 that surround but do not occupy the apertures 820 in the pattern 810.

Figure 10A:
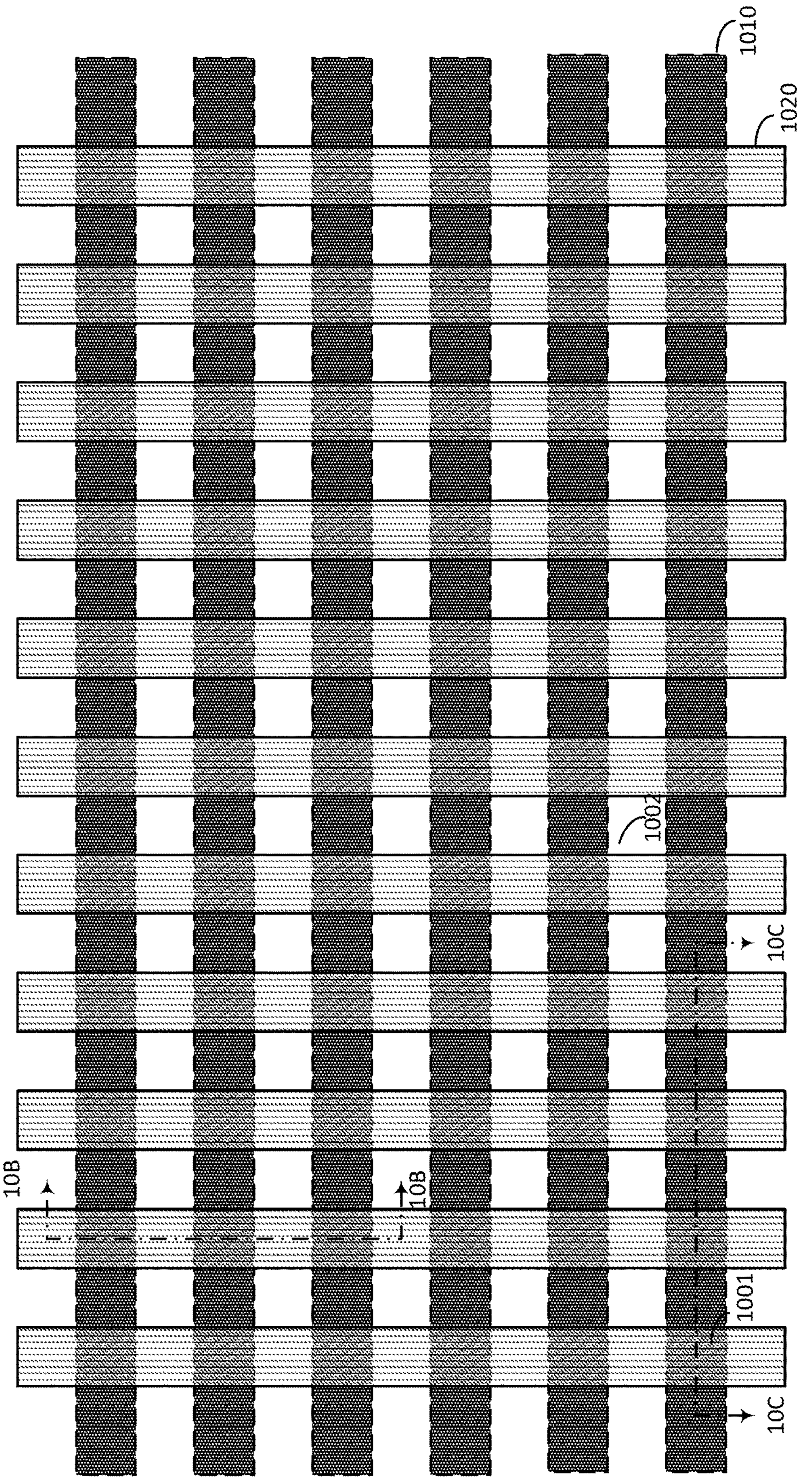
FIG. 10A is a schematic diagram illustrating, in plan view, a plurality of example patterns of electrodes suitable for use in an example version of the device of FIG. 6, according to an example in the present disclosure.

FIG. 10A may show, in plan view, a schematic diagram showing a plurality of patterns 1010, 1020 of electrodes 620, 640, 1150.

In some non-limiting examples, the first pattern 1010 may comprise a plurality of elongated, spaced-apart regions that extend in a first lateral direction. In some non-limiting examples, the first pattern 1010 may comprise a plurality of first electrode 620. In some non-limiting examples, a plurality of the regions that comprise the first pattern 1010 may be electrically coupled.

In some non-limiting examples, the second pattern 1020 may comprise a plurality of elongated, spaced-apart regions that extend in a second lateral direction. In some non-limiting examples, the second lateral direction may be substantially normal to the first lateral direction. In some non-limiting examples, the second pattern 1020 may comprise a plurality of second electrodes 640. In some non-limiting examples, a plurality of the regions that comprise the second pattern 1020 may be electrically coupled.

In some non-limiting examples, the first pattern 1010 and the second pattern 1020 may form part of an example version, shown generally at 1000, of the device 600.

In some non-limiting examples, the lateral aspect(s) 710 of emissive region(s) 1001 corresponding to (sub-) pixel(s) 1810/134*x* may be formed where the first pattern 1010 overlaps the second pattern 1020. In some non-limiting examples, the lateral aspect(s) 720 of non-emissive region(s) 1002 may correspond to any lateral aspect other than the lateral aspect(s) 710.

In some non-limiting examples, a first terminal, which, in some non-limiting examples, may be a positive terminal, of the power source 605, may be electrically coupled with at least one electrode 620, 640, 1150 of the first pattern 1010. In some non-limiting examples, the first terminal may be coupled with the at least one electrode 620, 640, 1150 of the first pattern 1010 through at least one driving circuit. In some non-limiting examples, a second terminal, which, in some non-limiting examples, may be a negative terminal, of the power source 605, may be electrically coupled with at least one electrode 620, 640, 1150 of the second pattern 1020. In some non-limiting examples, the second terminal may be coupled with the at least one electrode 620, 640, 1150 of the second pattern 1020 through the at least one driving circuit.

Figure 10B:
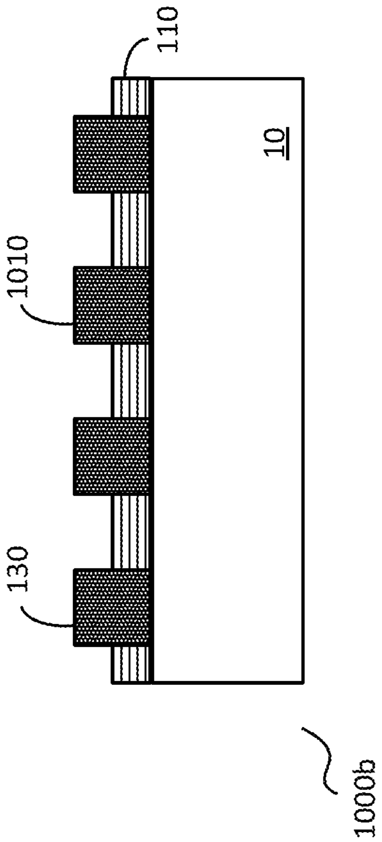
FIG. 10B is a schematic diagram illustrating an example cross-sectional view, at an intermediate stage, of the device of FIG. 10A taken along line 10B-10B.

Turning now to FIG. 10B, there may be shown a cross-sectional view of the device 1000, at a deposition stage 1000*b*, taken along line 10B-10B in FIG. 10A. In the figure, the device 1000 at the stage 1000*b* may be shown as comprising the substrate 10.

A patterning coating 110 may be selectively disposed in a pattern substantially corresponding to the inverse of the first pattern 1010 on the exposed layer surface 11 of the underlying layer, which, as shown in the figure, may be the substrate 10.

A deposited layer 130 suitable for forming the first pattern 1010 of electrode 620, 640, 1150, which in the figure is the first electrode 620, may be disposed on substantially all of the exposed layer surface 11 of the underlying layer, using an open mask and/or a mask-free deposition process. The underlying layer may comprise both regions of the patterning coating 110, disposed in the inverse of the first pattern 1010, and regions of the substrate 10, disposed in the first pattern 1010 where the patterning coating 110 has not been deposited. In some non-limiting examples, the regions of the substrate 10 may correspond substantially to the elongated spaced-apart regions of the first pattern 1010, while the regions of the patterning coating 110 may correspond substantially to a first portion 101 comprising the gaps therebetween.

Because of the nucleation-inhibiting properties of those regions of the first pattern 1010 where the patterning coating 110 was disposed (corresponding to the gaps therebetween), the deposited material 331 disposed on such regions may tend to not remain, resulting in a pattern of selective deposition of the deposited layer 130, that may correspond substantially to elongated spaced-apart regions of the first pattern 1010, leaving a first portion 101 comprising the gaps therebetween substantially devoid of a closed coating 140 of the deposited layer 130.

In other words, the deposited layer 130 that may form the first pattern 1010 of electrode 620, 640, 1150 may be selectively deposited substantially only on a second portion 102 comprising those regions of the substrate 10 that define the elongated spaced-apart regions of the first pattern 1010.

Figure 10C:
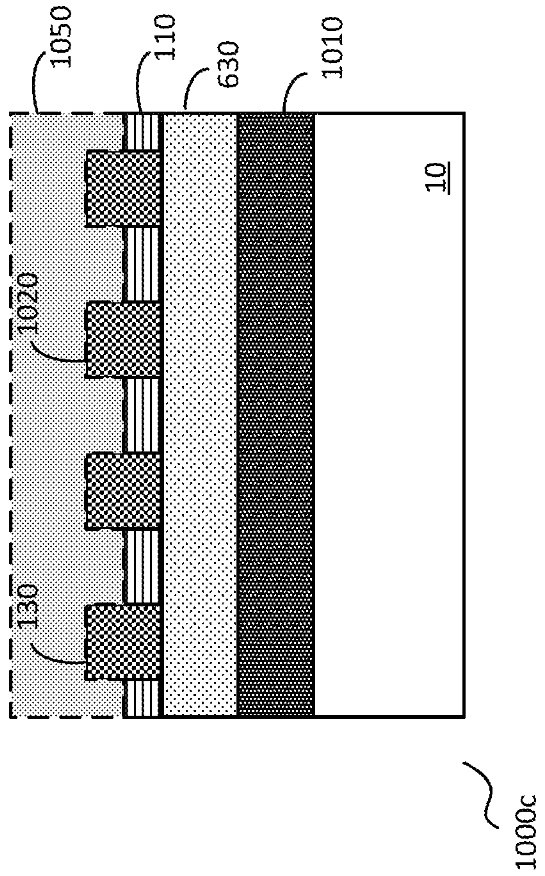
FIG. 10C is a schematic diagram illustrating an example cross-sectional view of the device of FIG. 10A taken along line 10C-10C.

Turning now to FIG. 10C, there may be shown a cross-sectional view 1000*c* of the device 1000, taken along line 10C-10C in FIG. 10A. In the figure, the device 1000 may be shown as comprising the substrate 10; the first pattern 1010 of electrode 620 deposited as shown in FIG. 10B, and the at least one semiconducting layer(s) 630.

In some non-limiting examples, the at least one semiconducting layer(s) 630 may be provided as a common layer across substantially all of the lateral aspect(s) of the device 1000.

A patterning coating 110 may be selectively disposed in a pattern substantially corresponding to the second pattern 1020 on the exposed layer surface 11 of the underlying layer, which, as shown in the figure, is the at least one semiconducting layer 630.

A deposited layer 130 suitable for forming the second pattern 1020 of electrode 620, 640, 1150, which in the figure is the second electrode 640, may be disposed on substantially all of the exposed layer surface 11 of the underlying layer, using an open mask and/or a mask-free deposition process. The underlying layer may comprise both regions of the patterning coating 110, disposed in the inverse of the second pattern 1020, and regions of the at least one semiconducting layer(s) 630, in the second pattern 1020 where the patterning coating 110 has not been deposited. In some non-limiting examples, the regions of the at least one semiconducting layer(s) 630 may correspond substantially to a first portion 101 comprising the elongated spaced-apart regions of the second pattern 1020, while the regions of the patterning coating 110 may correspond substantially to the gaps therebetween.

Because of the nucleation-inhibiting properties of those regions of the second pattern 1020 where the patterning coating 110 was disposed (corresponding to the gaps therebetween), the deposited layer 130 disposed on such regions may tend not to remain, resulting in a pattern of selective deposition of the deposited layer 130, that may correspond substantially to elongated spaced-apart regions of the second pattern 1020, leaving the first portion 101 comprising the gaps therebetween substantially devoid of a closed coating 140 of the deposited layer 130.

In other words, the deposited layer 130 that may form the second pattern 1020 of electrode 620, 640, 1150 may be selectively deposited substantially only on a second portion 102 comprising those regions of the at least one semiconducting layer 630 that define the elongated spaced-apart regions of the second pattern 1020.

In some non-limiting examples, an average layer thickness of the patterning coating 110 and of the deposited layer 130 deposited thereafter for forming either, or both, of the first pattern 1010, and/or the second pattern 1020 of electrode 620, 1150 may be varied according to a variety of parameters, including without limitation, a given application and given performance characteristics. In some non-limiting examples, the average layer thickness of the patterning coating 110 may be comparable to, and/or substantially less than an average layer thickness of the deposited layer 130 deposited thereafter. Use of a relatively thin patterning coating 110 to achieve selective patterning of a deposited layer 130 deposited thereafter may be suitable to provide flexible devices 600. In some non-limiting examples, a relatively thin patterning coating 110 may provide a relatively planar surface on which a barrier coating 1050 may be deposited. In some non-limiting examples, providing such a relatively planar surface for application of the barrier coating 1050 may increase adhesion of the barrier coating 1050 to such surface.

At least one of the first pattern 1010 of electrode 620, 640, 1150 and at least one of the second pattern 1020 of electrode 620, 640, 1150 may be electrically coupled with the power source 605, whether directly, and/or, in some non-limiting examples, through their respective driving circuit(s) to control EM radiation emission from the lateral aspect(s) 710 of the emissive region(s) 1001 corresponding to (sub-) pixel(s) 1810/134*x*.

Auxiliary Electrode

Those having ordinary skill in the relevant art will appreciate that the process of forming the second electrode 640 in the second pattern 1020 shown in FIGS. 10A-10C may, in some non-limiting examples, be used in similar fashion to form an auxiliary electrode 1150 for the device 600. In some non-limiting examples, the second electrode 640 thereof may comprise a common electrode, and the auxiliary electrode 1150 may be deposited in the second pattern 1020, in some non-limiting examples, above or in some non-limiting examples below, the second electrode 640 and electrically coupled therewith. In some non-limiting examples, the second pattern 1020 for such auxiliary electrode 1150 may be such that the elongated spaced-apart regions of the second pattern 1020 lie substantially within the lateral aspect(s) 720 of non-emissive region(s) 1002 surrounding the lateral aspect(s) 710 of emissive region(s) 1001 corresponding to (sub-) pixel(s) 1810/134*x*. In some non-limiting examples, the second pattern 1020 for such auxiliary electrodes 1150 may be such that the elongated spaced-apart regions of the second pattern 1020 lie substantially within the lateral aspect(s) 710 of emissive region(s) 1001 corresponding to (sub-) pixel(s) 1810/134*x*, and/or the lateral aspect(s) 720 of non-emissive region(s) 1002 surrounding them.

Figure 11:
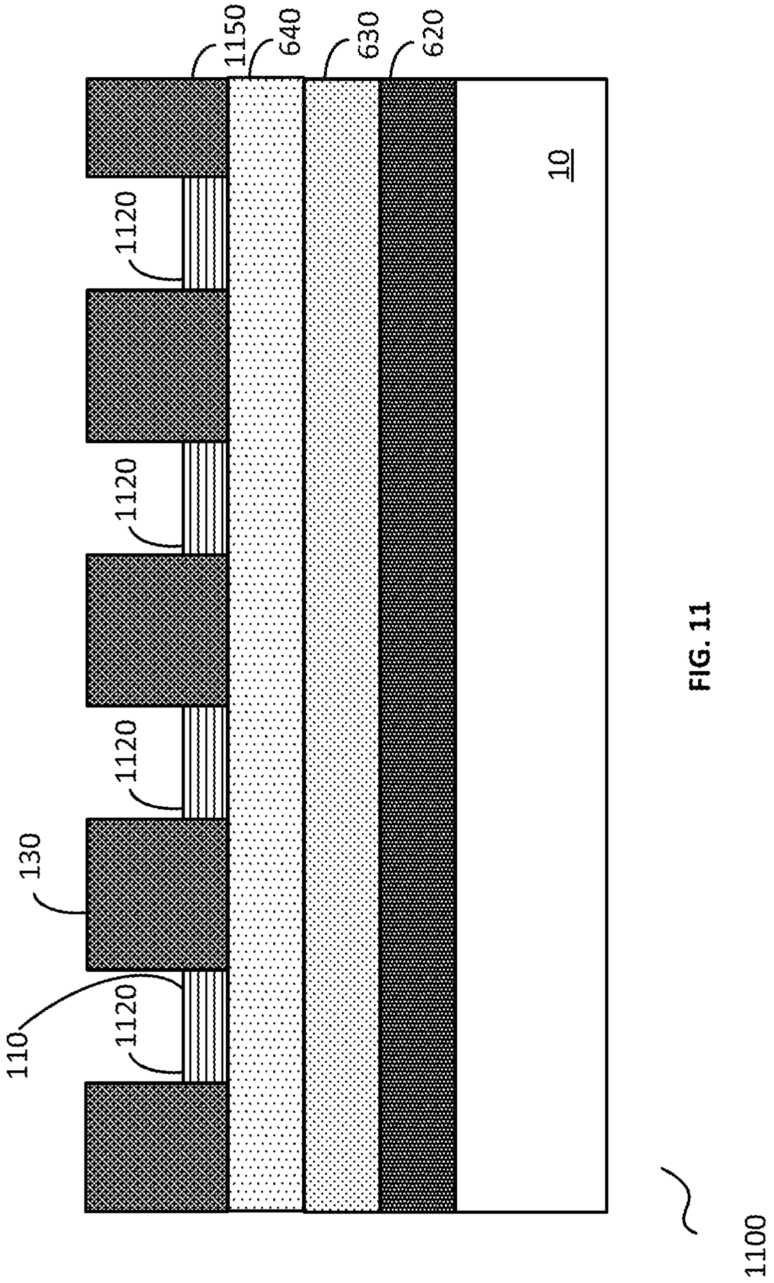
FIG. 11 is a schematic diagram illustrating a cross-sectional view of an example version of the device of FIG. 6, having an example patterned auxiliary electrode according to an example in the present disclosure.

FIG. 11 may show an example cross-sectional view of an example version 1100 of the device 600 that is substantially similar thereto, but further may comprise at least one auxiliary electrode 1150 disposed in a pattern above and electrically coupled (not shown) with the second electrode 640.

The auxiliary electrode 1150 may be electrically conductive. In some non-limiting examples, the auxiliary electrode 1150 may be formed by at least one metal, and/or metal oxide. Non-limiting examples of such metals include Cu, Al, molybdenum (Mo), or Ag. By way of non-limiting example, the auxiliary electrode 1150 may comprise a multilayer metallic structure, including without limitation, one formed by Mo/Al/Mo. Non-limiting examples of such metal oxides include ITO, ZnO, IZO, or other oxides containing In, or Zn. In some non-limiting examples, the auxiliary electrode 1150 may comprise a multi-layer structure formed by a combination of at least one metal and at least one metal oxide, including without limitation, Ag/ITO, Mo/ITO, ITO/Ag/ITO, or ITO/Mo/ITO. In some non-limiting examples, the auxiliary electrode 1150 comprises a plurality of such electrically conductive materials.

The device 1100 may be shown as comprising the substrate 10, the first electrode 620 and the at least one semiconducting layer 630.

The second electrode 640 may be disposed on substantially all of the exposed layer surface 11 of the at least one semiconducting layer 630.

In some non-limiting examples, particularly in a top-emission device 1100, the second electrode 640 may be formed by depositing a relatively thin conductive film layer (not shown) in order, by way of non-limiting example, to reduce optical interference (including, without limitation, attenuation, reflections, and/or diffusion) related to the presence of the second electrode 640. In some non-limiting examples, as discussed elsewhere, a reduced thickness of the second electrode 640, may generally increase a sheet resistance of the second electrode 640, which may, in some non-limiting examples, reduce the performance, and/or efficiency of the device 1100. By providing the auxiliary electrode 1150 that may be electrically coupled with the second electrode 640, the sheet resistance and thus, the IR drop associated with the second electrode 640, may, in some non-limiting examples, be decreased.

In some non-limiting examples, the device 1100 may be a bottom-emission, and/or double-sided emission device 1100. In such examples, the second electrode 640 may be formed as a relatively thick conductive layer without substantially affecting optical characteristics of such a device 1100. Nevertheless, even in such scenarios, the second electrode 640 may nevertheless be formed as a relatively thin conductive film layer (not shown), by way of non-limiting example, so that the device 1100 may be substantially transmissive relative to EM radiation incident on an external surface thereof, such that a substantial part of such externally-incident EM radiation may be transmitted through the device 1100, in addition to the emission of EM radiation generated internally within the device 1100 as disclosed herein.

A patterning coating 110 may be selectively disposed in a pattern on the exposed layer surface 11 of the underlying layer, which, as shown in the figure, may be the second electrode 640. In some non-limiting examples, as shown in the figure, the patterning coating 110 may be disposed, in a first portion 101 of the pattern, as a series of parallel rows 1120 that may correspond to the lateral aspects 720 of the non-emissive regions 1002.

A deposited layer 130 suitable for forming the patterned auxiliary electrode 1150, may be disposed on substantially all of the exposed layer surface 11 of the underlying layer, using an open mask and/or a mask-free deposition process. The underlying layer may comprise both regions of the patterning coating 110, disposed in the pattern of rows 1120, and regions of the second electrode 640 where the patterning coating 110 has not been deposited.

Because of the nucleation-inhibiting properties of those rows 1120 where the patterning coating 110 was disposed, the deposited material 331 disposed on such rows 1120 may tend to not remain, resulting in a pattern of selective deposition of the deposited layer 130, that may correspond substantially to at least one second portion 102 of the pattern, leaving the first portion 101 comprising the rows 1120 substantially devoid of a closed coating 140 of the deposited layer 130.

In other words, the deposited layer 130 that may form the auxiliary electrode 1150 may be selectively deposited substantially only on a second portion 102 comprising those regions of the at least one semiconducting layer 630, that surround but do not occupy the rows 1120.

In some non-limiting examples, selectively depositing the auxiliary electrode 1150 to cover only certain rows 1120 of the lateral aspect of the device 1100, while other regions thereof remain uncovered, may control, and/or reduce optical interference related to the presence of the auxiliary electrode 1150.

In some non-limiting examples, the auxiliary electrode 1150 may be selectively deposited in a pattern that may not be readily detected by the naked eye from a typical viewing distance.

In some non-limiting examples, the auxiliary electrode 1150 may be formed in devices other than OLED devices, including for decreasing an effective resistance of the electrodes of such devices.

The ability to pattern electrodes 620, 640, 1150, including without limitation, the second electrode 640, and/or the auxiliary electrode 1150 without employing a shadow mask 215 during the high-temperature deposited layer 130 deposition process by employing a patterning coating 110, including without limitation, the process depicted in FIG. 2, may allow numerous configurations of auxiliary electrodes 1150 to be deployed.

In some non-limiting examples, the auxiliary electrode 1150 may be disposed between neighbouring emissive regions 1001 and electrically coupled with the second electrode 640. In non-limiting examples, a width of the auxiliary electrode 1150 may be less than a separation distance between the neighbouring emissive regions 1001. As a result, there may exist a gap within the at least one non-emissive region 1002 on each side of the auxiliary electrode 1150. In some non-limiting examples, such an arrangement may reduce a likelihood that the auxiliary electrode 1150 would interfere with an optical output of the device 1100, in some non-limiting examples, from at least one of the emissive regions 1001. In some non-limiting examples, such an arrangement may be appropriate where the auxiliary electrode 1150 is relatively thick (in some non-limiting examples, greater than several hundred nm, and/or on the order of a few microns in thickness). In some non-limiting examples, an aspect ratio of the auxiliary electrode 1150 may exceed about 0.05, such as at least one of at least about: 0.1, 0.2, 0.5, 0.8, 1, or 2. By way of non-limiting example, a height (thickness) of the auxiliary electrode 1150 may exceed about 50 nm, such as at least one of at least about: 80 nm, 100 nm, 200 nm, 500 nm, 700 nm, 1,000 nm, 1,500 nm, 1,700 nm, or 2,000 nm.

Figure 12:
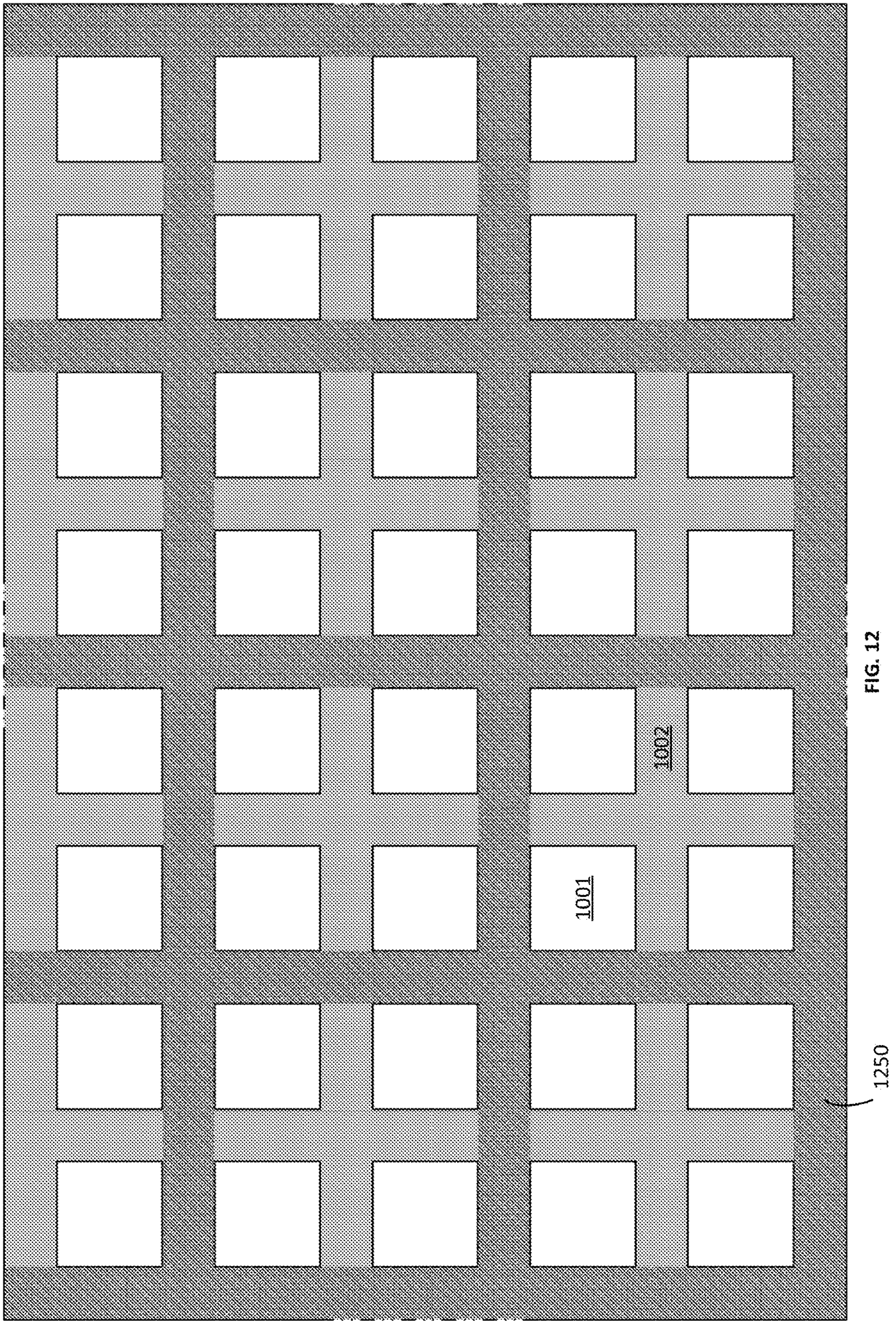
FIG. 12 is a schematic diagram illustrating, in plan view, an example pattern of an auxiliary electrode overlaying at least one emissive region and at least one non-emissive region according to an example in the present disclosure.

FIG. 12 may show, in plan view, a schematic diagram showing an example of a pattern 1250 of the auxiliary electrode 1150 formed as a grid that may be overlaid over both the lateral aspects 710 of emissive regions 1001, which may correspond to (sub-) pixel(s) 1810/134*x* of an example version 1200 of device 600, and the lateral aspects 720 of non-emissive regions 1002 surrounding the emissive regions 1001.

In some non-limiting examples, the auxiliary electrode pattern 1250 may extend substantially only over some but not all of the lateral aspects 720 of non-emissive regions 1002, to not substantially cover any of the lateral aspects 710 of the emissive regions 1001.

Those having ordinary skill in the relevant art will appreciate that while, in the figure, the pattern 1250 of the auxiliary electrode 1150 may be shown as being formed as a continuous structure such that all elements thereof are both physically connected to and electrically coupled with one another and electrically coupled with at least one electrode 620, 640, 1150, which in some non-limiting examples may be the first electrode 620, and/or the second electrode 640, in some non-limiting examples, the pattern 1250 of the auxiliary electrode 1150 may be provided as a plurality of discrete elements of the pattern 1250 of the auxiliary electrode 1150 that, while remaining electrically coupled with one another, may not be physically connected to one another. Even so, such discrete elements of the pattern 1250 of the auxiliary electrode 1150 may still substantially lower a sheet resistance of the at least one electrode 620, 640, 1150 with which they are electrically coupled, and consequently of the device 1200, to increase an efficiency of the device 1200 without substantially interfering with its optical characteristics.

In some non-limiting examples, auxiliary electrodes 1150 may be employed in devices 1200 with a variety of arrangements of (sub-) pixel(s) 1810/134*x*. In some non-limiting examples, the (sub-) pixel 1810/134*x* arrangement may be substantially diamond-shaped.

Figure 13A:
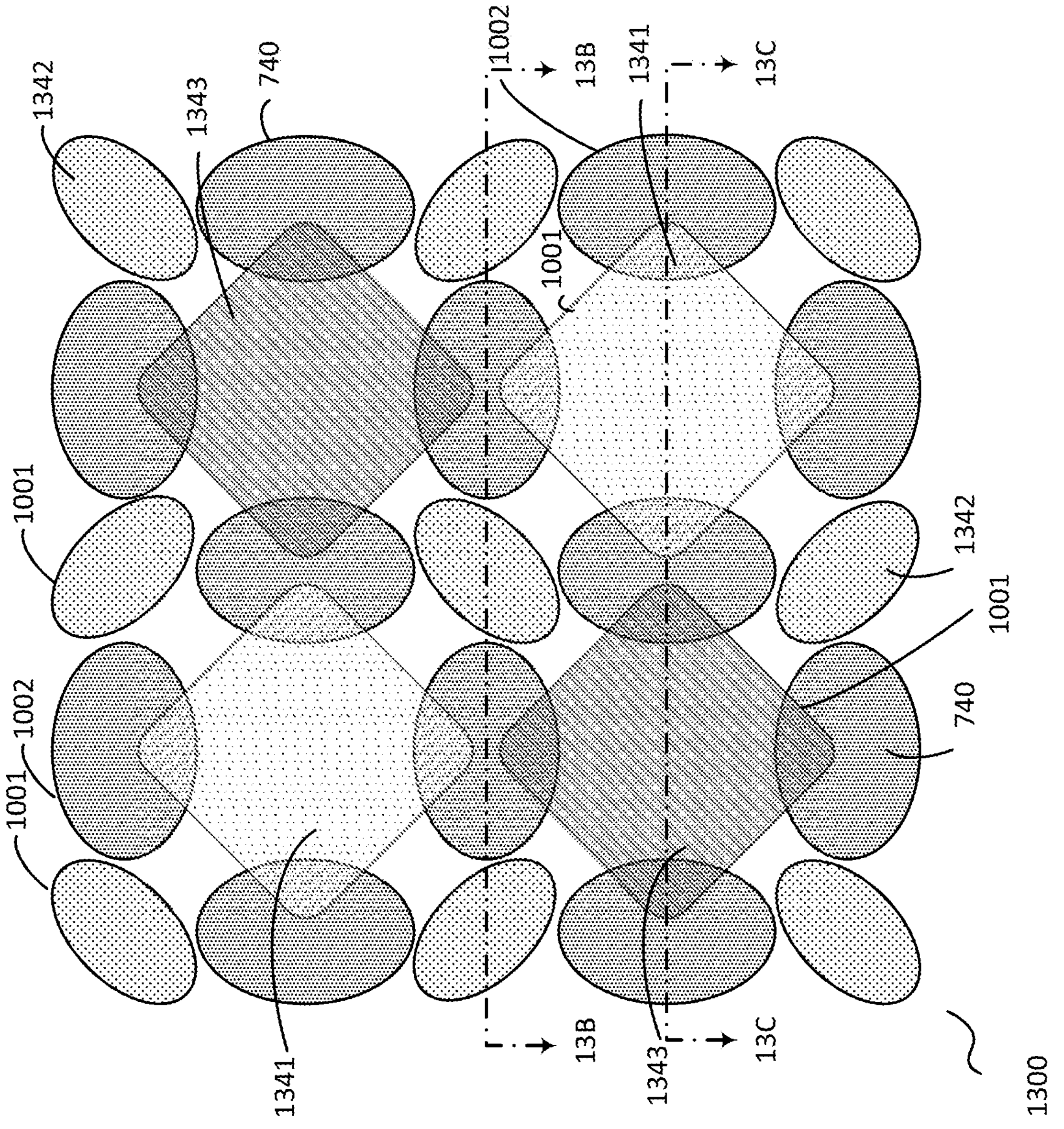
FIG. 13A is a schematic diagram illustrating, in plan view, an example pattern of an example version of the device of FIG. 6, having a plurality of groups of emissive regions in a diamond configuration according to an example in the present disclosure.

By way of non-limiting example, FIG. 13A may show, in plan, in an example version 1300 of device 600, a plurality of groups 1341-1343 of emissive regions 1001 each corresponding to a sub-pixel 134*x*, surrounded by the lateral aspects of a plurality of non-emissive regions 1002 comprising PDLs 740 in a diamond configuration. In some non-limiting examples, the configuration may be defined by patterns 1341-1343 of emissive regions 1001 and PDLs 740 in an alternating pattern of first and second rows.

In some non-limiting examples, the lateral aspects 720 of the non-emissive regions 1002 comprising PDLs 740 may be substantially elliptically shaped. In some non-limiting examples, the major axes of the lateral aspects 720 of the non-emissive regions 1002 in the first row may be aligned and substantially normal to the major axes of the lateral aspects 720 of the non-emissive regions 1002 in the second row. In some non-limiting examples, the major axes of the lateral aspects 720 of the non-emissive regions 1002 in the first row may be substantially parallel to an axis of the first row.

In some non-limiting examples, a first group 1341 of emissive regions 1001 may correspond to sub-pixels 134*x* that emit EM radiation at a first wavelength, in some non-limiting examples the sub-pixels 134*x* of the first group 1341 may correspond to R(ed) sub-pixels 1341. In some non-limiting examples, the lateral aspects 710 of the emissive regions 1001 of the first group 1341 may have a substantially diamond-shaped configuration. In some non-limiting examples, the emissive regions 1001 of the first group 1341 may lie in the pattern of the first row, preceded and followed by PDLs 740. In some non-limiting examples, the lateral aspects 710 of the emissive regions 1001 of the first group 1341 may slightly overlap the lateral aspects 720 of the preceding and following non-emissive regions 1002 comprising PDLs 740 in the same row, as well as of the lateral aspects 720 of adjacent non-emissive regions 1002 comprising PDLs 740 in a preceding and following pattern of the second row.

In some non-limiting examples, a second group 1342 of emissive regions 1001 may correspond to sub-pixels 134*x* that emit EM radiation at a second wavelength, in some non-limiting examples the sub-pixels 134*x* of the second group 1342 may correspond to G(reen) sub-pixels 1342. In some non-limiting examples, the lateral aspects 710 of the emissive regions 1001 of the second group 1342 may have a substantially elliptical configuration. In some non-limiting examples, the emissive regions 1001 of the second group 1342 may lie in the pattern of the second row, preceded and followed by PDLs 740. In some non-limiting examples, a major axis of some of the lateral aspects 710 of the emissive regions 1001 of the second group 1342 may be at a first angle, which in some non-limiting examples, may be 45° relative to an axis of the second row. In some non-limiting examples, a major axis of others of the lateral aspects 710 of the emissive regions 1001 of the second group 1342 may be at a second angle, which in some non-limiting examples may be substantially normal to the first angle. In some non-limiting examples, the emissive regions 1001 of the second group 1342, whose lateral aspects 710 may have a major axis at the first angle, may alternate with the emissive regions 1001 of the second group 1342, whose lateral aspects 710 may have a major axis at the second angle.

In some non-limiting examples, a third group 1343 of emissive regions 1001 may correspond to sub-pixels 134*x* that emit EM radiation at a third wavelength, in some non-limiting examples the sub-pixels 134*x* of the third group 1343 may correspond to B(lue) sub-pixels 1343. In some non-limiting examples, the lateral aspects 710 of the emissive regions 1001 of the third group 1343 may have a substantially diamond-shaped configuration. In some non-limiting examples, the emissive regions 1001 of the third group 1343 may lie in the pattern of the first row, preceded and followed by PDLs 740. In some non-limiting examples, the lateral aspects 710 of the emissive regions 1001 of the third group 1343 may slightly overlap the lateral aspects 720 of the preceding and following non-emissive regions 1002 comprising PDLs 740 in the same row, as well as of the lateral aspects 720 of adjacent non-emissive regions 1002 comprising PDLs 740 in a preceding and following pattern of the second row. In some non-limiting examples, the pattern of the second row may comprise emissive regions 1001 of the first group 1341 alternating emissive regions 1001 of the third group 1343, each preceded and followed by PDLs 740.

Figure 13B:
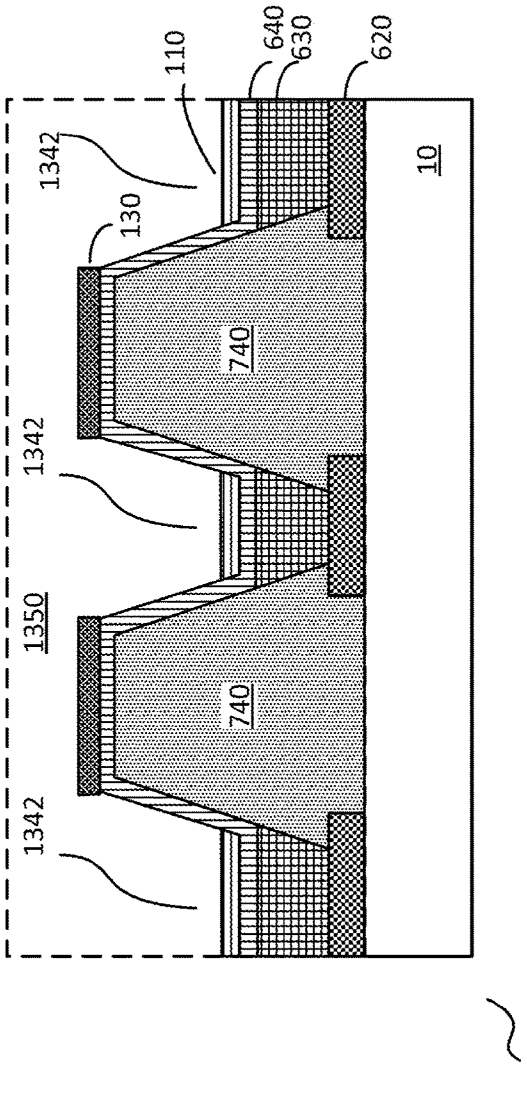
FIG. 13B is a schematic diagram illustrating an example cross-sectional view of the device of FIG. 13A taken along line 13B-13B.

Turning now to FIG. 13B, there may be shown an example cross-sectional view of the device 1300, taken along line 13B-13B in FIG. 13A. In the figure, the device 1300 may be shown as comprising a substrate 10 and a plurality of elements of a first electrode 620, formed on an exposed layer surface 11 thereof. The substrate 10 may comprise the base substrate 612 (not shown for purposes of simplicity of illustration), and/or at least one TFT structure 701 (not shown for purposes of simplicity of illustration), corresponding to and for driving each sub-pixel 134*x*. PDLs 740 may be formed over the substrate 10 between elements of the first electrode 620, to define emissive region(s) 1001 over each element of the first electrode 620, separated by non-emissive region(s) 1002 comprising the PDL(s) 740. In the figure, the emissive region(s) 1001 may all correspond to the second group 1342.

In some non-limiting examples, at least one semiconducting layer 630 may be deposited on each element of the first electrode 620, between the surrounding PDLs 740.

In some non-limiting examples, a second electrode 640, which in some non-limiting examples, may be a common cathode, may be deposited over the emissive region(s) 1001 of the second group 1342 to form the G(reen) sub-pixel(s) 1342 thereof and over the surrounding PDLs 740.

In some non-limiting examples, a patterning coating 110 may be selectively deposited over the second electrode 640 across the lateral aspects 710 of the emissive region(s) 1001 of the second group 1342 of G(reen) sub-pixels 1342 to allow selective deposition of a deposited layer 130 over parts of the second electrode 640 that may be substantially devoid of the patterning coating 110, namely across the lateral aspects 720 of the non-emissive region(s) 1002 comprising the PDLs 740. In some non-limiting examples, the deposited layer 130 may tend to accumulate along the substantially planar parts of the PDLs 740, as the deposited layer 130 may tend to not remain on the inclined parts of the PDLs 740 but may tend to descend to a base of such inclined parts, which may be coated with the patterning coating 110. In some non-limiting examples, the deposited layer 130 on the substantially planar parts of the PDLs 740 may form at least one auxiliary electrode 1150 that may be electrically coupled with the second electrode 640.

In some non-limiting examples, the device 1300 may comprise a CPL, and/or an outcoupling layer. By way of non-limiting example, such CPL, and/or outcoupling layer may be provided directly on a surface of the second electrode 640, and/or a surface of the patterning coating 110. In some non-limiting examples, such CPL, and/or outcoupling layer may be provided across the lateral aspect of at least one emissive region 1001 corresponding to a (sub-) 1810/134*x*.

In some non-limiting examples, the patterning coating 110 may also act as an index-matching coating. In some non-limiting examples, the patterning coating 110 may also act as an outcoupling layer.

In some non-limiting examples, the device 1300 may comprise an encapsulation layer 1350. Non-limiting examples of such encapsulation layer 1350 include a glass cap, a barrier film, a barrier adhesive, a barrier coating 1050, and/or a TFE layer such as shown in dashed outline in the figure, provided to encapsulate the device 1300. In some non-limiting examples, the TFE layer 1050 may be considered a type of barrier coating 1050.

In some non-limiting examples, the encapsulation layer 1350 may be arranged above at least one of the second electrode 640, and/or the patterning coating 110. In some non-limiting examples, the device 1300 may comprise additional optical, and/or structural layers, coatings, and components, including without limitation, a polarizer, a color filter, an anti-reflection coating, an anti-glare coating, cover glass, and/or an optically clear adhesive (OCA).

Figure 13C:
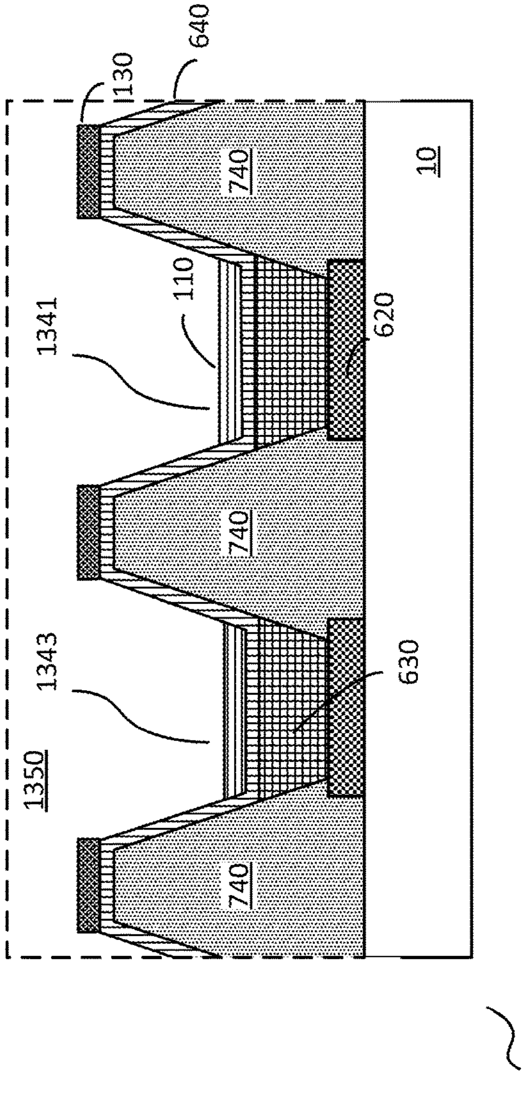
FIG. 13C is a schematic diagram illustrating an example cross-sectional view of the device of FIG. 13A taken along line 13C-13C.

Turning now to FIG. 13C, there may be shown an example cross-sectional view of the device 1300, taken along line 13C-13C in FIG. 13A. In the figure, the device 1300 may be shown as comprising a substrate 10 and a plurality of elements of a first electrode 620, formed on an exposed layer surface 11 thereof. PDLs 740 may be formed over the substrate 10 between elements of the first electrode 620, to define emissive region(s) 1001 over each element of the first electrode 620, separated by non-emissive region(s) 1002 comprising the PDL(s) 740. In the figure, the emissive region(s) 1001 may correspond to the first group 1341 and to the third group 1343 in alternating fashion.

In some non-limiting examples, at least one semiconducting layer 630 may be deposited on each element of the first electrode 620, between the surrounding PDLs 740.

In some non-limiting examples, a second electrode 640, which in some non-limiting examples, may be a common cathode, may be deposited over the emissive region(s) 1001 of the first group 1341 to form the R(ed) sub-pixel(s) 1341 thereof, over the emissive region(s) 1001 of the third group 1343 to form the B(lue) sub-pixel(s) 1343 thereof, and over the surrounding PDLs 740.

In some non-limiting examples, a patterning coating 110 may be selectively deposited over the second electrode 640 across the lateral aspects 710 of the emissive region(s) 1001 of the first group 1341 of R(ed) sub-pixels 1341 and of the third group 1343 of B(lue) sub-pixels 1343 to allow selective deposition of a deposited layer 130 over parts of the second electrode 640 that may be substantially devoid of the patterning coating 110, namely across the lateral aspects 720 of the non-emissive region(s) 1002 comprising the PDLs 740. In some non-limiting examples, the deposited layer 130 may tend to accumulate along the substantially planar parts of the PDLs 740, as the deposited layer 130 may tend to not remain on the inclined parts of the PDLs 740 but may tend to descend to a base of such inclined parts, which are coated with the patterning coating 110. In some non-limiting examples, the deposited layer 130 on the substantially planar parts of the PDLs 740 may form at least one auxiliary electrode 1150 that may be electrically coupled with the second electrode 640.

Figure 14:
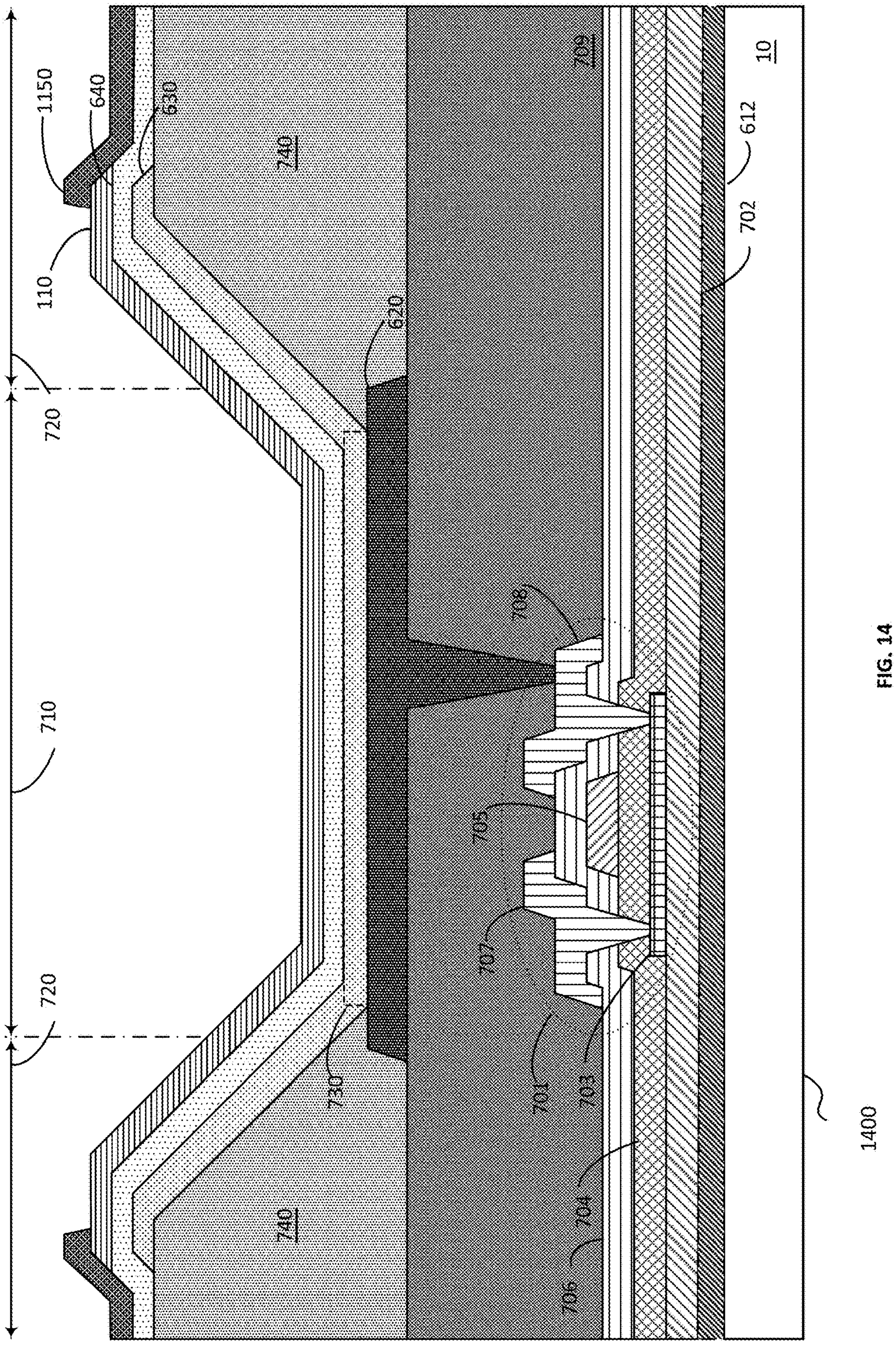
FIG. 14 is a schematic diagram illustrating an example cross-sectional view of an example version of the device of FIG. 7 with additional example deposition steps according to an example in the present disclosure.

Turning now to FIG. 14, there may be shown an example version 1400 of the device 600, which may encompass the device shown in cross-sectional view in FIG. 7, but with additional deposition steps that are described herein.

The device 1400 may show a patterning coating 110 selectively deposited over the exposed layer surface 11 of the underlying layer, in the figure, the second electrode 640, within a first portion 101 of the device 1400, corresponding substantially to the lateral aspect 710 of emissive region(s) 1001 corresponding to (sub-) pixel(s) 1810/134*x* and not within a second portion 102 of the device 1400, corresponding substantially to the lateral aspect(s) 720 of non-emissive region(s) 1002 surrounding the first portion 101.

In some non-limiting examples, the patterning coating 110 may be selectively deposited using a shadow mask 215.

The patterning coating 110 may provide, within the first portion 101, an exposed layer surface 11 with a relatively low initial sticking probability against deposition of a deposited material 331 to be thereafter deposited as a deposited layer 130 to form an auxiliary electrode 1150.

After selective deposition of the patterning coating 110, the deposited material 331 may be deposited over the device 1400 but may remain substantially only within the second portion 102, which may be substantially devoid of any patterning coating 110, to form the auxiliary electrode 1150.

In some non-limiting examples, the deposited material 331 may be deposited using an open mask and/or a mask-free deposition process.

The auxiliary electrode 1150 may be electrically coupled with the second electrode 640 to reduce a sheet resistance of the second electrode 640, including, as shown, by lying above and in physical contact with the second electrode 640 across the second portion that may be substantially devoid of any patterning coating 110.

In some non-limiting examples, the deposited layer 130 may comprise substantially the same material as the second electrode 640, to ensure a high initial sticking probability against deposition of the deposited material 331 in the second portion 102.

In some non-limiting examples, the second electrode 640 may comprise substantially pure Mg, and/or an alloy of Mg and another metal, including without limitation, Ag. In some non-limiting examples, an Mg:Ag alloy composition may range from about 1:9-9:1 by volume. In some non-limiting examples, the second electrode 640 may comprise metal oxides, including without limitation, ternary metal oxides, such as, without limitation, ITO, and/or IZO, and/or a combination of metals, and/or metal oxides.

In some non-limiting examples, the deposited layer 130 used to form the auxiliary electrode 1150 may comprise substantially pure Mg.

Figure 15:
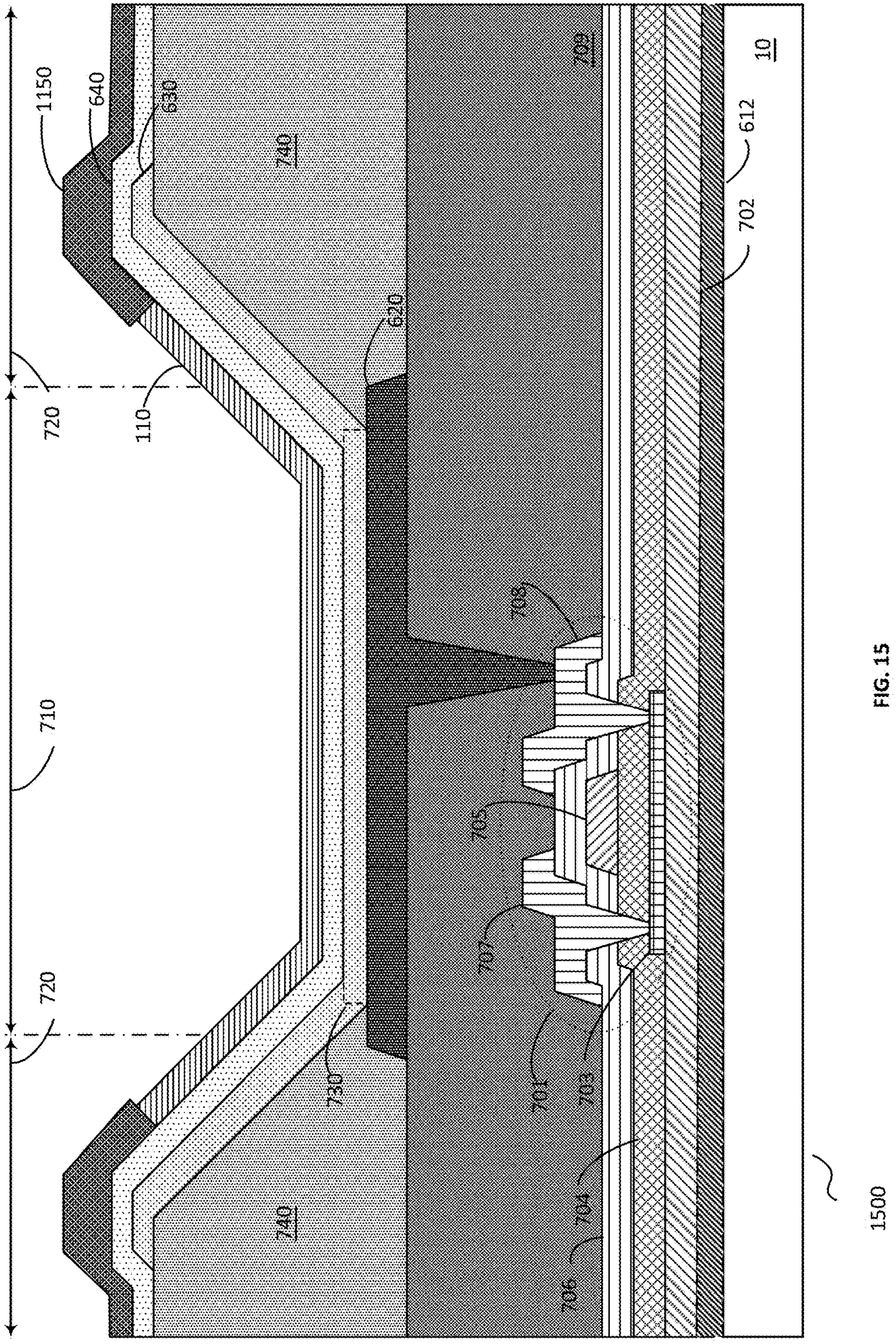
FIG. 15 is a schematic diagram illustrating an example cross-sectional view of an example version of the device of FIG. 7 with additional example deposition steps according to an example in the present disclosure.

Turning now to FIG. 15, there may be shown an example version 1500 of the device 600, which may encompass the device shown in cross-sectional view in FIG. 7, but with additional deposition steps that are described herein.

The device 1500 may show a patterning coating 110 selectively deposited over the exposed layer surface 11 of the underlying layer, in the figure, the second electrode 640, within a first portion 101 of the device 1500, corresponding substantially to a part of the lateral aspect 710 of emissive region(s) 1001 corresponding to (sub-) pixel(s) 1810/134*x*, and not within a second portion 102. In the figure, the first portion 101 may extend partially along the extent of an inclined part of the PDLs 740 defining the emissive region(s) 1001.

In some non-limiting examples, the patterning coating 110 may be selectively deposited using a shadow mask 215.

The patterning coating 110 may provide, within the first portion 101, an exposed layer surface 11 with a relatively low initial sticking probability against deposition of a deposited material 331 to be thereafter deposited as a deposited layer 130 to form an auxiliary electrode 1150.

After selective deposition of the patterning coating 110, the deposited material 331 may be deposited over the device 1500 but may remain substantially only within the second portion 102, which may be substantially devoid of patterning coating 110, to form the auxiliary electrode 1150. As such, in the device 1500, the auxiliary electrode 1150 may extend partly across the inclined part of the PDLs 740 defining the emissive region(s) 1001.

In some non-limiting examples, the deposited layer 130 may be deposited using an open mask and/or a mask-free deposition process.

The auxiliary electrode 1150 may be electrically coupled with the second electrode 640 to reduce a sheet resistance of the second electrode 640, including, as shown, by lying above and in physical contact with the second electrode 640 across the second portion 102 that may be substantially devoid of patterning coating 110.

In some non-limiting examples, the material of which the second electrode 640 may be comprised, may not have a high initial sticking probability against deposition of the deposited material 331.

Figure 16:
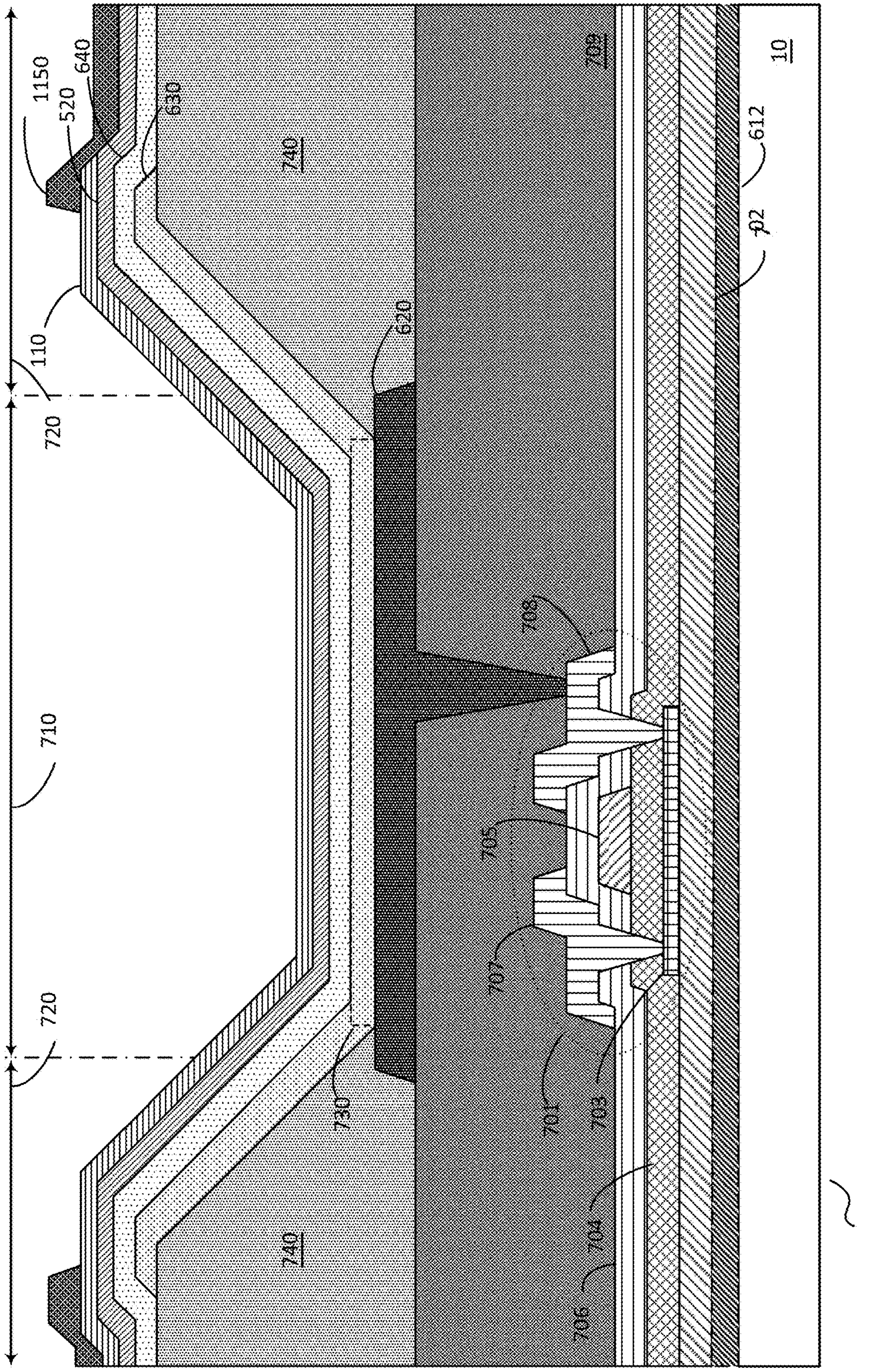
FIG. 16 is a schematic diagram illustrating an example cross-sectional view of an example version of the device of FIG. 7 with additional example deposition steps according to an example in the present disclosure.

FIG. 16 may illustrate such a scenario, in which there may be shown an example version 1600 of the device 600, which may encompass the device shown in cross-sectional view in FIG. 7, but with additional deposition steps that are described herein.

The device 1600 may show an NPC 520 deposited over the exposed layer surface 11 of the underlying material, in the figure, the second electrode 640.

In some non-limiting examples, the NPC 520 may be deposited using an open mask and/or a mask-free deposition process.

Thereafter, a patterning coating 110 may be deposited selectively deposited over the exposed layer surface 11 of the underlying material, in the figure, the NPC 520, within a first portion 101 of the device 1600, corresponding substantially to a part of the lateral aspect 710 of emissive region(s) 1001 corresponding to (sub-) pixel(s) 1810/134*x*, and not within a second portion 102 of the device 1600, corresponding substantially to the lateral aspect(s) 720 of non-emissive region(s) 1002 surrounding the first portion 101.

In some non-limiting examples, the patterning coating 110 may be selectively deposited using a shadow mask 215.

The patterning coating 110 may provide, within the first portion 101, an exposed layer surface 11 with a relatively low initial sticking probability against deposition of a deposited material 331 to be thereafter deposited as a deposited layer 130 to form an auxiliary electrode 1150.

After selective deposition of the patterning coating 110, the deposited material 331 may be deposited over the device 1600 but may remain substantially only within the second portion 102, which may be substantially devoid of patterning coating 110, to form the auxiliary electrode 1150.

In some non-limiting examples, the deposited layer 130 may be deposited using an open mask and/or a mask-free deposition process.

The auxiliary electrode 1150 may be electrically coupled with the second electrode 640 to reduce a sheet resistance thereof. While, as shown, the auxiliary electrode 1150 may not be lying above and in physical contact with the second electrode 640, those having ordinary skill in the relevant art will nevertheless appreciate that the auxiliary electrode 1150 may be electrically coupled with the second electrode 640 by several well-understood mechanisms. By way of non-limiting example, the presence of a relatively thin film (in some non-limiting examples, of up to about 50 nm) of a patterning coating 110 may still allow a current to pass therethrough, thus allowing a sheet resistance of the second electrode 640 to be reduced.

Figure 17:
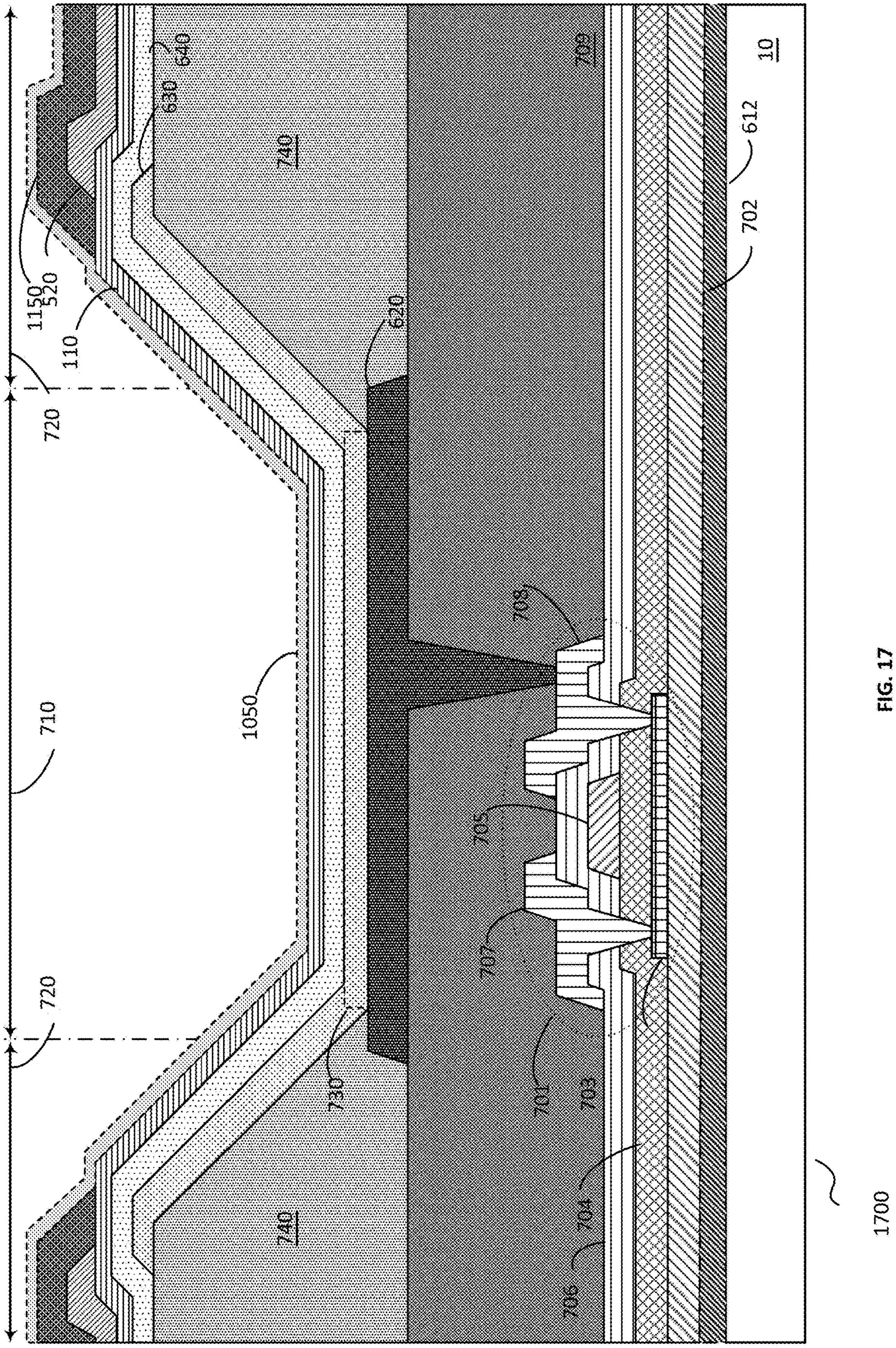
FIG. 17 is a schematic diagram illustrating an example cross-sectional view of an example version of the device of FIG. 7 with additional example deposition steps according to an example in the present disclosure.

Turning now to FIG. 17, there may be shown an example version 1700 of the device 600, which may encompass the device shown in cross-sectional view in FIG. 7, but with additional deposition steps that are described herein.

The device 1700 may show a patterning coating 110 deposited over the exposed layer surface 11 of the underlying material, in the figure, the second electrode 640.

In some non-limiting examples, the patterning coating 110 may be deposited using an open mask and/or a mask-free deposition process.

The patterning coating 110 may provide an exposed layer surface 11 with a relatively low initial sticking probability against deposition of a deposited material 331 to be thereafter deposited as a deposited layer 130 to form an auxiliary electrode 1150.

After deposition of the patterning coating 110, an NPC 520 may be selectively deposited over the exposed layer surface 11 of the underlying layer, in the figure, the patterning coating 110, corresponding substantially to a part of the lateral aspect 720 of non-emissive region(s) 1002, and surrounding a second portion 102 of the device 1700, corresponding substantially to the lateral aspect(s) 710 of emissive region(s) 1001 corresponding to (sub-) pixel(s) 1810/134*x*.

In some non-limiting examples, the NPC 520 may be selectively deposited using a shadow mask 215.

The NPC 520 may provide, within the first portion 101, an exposed layer surface 11 with a relatively high initial sticking probability against deposition of a deposited material 331 to be thereafter deposited as a deposited layer 130 to form an auxiliary electrode 1150.

After selective deposition of the NPC 520, the deposited material 331 may be deposited over the device 1700 but may remain substantially where the patterning coating 110 has been overlaid with the NPC 520, to form the auxiliary electrode 1150.

In some non-limiting examples, the deposited layer 130 may be deposited using an open mask and/or a mask-free deposition process.

The auxiliary electrode 1150 may be electrically coupled with the second electrode 640 to reduce a sheet resistance of the second electrode 640.

Transparent OLED

Because the OLED device 600 may emit EM radiation through either, or both, of the first electrode 620 (in the case of a bottom-emission, and/or a double-sided emission device), as well as the substrate 10, and/or the second electrode 640 (in the case of a top-emission, and/or double-sided emission device), there may be an aim to make either, or both of, the first electrode 620, and/or the second electrode 640 substantially EM radiation-(or light)-transmissive ("transmissive"), in some non-limiting examples, at least across a substantial part of the lateral aspect of the emissive region(s) 1001 of the device 600. In the present disclosure, such a transmissive element, including without limitation, an electrode 620, 640, a material from which such element may be formed, and/or property thereof, may comprise an element, material, and/or property thereof that is substantially transmissive ("transparent"), and/or, in some non-limiting examples, partially transmissive ("semi-transparent"), in some non-limiting examples, in at least one wavelength range.

A variety of mechanisms may be adopted to impart transmissive properties to the device 600, at least across a substantial part of the lateral aspect of the emissive region(s) 1001 thereof.

In some non-limiting examples, including without limitation, where the device 600 is a bottom-emission device, and/or a double-sided emission device, the TFT structure(s) 701 of the driving circuit associated with an emissive region 1001 of a (sub-) pixel 1810/134*x*, which may at least partially reduce the transmissivity of the surrounding substrate 10, may be located within the lateral aspect 720 of the surrounding non-emissive region(s) 1002 to avoid impacting the transmissive properties of the substrate 10 within the lateral aspect 710 of the emissive region 1001.

In some non-limiting examples, where the device 600 is a double-sided emission device, in respect of the lateral aspect 710 of an emissive region 1001 of a (sub-) pixel 1810/134*x*, a first one of the electrodes 620, 640 may be made substantially transmissive, including without limitation, by at least one of the mechanisms disclosed herein, in respect of the lateral aspect 710 of neighbouring, and/or adjacent (sub-) pixel(s) 1810/134*x*, a second one of the electrodes 620, 640 may be made substantially transmissive, including without limitation, by at least one of the mechanisms disclosed herein. Thus, the lateral aspect 710 of a first emissive region 1001 of a (sub-) pixel 1810/134*x* may be made substantially top-emitting while the lateral aspect 710 of a second emissive region 1001 of a neighbouring (sub-) pixel 1810/134*x* may be made substantially bottom-emitting, such that a subset of the (sub-) pixel(s) 1810/134*x* may be substantially top-emitting and a subset of the (sub-) pixel(s) 1810/134*x* may be substantially bottom-emitting, in an alternating (sub-) pixel 1810/134*x* sequence, while only a single electrode 620, 640 of each (sub-) pixel 1810/134*x* may be made substantially transmissive.

In some non-limiting examples, a mechanism to make an electrode 620, 640, in the case of a bottom-emission device, and/or a double-sided emission device, the first electrode 620, and/or in the case of a top-emission device, and/or a double-sided emission device, the second electrode 640, transmissive, may be to form such electrode 620, 640 of a transmissive thin film.

In some non-limiting examples, an electrically conductive deposited layer 130, in a thin film, including without limitation, those formed by a depositing a thin conductive film layer of a metal, including without limitation, Ag, Al, and/or by depositing a thin layer of a metallic alloy, including without limitation, an Mg:Ag alloy, and/or a Yb:Ag alloy, may exhibit transmissive characteristics. In some non-limiting examples, the alloy may comprise a composition ranging from between about 1:9-9:1 by volume. In some non-limiting examples, the electrode 620, 640 may be formed of a plurality of thin conductive film layers of any combination of deposited layers 130, any at least one of which may be comprised of TCOs, thin metal films, thin metallic alloy films, and/or any combination of any of these.

In some non-limiting examples, especially in the case of such thin conductive films, a relatively thin layer thickness may be up to substantially a few tens of nm to contribute to enhanced transmissive qualities but also favorable optical properties (including without limitation, reduced microcavity effects) for use in an OLED device 600.

In some non-limiting examples, a reduction in the thickness of an electrode 620, 640 to promote transmissive qualities may be accompanied by an increase in the sheet resistance of the electrode 620, 640.

In some non-limiting examples, a device 600 having at least one electrode 620, 640 with a high sheet resistance may create a large current resistance (IR) drop when coupled with the power source 605, in operation. In some non-limiting examples, such an IR drop may be compensated for, to some extent, by increasing a level of the power source 605. However, in some non-limiting examples, increasing the level of the power source 605 to compensate for the IR drop due to high sheet resistance, for at least one (sub-) pixel 1810/134*x* may call for increasing the level of a voltage to be supplied to other components to maintain effective operation of the device 600.

In some non-limiting examples, to reduce power supply demands for a device 600 without significantly impacting an ability to make an electrode 620, 640 substantially transmissive (by employing at least one thin film layer of any combination of TCOs, thin metal films, and/or thin metallic alloy films), an auxiliary electrode 1150 may be formed on the device 600 to allow current to be carried more effectively to various emissive region(s) 1001 of the device 600, while at the same time, reducing the sheet resistance and its associated IR drop of the transmissive electrode 620, 640.

In some non-limiting examples, a sheet resistance specification, for a common electrode 620, 640 of a display device 600, may vary according to several parameters, including without limitation, a (panel) size of the device 600, and/or a tolerance for voltage variation across the device 600. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 1150 to comply with such specification for various panel sizes.

By way of non-limiting example, for a top-emission device, the second electrode 640 may be made transmissive. On the other hand, in some non-limiting examples, such auxiliary electrode 1150 may not be substantially transmissive but may be electrically coupled with the second electrode 640, including without limitation, by deposition of a conductive deposited layer 130 therebetween, to reduce an effective sheet resistance of the second electrode 640.

In some non-limiting examples, such auxiliary electrode 1150 may be positioned, and/or shaped in either, or both of, a lateral aspect, and/or cross-sectional aspect to not interfere with the emission of photons from the lateral aspect of the emissive region 1001 of a (sub-) pixel 1810/134*x*.

In some non-limiting examples, a mechanism to make the first electrode 620, and/or the second electrode 640, may be to form such electrode 620, 640 in a pattern across at least a part of the lateral aspect of the emissive region(s) 1001 thereof, and/or in some non-limiting examples, across at least a part of the lateral aspect 720 of the non-emissive region(s) 1002 surrounding them. In some non-limiting examples, such mechanism may be employed to form the auxiliary electrode 1150 in a position, and/or shape in either, or both of, a lateral aspect, and/or cross-sectional aspect to not interfere with the emission of photons from the lateral aspect 710 of the emissive region 1001 of a (sub-) pixel 1810/134*x*, as discussed above.

In some non-limiting examples, the device 600 may be configured such that it may be substantially devoid of a conductive oxide material in an optical path of EM radiation emitted by the device 600. By way of non-limiting example, in the lateral aspect 710 of at least one emissive region 1001 corresponding to a (sub-) pixel 1810/134*x*, at least one of the layers, and/or coatings deposited after the at least one semiconducting layer 630, including without limitation, the second electrode 640, the patterning coating 110, and/or any other layers, and/or coatings deposited thereon, may be substantially devoid of any conductive oxide material. In some non-limiting examples, being substantially devoid of any conductive oxide material may reduce absorption, and/or reflection of EM radiation emitted by the device 600. By way of non-limiting example, conductive oxide materials, including without limitation, ITO, and/or IZO, may absorb EM radiation in at least the B(lue) region of the visible spectrum, which may, in generally, reduce efficiency, and/or performance of the device 600.

In some non-limiting examples, a combination of these, and/or other mechanisms may be employed.

Additionally, in some non-limiting examples, in addition to rendering at least one of the first electrode 620, the second electrode 640, and/or the auxiliary electrode 1150, substantially transmissive across at least across a substantial part of the lateral aspect 710 of the emissive region 1001 corresponding to the (sub-) pixel(s) 1810/134*x* of the device 600, to allow EM radiation to be emitted substantially across the lateral aspect 710 thereof, there may be an aim to make at least one of the lateral aspect(s) 720 of the surrounding non-emissive region(s) 1002 of the device 600 substantially transmissive in both the bottom and top directions, to render the device 600 substantially transmissive relative to EM radiation incident on an external surface thereof, such that a substantial part of such externally-incident EM radiation may be transmitted through the device 600, in addition to the emission (in a top-emission, bottom-emission, and/or double-sided emission) of EM radiation generated internally within the device 600 as disclosed herein.

Figure 18A:
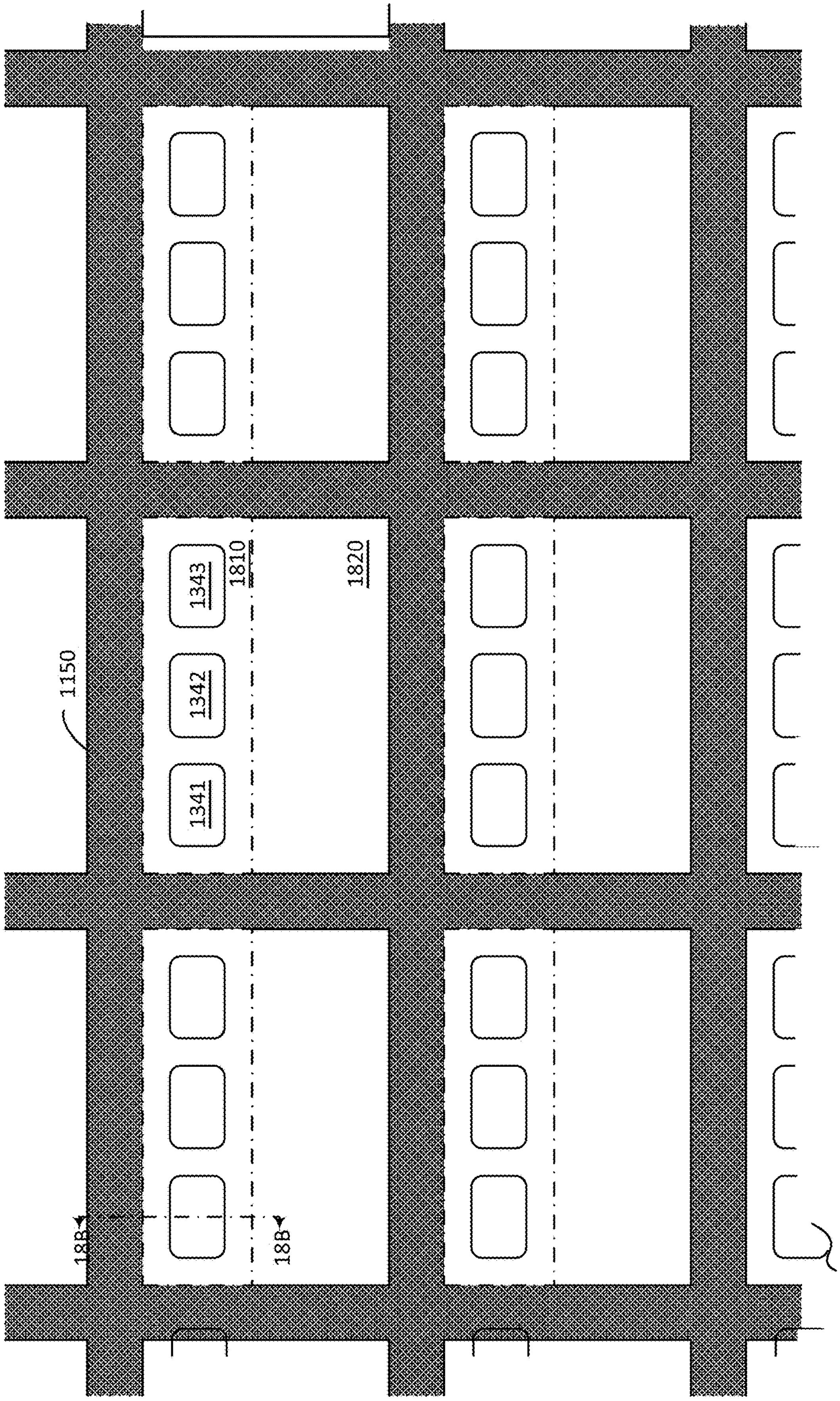
FIG. 18A is a schematic diagram illustrating, in plan view, an example of a transparent version of the device of FIG. 6 comprising at least one example pixel region and at least one example light-transmissive region, with at least one auxiliary electrode according to an example in the present disclosure.

Turning now to FIG. 18A, there may be shown an example view in plan of a transmissive (transparent) version, shown generally at 1800, of the device 600. In some non-limiting examples, the device 1800 may be an active matrix OLED (AMOLED) device having a plurality of pixels or pixel regions 1810 and a plurality of transmissive regions 1820. In some non-limiting examples, at least one auxiliary electrode 1150 may be deposited on an exposed layer surface 11 of an underlying layer between the pixel region(s) 1810, and/or the transmissive region(s) 1820.

In some non-limiting examples, each pixel region 1810 may comprise a plurality of emissive regions 1001 each corresponding to a sub-pixel 134*x*. In some non-limiting examples, the sub-pixels 134*x* may correspond to, respectively, R(ed) sub-pixels 1341, G(reen) sub-pixels 1342, and/or B(lue) sub-pixels 1343.

In some non-limiting examples, each transmissive region 1820 may be substantially transparent and allows EM radiation to pass through the entirety of a cross-sectional aspect thereof.

Figure 18B:
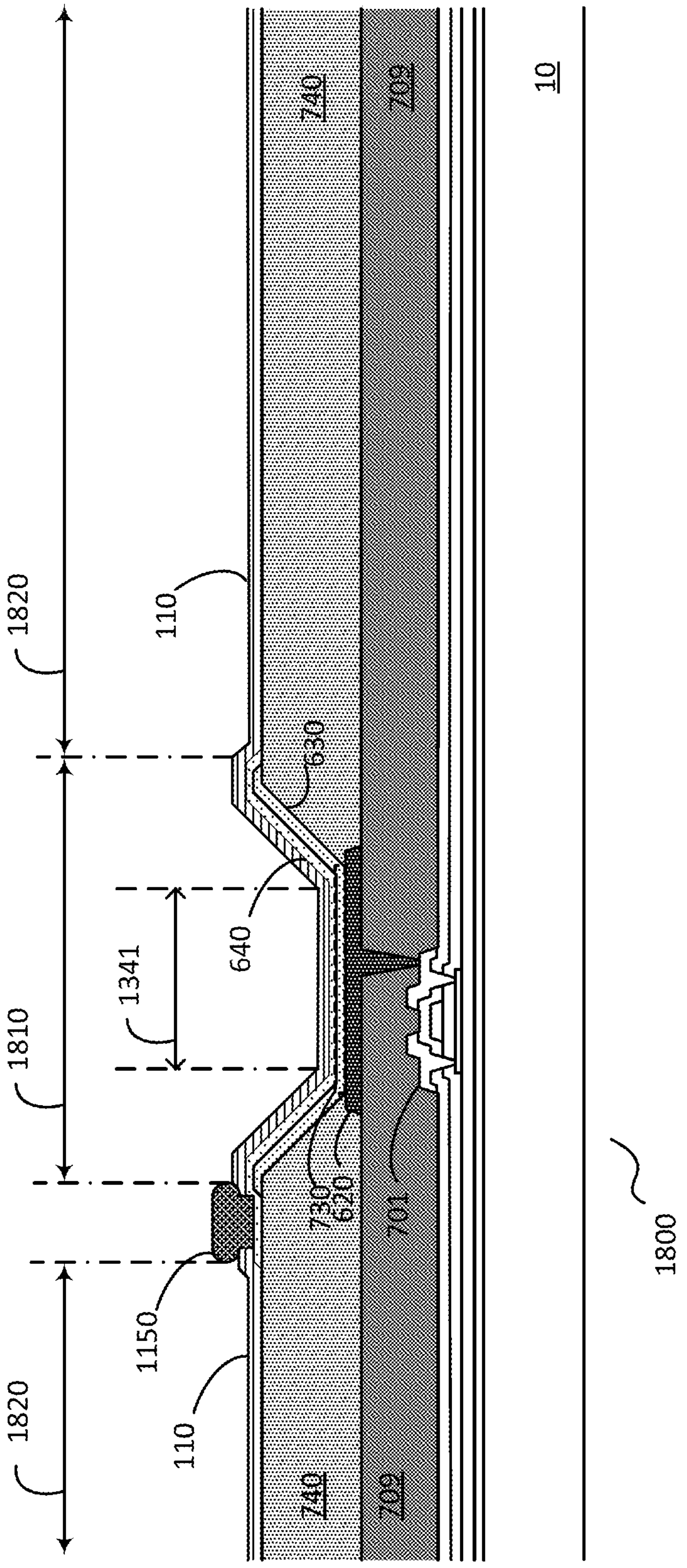
FIG. 18B is a schematic diagram illustrating an example cross-sectional view of the device of FIG. 18A taken along line 18B-18B.

Turning now to FIG. 18B, there may be shown an example cross-sectional view of a version 1800 of the device 600, taken along line 18B-18B in FIG. 18A. In the figure, the device 1800 may be shown as comprising a substrate 10, a TFT insulating layer 709 and a first electrode 620 formed on a surface of the TFT insulating layer 709. In some non-limiting examples, the substrate 10 may comprise the base substrate 612 (not shown for purposes of simplicity of illustration), and/or at least one TFT structure 701, corresponding to, and for driving, each sub-pixel 134*x* positioned substantially thereunder and electrically coupled with the first electrode 620 thereof. In some non-limiting examples, PDL(s) 740 may be formed in non-emissive regions 1002 over the substrate 10, to define emissive region(s) 1001 also corresponding to each sub-pixel 134*x*, over the first electrode 620 corresponding thereto. In some non-limiting examples, the PDL(s) 740 may cover edges of the first electrode 620.

In some non-limiting examples, at least one semiconducting layer 630 may be deposited over exposed region(s) of the first electrode 620 and, in some non-limiting examples, at least parts of the surrounding PDLs 740.

In some non-limiting examples, a second electrode 640 may be deposited over the at least one semiconducting layer(s) 630, including over the pixel region 1810 to form the sub-pixel(s) 134*x* thereof and, in some non-limiting examples, at least partially over the surrounding PDLs 740 in the transmissive region 1820.

In some non-limiting examples, a patterning coating 110 may be selectively deposited over first portion(s) 101 of the device 1800, comprising both the pixel region 1810 and the transmissive region 1820 but not the region of the second electrode 640 corresponding to the auxiliary electrode 1150 comprising second portion(s) 102 thereof.

In some non-limiting examples, the entire exposed layer surface 11 of the device 1800 may then be exposed to a vapor flux 332 of the deposited material 331, which in some non-limiting examples may be Mg. The deposited layer 130 may be selectively deposited over second portion(s) 102 of the second electrode 640 that may be substantially devoid of the patterning coating 110 to form an auxiliary electrode 1150 that may be electrically coupled with and in some non-limiting examples, in physical contact with uncoated parts of the second electrode 640.

At the same time, the transmissive region 1820 of the device 1800 may remain substantially devoid of any materials that may substantially affect the transmission of EM radiation therethrough. In particular, as shown in the figure, the TFT structure 701 and the first electrode 620 may be positioned, in a cross-sectional aspect, below the sub-pixel 134*x* corresponding thereto, and together with the auxiliary electrode 1150, may lie beyond the transmissive region 1820. As a result, these components may not attenuate or impede light from being transmitted through the transmissive region 1820. In some non-limiting examples, such arrangement may allow a viewer viewing the device 1800 from a typical viewing distance to see through the device 1800, in some non-limiting examples, when all the (sub-) pixel(s) 1810/134*x* may not be emitting, thus creating a transparent device 1800.

While not shown in the figure, in some non-limiting examples, the device 1800 may further comprise an NPC 520 disposed between the auxiliary electrode 1150 and the second electrode 640. In some non-limiting examples, the NPC 520 may also be disposed between the patterning coating 110 and the second electrode 640.

In some non-limiting examples, the patterning coating 110 may be formed concurrently with the at least one semiconducting layer(s) 630. By way of non-limiting example, at least one material used to form the patterning coating 110 may also be used to form the at least one semiconducting layer(s) 630. In such non-limiting example, several stages for fabricating the device 1800 may be reduced.

Those having ordinary skill in the relevant art will appreciate that in some non-limiting examples, various other layers, and/or coatings, including without limitation those forming the at least one semiconducting layer(s) 630, and/or the second electrode 640, may cover a part of the transmissive region 1820, especially if such layers, and/or coatings are substantially transparent. In some non-limiting examples, the PDL(s) 740 may have a reduced thickness, including without limitation, by forming a well therein, which in some non-limiting examples may be similar to the well defined for emissive region(s) 1001, to further facilitate transmission of EM radiation through the transmissive region 1820.

Those having ordinary skill in the relevant art will appreciate that (sub-) pixel(s) 1810/134*x* arrangements other than the arrangement shown in FIGS. 18A and 18B may, in some non-limiting examples, be employed.

Those having ordinary skill in the relevant art will appreciate that arrangements of the auxiliary electrode(s) 1150 other than the arrangement shown in FIGS. 18A and 18B may, in some non-limiting examples, be employed. By way of non-limiting example, the auxiliary electrode(s) 1150 may be disposed between the pixel region 1810 and the transmissive region 1820. By way of non-limiting example, the auxiliary electrode(s) 1150 may be disposed between sub-pixel(s) 134*x* within a pixel region 1810.

Figure 19A:
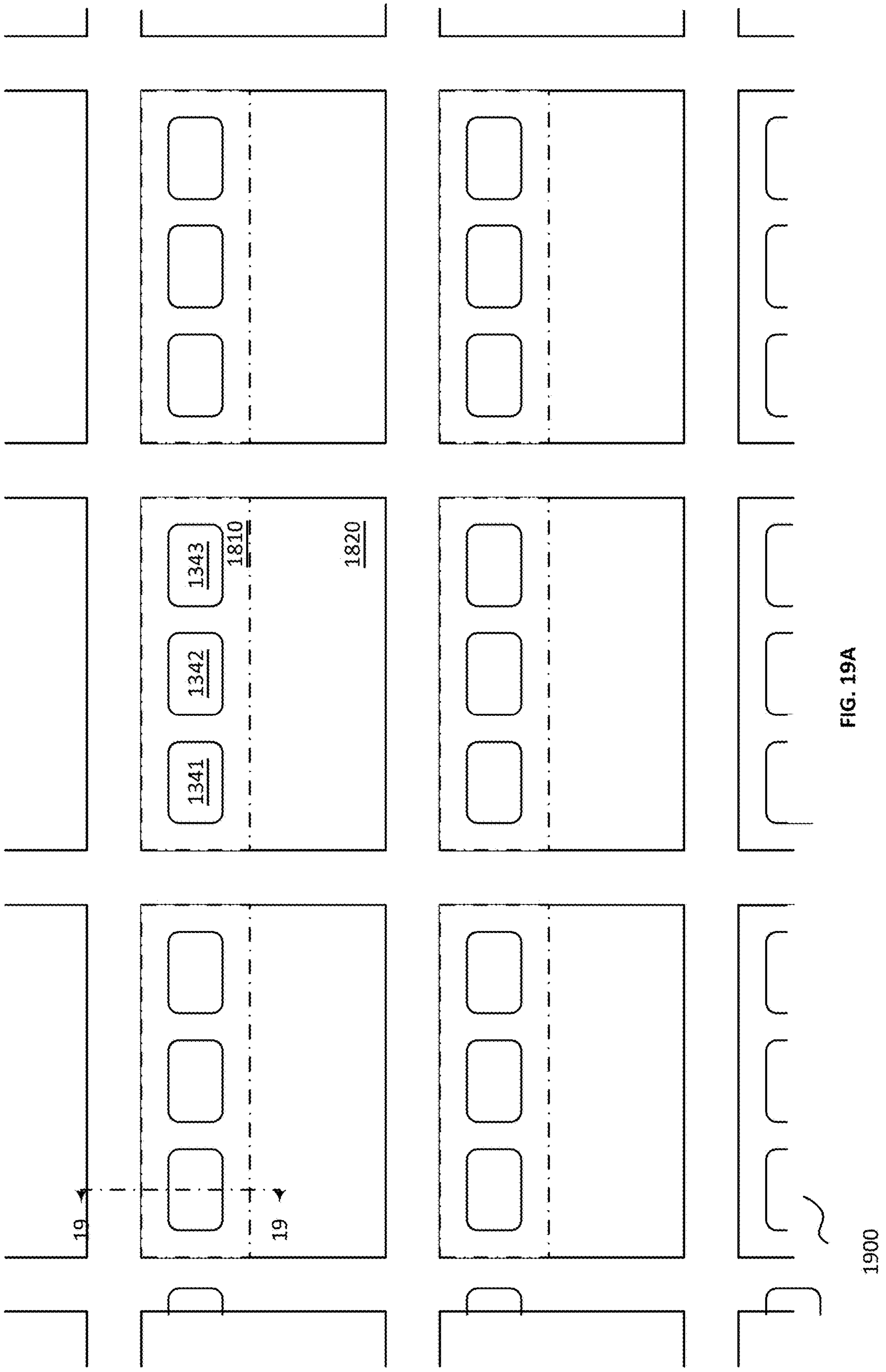
FIG. 19A is a schematic diagram illustrating, in plan view, an example of a transparent version of the device of FIG. 6 comprising at least one example pixel region and at least one example light-transmissive region according to an example in the present disclosure.

Turning now to FIG. 19A, there may be shown an example plan view of a transparent version, shown generally at 1900, of the device 600. In some non-limiting examples, the device 1800 may be an AMOLED device having a plurality of pixel regions 1810 and a plurality of transmissive regions 1820. The device 1900 may differ from device 1800 in that no auxiliary electrode(s) 1150 lie between the pixel region(s) 1810, and/or the transmissive region(s) 1820.

In some non-limiting examples, each pixel region 1810 may comprise a plurality of emissive regions 1001, each corresponding to a sub-pixel 134*x*. In some non-limiting examples, the sub-pixels 134*x* may correspond to, respectively, R(ed) sub-pixels 1341, G(reen) sub-pixels 1342, and/or B(lue) sub-pixels 1343.

In some non-limiting examples, each transmissive region 1820 may be substantially transparent and may allow light to pass through the entirety of a cross-sectional aspect thereof.

Figure 19B:
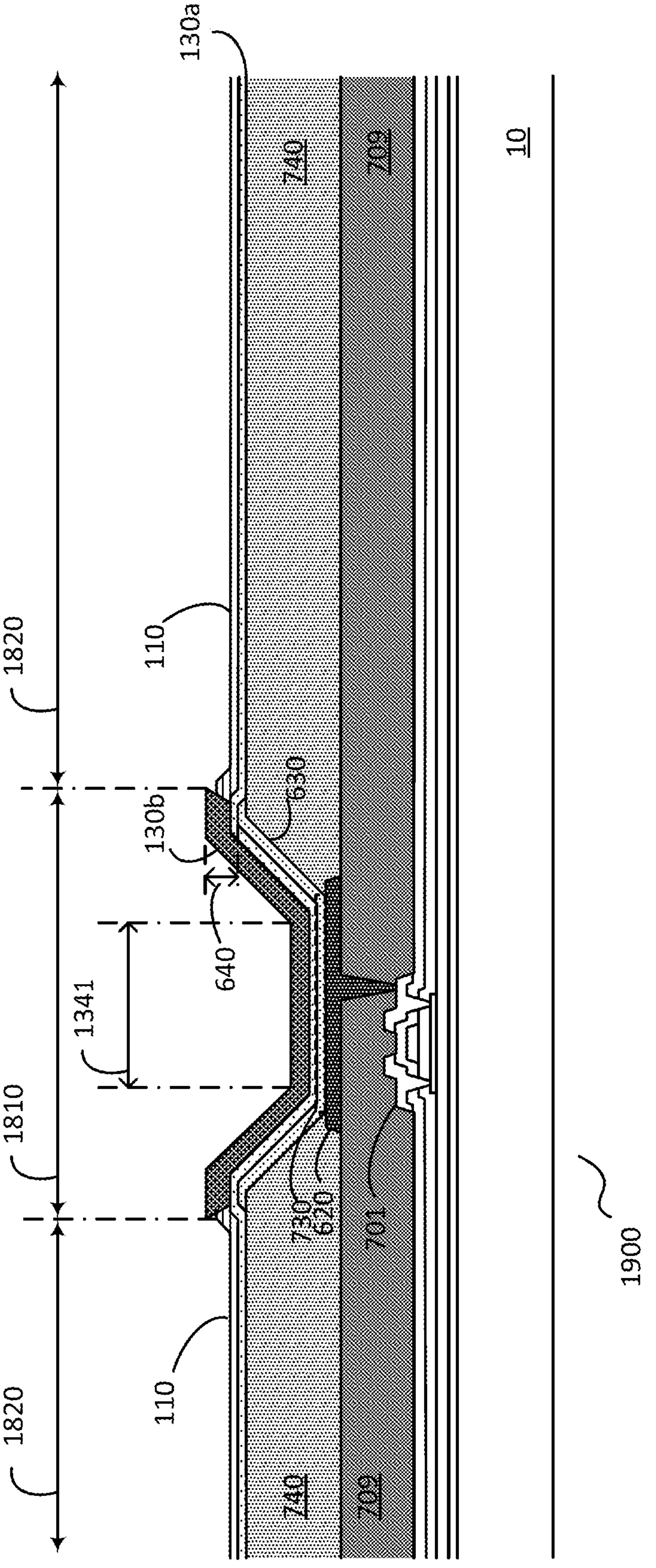
FIG. 19B is a schematic diagram illustrating an example cross-sectional view of the device of FIG. 19A taken along line 19-19.

Turning now to FIG. 19B, there may be shown an example cross-sectional view of the device 1900, taken along line 19-19 in FIG. 19A. In the figure, the device 1900 may be shown as comprising a substrate 10, a TFT insulating layer 709 and a first electrode 620 formed on a surface of the TFT insulating layer 709. The substrate 10 may comprise the base substrate 612 (not shown for purposes of simplicity of illustration), and/or at least one TFT structure 701 corresponding to, and for driving, each sub-pixel 134*x* positioned substantially thereunder and electrically coupled with the first electrode 620 thereof. PDL(s) 740 may be formed in non-emissive regions 1002 over the substrate 10, to define emissive region(s) 1001 also corresponding to each sub-pixel 134*x*, over the first electrode 620 corresponding thereto. The PDL(s) 740 cover edges of the first electrode 620.

In some non-limiting examples, at least one semiconducting layer 630 may be deposited over exposed region(s) of the first electrode 620 and, in some non-limiting examples, at least parts of the surrounding PDLs 740.

In some non-limiting examples, a first deposited layer 130*a* may be deposited over the at least one semiconducting layer(s) 630, including over the pixel region 1810 to form the sub-pixel(s) 134*x* thereof and over the surrounding PDLs 740 in the transmissive region 1820. In some non-limiting examples, the average layer thickness of the first deposited layer 130*a* may be relatively thin such that the presence of the first deposited layer 130*a* across the transmissive region 1820 does not substantially attenuate transmission of EM radiation therethrough. In some non-limiting examples, the first deposited layer 130*a* may be deposited using an open mask and/or mask-free deposition process.

In some non-limiting examples, a patterning coating 110 may be selectively deposited over first portions 101 of the device 1900, comprising the transmissive region 1820.

In some non-limiting examples, the entire exposed layer surface 11 of the device 1900 may then be exposed to a vapor flux 332 of the deposited material 331, which in some non-limiting examples may be Mg, to selectively deposit a second deposited layer 130*b*, over second portion(s) 102 of the first deposited layer 130*a* that may be substantially devoid of the patterning coating 110, in some examples, the pixel region 1810, such that the second deposited layer 130*b* may be electrically coupled with and in some non-limiting examples, in physical contact with uncoated parts of the first deposited layer 130*a*, to form the second electrode 640.

In some non-limiting examples, an average layer thickness of the first deposited layer 130*a* may be no more than an average layer thickness of the second deposited layer 130*b*. In this way, relatively high transmittance may be maintained in the transmissive region 1820, over which only the first deposited layer 130*a* may extend. In some non-limiting examples, an average layer thickness of the first deposited layer 130*a* may be no more than at least one of about: 30 nm, 25 nm, 20 nm, 15 nm, 10 nm, 8 nm, or 5 nm. In some non-limiting examples, an average layer thickness of the second deposited layer 130*b* may be no more than at least one of about: 30 nm, 25 nm, 20 nm, 15 nm, 10 nm, or 8 nm.

Thus, in some non-limiting examples, an average layer thickness of the second electrode 640 may be no more than about 40 nm, and/or in some non-limiting examples, at least one of between about: 5-30 nm, 10-25 nm, or 15-25 nm.

In some non-limiting examples, the average layer thickness of the first deposited layer 130*a* may exceed the average layer thickness of the second deposited layer 130*b*. In some non-limiting examples, the average layer thickness of the first deposited layer 130*a* and the average layer thickness of the second deposited layer 130*b* may be substantially the same.

In some non-limiting examples, at least one deposited material 331 used to form the first deposited layer 130*a* may be substantially the same as at least one deposited material 331 used to form the second deposited layer 130*b*. In some non-limiting examples, such at least one deposited material 331 may be substantially as described herein in respect of the first electrode 620, the second electrode 640, the auxiliary electrode 1150, and/or a deposited layer 130 thereof.

In some non-limiting examples, the first deposited layer 130*a* may provide, at least in part, the functionality of an EIL 639, in the pixel region 1810. Non-limiting examples, of the deposited material 331 for forming the first deposited layer 130*a* include Yb, which for example, may be about 1-3 nm in thickness.

In some non-limiting examples, the transmissive region 1820 of the device 1900 may remain substantially devoid of any materials that may substantially inhibit the transmission of EM radiation, including without limitation, EM signals, including without limitation, in the IR spectrum and/or NIR spectrum, therethrough. In particular, as shown in the figure, the TFT structure 709, and/or the first electrode 620 may be positioned, in a cross-sectional aspect below the sub-pixel 134*x* corresponding thereto and beyond the transmissive region 1820. As a result, these components may not attenuate or impede EM radiation from being transmitted through the transmissive region 1820. In some non-limiting examples, such arrangement may allow a viewer viewing the device 1900 from a typical viewing distance to see through the device 1900, in some non-limiting examples, when the (sub-) pixel(s) 1810/134*x* are not emitting, thus creating a transparent AMOLED device 1900.

In some non-limiting examples, such arrangement may also allow an IR emitter and/or an IR detector to be arranged behind the AMOLED device 1900 such that EM signals, including without limitation, in the IR and/or NIR spectrum, to be exchanged through the AMOLED device 1900 by such under-display components 2430.

While not shown in the figure, in some non-limiting examples, the device 1900 may further comprise an NPC 520 disposed between the second deposited layer 130*b* and the first deposited layer 130*a*. In some non-limiting examples, the NPC 520 may also be disposed between the patterning coating 110 and the first deposited layer 130*a*.

In some non-limiting examples, the patterning coating 110 may be formed concurrently with the at least one semiconducting layer(s) 630. By way of non-limiting example, at least one material used to form the patterning coating 110 may also be used to form the at least one semiconducting layer(s) 630. In such non-limiting example, several stages for fabricating the device 1900 may be reduced.

Those having ordinary skill in the relevant art will appreciate that in some non-limiting examples, various other layers, and/or coatings, including without limitation those forming the at least one semiconducting layer(s) 630, and/or the first deposited layer 130*a*, may cover a part of the transmissive region 1820, especially if such layers, and/or coatings are substantially transparent. In some non-limiting examples, the PDL(s) 740 may have a reduced thickness, including without limitation, by forming a well therein, which in some non-limiting examples may be similar to the well defined for emissive region(s) 1001, to further facilitate transmission of EM radiation through the transmissive region 1820.

Those having ordinary skill in the relevant art will appreciate that (sub-) pixel(s) 1810/134*x* arrangements other than the arrangement shown in FIGS. 19A and 19B may, in some non-limiting examples, be employed.

Figure 19C:
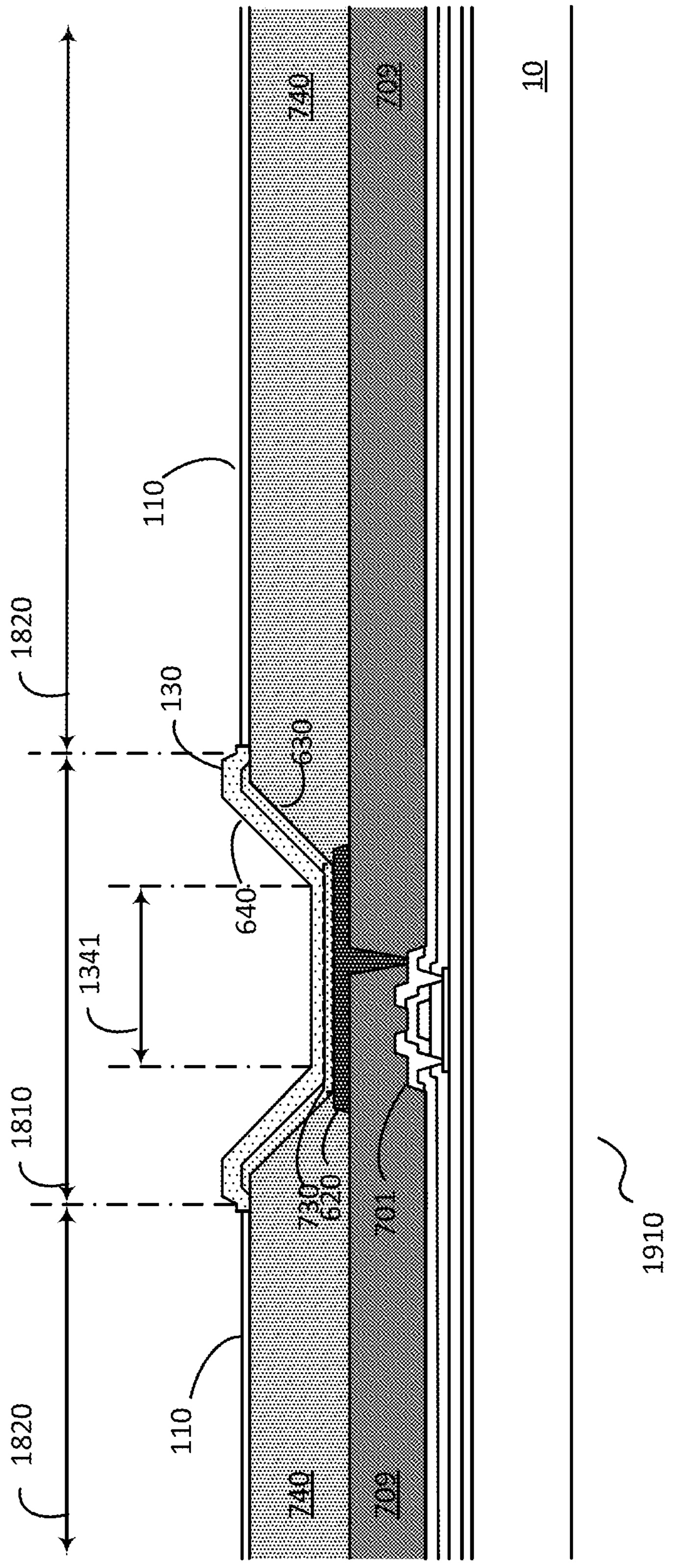
FIG. 19C is a schematic diagram illustrating an example cross-sectional view of the device of FIG. 19A taken along line 19-19.

Turning now to FIG. 19C, there may be shown an example cross-sectional view of a different version 1910 of the device 600, taken along the same line 19-19 in FIG. 19A. In the figure, the device 1910 may be shown as comprising a substrate 10, a TFT insulating layer 709 and a first electrode 620 formed on a surface of the TFT insulating layer 709. The substrate 10 may comprise the base substrate 612 (not shown for purposes of simplicity of illustration), and/or at least one TFT structure 701 corresponding to and for driving each sub-pixel 134*x* positioned substantially thereunder and electrically coupled with the first electrode 620 thereof. PDL(s) 740 may be formed in non-emissive regions 1002 over the substrate 10, to define emissive region(s) 1001 also corresponding to each sub-pixel 134*x*, over the first electrode 620 corresponding thereto. The PDL(s) 740 may cover edges of the first electrode 620.

In some non-limiting examples, at least one semiconducting layer 630 may be deposited over exposed region(s) of the first electrode 620 and, in some non-limiting examples, at least parts of the surrounding PDLs 740.

In some non-limiting examples, a patterning coating 110 may be selectively deposited over first portions 101 of the device 1910, comprising the transmissive region 1820.

In some non-limiting examples, a deposited layer 130 may be deposited over the at least one semiconducting layer(s) 630, including over the pixel region 1810 to form the sub-pixel(s) 134*x* thereof but not over the surrounding PDLs 740 in the transmissive region 1820. In some non-limiting examples, the first deposited layer 130*a* may be deposited using an open mask and/or mask-free deposition process. In some non-limiting examples, such deposition may be effected by exposing the entire exposed layer surface 11 of the device 1910 to a vapor flux 332 of the deposited material 331, which in some non-limiting examples may be Mg, to selectively deposit the deposited layer 130 over second portions 102 of the at least one semiconducting layer(s) 630 that are substantially devoid of the patterning coating 110, in some non-limiting examples, the pixel region 1810, such that the deposited layer 130 may be deposited on the at least one semiconducting layer(s) 630 to form the second electrode 640.

In some non-limiting examples, the transmissive region 1820 of the device 1910 may remain substantially devoid of any materials that may substantially affect the transmission of EM radiation therethrough, including without limitation, EM signals, including without limitation, in the IR and/or NIR spectrum. In particular, as shown in the figure, the TFT structure 701, and/or the first electrode 620 may be positioned, in a cross-sectional aspect below the sub-pixel 134*x* corresponding thereto and beyond the transmissive region 1820. As a result, these components may not attenuate or impede EM radiation from being transmitted through the transmissive region 1820. In some non-limiting examples, such arrangement may allow a viewer viewing the device 1910 from a typical viewing distance to see through the device 1910, in some non-limiting examples, when the (sub-) pixel(s) 1810/134*x* are not emitting, thus creating a transparent AMOLED device 1910.

By providing a transmissive region 1820 that may be free, and/or substantially devoid of any deposited layer 130, the transmittance in such region 1820 may, in some non-limiting examples, be favorably enhanced, by way of non-limiting example, by comparison to the device 1900 of FIG. 19B.

While not shown in the figure, in some non-limiting examples, the device 1910 may further comprise an NPC 520 disposed between the deposited layer 130 and the at least one semiconducting layer(s) 630. In some non-limiting examples, the NPC 520 may also be disposed between the patterning coating 110 and the PDL(s) 740.

While not shown in FIGS. 19B and 19C for sake of simplicity, those having ordinary skill in the relevant art will appreciate that in some non-limiting examples, at least one particle structures 441 may be disposed thereon, to facilitate absorption of EM radiation in the transmissive region 1820 in at least a part of the visible spectrum, while allowing EM signals having a wavelength in at least a part of the IR and/or NIR spectrum to be exchanged through the device in the transmissive region 1820.

In some non-limiting examples, the patterning coating 110 may be formed concurrently with the at least one semiconducting layer(s) 630. By way of non-limiting example, at least one material used to form the patterning coating 110 may also be used to form the at least one semiconducting layer(s) 630. In such non-limiting example, several stages for fabricating the device 1910 may be reduced.

In some non-limiting examples, at least one layer of the at least one semiconducting layer 630 may be deposited in the transmissive region 1820 to provide the patterning coating 110. By way of non-limiting example, the ETL 637 of the at least one semiconducting layer 630 may be a patterning coating 110 that may be deposited in both the emissive region 1001 and the transmissive region 1820 during the deposition of the at least one semiconducting layer 630. The EIL 639 may then be selectively deposited in the emissive region 1001 over the ETL 637, such that the exposed layer surface 11 of the ETL 637 in the transmissive region 1820 may be substantially devoid of the EIL 639. The exposed layer surface 11 of the EIL 639 in the emissive region 1001 and the exposed layer surface of the ETL 637, which acts as the patterning coating 110, may then be exposed to a vapor flux 332 of the deposited material 331 to form a closed coating 140 of the deposited layer 130 on the EIL 639 in the emissive region 1001, and a discontinuous layer 440 of the deposited material 331 on the EIL 639 in the transmissive region 1820.

Those having ordinary skill in the relevant art will appreciate that in some non-limiting examples, various other layers, and/or coatings, including without limitation those forming the at least one semiconducting layer(s) 630, and/or the deposited layer 130, may cover a part of the transmissive region 1820, especially if such layers, and/or coatings are substantially transparent. In some non-limiting examples, the PDL(s) 740 may have a reduced thickness, including without limitation, by forming a well therein, which in some non-limiting examples may be similar to the well defined for emissive region(s) 1001, to further facilitate transmission of EM radiation through the transmissive region 1820.

Those having ordinary skill in the relevant art will appreciate that (sub-) pixel(s) 1810/134$x$ arrangements other than the arrangement shown in FIGS. 19B and 19C may, in some non-limiting examples, be employed.

Selective Deposition to Modulate Electrode Thickness Over Emissive Region(s)

As discussed above, modulating the thickness of an electrode 620, 640, 1150 in and across a lateral aspect 710 of emissive region(s) 1001 of a (sub-) pixel 1810/134$x$ may impact the microcavity effect observable. In some non-limiting examples, selective deposition of at least one deposited layer 130 through deposition of at least one patterning coating 110, including without limitation, an NIC and/or an NPC 520, in the lateral aspects 710 of emissive region(s) 1001 corresponding to different sub-pixel(s) 134$x$ in a pixel region 1810 may allow the optical microcavity effect in each emissive region 1001 to be controlled, and/or modulated to optimize desirable optical microcavity effects on a sub-pixel 134$x$ basis, including without limitation, an emission spectrum, a luminous intensity, and/or an angular dependence of a brightness, and/or a color shift of emitted light.

Such effects may be controlled by independently modulating an average layer thickness and/or a number of the deposited layer(s) 130, disposed in each emissive region 1001 of the sub-pixel(s) 134$x$. By way of non-limiting example, the average layer thickness of a second electrode 640 disposed over a B(lue) sub-pixel 1343 may be less than the average layer thickness of a second electrode 640 disposed over a G(reen) sub-pixel 1342, and the average layer thickness of a second electrode 640 disposed over a G(reen) sub-pixel 1342 may be less than the average layer thickness of a second electrode 640 disposed over a R(ed) sub-pixel 1341.

In some non-limiting examples, such effects may be controlled to an even greater extent by independently modulating the average layer thickness and/or a number of the deposited layers 130, but also of the patterning coating 110 and/or an NPC 520, deposited in part(s) of each emissive region 1001 of the sub-pixel(s) 134$x$.

Figure 20:
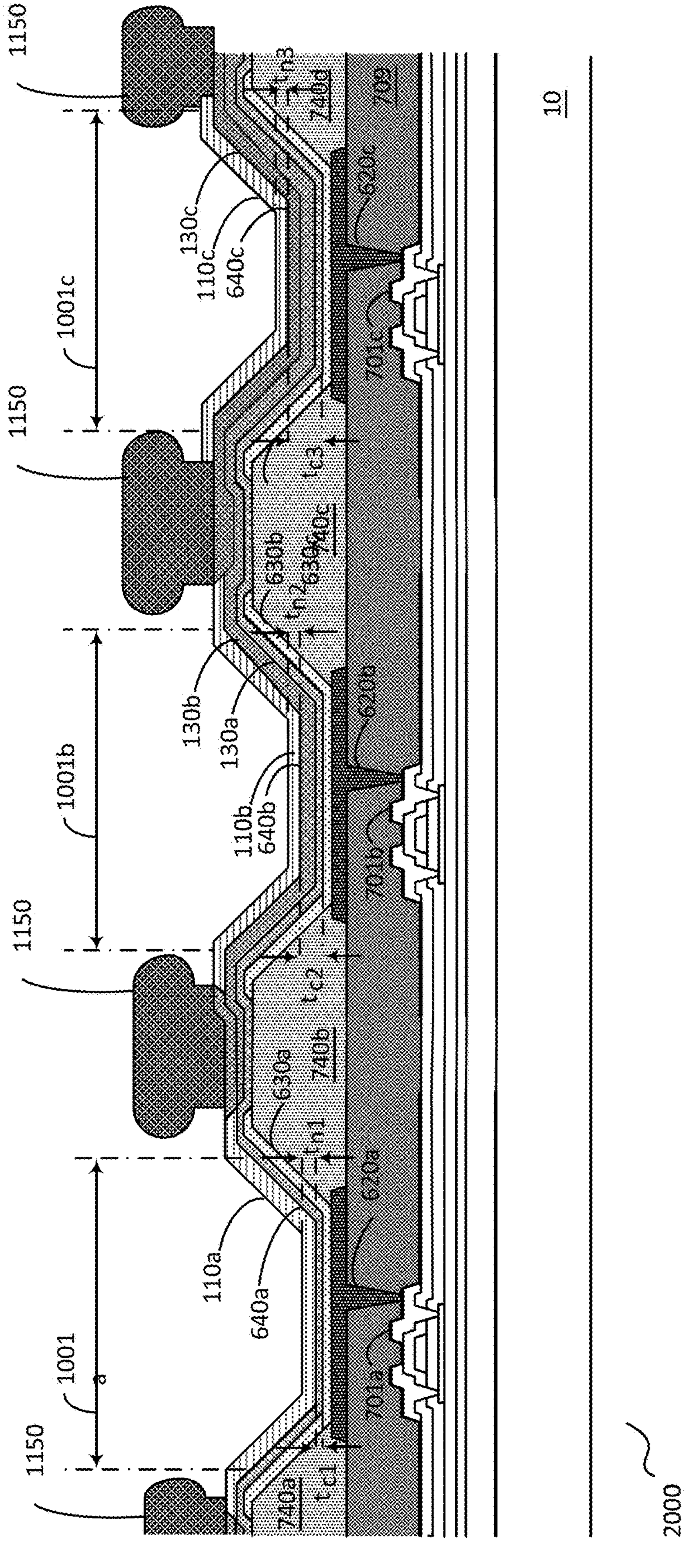
FIG. 20 is a schematic diagram that may show example stages of an example process for manufacturing an example version of the device of FIG. 7 having sub-pixel regions having a second electrode of different thickness according to an example in the present disclosure.

As shown by way of non-limiting example in FIG. 20, there may be deposited layer(s) 130 of varying average layer thickness selectively deposited for emissive region(s) 1001 corresponding to sub-pixel(s) 134$x$, in some non-limiting examples, in a version 2000 of an OLED display device 600, having different emission spectra. In some non-limiting examples, a first emissive region 1001$a$ may correspond to a sub-pixel 134$x$ configured to emit EM radiation of a first wavelength, and/or emission spectrum, and/or in some non-limiting examples, a second emissive region 1001$b$ may correspond to a sub-pixel 134$x$ configured to emit EM radiation of a second wavelength, and/or emission spectrum. In some non-limiting examples, a device 2000 may comprise a third emissive region 1001$c$ that may correspond to a sub-pixel 134$x$ configured to emit EM radiation of a third wavelength, and/or emission spectrum.

In some non-limiting examples, the first wavelength may be less than, greater than, and/or equal to at least one of the second wavelength, and/or the third wavelength. In some non-limiting examples, the second wavelength may be less than, greater than, and/or equal to at least one of the first wavelength, and/or the third wavelength. In some non-limiting examples, the third wavelength may be less than, greater than, and/or equal to at least one of the first wavelength, and/or the second wavelength.

In some non-limiting examples, the device 2000 may also comprise at least one additional emissive region 1001 (not shown) that may in some non-limiting examples be configured to emit EM radiation having a wavelength, and/or emission spectrum that is substantially identical to at least one of the first emissive region 1001$a$, the second emissive region 1001$b$, and/or the third emissive region 1001$c$.

In some non-limiting examples, the patterning coating 110 may be selectively deposited using a shadow mask 215 that may also have been used to deposit the at least one semiconducting layer 630 of the first emissive region 1001$a$. In some non-limiting examples, such shared use of a shadow mask 215 may allow the optical microcavity effect(s) to be tuned for each sub-pixel 134$x$ in a cost-effective manner.

The device 2000 may be shown as comprising a substrate 10, a TFT insulating layer 709 and a plurality of first electrodes 620, formed on an exposed layer surface 11 of the TFT insulating layer 709.

In some non-limiting examples, the substrate 10 may comprise the base substrate 612 (not shown for purposes of simplicity of illustration), and/or at least one TFT structure 701 corresponding to, and for driving, a corresponding emissive region 1001, each having a corresponding sub-pixel 134$x$, positioned substantially thereunder and electrically coupled with its associated first electrode 620. PDL(s) 740 may be formed over the substrate 10, to define emissive region(s) 1001. In some non-limiting examples, the PDL(s) 740 may cover edges of their respective first electrode 620.

In some non-limiting examples, at least one semiconducting layer 630 may be deposited over exposed region(s) of their respective first electrode 620 and, in some non-limiting examples, at least parts of the surrounding PDLs 740.

In some non-limiting examples, a first deposited layer 130_a_ may be deposited over the at least one semiconducting layer(s) 630. In some non-limiting examples, the first deposited layer 130_a_ may be deposited using an open mask and/or mask-free deposition process. In some non-limiting examples, such deposition may be effected by exposing the entire exposed layer surface 11 of the device 2000 to a vapor flux 332 of deposited material 331, which in some non-limiting examples may be Mg, to deposit the first deposited layer 130_a_ over the at least one semiconducting layer(s) 630 to form a first layer of the second electrode 640_a_ (not shown), which in some non-limiting examples may be a common electrode, at least for the first emissive region 1001_a_. Such common electrode may have a first thickness $t_{c1}$ in the first emissive region 1001_a_. In some non-limiting examples, the first thickness $t_{c1}$ may correspond to a thickness of the first deposited layer 130_a_.

In some non-limiting examples, a first patterning coating 110_a_ may be selectively deposited over first portions 101 of the device 2000, comprising the first emissive region 1001_a_.

In some non-limiting examples, a second deposited layer 130_b_ may be deposited over the device 2000. In some non-limiting examples, the second deposited layer 130_b_ may be deposited using an open mask and/or mask-free deposition process. In some non-limiting examples, such deposition may be effected by exposing the entire exposed layer surface 11 of the device 2000 to a vapor flux 332 of deposited material 331, which in some non-limiting examples may be Mg, to deposit the second deposited layer 130_b_ over the first deposited layer 130_a_ that may be substantially devoid of the first patterning coating 110_a_, in some examples, the second and third emissive regions 1001_b_, 1001_c_, and/or at least part(s) of the non-emissive region(s) 1002 in which the PDLs 740 lie, such that the second deposited layer 130_b_ may be deposited on the second portion(s) 102 of the first deposited layer 130_a_ that are substantially devoid of the first patterning coating 110_a_ to form a second layer of the second electrode 640_b_ (not shown), which in some non-limiting examples, may be a common electrode, at least for the second emissive region 1001_b_. In some non-limiting examples, such common electrode may have a second thickness $t_{c2}$ in the second emissive region 1001_b_. In some non-limiting examples, the second thickness $t_{c2}$ may correspond to a combined average layer thickness of the first deposited layer 130_a_ and of the second deposited layer 130_b_ and may in some non-limiting examples exceed the first thickness $t_{c1}$.

In some non-limiting examples, a second patterning coating 110_b_ may be selectively deposited over further first portions 101 of the device 2000, comprising the second emissive region 1001_b_.

In some non-limiting examples, a third deposited layer 130_c_ may be deposited over the device 2000. In some non-limiting examples, the third deposited layer 130_c_ may be deposited using an open mask and/or mask-free deposition process. In some non-limiting examples, such deposition may be effected by exposing the entire exposed layer surface 11 of the device 2000 to a vapor flux 332 of deposited material 331, which in some non-limiting examples may be Mg, to deposit the third deposited layer 130_c_ over the second deposited layer 130_b_ that may be substantially devoid of either the first patterning coating 110_a_ or the second patterning coating 110_b_, in some examples, the third emissive region 1001_c_, and/or at least part(s) of the non-emissive region 1002 in which the PDLs 740 lie, such that the third deposited layer 130_c_ may be deposited on the further second portion(s) 102 of the second deposited layer 130_b_ that are substantially devoid of the second patterning coating 110_b_ to form a third layer of the second electrode 640_c_ (not shown), which in some non-limiting examples, may be a common electrode, at least for the third emissive region 1001_c_. In some non-limiting examples, such common electrode may have a third thickness $t_{c3}$ in the third emissive region 1001_c_. In some non-limiting examples, the third thickness $t_{c3}$ may correspond to a combined thickness of the first deposited layer 130_a_, the second deposited layer 130_b_ and the third deposited layer 130_c_ and may in some non-limiting examples exceed either, or both of, the first thickness $t_{c1}$ and the second thickness $t_{c2}$.

In some non-limiting examples, a third patterning coating 110_c_ may be selectively deposited over additional first portions 101 of the device 2000, comprising the third emissive region 1001_c_.

In some non-limiting examples, at least one auxiliary electrode 1150 may be disposed in the non-emissive region (s) 1002 of the device 2000 between neighbouring emissive regions 1001 thereof and in some non-limiting examples, over the PDLs 740. In some non-limiting examples, the deposited layer 130 used to deposit the at least one auxiliary electrode 1150 may be deposited using an open mask and/or mask-free deposition process. In some non-limiting examples, such deposition may be effected by exposing the entire exposed layer surface 11 of the device 2000 to a vapor flux 332 of deposited material 331, which in some non-limiting examples may be Mg, to deposit the deposited layer 130 over the exposed parts of the first deposited layer 130_a_, the second deposited layer 130_b_ and the third deposited layer 130_c_ that may be substantially devoid of any of the first patterning coating 110_a_, the second patterning coating 110_b_, and/or the third patterning coating 110_c_, such that the deposited layer 130 may be deposited on an additional second portion 102 comprising the exposed part(s) of the first deposited layer 130_a_, the second deposited layer 130_b_, and/or the third deposited layer 130_c_ that may be substantially devoid of any of the first patterning coating 110_a_, the second patterning coating 110_b_, and/or the third patterning coating 110_c_ to form the at least one auxiliary electrode 1150. In some non-limiting examples, each of the at least one auxiliary electrodes 1150 may be electrically coupled with a respective one of the second electrodes 640. In some non-limiting examples, each of the at least one auxiliary electrode 1150 may be in physical contact with such second electrode 640.

In some non-limiting examples, the first emissive region 1001_a_, the second emissive region 1001_b_ and the third emissive region 1001_c_ may be substantially devoid of a closed coating 140 of the deposited material 331 used to form the at least one auxiliary electrode 1150.

In some non-limiting examples, at least one of the first deposited layer 130_a_, the second deposited layer 130_b_, and/or the third deposited layer 130_c_ may be transmissive, and/or substantially transparent in at least a part of the visible spectrum. Thus, in some non-limiting examples, the second deposited layer 130_b_, and/or the third deposited layer 130_a_ (and/or any additional deposited layer(s) 130) may be disposed on top of the first deposited layer 130_a_ to form a multi-coating electrode 620, 640, 1150 that may also be transmissive, and/or substantially transparent in at least a part of the visible spectrum. In some non-limiting examples, the transmittance of any of the at least one of the first deposited layer 130_a_, the second deposited layer 130_b_, the third deposited layer 130_c_, any additional deposited layer(s) 130, and/or the multi-coating electrode 620, 640, 1150 may exceed at least one of about: 30%, 40% 45%, 50%, 60%, 70%, 75%, or 80% in at least a part of the visible spectrum.

In some non-limiting examples, an average layer thickness of the first deposited layer 130*a*, the second deposited layer 130*b*, and/or the third deposited layer 130*c* may be made relatively thin to maintain a relatively high transmittance. In some non-limiting examples, an average layer thickness of the first deposited layer 130*a* may be at least one of between about: 5-30 nm, 8-25 nm, or 10-20 nm. In some non-limiting examples, an average layer thickness of the second deposited layer 130*b* may be at least one of between about: 1-25 nm, 1-20 nm, 1-15 nm, 1-10 nm, or 3-6 nm. In some non-limiting examples, an average layer thickness of the third deposited layer 130*c* may be at least one of between about: 1-25 nm, 1-20 nm, 1-15 nm, 1-10 nm, or 3-6 nm. In some non-limiting examples, a thickness of a multi-coating electrode formed by a combination of the first deposited layer 130*a*, the second deposited layer 130*b*, the third deposited layer 130*c*, and/or any additional deposited layer(s) 130 may be at least one of between about: 6-35 nm, 10-30 nm, 10-25 nm, or 12-18 nm.

In some non-limiting examples, a thickness of the at least one auxiliary electrode 1150 may exceed an average layer thickness of the first deposited layer 130*a*, the second deposited layer 130*b*, the third deposited layer 130*c*, and/or a common electrode. In some non-limiting examples, the thickness of the at least one auxiliary electrode 1150 may exceed at least one of about: 50 nm, 80 nm, 100 nm, 150 nm, 200 nm, 300 nm, 400 nm, 500 nm, 700 nm, 800 nm, 1 µm, 1.2 µm, 1.5 µm, 2 µm, 2.5 µm, or 3 µm.

In some non-limiting examples, the at least one auxiliary electrode 1150 may be substantially non-transparent, and/or opaque. However, since the at least one auxiliary electrode 1150 may be, in some non-limiting examples, provided in a non-emissive region 1002 of the device 2000, the at least one auxiliary electrode 1150 may not cause or contribute to significant optical interference. In some non-limiting examples, the transmittance of the at least one auxiliary electrode 1150 may be no more than at least one of about: 50%, 70%, 80%, 85%, 90%, or 95% in at least a part of the visible spectrum.

In some non-limiting examples, the at least one auxiliary electrode 1150 may absorb EM radiation in at least a part of the visible spectrum.

In some non-limiting examples, an average layer thickness of the first patterning coating 110*a*, the second patterning coating 110*b*, and/or the third patterning coating 110*c* disposed in the first emissive region 1001*a*, the second emissive region 1001*b*, and/or the third emissive region 1001*c* respectively, may be varied according to a colour, and/or emission spectrum of EM radiation emitted by each emissive region 1001. In some non-limiting examples, the first patterning coating 110*a* may have a first patterning coating thickness $t_{n1}$, the second patterning coating 110*b* may have a second patterning coating thickness $t_{n2}$, and/or the third patterning coating 110*c* may have a third patterning coating thickness $t_{n3}$. In some non-limiting examples, the first patterning coating thickness $t_{n1}$, the second patterning coating thickness $t_{n2}$, and/or the third patterning coating thickness $t_{n3}$, may be substantially the same. In some non-limiting examples, the first patterning coating thickness $t_{n1}$, the second patterning coating thickness $t_{n2}$, and/or the third patterning coating thickness $t_{n3}$, may be different from one another.

In some non-limiting examples, the device 2000 may also comprise any number of emissive regions 1001*a*-1001*c*, and/or (sub-) pixel(s) 1810/134*x* thereof. In some non-limiting examples, a device may comprise a plurality of pixels 1810, wherein each pixel 1810 comprises two, three or more sub-pixel(s) 134*x*.

Those having ordinary skill in the relevant art will appreciate that the specific arrangement of (sub-) pixel(s) 1810/134*x* may be varied depending on the device design. In some non-limiting examples, the sub-pixel(s) 134*x* may be arranged according to known arrangement schemes, including without limitation, RGB side-by-side, diamond, and/or PenTile®.

Figure 21:
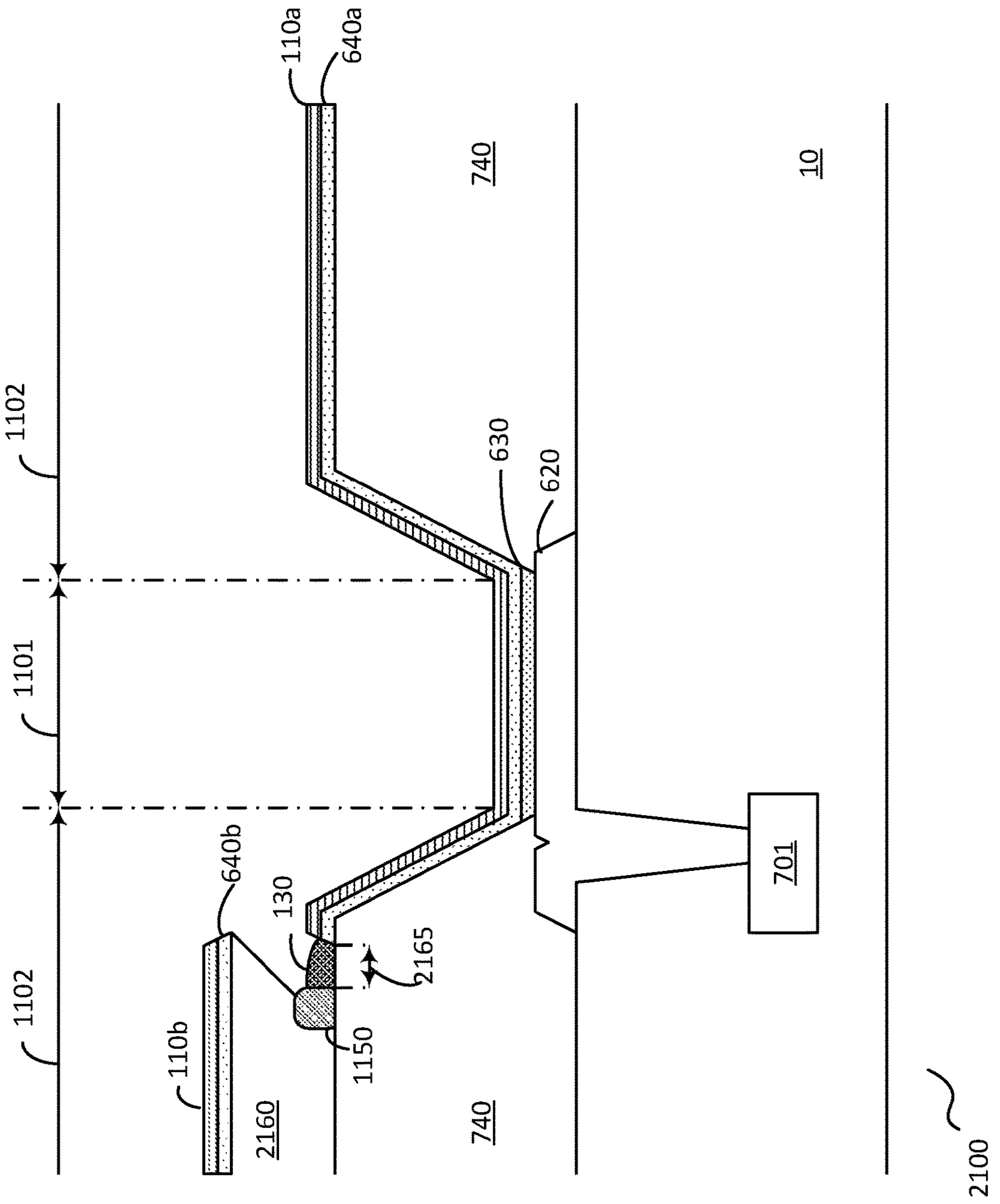
FIG. 21 is a schematic diagram illustrating an example cross-sectional view of an example version of the device of FIG. 6 in which a second electrode is coupled with an auxiliary electrode according to an example in the present disclosure.

Conductive Coating for Electrically Coupling an Electrode to an Auxiliary Electrode Turning to FIG. 21, there may be shown a cross-sectional view of an example version 2100 of the device 600. The device 2100 may comprise in a lateral aspect, an emissive region 1001 and an adjacent non-emissive region 1002.

In some non-limiting examples, the emissive region 1001 may correspond to a sub-pixel 134*x* of the device 2100. The emissive region 1001 may have a substrate 10, a first electrode 620, a second electrode 640 and at least one semiconducting layer 630 arranged therebetween.

The first electrode 620 may be disposed on an exposed layer surface 11 of the substrate 10. The substrate 10 may comprise a TFT structure 701, that may be electrically coupled with the first electrode 620. The edges, and/or perimeter of the first electrode 620 may generally be covered by at least one PDL 740.

The non-emissive region 1002 may have an auxiliary electrode 1150 and a first part of the non-emissive region 1002 may have a projecting structure 2160 arranged to project over and overlap a lateral aspect of the auxiliary electrode 1150. The projecting structure 2160 may extend laterally to provide a sheltered region 2165. By way of non-limiting example, the projecting structure 2160 may be recessed at, and/or near the auxiliary electrode 1150 on at least one side to provide the sheltered region 2165. As shown, the sheltered region 2165 may in some non-limiting examples, correspond to a region on a surface of the PDL 740 that may overlap with a lateral projection of the projecting structure 2160. The non-emissive region 1002 may further comprise a deposited layer 130 disposed in the sheltered region 2165. The deposited layer 130 may electrically couple the auxiliary electrode 1150 with the second electrode 640.

A patterning coating 110*a* may be disposed in the emissive region 1001 over the exposed layer surface 11 of the second electrode 640. In some non-limiting examples, an exposed layer surface 11 of the projecting structure 2160 may be coated with a residual thin conductive film from deposition of a thin conductive film to form a second electrode 640. In some non-limiting examples, an exposed layer surface 11 of the residual thin conductive film may be coated with a residual patterning coating 110*b* from deposition of the patterning coating 110.

However, because of the lateral projection of the projecting structure 2160 over the sheltered region 2165, the sheltered region 2165 may be substantially devoid of patterning coating 110. Thus, when a deposited layer 130 may be deposited on the device 2100 after deposition of the patterning coating 110, the deposited layer 130 may be deposited on, and/or migrate to the sheltered region 2165 to couple the auxiliary electrode 1150 to the second electrode 640.

Those having ordinary skill in the relevant art will appreciate that a non-limiting example has been shown in FIG. 21 and that various modifications may be apparent. By way of non-limiting example, the projecting structure 2160 may provide a sheltered region 2165 along at least two of its sides. In some non-limiting examples, the projecting structure 2160 may be omitted and the auxiliary electrode 1150 may comprise a recessed portion that may define the sheltered region 2165. In some non-limiting examples, the auxiliary electrode 1150 and the deposited layer 130 may be disposed directly on a surface of the substrate 10, instead of the PDL 740.

Selective Deposition of Optical Coating

In some non-limiting examples, a device (not shown), which in some non-limiting examples may be an opto-electronic device, may comprise a substrate 10, a patterning coating 110 and an optical coating. The patterning coating 110 may cover, in a lateral aspect, a first lateral portion 101 of the substrate 10. The optical coating may cover, in a lateral aspect, a second lateral portion 102 of the substrate 10. At least a part of the patterning coating 110 may be substantially devoid of a closed coating 140 of the optical coating.

In some non-limiting examples, the optical coating may be used to modulate optical properties of EM radiation being transmitted, emitted, and/or absorbed by the device, including without limitation, plasmon modes. By way of non-limiting example, the optical coating may be used as an optical filter, index-matching coating, optical outcoupling coating, scattering layer, diffraction grating, and/or parts thereof.

In some non-limiting examples, the optical coating may be used to modulate at least one optical microcavity effect in the device by, without limitation, tuning the total optical path length, and/or the refractive index thereof. At least one optical property of the device may be affected by modulating at least one optical microcavity effect including without limitation, the output EM radiation, including without limitation, an angular dependence of an intensity thereof, and/or a wavelength shift thereof. In some non-limiting examples, the optical coating may be a non-electrical component, that is, the optical coating may not be configured to conduct, and/or transmit electrical current during normal device operations.

In some non-limiting examples, the optical coating may be formed of any deposited material 331, and/or may employ any mechanism of depositing a deposited layer 130 as described herein.

Partition and Recess

Figure 22:
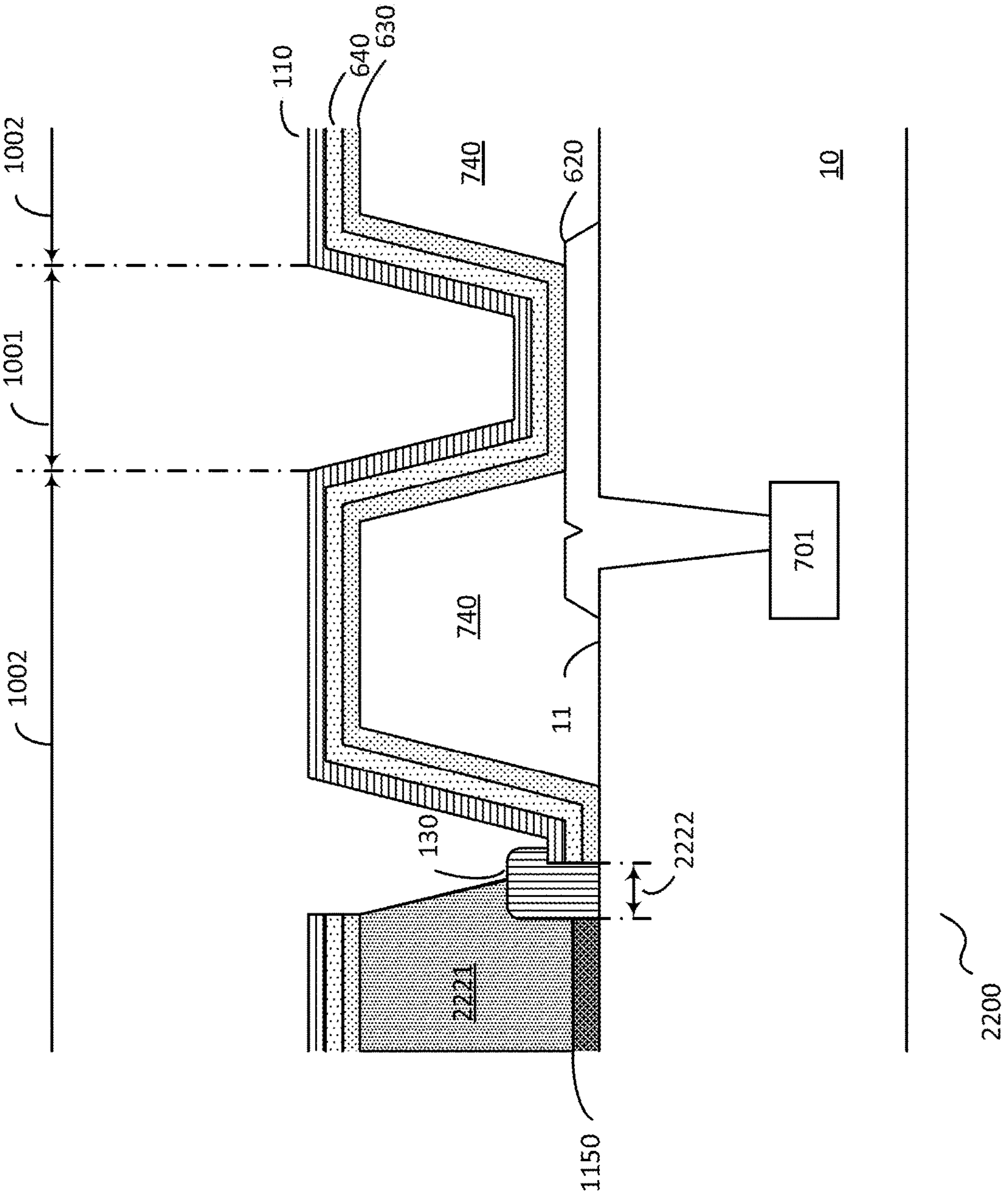
FIG. 22 is a schematic diagram illustrating an example cross-sectional view of an example version of the device of FIG. 6 having a partition and a sheltered region, such as a recess, in a non-emissive region thereof according to an example in the present disclosure.

Turning to FIG. 22, there may be shown a cross-sectional view of an example version 2200 of the device 600. The device 2200 may comprise a substrate 10 having an exposed layer surface 11. The substrate 10 may comprise at least one TFT structure 701. By way of non-limiting example, the at least one TFT structure 701 may be formed by depositing and patterning a series of thin films when fabricating the substrate 10, in some non-limiting examples, as described herein.

The device 2200 may comprise, in a lateral aspect, an emissive region 1001 having an associated lateral aspect 710 and at least one adjacent non-emissive region 1002, each having an associated lateral aspect 720. The exposed layer surface 11 of the substrate 10 in the emissive region 1001 may be provided with a first electrode 620, that may be electrically coupled with the at least one TFT structure 701. A PDL 740 may be provided on the exposed layer surface 11, such that the PDL 740 covers the exposed layer surface 11 as well as at least one edge, and/or perimeter of the first electrode 620. The PDL 740 may, in some non-limiting examples, be provided in the lateral aspect 720 of the non-emissive region 1002. The PDL 740 may define a valley-shaped configuration that may provide an opening that generally may correspond to the lateral aspect 710 of the emissive region 1001 through which a layer surface of the first electrode 620 may be exposed. In some non-limiting examples, the device 3500 may comprise a plurality of such openings defined by the PDLs 740, each of which may correspond to a (sub-) pixel 1810/134*x* region of the device 2200.

As shown, in some non-limiting examples, a partition 2221 may be provided on the exposed layer surface 11 in the lateral aspect 720 of a non-emissive region 1002 and, as described herein, may define a sheltered region 2165, such as a recess 2222. In some non-limiting examples, the recess 2222 may be formed by an edge of a lower section of the partition 2221 being recessed, staggered, and/or offset with respect to an edge of an upper section of the partition 2221 that may overlap, and/or project beyond the recess 2222.

In some non-limiting examples, the lateral aspect 710 of the emissive region 1001 may comprise at least one semiconducting layer 630 disposed over the first electrode 620, a second electrode 640, disposed over the at least one semiconducting layer 630, and a patterning coating 110 disposed over the second electrode 640. In some non-limiting examples, the at least one semiconducting layer 630, the second electrode 640 and the patterning coating 110 may extend laterally to cover at least the lateral aspect 720 of a part of at least one adjacent non-emissive region 1002. In some non-limiting examples, as shown, the at least one semiconducting layer 630, the second electrode 640 and the patterning coating 110 may be disposed on at least a part of at least one PDL 740 and at least a part of the partition 2221. Thus, as shown, the lateral aspect 710 of the emissive region 1001, the lateral aspect 720 of a part of at least one adjacent non-emissive region 1002, a part of at least one PDL 740, and at least a part of the partition 2221, together may make up a first portion 101, in which the second electrode 640 may lie between the patterning coating 110 and the at least one semiconducting layer 630.

An auxiliary electrode 1150 may be disposed proximate to, and/or within the recess 2222 and a deposited layer 130 may be arranged to electrically couple the auxiliary electrode 1150 with the second electrode 640. Thus as shown, in some non-limiting examples, the recess 2222 may comprise a second portion 102, in which the deposited layer 130 is disposed on the exposed layer surface 11.

In some non-limiting examples, in depositing the deposited layer 130, at least a part of the evaporated flux 332 of the deposited material 331 may be directed at a non-normal angle relative to a lateral plane of the exposed layer surface 11. By way of non-limiting example, at least a part of the evaporated flux 332 may be incident on the device 2200 at a non-zero angle of incidence that is, relative to such lateral plane of the exposed layer surface 11, no more than at least one of about: 90°, 85°, 80°, 75°, 70°, 60°, or 50°. By directing an evaporated flux 332 of a deposited material 331, including at least a part thereof incident at a non-normal angle, at least one exposed layer surface 11 of, and/or in the recess 2222 may be exposed to such evaporated flux 332.

In some non-limiting examples, a likelihood of such evaporated flux 332 being precluded from being incident onto at least one exposed layer surface 11 of, and/or in the recess 2222 due to the presence of the partition 2221, may be reduced since at least a part of such evaporated flux 332 may be flowed at a non-normal angle of incidence.

In some non-limiting examples, at least a part of such evaporated flux 332 may be non-collimated. In some non-limiting examples, at least a part of such evaporated flux 332 may be generated by an evaporation source that is a point source, a linear source, and/or a surface source.

In some non-limiting examples, the device 2200 may be displaced during deposition of the deposited layer 130. By way of non-limiting example, the device 2200, and/or the substrate 10 thereof, and/or any layer(s) deposited thereon, may be subjected to a displacement that is angular, in a lateral aspect, and/or in an aspect substantially parallel to the cross-sectional aspect.

In some non-limiting examples, the device 2200 may be rotated about an axis that substantially normal to the lateral plane of the exposed layer surface 11 while being subjected to the evaporated flux 332.

In some non-limiting examples, at least a part of such evaporated flux 332 may be directed toward the exposed layer surface 11 of the device 2200 in a direction that is substantially normal to the lateral plane of the exposed layer surface 11.

Without wishing to be bound by a particular theory, it may be postulated that the deposited material 331 may nevertheless be deposited within the recess 2222 due to lateral migration, and/or desorption of adatoms adsorbed onto the exposed layer surface 11 of the patterning coating 110. In some non-limiting examples, it may be postulated that any adatoms adsorbed onto the exposed layer surface 11 of the patterning coating 110 may tend to migrate, and/or desorb from such exposed layer surface 11 due to unfavorable thermodynamic properties of the exposed layer surface 11 for forming a stable nucleus. In some non-limiting examples, it may be postulated that at least some of the adatoms migrating, and/or desorbing off such exposed layer surface 11 may be re-deposited onto the surfaces in the recess 2222 to form the deposited layer 130.

In some non-limiting examples, the deposited layer 130 may be formed such that the deposited layer 130 may be electrically coupled with both the auxiliary electrode 1150 and the second electrode 640. In some non-limiting examples, the deposited layer 130 may be in physical contact with at least one of the auxiliary electrode 1150, and/or the second electrode 640. In some non-limiting examples, an intermediate layer may be present between the deposited layer 130 and at least one of the auxiliary electrode 1150, and/or the second electrode 640. However, in such example, such intermediate layer may not substantially preclude the deposited layer 130 from being electrically coupled with the at least one of the auxiliary electrode 1150, and/or the second electrode 640. In some non-limiting examples, such intermediate layer may be relatively thin and be such as to permit electrical coupling therethrough. In some non-limiting examples, a sheet resistance of the deposited layer 130 may be no more than a sheet resistance of the second electrode 640.

As shown in FIG. 22, the recess 2222 may be substantially devoid of the second electrode 640. In some non-limiting examples, during the deposition of the second electrode 640, the recess 2222 may be masked, by the partition 2221, such that the evaporated flux 332 of the deposited material 331 for forming the second electrode 640 may be substantially precluded from being incident on at least one exposed layer surface 11 of, and/or in, the recess 2222. In some non-limiting examples, at least a part of the evaporated flux 332 of the deposited material 331 for forming the second electrode 640 may be incident on at least one exposed layer surface 11 of, and/or in, the recess 2222, such that the second electrode 640 may extend to cover at least a part of the recess 2222.

Figure 24:
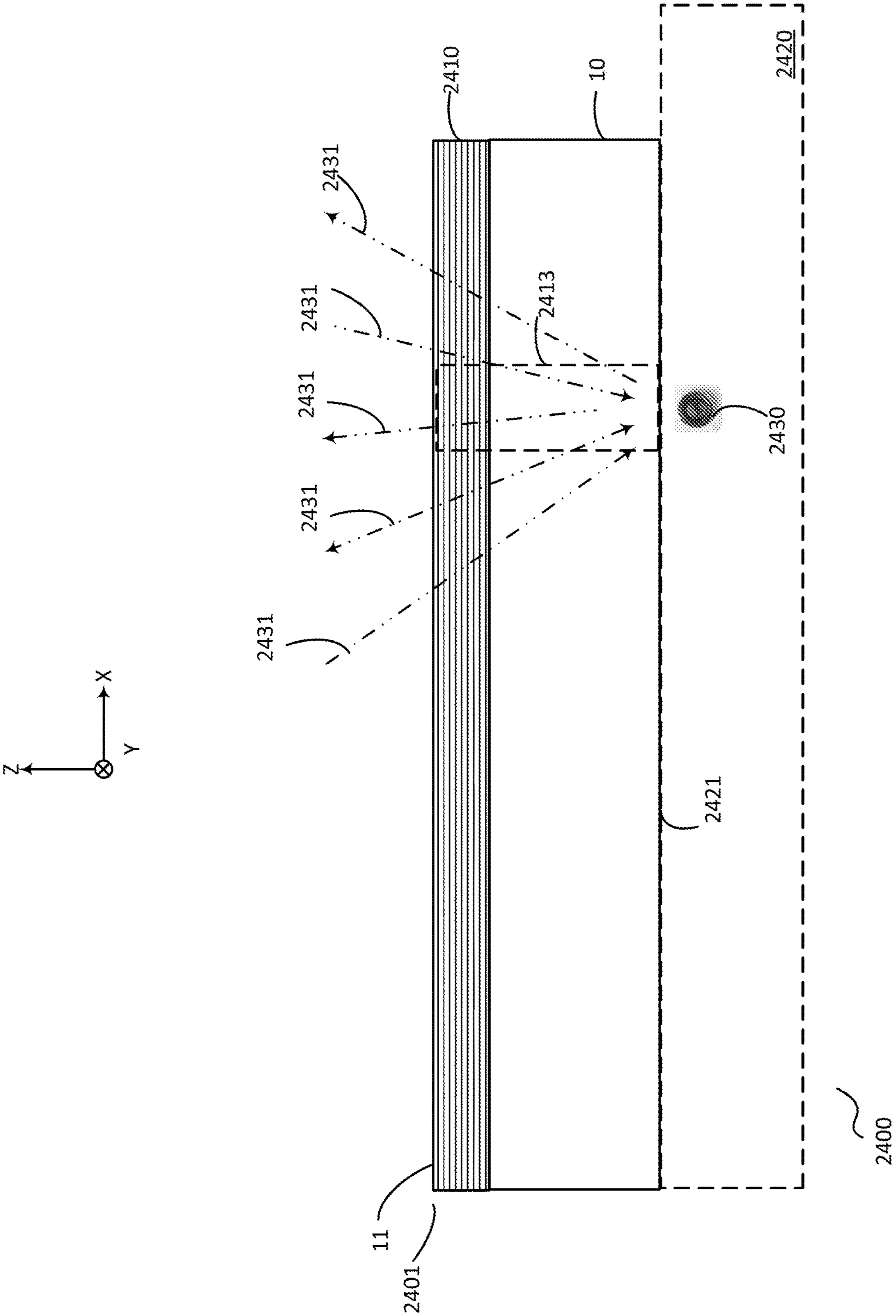
FIG. 24 is a schematic diagram illustrating an example cross-sectional view of an example display panel having a plurality of layers, comprising at least one aperture therewithin, according to an example in the present disclosure.

In some non-limiting examples, the auxiliary electrode 1150, the deposited layer 130, and/or the partition 2221 may be selectively provided in certain region(s) of a display panel 2410 (FIG. 24). In some non-limiting examples, any of these features may be provided at, and/or proximate to, at least one edge of such display panel for electrically coupling at least one element of the frontplane 610, including without limitation, the second electrode 640, to at least one element of the backplane 615. In some non-limiting examples, providing such features at, and/or proximate to, such edges may facilitate supplying and distributing electrical current to the second electrode 640 from an auxiliary electrode 1150 located at, and/or proximate to, such edges. In some non-limiting examples, such configuration may facilitate reducing a bezel size of the display panel.

In some non-limiting examples, the auxiliary electrode 1150, the deposited layer 130, and/or the partition 2221 may be omitted from certain regions(s) of such display panel 2410. In some non-limiting examples, such features may be omitted from parts of the display panel 2410, including without limitation, where a relatively high pixel density may be provided, other than at, and/or proximate to, at least one edge thereof.

Aperture in Non-Emissive Region

Figure 23A:
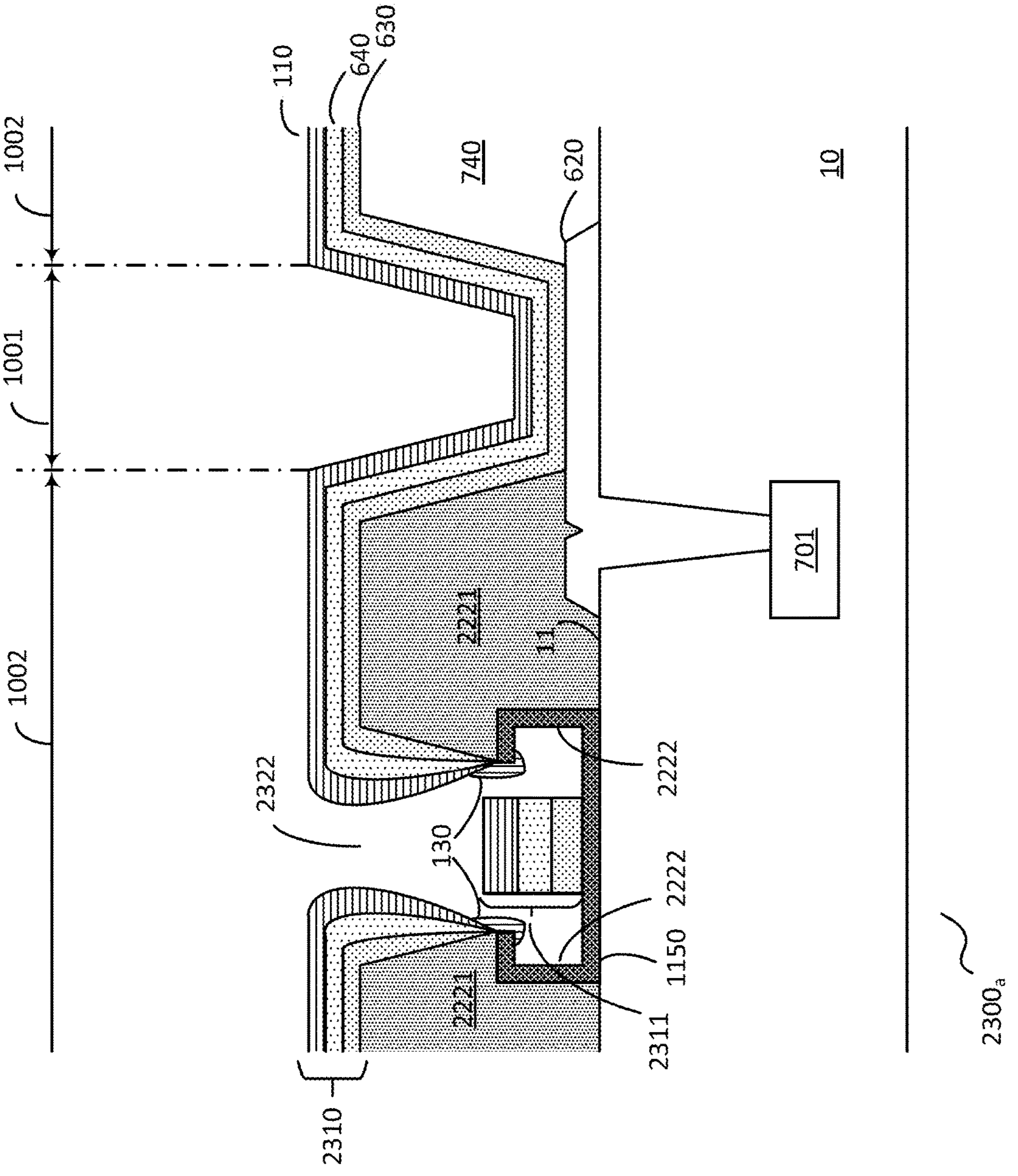
FIGS. 23A-23B are schematic diagrams that show example cross-sectional views of an example version of the device of FIG. 6 having a partition and a sheltered region, such as an aperture, in a non-emissive region, according to various examples in the present disclosure.

Turning now to FIG. 23A, there may be shown a cross-sectional view of an example version $\mathbf{2300}_a$ of the device 600. The device $\mathbf{2300}_a$ may differ from the device 2200 in that a pair of partitions 2221 in the non-emissive region 1002 may be disposed in a facing arrangement to define a sheltered region 2165, such as an aperture 2322, therebetween. As shown, in some non-limiting examples, at least one of the partitions 2221 may function as a PDL 740 that covers at least an edge of the first electrode 620 and that defines at least one emissive region 1001. In some non-limiting examples, at least one of the partitions 2221 may be provided separately from a PDL 740.

A sheltered region 2165, such as the recess 2222, may be defined by at least one of the partitions 2221. In some non-limiting examples, the recess 2222 may be provided in a part of the aperture 2322 proximal to the substrate 10. In some non-limiting examples, the aperture 2322 may be substantially elliptical when viewed in plan. In some non-limiting examples, the recess 2222 may be substantially annular when viewed in plan and surround the aperture 2322.

In some non-limiting examples, the recess 2222 may be substantially devoid of materials for forming each of the layers of a device stack 2310, and/or of a residual device stack 2311.

In these figures, a device stack 2310 may be shown comprising the at least one semiconducting layer 630, the second electrode 640 and the patterning coating 110 deposited on an upper section of the partition 2221.

In these figures, a residual device stack 2311 may be shown comprising the at least one semiconducting layer 630, the second electrode 640 and the patterning coating 110 deposited on the substrate 10 beyond the partition 2221 and recess 2222. From comparison with FIG. 22, it may be seen that the residual device stack 2311 may, in some non-limiting examples, correspond to the semiconductor layer 630, second electrode 640 and the patterning coating 110 as it approaches the recess 2222 at, and/or proximate to, a lip of the partition 2221. In some non-limiting examples, the residual device stack 2311 may be formed when an open mask and/or mask-free deposition process is used to deposit various materials of the device stack 2310.

In some non-limiting examples, the residual device stack 2311 may be disposed within the aperture 2322. In some non-limiting examples, evaporated materials for forming each of the layers of the device stack 2310 may be deposited within the aperture 2322 to form the residual device stack 2311 therein.

In some non-limiting examples, the auxiliary electrode 1150 may be arranged such that at least a part thereof is disposed within the recess 2322. As shown, in some non-limiting examples, the auxiliary electrode 1150 may be arranged within the aperture 2322, such that the residual device stack 3611 is deposited onto a surface of the auxiliary electrode 1150.

A deposited layer 130 may be disposed within the aperture 2322 for electrically coupling the second electrode 640 with the auxiliary electrode 1150. By way of non-limiting example, at least a part of the deposited layer 130 may be disposed within the recess 2222.

Figure 23B:
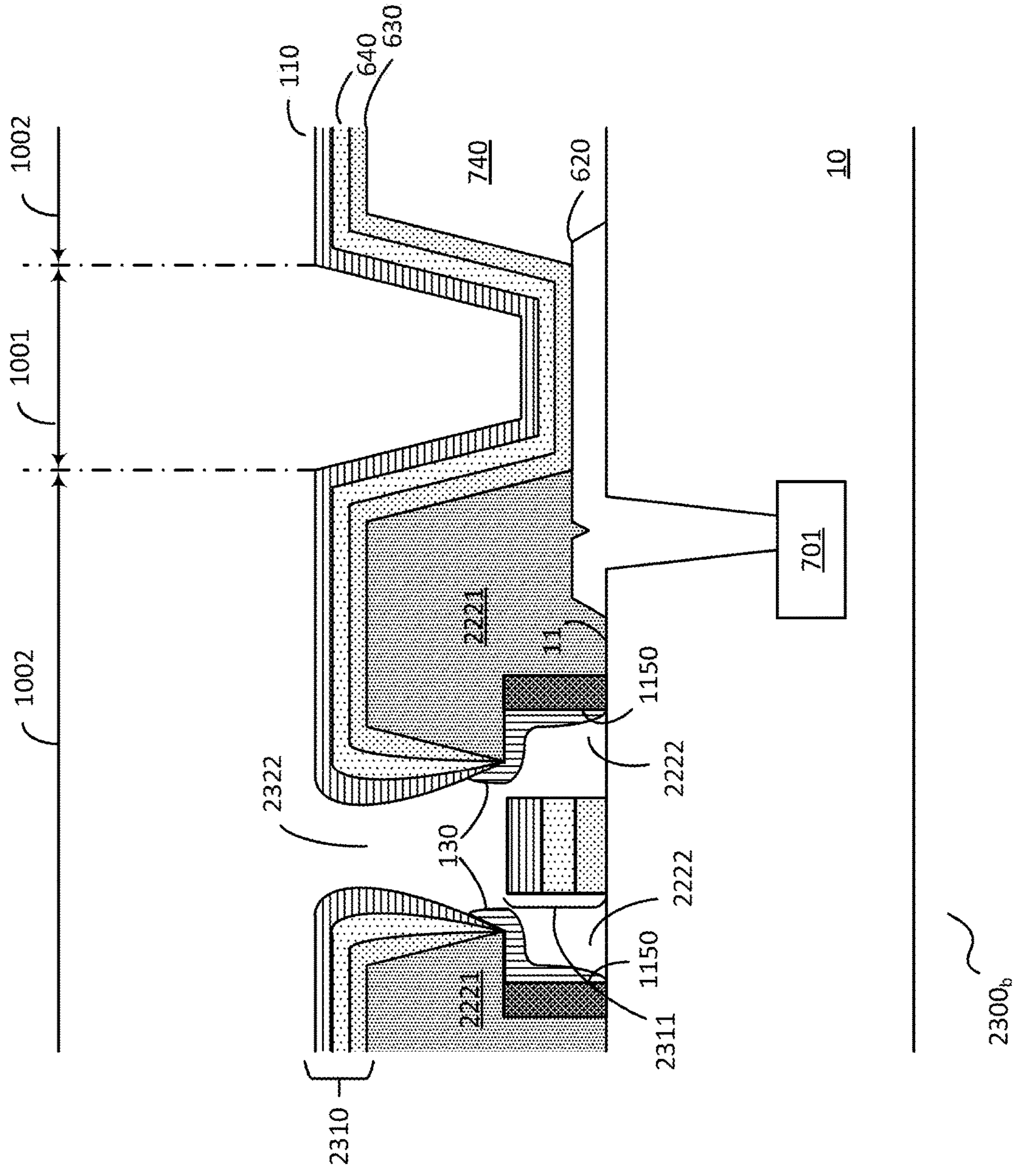

Turning now to FIG. 23B, there may be shown a cross-sectional view of a further example of the device 2300$_b$. As shown, the auxiliary electrode 1150 may be arranged to form at least a part of a side of the partition 2221. As such, the auxiliary electrode 1150 may be substantially annular, when viewed in plan view, and may surround the aperture 2322. As shown, in some non-limiting examples, the residual device stack 2311 may be deposited onto an exposed layer surface 11 of the substrate 10.

In some non-limiting examples, the partition 2221 may comprise, and/or be formed by, an NPC 520. By way of non-limiting example, the auxiliary electrode 1150 may act as an NPC 520.

In some non-limiting examples, the NPC 520 may be provided by the second electrode 640, and/or a portion, layer, and/or material thereof. In some non-limiting examples, the second electrode 640 may extend laterally to cover the exposed layer surface 11 arranged in the sheltered region 2165. In some non-limiting examples, the second electrode 640 may comprise a lower layer thereof and a second layer thereof, wherein the second layer thereof may be deposited on the lower layer thereof. In some non-limiting examples, the lower layer of the second electrode 640 may comprise an oxide such as, without limitation, ITO, IZO, or ZnO. In some non-limiting examples, the upper layer of the second electrode 640 may comprise a metal such as, without limitation, at least one of Ag, Mg, Mg:Ag, Yb/Ag, other alkali metals, and/or other alkali earth metals.

In some non-limiting examples, the lower layer of the second electrode 640 may extend laterally to cover a surface of the sheltered region 2165, such that it forms the NPC 520. In some non-limiting examples, at least one surface defining the sheltered region 2165 may be treated to form the NPC 520. In some non-limiting examples, such NPC 520 may be formed by chemical, and/or physical treatment, including without limitation, subjecting the surface(s) of the sheltered region 2165 to a plasma, UV, and/or UV-ozone treatment.

Without wishing to be bound to any particular theory, it may be postulated that such treatment may chemically, and/or physically alter such surface(s) to modify at least one property thereof. By way of non-limiting example, such treatment of the surface(s) may increase a concentration of C—O, and/or C—OH bonds on such surface(s), may increase a roughness of such surface(s), and/or may increase a concentration of certain species, and/or functional groups, including without limitation, halogens, nitrogen-containing functional groups, and/or oxygen-containing functional groups to thereafter act as an NPC 520.

Display Panel and User Device

Turning now to FIG. 24, there is shown a cross-sectional view of an example layered device, such as a display panel 2410. In some non-limiting examples, the display panel 2410 may comprise a plurality of layers deposited on a substrate 10, culminating with an outermost layer that forms a face 2401 thereof. In some non-limiting examples, the display panel 2410 may be a version of the device 600.

The face 2401 of the display panel 2410 may extend across a lateral aspect thereof, substantially along a plane defined by the lateral axes. In some non-limiting examples, the face 2401, and indeed the display panel 2410 may act as a face of a user device 2400 through which at least one EM signal 2431 may be exchanged therethrough at an angle relative to the plane of the face 2401. In some non-limiting examples, the user device 2400 may be a computing device, such as, without limitation, a smartphone, a tablet, a laptop, and/or an e-reader, and/or some other electronic device, such as a monitor, a television set, and/or a smart device, including without limitation, an automotive display and/or windshield, a household appliance, and/or a medical, commercial, and/or industrial device.

In some non-limiting examples, the face 2401 may correspond to and/or mate with a body 2420, and/or an opening 2421 therewithin, within which at least one under-display component 2430 may be housed.

In some non-limiting examples, the at least one under-display component 2430 may be formed integrally, or as an assembled module, with the display panel 2410 on a surface thereof opposite to the face 2401. In some non-limiting examples, the at least one under-display component 2430 may be formed on a surface of the substrate 10 of the display panel 2410 opposite to the face 2401.

In some non-limiting examples, at least one aperture 2413 may be formed in the display panel 2410 to allow for the exchange of at least one EM signal 2431 through the face 2401 of the display panel 2410, at an angle to the plane defined by the lateral axes, or concomitantly, the layers of the display panel 2410, including without limitation, the face 2401 of the display panel 2410.

In some non-limiting examples, the at least one aperture 2413 may be understood to comprise the absence and/or reduction in thickness and/or opacity of a substantially opaque coating otherwise disposed across the display panel 2410.

In other words, the at least one EM signal 2431 may pass through the at least one aperture such that it passes through the face 2401. As a result, the at least one EM signal 2431 may be considered to exclude any EM radiation that may extend along the plane defined by the lateral axes, including without limitation, any electric current that may be conducted across a deposited layer 130 laterally across the display panel 2410.

Further, those having ordinary skill in the relevant art will appreciate that the at least one EM signal 2431 may be differentiated from EM radiation per se, including without limitation, electric current, and/or an electric field generated thereby, in that the at least one EM signal 2431 may convey, either alone, or in conjunction with other EM signals 2431, some information content, including without limitation, an identified by which the at least one EM signal 2431 may be distinguished from other EM signals 2431. In some non-limiting examples, the information content may be conveyed by specifying, altering, and/or modulating at least one of the wavelength, frequency, phase, timing, bandwidth, resistance, capacitance, impedance, conductance, and/or other characteristic of the at least one EM signal 2431.

In some non-limiting examples, the at least one EM signal 2431 passing through the at least one aperture 2413 of the display panel 2410 may comprise at least one photon and, in some non-limiting examples, may have a wavelength spectrum that lies, without limitation, within at least one of the visible spectrum, the IR spectrum, and/or the NIR spectrum.

In some non-limiting examples, the EM signal passing through the at least one aperture 2413 of the display panel 2410 may comprise ambient light incident thereon.

In some non-limiting examples, the at least one EM signal 2431 exchanged through the at least one aperture 2413 of the display panel 2410 may be transmitted and/or received by the at least one under-display component 2430.

In some non-limiting examples, the at least one under-display component 2430 may have a size that is greater than a single light transmissive region 1820, but may underlie not only a plurality of light transmissive regions 1820 but also at least one emissive region 1001 extending therebetween. Similarly, in some non-limiting examples, the at least one under-display component 2430 may have a size that is greater than a single one of the at least one apertures 2413.

In some non-limiting examples, the at least one under-display component 2430 may comprise a receiver $\mathbf{2430}_r$ adapted to receive and process at least one EM signal 2431 passing through the at least one aperture 2413 from beyond the user device 2400. Non-limiting examples of such receiver $\mathbf{2430}_r$ include an under-display camera (UDC), and/or a sensor, including without limitation, an IR sensor, an NIR sensor, a LIDAR sensing module, a fingerprint sensing module, an optical sensing module, an IR (proximity) sensing module, an iris recognition sensing module, and/or a facial recognition sensing module.

In some non-limiting examples, the at least one under-display component 2430 may comprise a transmitter $\mathbf{2430}_t$ adapted to emit at least one EM signal 2431 passing through the at least one aperture 2413 beyond the user device 2400. Non-limiting examples of such transmitter $\mathbf{2430}_t$ include a source of EM radiation, including without limitation, a built-in flash, a flashlight, an IR emitter, and/or an NIR emitter, and/or a LIDAR sensing module, a fingerprint sensing module, an optical sensing module, an IR (proximity) sensing module, an iris recognition sensing module, and/or a facial recognition sensing module.

In some non-limiting examples, the at least one EM signal 2431 passing through the at least one aperture 2413 of the display panel 2410 beyond the user device 2400, including without limitation, those emitted by the at least one under-display component 2430 that comprises a transmitter $\mathbf{2430}_r$, may emanate from the display panel 2400 and pass back through the at least one aperture 2413 of the display panel 2410 to at least one under-display component 2430 that comprises a receiver $\mathbf{2430}_r$.

In some non-limiting examples, there may be a plurality of under-display components 2430 within the user device 2400, a first one of which comprises a transmitter $\mathbf{2430}_t$ for emitting at least one EM signal 2431 to pass through the at least one aperture 2413, beyond the user device 2400, and a second one of which comprises a receiver $\mathbf{2430}_r$, for receiving at least one EM signal 2431. In some non-limiting examples, such transmitter $\mathbf{2430}_t$ and receiver $\mathbf{2430}_r$ may be embodied in a single, common one of the at least one under-display components 2430.

In some non-limiting examples, the at least one under-display component 2430 may not emit EM signals 2431, but rather the display panel 2410 that forms the face 2401 may comprise an opto-electronic device, including without limitation, an opto-luminescent device, including without limitation, an OLED device that emits at least one EM signal 2431.

Diffraction Reduction

It has been discovered that, in some non-limiting examples, the at least one EM signal 2431 passing through the at least one signal transmissive region 1820 may be impacted by a diffraction characteristic of a diffraction pattern imposed by a shape of the at least one signal transmissive region 1820.

At least in some non-limiting examples, a display panel 2410 that causes at least one EM signal 2431 to pass through the at least one signal transmissive region 1820 that is shaped to exhibit a distinctive and non-uniform diffraction pattern, may interfere with the capture of an image and/or EM radiation pattern represented thereby.

By way of non-limiting example, such diffraction pattern may interfere with an ability to facilitate mitigating interference by such diffraction pattern, that is, to permit an under-display component 2430 to be able to accurately receive and process such image or pattern, even with the application of optical post-processing techniques, or to allow a viewer of such image and/or pattern through such display panel 2410 to discern information contained therein.

In some non-limiting examples, a distinctive and/or non-uniform diffraction pattern may result from a shape of the at least one signal transmissive region 1820 that may cause distinct and/or angularly separated diffraction spikes in the diffraction pattern.

In some non-limiting examples, a first diffraction spike may be distinguished from a second proximate diffraction spike by simple observation, such that a total number of diffraction spikes along a full angular revolution may be counted. However, in some non-limiting examples, especially where the number of diffraction spikes is large, it may be more difficult to identify individual diffraction spikes. In such circumstances, the distortion effect of the resulting diffraction pattern may in fact facilitate mitigation of the interference caused thereby, since the distortion effect tends to be blurred and/or distributed more evenly. Such blurring and/or more even distribution of the distortion effect may, in some non-limiting examples, be more amenable to mitigation, including without limitation, by optical post-processing techniques, in order to recover the original image and/or information contained therein.

In some non-limiting examples, an ability to facilitate mitigation of the interference caused by the diffraction pattern may increase as the number of diffraction spikes increases.

In some non-limiting examples, a distinctive and non-uniform diffraction pattern may result from a shape of the at least one signal transmissive region 1820 that increase a length of a pattern boundary within the diffraction pattern between region(s) of high intensity of EM radiation and region(s) of low intensity of EM radiation as a function of a pattern circumference of the diffraction pattern and/or that reduces a ratio of the pattern circumference relative to the length of the pattern boundary thereof.

Without wishing to be bound by any specific theory, it may be postulated that display panels 2410 having closed boundaries of light transmissive regions 1820 defined by a corresponding signal transmissive region 1820 that are polygonal may exhibit a distinctive and non-uniform diffraction pattern that may adversely impact an ability to facilitate mitigation of interference caused by the diffraction pattern, relative to a display panel 2410 having closed boundaries of light transmissive regions 1820 defined by a corresponding signal transmissive region 1820 that is non-polygonal.

In the present disclosure, the term "polygonal" may refer generally to shapes, figures, closed boundaries, and/or perimeters formed by a finite number of linear and/or straight segments and the term "non-polygonal" may refer generally to shapes, figures, closed boundaries, and/or perimeters that are not polygonal. By way of non-limiting example, a closed boundary formed by a finite number of linear segments and at least one non-linear or curved segment may be considered non-polygonal.

Without wishing to be bound by a particular theory, it may be postulated that when a closed boundary of an EM radiation transmissive region 1820 defined by a corresponding signal transmissive region 1820 comprises at least one non-linear and/or curved segment, EM signals incident thereon and transmitted therethrough may exhibit a less distinctive and/or more uniform diffraction pattern that facilitates mitigation of interference caused by the diffraction pattern.

In some non-limiting examples, a display panel 2410 having a closed boundary of the EM radiation transmissive regions 1820 defined by a corresponding signal transmissive region 1820 that is substantially elliptical and/or circular may further facilitate mitigation of interference caused by the diffraction pattern.

In some non-limiting examples, a signal transmissive region 1820 may be defined by a finite plurality of convex rounded segments. In some non-limiting examples, at least some of these segments coincide at a concave notch or peak.

Removal of Selective Coating

In some non-limiting examples, the patterning coating 110 may be removed after deposition of the deposited layer 130, such that at least a part of a previously exposed layer surface 11 of an underlying material covered by the patterning coating 110 may become exposed once again. In some non-limiting examples, the patterning coating 110 may be selectively removed by etching, and/or dissolving the patterning coating 110, and/or by employing plasma, and/or solvent processing techniques that do not substantially affect or erode the deposited layer 130.

Figures 25A, 25B, 25C:
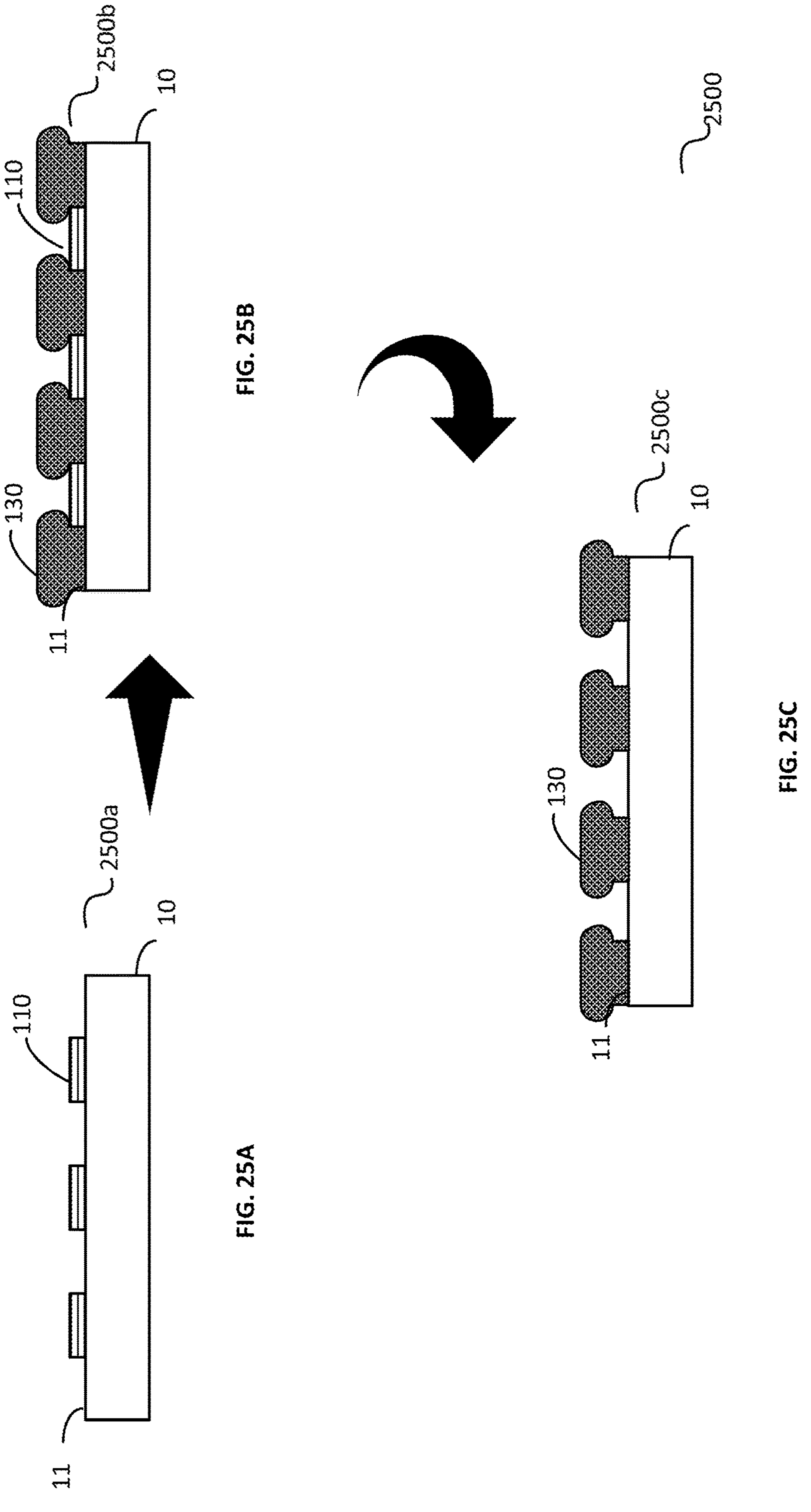
FIGS. 25A-25C are schematic diagrams that show example stages of an example process for depositing a deposited layer in a pattern on an exposed layer surface of an example version of the device of FIG. 6, by selective deposition and subsequent removal process, according to an example in the present disclosure.

Turning now to FIG. 25A, there may be shown an example cross-sectional view of an example version 2500 of the device 600, at a deposition stage 2500*a*, in which a patterning coating 110 may have been selectively deposited on a first portion 101 of an exposed layer surface 11 of an underlying material. In the figure, the underlying material may be the substrate 10.

In FIG. 25B, the device 2500 may be shown at a deposition stage 2500*b*, in which a deposited layer 130 may be deposited on the exposed layer surface 11 of the underlying material, that is, on both the exposed layer surface 11 of patterning coating 110 where the patterning coating 110 may have been deposited during the stage 2500*a*, as well as the exposed layer surface 11 of the substrate 10 where that patterning coating 110 may not have been deposited during the stage 2500*a*. Because of the nucleation-inhibiting properties of the first portion 101 where the patterning coating 110 may have been disposed, the deposited layer 130 disposed thereon may tend to not remain, resulting in a pattern of selective deposition of the deposited layer 130, that may correspond to a second portion 102, leaving the first portion 101 substantially devoid of the deposited layer 130.

In FIG. 25C, the device 2500 may be shown at a deposition stage 2500*c*, in which the patterning coating 110 may have been removed from the first portion 101 of the exposed layer surface 11 of the substrate 10, such that the deposited layer 130 deposited during the stage 2500*b* may remain on the substrate 10 and regions of the substrate 10 on which the patterning coating 110 may have been deposited during the stage 2500*a* may now be exposed or uncovered.

In some non-limiting examples, the removal of the patterning coating 110 in the stage 2500*c* may be effected by exposing the device 2500 to a solvent, and/or a plasma that reacts with, and/or etches away the patterning coating 110 without substantially impacting the deposited layer 130.

Thin Film Formation

The formation of thin films during vapor deposition on an exposed layer surface 11 of an underlying layer may involve processes of nucleation and growth.

During initial stages of film formation, a sufficient number of vapor monomers which in some non-limiting examples may be molecules, and/or atoms of a deposited material 331 in vapor form) may typically condense from a vapor phase to form initial nuclei on the exposed layer surface 11 presented of an underlying layer. As vapor monomers may impinge on such surface, a characteristic size, and/or deposited density of these initial nuclei may increase to form small particle structures 441. Non-limiting examples of a dimension to which such characteristic size refers may include a height, width, length, and/or diameter of such particle structure 441.

After reaching a saturation island density, adjacent particle structures 441 may typically start to coalesce, increasing an average characteristic size of such particle structures 441, while decreasing a deposited density thereof.

With continued vapor deposition of monomers, coalescence of adjacent particle structures 441 may continue until a substantially closed coating 140 may eventually be deposited on an exposed layer surface 11 of an underlying layer. The behaviour, including optical effects caused thereby, of such closed coatings 140 may be generally relatively uniform, consistent, and unsurprising.

There may be at least three basic growth modes for the formation of thin films, in some non-limiting examples, culminating in a closed coating 140: 1) island (Volmer-Weber), 2) layer-by-layer (Frank-van der Merwe), and 3) Stranski-Krastanov.

Island growth may typically occur when stale clusters of monomers nucleate on an exposed layer surface 11 and grow to form discrete islands. This growth mode may occur when the interaction between the monomers is stronger than that between the monomers and the surface.

The nucleation rate may describe how many nuclei of a given size (where the free energy does not push a cluster of such nuclei to either grow or shrink) ("critical nuclei") may be formed on a surface per unit time. During initial stages of film formation, it may be unlikely that nuclei will grow from direct impingement of monomers on the surface, since the deposited density of nuclei is low, and thus the nuclei may cover a relatively small fraction of the surface (e.g., there are large gaps/spaces between neighboring nuclei). Therefore, the rate at which critical nuclei may grow may typically depend on the rate at which adatoms (e.g., adsorbed monomers) on the surface migrate and attach to nearby nuclei.

Figure 26:
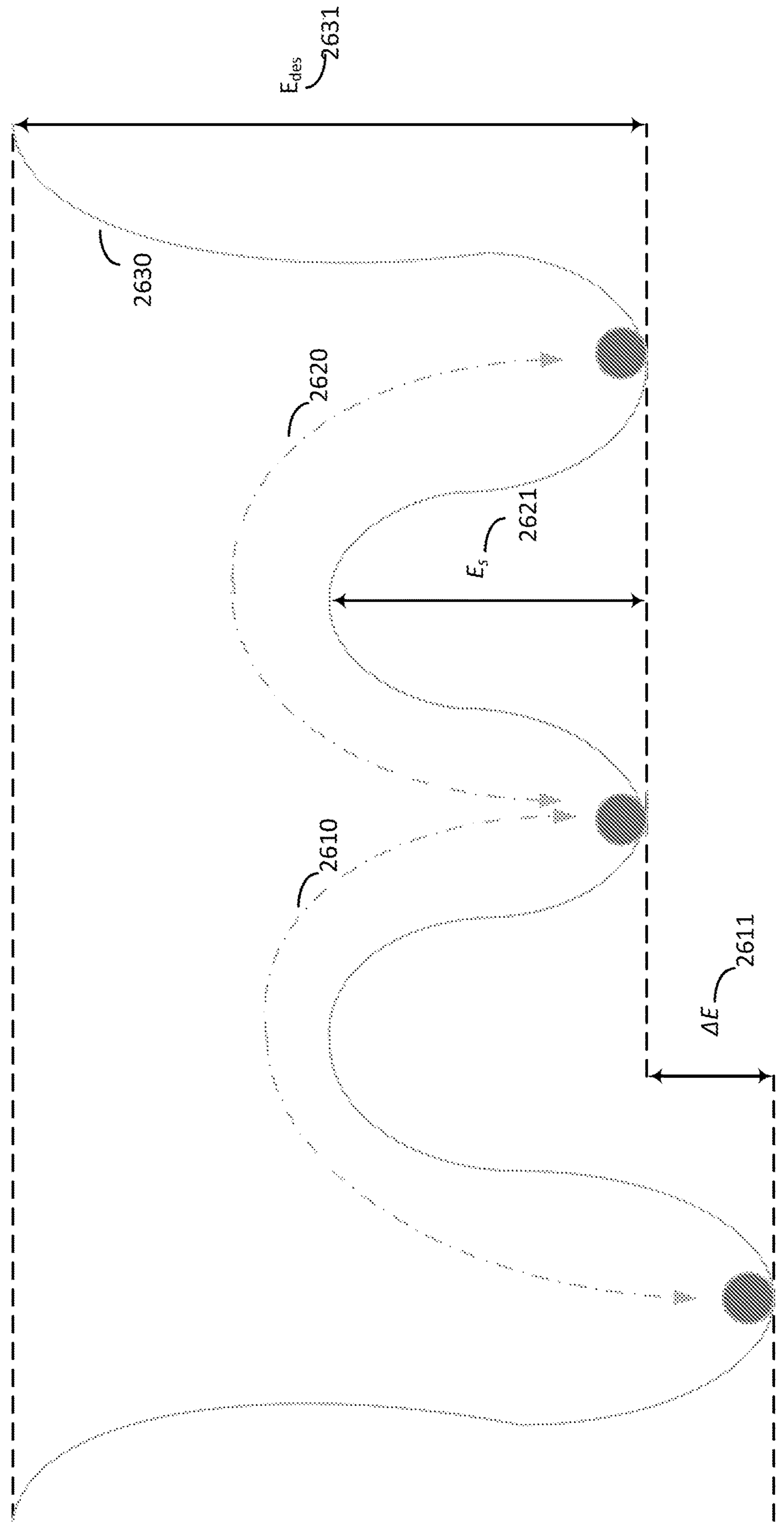
FIG. 26 is an example energy profile illustrating relative energy states of an adatom absorbed onto a surface according to an example in the present disclosure.

An example of an energy profile of an adatom adsorbed onto an exposed layer surface 11 of an underlying material is illustrated in FIG. 26. Specifically, FIG. 26 may illustrate example qualitative energy profiles corresponding to: an adatom escaping from a local low energy site (2610); diffusion of the adatom on the exposed layer surface 11 (2620); and desorption of the adatom (2630).

In 2610, the local low energy site may be any site on the exposed layer surface 11 of an underlying layer, onto which an adatom will be at a lower energy. Typically, the nucleation site may comprise a defect, and/or an anomaly on the exposed layer surface 11, including without limitation, a ledge, a step edge, a chemical impurity, a bonding site, and/or a kink ("heterogeneity").

Sites of substrate heterogeneity may increase an energy involved to desorb the adatom from the surface $E_{des}$ 2631, leading to a higher deposited density of nuclei observed at such sites. Also, impurities or contamination on a surface may also increase $E_{des}$ 2631, leading to a higher deposited density of nuclei. For vapor deposition processes, conducted under high vacuum conditions, the type and deposited density of contaminants on a surface may be affected by a vacuum pressure and a composition of residual gases that make up that pressure.

Once the adatom is trapped at the local low energy site, there may typically, in some non-limiting examples, be an energy barrier before surface diffusion takes place. Such energy barrier may be represented as ΔE 2611 in FIG. 26. In some non-limiting examples, if the energy barrier ΔE 2611 to escape the local low energy site is sufficiently large, the site may act as a nucleation site.

In 2620, the adatom may diffuse on the exposed layer surface 11. By way of non-limiting example, in the case of localized absorbates, adatoms may tend to oscillate near a minimum of the surface potential and migrate to various neighboring sites until the adatom is either desorbed, and/or is incorporated into growing islands 441 formed by a cluster of adatoms, and/or a growing film. In FIG. 26, the activation energy associated with surface diffusion of adatoms may be represented as $E_s$ 2621.

In 2630, the activation energy associated with desorption of the adatom from the surface may be represented as $E_{des}$ 2631. Those having ordinary skill in the relevant art will appreciate that any adatoms that are not desorbed may remain on the exposed layer surface 11. By way of non-limiting example, such adatoms may diffuse on the exposed layer surface 11, become part of a cluster of adatoms that form islands 441 on the exposed layer surface 11, and/or be incorporated as part of a growing film, and/or coating.

After adsorption of an adatom on a surface, the adatom may either desorb from the surface, or may migrate some distance on the surface before either desorbing, interacting with other adatoms to form a small cluster, or attaching to a growing nucleus. An average amount of time that an adatom may remain on the surface after initial adsorption may be given by:

$$\tau_s = \frac{1}{v}\exp\left(\frac{E_{des}}{kT}\right) \quad \text{(TF1)}$$

In the above equation:

v is a vibrational frequency of the adatom on the surface, k is the Botzmann constant, and T is temperature.

From Equation TF1 it may be noted that the lower the value of $E_{des}$ 2631, the easier it may be for the adatom to desorb from the surface, and hence the shorter the time the adatom may remain on the surface. A mean distance an adatom can diffuse may be given by, $$X = a_0\exp\left(\frac{E_{des} - E_s}{2kT}\right) \quad \text{(TF2)}$$

where:

$\alpha_0$ is a lattice constant.

For low values of $E_{des}$ 2631, and/or high values of $E_s$ 2621, the adatom may diffuse a shorter distance before desorbing, and hence may be less likely to attach to growing nuclei or interact with another adatom or cluster of adatoms.

During initial stages of formation of a deposited layer of particle structures 441, adsorbed adatoms may interact to form particle structures 441, with a critical concentration of particle structures 441 per unit area being given by, $$\frac{N_i}{n_0} = \left|\frac{N_1}{n_0}\right|^i \exp\left(\frac{E_i}{kT}\right) \quad \text{(TF3)}$$

where:

$E_i$ is an energy involved to dissociate a critical cluster containing i adatoms into separate adatoms, $n_0$ is a total deposited density of adsorption sites, and $N_1$ is a monomer deposited density given by:

$$N_1 = \dot{R}\tau_s \quad \text{(TF4)}$$

where:

$\dot{R}$ is a vapor impingement rate.

Typically, i may depend on a crystal structure of a material being deposited and may determine a critical size of particle structures 441 to form a stable nucleus.

A critical monomer supply rate for growing particle structures 441 may be given by the rate of vapor impingement and an average area over which an adatom can diffuse before desorbing:

$$\dot{R}X^2 = \alpha_0^2\exp\left(\frac{E_{des} - E_s}{kT}\right) \quad \text{(TF5)}$$

The critical nucleation rate may us be given by the combination of the above equations:

$$\dot{N}_i = \dot{R}\alpha_0^2 n_0\left(\frac{\dot{R}}{vn_0}\right)^i \exp\left(\frac{(i+1)E_{des} - E_s + E_i}{kT}\right) \quad \text{(TF6)}$$

From the above equation, it may be noted that the critical nucleation rate may be suppressed for surfaces that have a low desorption energy for adsorbed adatoms, a high activation energy for diffusion of an adatom, are at high temperatures, and/or are subjected to vapor impingement rates.

Under high vacuum conditions, a flux 332 of molecules that may impinge on a surface (per $cm^2$-sec) may be given by:

$$\phi = 3.513 \times 10^{22}\frac{P}{MT} \quad \text{(TF7)}$$

where:

P is pressure, and

M is molecular weight.

Therefore, a higher partial pressure of a reactive gas, such as $H_2O$, may lead to a higher deposited density of contamination on a surface during vapor deposition, leading to an increase in $E_{des}$ 2631 and hence a higher deposited density of nuclei.

In the present disclosure, "nucleation-inhibiting" may refer to a coating, material, and/or a layer thereof, that may have a surface that exhibits an initial sticking probability against deposition of a deposited material 331 thereon, that may be close to 0, including without limitation, less than about 0.3, such that the deposition of the deposited material 331 on such surface may be inhibited.

In the present disclosure, "nucleation-promoting" may refer to a coating, material, and/or a layer thereof, that has a surface that exhibits an initial sticking probability against deposition of a deposited material 331 thereon, that may be close to 1, including without limitation, greater than about 0.7, such that the deposition of the deposited material 331 on such surface may be facilitated.

Without wishing to be bound by a particular theory, it may be postulated that the shapes and sizes of such nuclei and the subsequent growth of such nuclei into islands 441 and thereafter into a thin film may depend upon various factors, including without limitation, interfacial tensions between the vapor, the surface, and/or the condensed film nuclei.

One measure of a nucleation-inhibiting, and/or nucleation-promoting property of a surface may be the initial sticking probability of the surface against the deposition of a given deposited material 331.

In some non-limiting examples, the sticking probability S may be given by:

$$S = \frac{N_{ads}}{N_{total}} \quad \text{(TF8)}$$

where:

$N_{ads}$ is a number of adatoms that remain on an exposed layer surface 11 (that is, are incorporated into a film), and $N_{total}$ is a total number of impinging monomers on the surface.

A sticking probability S equal to 1 may indicate that all monomers that impinge on the surface are adsorbed and subsequently incorporated into a growing film. A sticking probability S equal to 0 may indicate that all monomers that impinge on the surface are desorbed and subsequently no film may be formed on the surface.

A sticking probability S of a deposited material 331 on various surfaces may be evaluated using various techniques of measuring the sticking probability S, including without limitation, a dual quartz crystal microbalance (QCM) technique as described by Walker et al., *J. Phys. Chem. C* 2007, 111, 765 (2006).

As the deposited density of a deposited material 331 may increase (e.g., increasing average film thickness), a sticking probability S may change.

An initial sticking probability $S_0$ may therefore be specified as a sticking probability S of a surface prior to the formation of any significant number of critical nuclei. One measure of an initial sticking probability $S_0$ may involve a sticking probability S of a surface against the deposition of a deposited material 331 during an initial stage of deposition thereof, where an average film thickness of the deposited material 331 across the surface is at or below a threshold value. In the description of some non-limiting examples a threshold value for an initial sticking probability may be specified as, by way of non-limiting example, 1 nm. An average sticking probability S may then be given by:

$$\overline{S} = S_0(1 - A_{nuc}) + S_{nuc}(A_{nuc}) \quad \text{(TF9)}$$

where:

$S_{nuc}$ is a sticking probability S of an area covered by particle structures 441, and $A_{nuc}$ is a percentage of an area of a substrate surface covered by particle structures 441.

By way of non-limiting example, a low initial sticking probability may increase with increasing average film thickness. This may be understood based on a difference in sticking probability between an area of an exposed layer surface 11 with no particle structures 441, by way of non-limiting example, a bare substrate 10, and an area with a high deposited density. By way of non-limiting example, a monomer that may impinge on a surface of a particle structure 441 may have a sticking probability that may approach 1.

Based on the energy profiles 2610, 2620, 2630 shown in FIG. 26, it may be postulated that materials that exhibit relatively low activation energy for desorption ($E_{des}$ 2631), and/or relatively high activation energy for surface diffusion ($E_s$ 2621), may be deposited as a patterning coating 110, and may be suitable for use in various applications.

Without wishing to be bound by a particular theory, it may be postulated that, in some non-limiting examples, the relationship between various interfacial tensions present during nucleation and growth may be dictated according to Young's equation in capillarity theory:

$$\gamma_{sv} = \gamma_{fs} + \gamma_{vf} \cos\theta \quad \text{(TF10)}$$

where:

$\gamma_{sv}$ (FIG. 27) corresponds to the interfacial tension between the substrate 10 and vapor 332, $\gamma_{fs}$ (FIG. 27) corresponds to the interfacial tension between the deposited material 331 and the substrate 10, $\gamma_{vf}$ (FIG. 27) corresponds to the interfacial tension between the vapor 332 and the film, and $\theta$ is the film nucleus contact angle.

Figure 27:
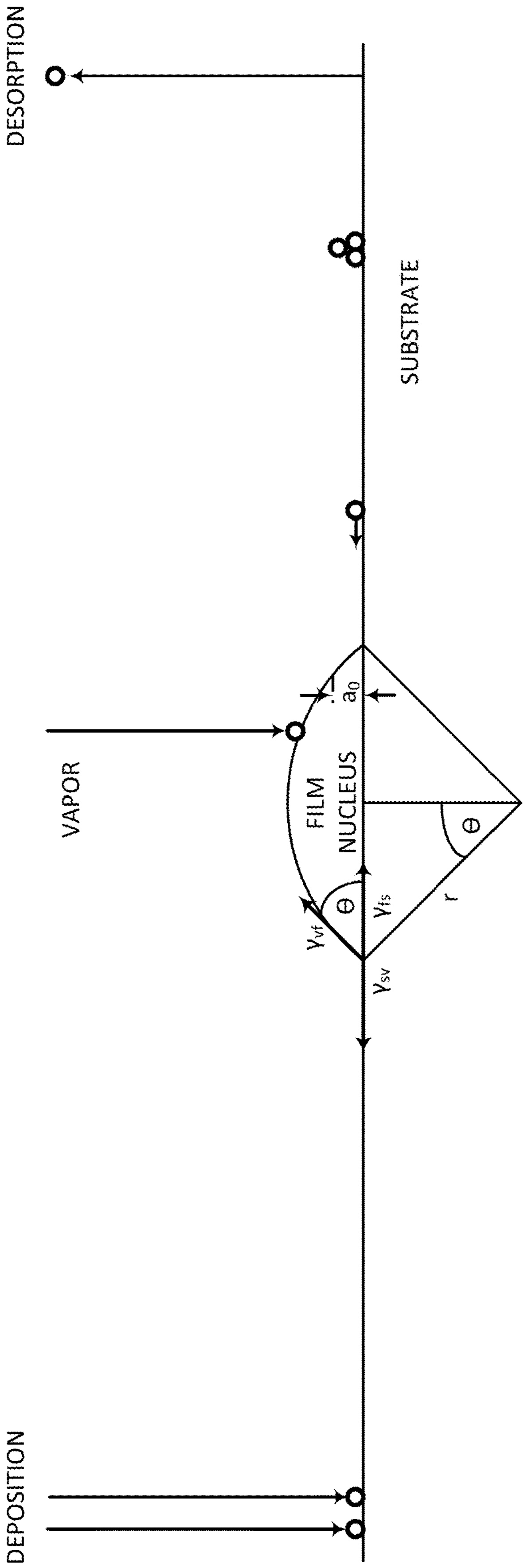
FIG. 27 is a schematic diagram illustrating the formation of a film nucleus according to an example in the present disclosure.

FIG. 27 may illustrate the relationship between the various parameters represented in this equation.

On the basis of Young's equation (Equation (TF10)), it may be derived that, for island growth, the film nucleus contact angle may exceed 0 and therefore: $\gamma_{sv} < \gamma_{fs} + \gamma_{vf}$.

For layer growth, where the deposited material 331 may "wet" the substrate 10, the nucleus contact angle $\theta$ may be equal to 0, and therefore: $\gamma_{sv} = \gamma_{fs} + \gamma_{vf}$.

For Stranski-Krastanov growth, where the strain energy per unit area of the film overgrowth may be large with respect to the interfacial tension between the vapor 332 and the deposited material 331: $\gamma_{sv} > \gamma_{fs} + \gamma_{vf}$.

Without wishing to be bound by any particular theory, it may be postulated that the nucleation and growth mode of a deposited material 331 at an interface between the patterning coating 110 and the exposed layer surface 11 of the substrate 10, may follow the island growth model, where $\theta > 0$.

Particularly in cases where the patterning coating 110 may exhibit a relatively low initial sticking probability (in some non-limiting examples, under the conditions identified in the dual QCM technique described by Walker et. al) against deposition of the deposited material 331, there may be a relatively high thin film contact angle of the deposited material 331.

On the contrary, when a deposited material 331 may be selectively deposited on an exposed layer surface 11 without the use of a patterning coating 110, by way of non-limiting example, by employing a shadow mask 215, the nucleation and growth mode of such deposited material 331 may differ. In particular, it has been observed that a coating formed using a shadow mask 215 patterning process may, at least in some non-limiting examples, exhibit relatively low thin film contact angle of less than about 10°.

It has now been found, somewhat surprisingly, that in some non-limiting examples, a patterning coating 110 (and/or the patterning material 211 of which it is comprised) may exhibit a relatively low critical surface tension.

Those having ordinary skill in the relevant art will appreciate that a "surface energy" of a coating, layer, and/or a material constituting such coating, and/or layer, may generally correspond to a critical surface tension of the coating, layer, and/or material. According to some models of surface energy, the critical surface tension of a surface may correspond substantially to the surface energy of such surface.

Generally, a material with a low surface energy may exhibit low intermolecular forces. Generally, a material with low intermolecular forces may readily crystallize or undergo other phase transformation at a lower temperature in comparison to another material with high intermolecular forces. In at least some applications, a material that may readily crystallize or undergo other phase transformations at relatively low temperatures may be detrimental to the long-term performance, stability, reliability, and/or lifetime of the device.

Without wishing to be bound by a particular theory, it may be postulated that certain low energy surfaces may exhibit relatively low initial sticking probabilities and may thus be suitable for forming the patterning coating 110.

Without wishing to be bound by any particular theory, it may be postulated that, especially for low surface energy surfaces, the critical surface tension may be positively correlated with the surface energy. By way of non-limiting example, a surface exhibiting a relatively low critical surface tension may also exhibit a relatively low surface energy, and a surface exhibiting a relatively high critical surface tension may also exhibit a relatively high surface energy.

In reference to Young's equation (Equation (TF10)), a lower surface energy may result in a greater contact angle, while also lowering the $\gamma_{sv}$, thus enhancing the likelihood of such surface having low wettability and low initial sticking probability with respect to the deposited material 331.

The critical surface tension values, in various non-limiting examples, herein may correspond to such values measured at around normal temperature and pressure (NTP), which in some non-limiting examples, may correspond to a temperature of 20° C., and an absolute pressure of 1 atm. In some non-limiting examples, the critical surface tension of a surface may be determined according to the Zisman method, as further detailed in Zisman, W. A., "*Advances in Chemistry*" 43 (1964), p. 1-51.

In some non-limiting examples, the exposed layer surface 11 of the patterning coating 110 may exhibit a critical surface tension of no more than at least one of about: 20 dynes/cm, 19 dynes/cm, 18 dynes/cm, 17 dynes/cm, 16 dynes/cm, 15 dynes/cm, 13 dynes/cm, 12 dynes/cm, or 11 dynes/cm.

In some non-limiting examples, the exposed layer surface 11 of the patterning coating 110 may exhibit a critical surface tension of at least one of at least about: 6 dynes/cm, 7 dynes/cm, 8 dynes/cm, 9 dynes/cm, and 10 dynes/cm.

Those having ordinary skill in the relevant art will appreciate that various methods and theories for determining the surface energy of a solid may be known. By way of non-limiting example, the surface energy may be calculated, and/or derived based on a series of measurements of contact angle, in which various liquids are brought into contact with a surface of a solid to measure the contact angle between the liquid-vapor interface and the surface. In some non-limiting examples, the surface energy of a solid surface may be equal to the surface tension of a liquid with the highest surface tension that completely wets the surface. By way of non-limiting example, a Zisman plot may be used to determine the highest surface tension value that would result in a contact angle of 0° with the surface. According to some theories of surface energy, various types of interactions between solid surfaces and liquids may be considered in determining the surface energy of the solid. By way of non-limiting example, according to some theories, including without limitation, the Owens/Wendt theory, and/or Fowkes' theory, the surface energy may comprise a dispersive component and a non-dispersive or "polar" component.

Without wishing to be bound by a particular theory, it may be postulated that, in some non-limiting examples, the contact angle of a coating of deposited material 331 may be determined, based at least partially on the properties (including, without limitation, initial sticking probability) of the patterning coating 110 onto which the deposited material 331 is deposited. Accordingly, patterning materials 211 that allow selective deposition of deposited materials 331 exhibiting relatively high contact angles may provide some benefit.

Those having ordinary skill in the relevant art will appreciate that various methods may be used to measure a contact angle θ, including without limitation, the static, and/or dynamic sessile drop method and the pendant drop method.

In some non-limiting examples, the activation energy for desorption ($E_{des}$ 2631) (in some non-limiting examples, at a temperature T of about 300K) may be no more than at least one of about: 2 times, 1.5 times, 1.3 times, 1.2 times, 1.0 times, 0.8 times, or 0.5 times, the thermal energy. In some non-limiting examples, the activation energy for surface diffusion ($E_s$ 2621) (in some non-limiting examples, at a temperature of about 300K) may exceed at least one of about: 1.0 times, 1.5 times, 1.8 times, 2 times, 3 times, 5 times, 7 times, or 10 times the thermal energy.

Without wishing to be bound by a particular theory, it may be postulated that, during thin film nucleation and growth of a deposited material 331 at, and/or near an interface between the exposed layer surface 11 of the underlying layer and the patterning coating 110, a relatively high contact angle between the edge of the deposited material 331 and the underlying layer may be observed due to the inhibition of nucleation of the solid surface of the deposited material 331 by the patterning coating 110. Such nucleation inhibiting property may be driven by minimization of surface energy between the underlying layer, thin film vapor and the patterning coating 110.

One measure of a nucleation-inhibiting, and/or nucleation-promoting property of a surface may be an initial deposition rate of a given (electrically conductive) deposited material 331, on the surface, relative to an initial deposition rate of the same deposited material 331 on a reference surface, where both surfaces are subjected to, and/or exposed to an evaporation flux of the deposited material 331.

Definitions

In some non-limiting examples, the opto-electronic device may be an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor, and/or a television set.

In some non-limiting examples, the opto-electronic device may be an organic photo-voltaic (OPV) device that converts photons into electricity. In some non-limiting examples, the opto-electronic device may be an electro-luminescent quantum dot (QD) device.

In the present disclosure, unless specifically indicated to the contrary, reference will be made to OLED devices, with the understanding that such disclosure could, in some examples, equally be made applicable to other opto-electronic devices, including without limitation, an OPV, and/or QD device, in a manner apparent to those having ordinary skill in the relevant art.

The structure of such devices may be described from each of two aspects, namely from a cross-sectional aspect, and/or from a lateral (plan view) aspect.

In the present disclosure, a directional convention may be followed, extending substantially normally to the lateral aspect described above, in which the substrate may be the "bottom" of the device, and the layers may be disposed on "top" of the substrate. Following such convention, the second electrode may be at the top of the device shown, even if (as may be the case in some examples, including without limitation, during a manufacturing process, in which at least one layers may be introduced by means of a vapor deposition process), the substrate may be physically inverted, such that the top surface, in which one of the layers, such as, without limitation, the first electrode, may be disposed, may be physically below the substrate, to allow the deposition material (not shown) to move upward and be deposited upon the top surface thereof as a thin film.

In the context of introducing the cross-sectional aspect herein, the components of such devices may be shown in substantially planar lateral strata. Those having ordinary skill in the relevant art will appreciate that such substantially planar representation may be for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device may be shown below in its cross-sectional aspect as a substantially stratified structure, in the plan view aspect discussed below, such device may illustrate a diverse topography to define features, each of which may substantially exhibit the stratified profile discussed in the cross-sectional aspect.

In the present disclosure, the terms "layer" and "strata" may be used interchangeably to refer to similar concepts.

The thickness of each layer shown in the figures may be illustrative only and not necessarily representative of a thickness relative to another layer.

For purposes of simplicity of description, in the present disclosure, a combination of a plurality of elements in a single layer may be denoted by a colon ":", while a plurality of (combination(s) of) elements comprising a plurality of layers in a multi-layer coating may be denoted by separating two such layers by a slash "/". In some non-limiting examples, the layer after the slash may be deposited after, and/or on the layer preceding the slash.

For purposes of illustration, an exposed layer surface of an underlying material, onto which a coating, layer, and/or material may be deposited, may be understood to be a surface of such underlying material that may be presented for deposition of the coating, layer, and/or material thereon, at the time of deposition.

Those having ordinary skill in the relevant art will appreciate that when a component, a layer, a region, and/or a portion thereof, is referred to as being "formed", "disposed", and/or "deposited" on, and/or over another underlying material, component, layer, region, and/or portion, such formation, disposition, and/or deposition may be directly, and/or indirectly on an exposed layer surface (at the time of such formation, disposition, and/or deposition) of such underlying material, component, layer, region, and/or portion, with the potential of intervening material(s), component(s), layer(s), region(s), and/or portion(s) therebetween.

In the present disclosure, the terms "overlap", and/or "overlapping" may refer generally to a plurality of layers, and/or structures arranged to intersect a cross-sectional axis extending substantially normally away from a surface onto which such layers, and/or structures may be disposed.

While the present disclosure discusses thin film formation, in reference to at least one layer or coating, in terms of vapor deposition, those having ordinary skill in the relevant art will appreciate that, in some non-limiting examples, various components of the device may be selectively deposited using a wide variety of techniques, including without limitation, evaporation (including without limitation, thermal evaporation, and/or electron beam evaporation), photolithography, printing (including without limitation, inkjet, and/or vapor jet printing, reel-to-reel printing, and/or micro-contact transfer printing), PVD (including without limitation, sputtering), chemical vapor deposition (CVD) (including without limitation, plasma-enhanced CVD (PECVD), and/or organic vapor phase deposition (OVPD)), laser annealing, laser-induced thermal imaging (LITI) patterning, atomic-layer deposition (ALD), coating (including without limitation, spin-coating, di coating, line coating, and/or spray coating), and/or combinations thereof (collectively "deposition process").

Some processes may be used in combination with a shadow mask, which may, in some non-limiting examples, may be an open mask, and/or fine metal mask (FMM), during deposition of any of various layers, and/or coatings to achieve various patterns by masking, and/or precluding deposition of a deposited material on certain parts of a surface of an underlying material exposed thereto.

In the present disclosure, the terms "evaporation", and/or "sublimation" may be used interchangeably to refer generally to deposition processes in which a source material is converted into a vapor, including without limitation, by heating, to be deposited onto a target surface in, without limitation, a solid state. As will be understood, an evaporation deposition process may be a type of PVD process where at least one source material is evaporated, and/or sublimed under a low pressure (including without limitation, a vacuum) environment to form vapor monomers, and deposited on a target surface through de-sublimation of the at least one evaporated source material. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source), and/or any other type of evaporation source.

In some non-limiting examples, a deposition source material may be a mixture. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness, a film thickness, and/or an average layer, and/or film thickness, of a material, irrespective of the mechanism of deposition thereof, may refer to an amount of the material deposited on a target exposed layer surface, which corresponds to an amount of the material to cover the target surface with a uniformly thick layer of the material having the referenced layer thickness. By way of non-limiting example, depositing a layer thickness of 10 nm of material may indicate that an amount of the material deposited on the surface may correspond to an amount of the material to form a uniformly thick layer of the material that may be 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material 331 having an actual thickness greater than 10 nm, or other parts of the deposited material 1631 having an actual thickness of no more than 10 nm. A certain layer thickness of a material deposited on a surface may thus correspond, in some non-limiting examples, to an average thickness of the deposited material across the target surface.

In the present disclosure, a reference to a reference layer thickness may refer to a layer thickness of the deposited material (such as Mg), that may be deposited on a reference surface exhibiting a high initial sticking probability or initial sticking coefficient (that is, a surface having an initial sticking probability that is about, and/or close to 1.0). The reference layer thickness may not indicate an actual thickness of the deposited material deposited on a target surface (such as, without limitation, a surface of a patterning coating). Rather, the reference layer thickness may refer to a layer thickness of the deposited material that would be deposited on a reference surface, in some non-limiting examples, a surface of a quartz crystal, positioned inside a deposition chamber for monitoring a deposition rate and the reference layer thickness, upon subjecting the target surface and the reference surface to identical vapor flux 332 of the deposited material for the same deposition period. Those having ordinary skill in the relevant art will appreciate that in the event that the target surface and the reference surface are not subjected to identical vapor flux simultaneously during deposition, an appropriate tooling factor may be used to determine, and/or to monitor the reference layer thickness.

In the present disclosure, a reference deposition rate may refer to a rate at which a layer of the deposited material would grow on the reference surface, if it were identically positioned and configured within a deposition chamber as the sample surface.

In the present disclosure, a reference to depositing a number X of monolayers of material may refer to depositing an amount of the material to cover a given area of an exposed layer surface with X single layer(s) of constituent monomers of the material, such as, without limitation, in a closed coating.

In the present disclosure, a reference to depositing a fraction of a monolayer of a material may refer to depositing an amount of the material to cover such fraction of a given area of an exposed layer surface with a single layer of constituent monomers of the material. Those having ordinary skill in the relevant art will appreciate that due to, by way of non-limiting example, possible stacking, and/or clustering of monomers, an actual local thickness of a deposited material across a given area of a surface may be non-uniform. By way of non-limiting example, depositing 1 monolayer of a material may result in some local regions of the given area of the surface being uncovered by the material, while other local regions of the given area of the surface may have multiple atomic, and/or molecular layers deposited thereon.

In the present disclosure a target surface (and/or target region(s) thereof) may be considered to be "substantially devoid of", "substantially free of", and/or "substantially uncovered by" a material if there may be a substantial absence of the material on the target surface as determined by any suitable determination mechanism.

In the present disclosure, the terms "sticking probability" and "sticking coefficient" may be used interchangeably.

In the present disclosure, the term "nucleation" may reference a nucleation stage of a thin film formation process, in which monomers in a vapor phase condense onto a surface to form nuclei.

In the present disclosure, in some non-limiting examples, as the context dictates, the terms "patterning coating" and "patterning material" may be used interchangeably to refer to similar concepts, and references to a patterning coating herein, in the context of being selectively deposited to pattern a deposited layer may, in some non-limiting examples, be applicable to a patterning material in the context of selective deposition thereof to pattern a deposited material, and/or an electrode coating material.

Similarly, in some non-limiting examples, as the context dictates, the term "patterning coating" and "patterning material" may be used interchangeably to refer to similar concepts, and reference to an NPC herein, in the context of being selectively deposited to pattern a deposited layer may, in some non-limiting examples, be applicable to an NPC in the context of selective deposition thereof to pattern a deposited material, and/or an electrode coating.

While a patterning material may be either nucleation-inhibiting or nucleation-promoting, in the present disclosure, unless the context dictates otherwise, a reference herein to a patterning material is intended to be a reference to an NIC.

In some non-limiting examples, reference to a patterning coating may signify a coating having a specific composition as described herein.

In the present disclosure, the terms "deposited layer", "conductive coating", and "electrode coating" may be used interchangeably to refer to similar concepts and references to a deposited layer herein, in the context of being patterned by selective deposition of a patterning coating, and/or an NPC may, in some non-limiting examples, be applicable to a deposited layer in the context of being patterned by selective deposition of a patterning material. In some non-limiting examples, reference to an electrode coating may signify a coating having a specific composition as described herein. Similarly, in the present disclosure, the terms "deposited layer material", "deposited material", "conductive coating material", and "electrode coating material" may be used interchangeably to refer to similar concepts and references to a deposited material herein.

In the present disclosure, it will be appreciated by those having ordinary skill in the relevant art that an organic material may comprise, without limitation, a wide variety of organic molecules, and/or organic polymers. Further, it will be appreciated by those having ordinary skill in the relevant art that organic materials that are doped with various inorganic substances, including without limitation, elements, and/or inorganic compounds, may still be considered organic materials. Still further, it will be appreciated by those having ordinary skill in the relevant art that various organic materials may be used, and that the processes described herein are generally applicable to an entire range of such organic materials. Still further, it will be appreciated by those having ordinary skill in the relevant art that organic materials that contain metals, and/or other organic elements, may still be considered as organic materials. Still further, it will be appreciated by those having ordinary skill in the relevant art that various organic materials may be molecules, oligomers, and/or polymers.

As used herein, an organic-inorganic hybrid material may generally refer to a material that comprises both an organic component and an inorganic component. In some non-limiting examples, such organic-inorganic hybrid material may comprise an organic-inorganic hybrid compound that comprises an organic moiety and an inorganic moiety. Non-limiting examples of such organic-inorganic hybrid compounds include those in which an inorganic scaffold is functionalized with at least one organic functional group. Non-limiting examples of such organic-inorganic hybrid materials include those comprising at least one of: a siloxane group, a silsesquioxane group, a polyhedral oligomeric silsesquioxane (POSS) group, a phosphazene group, and a metal complex.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is no more than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

As used herein, an oligomer may generally refer to a material which includes at least two monomer units or monomers. As would be appreciated by a person skilled in the art, an oligomer may differ from a polymer in at least one aspect, including but not limited to: (1) the number of monomer units contained therein; (2) the molecular weight; and (3) other material properties, and/or characteristics. By way of non-limiting example, further description of polymers and oligomers may be found in Naka K. (2014) *Monomers, Oligomers, Polymers, and Macromolecules* (*Overview*), and in Kobayashi S., Mullen K. (eds.) *Encyclopedia of Polymeric Nanomaterials*, Springer, Berlin, Heidelberg.

An oligomer or a polymer may generally include monomer units that may be chemically bonded together to form a molecule. Such monomer units may be substantially identical to one another such that the molecule is primarily formed by repeating monomer units, or the molecule may include plurality different monomer units. Additionally, the molecule may include at least one terminal unit, which may be different from the monomer units of the molecule. An oligomer or a polymer may be linear, branched, cyclic, cyclo-linear, and/or cross-linked. An oligomer or a polymer may include a plurality of different monomer units which are arranged in a repeating pattern, and/or in alternating blocks of different monomer units.

In the present disclosure, the term "semiconducting layer(s)" may be used interchangeably with "organic layer(s)" since the layers in an OLED device may in some non-limiting examples, may comprise organic semiconducting materials.

In the present disclosure, an inorganic substance may refer to a substance that primarily includes an inorganic material. In the present disclosure, an inorganic material may comprise any material that is not considered to be an organic material, including without limitation, metals, glasses, and/or minerals.

In the present disclosure, the terms "EM radiation", "photon", and "light" may be used interchangeably to refer to similar concepts. In the present disclosure, EM radiation may have a wavelength that lies in the visible spectrum, in the infrared (IR) region (IR spectrum), near IR region (NIR spectrum), ultraviolet (UV) region (UV spectrum), and/or UVA region (UVA spectrum) (which may correspond to a wavelength range between about 315-400 nm) thereof, and/or UVB region (UVB spectrum) (which may correspond to a wavelength between about 280-315 nm) thereof.

In the present disclosure, the term "visible spectrum" as used herein, generally refers to at least one wavelength in the visible part of the EM spectrum.

As would be appreciated by those having ordinary skill in the relevant art, such visible part may correspond to any wavelength between about 380-740 nm. In general, electroluminescent devices may be configured to emit, and/or transmit EM radiation having wavelengths in a range of between about 425-725 nm, and more specifically, in some non-limiting examples, EM radiation having peak emission wavelengths of 456 nm, 528 nm, and 624 nm, corresponding to B(lue), G(reen), and R(ed) sub-pixels, respectively. Accordingly, in the context of such electro-luminescent devices, the visible part may refer to any wavelength between about 425-725 nm, or between about 456-624 nm. EM radiation having a wavelength in the visible spectrum may, in some non-limiting examples, also be referred to as "visible light" herein.

In the present disclosure, the term "emission spectrum" as used herein, generally refers to an electroluminescence spectrum of light emitted by an opto-electronic device. By way of non-limiting example, an emission spectrum may be detected using an optical instrument, such as, by way of non-limiting example, a spectrophotometer, which may measure an intensity of EM radiation across a wavelength range.

In the present disclosure, the term "onset wavelength", as used herein, may generally refer to a lowest wavelength at which an emission is detected within an emission spectrum.

In the present disclosure, the term "peak wavelength", as used herein, may generally refer to a wavelength at which a maximum luminous intensity is detected within an emission spectrum.

In some non-limiting examples, the onset wavelength may be less than the peak wavelength. In some non-limiting examples, the onset wavelength $\lambda_{onset}$ may correspond to a wavelength at which a luminous intensity is no more than at least one of about: 10%, 5%, 3%, 1%, 0.5%, 0.1%, or 0.01%, of the luminous intensity at the peak wavelength.

In some non-limiting examples, an emission spectrum that lies in the R(ed) part of the visible spectrum may be characterized by a peak wavelength that may lie in a wavelength range of about 600-640 nm and in some non-limiting examples, may be substantially about 620 nm.

In some non-limiting examples, an emission spectrum that lies in the G(reen) part of the visible spectrum may be characterized by a peak wavelength that may lie in a wavelength range of about 510-540 nm and in some non-limiting examples, may be substantially about 530 nm.

In some non-limiting examples, an emission spectrum that lies in the B(lue) part of the visible spectrum may be characterized by a peak wavelength $\lambda_{max}$ that may lie in a wavelength range of about 450-460 nm and in some non-limiting examples, may be substantially about 455 nm.

In the present disclosure, the term "IR signal" as used herein, may generally refer to EM radiation having a wavelength in an IR subset (IR spectrum) of the EM spectrum. An IR signal may, in some non-limiting examples, have a wavelength corresponding to a near-infrared (NIR) subset (NIR spectrum) thereof. By way of non-limiting example, an NIR signal may have a wavelength of at least one of between about: 750-1400 nm, 750-1300 nm, 800-1300 nm, 800-1200 nm, 850-1300 nm, or 900-1300 nm.

In the present disclosure, the term "absorption spectrum", as used herein, may generally refer to a wavelength (sub-) range of the EM spectrum over which absorption may be concentrated.

In the present disclosure, the terms "absorption edge", "absorption discontinuity", and/or "absorption limit" as used herein, may generally refer to a sharp discontinuity in the absorption spectrum of a substance. In some non-limiting examples, an absorption edge may tend to occur at wavelengths where the energy of absorbed EM radiation may correspond to an electronic transition, and/or ionization potential.

In the present disclosure, the term "extinction coefficient" as used herein, may generally refer to a degree to which an EM coefficient may be attenuated when propagating through a material. In some non-limiting examples, the extinction coefficient may be understood to correspond to the imaginary component k of a complex refractive index. In some non-limiting examples, the extinction coefficient of a material may be measured by a variety of methods, including without limitation, by ellipsometry.

In the present disclosure, the terms "refractive index", and/or "index", as used herein to describe a medium, may refer to a value calculated from a ratio of the speed of light in such medium relative to the speed of light in a vacuum. In the present disclosure, particularly when used to describe the properties of substantially transparent materials, including without limitation, thin film layers, and/or coatings, the terms may correspond to the real part, n, in the expression N=n+ik, in which N may represent the complex refractive index and k may represent the extinction coefficient.

As would be appreciated by those having ordinary skill in the relevant art, substantially transparent materials, including without limitation, thin film layers, and/or coatings, may generally exhibit a relatively low extinction coefficient value in the visible spectrum, and therefore the imaginary component of the expression may have a negligible contribution to the complex refractive index. On the other hand, light-transmissive electrodes formed, for example, by a metallic thin film, may exhibit a relatively low refractive index value and a relatively high extinction coefficient value in the visible spectrum. Accordingly, the complex refractive index, N, of such thin films may be dictated primarily by its imaginary component k.

In the present disclosure, unless the context dictates otherwise, reference without specificity to a refractive index may be intended to be a reference to the real part n of the complex refractive index N.

In some non-limiting examples, there may be a generally positive correlation between refractive index and transmittance, or in other words, a generally negative correlation between refractive index and absorption. In some non-limiting examples, the absorption edge of a substance may correspond to a wavelength at which the extinction coefficient approaches 0.

It will be appreciated that the refractive index, and/or extinction coefficient values described herein may correspond to such value(s) measured at a wavelength in the visible spectrum. In some non-limiting examples, the refractive index, and/or extinction coefficient value may correspond to the value measured at wavelength(s) of about 456 nm which may correspond to a peak emission wavelength of a B(lue) sub-pixel, about 528 nm which may correspond to a peak emission wavelength of a G(reen) sub-pixel, and/or about 624 nm which may correspond to a peak emission wavelength of a R(ed) sub-pixel. In some non-limiting examples, the refractive index, and/or extinction coefficient value described herein may correspond to a value measured at a wavelength of about 589 nm, which may approximately correspond to the Fraunhofer D-line.

In the present disclosure, the concept of a pixel may be discussed on conjunction with the concept of at least one sub-pixel thereof. For simplicity of description only, such composite concept may be referenced herein as a "(sub-) pixel" and such term may be understood to suggest either, or both of, a pixel, and/or at least one sub-pixel thereof, unless the context dictates otherwise.

In some nonlimiting examples, one measure of an amount of a material on a surface may be a percentage coverage of the surface by such material. In some non-limiting examples, surface coverage may be assessed using a variety of imaging techniques, including without limitation, TEM, AFM, and/or SEM.

In the present disclosure, the terms "particle", "island", and "cluster" may be used interchangeably to refer to similar concepts.

In the present disclosure, for purposes of simplicity of description, the terms "coating film", "closed coating", and/or "closed film", as used herein, may refer to a thin film structure, and/or coating of a deposited material used for a deposited layer, in which a relevant part of a surface may be substantially coated thereby, such that such surface may be not substantially exposed by or through the coating film deposited thereon.

In the present disclosure, unless the context dictates otherwise, reference without specificity to a thin film may be intended to be a reference to a substantially closed coating.

In some non-limiting examples, a closed coating, in some non-limiting examples, of a deposited layer, and/or a deposited material, may be disposed to cover a part of an underlying surface, such that, within such part, no more than at least one of about: 40%, 30%, 25%, 20%, 15%, 10%, 5%, 3%, or 1% of the underlying surface therewithin may be exposed by, or through, the closed coating.

Those having ordinary skill in the relevant art will appreciate that a closed coating may be patterned using various techniques and processes, including without limitation, those described herein, to deliberately leave a part of the exposed layer surface of the underlying surface to be exposed after deposition of the closed coating. In the present disclosure, such patterned films may nevertheless be considered to constitute a closed coating, if, by way of non-limiting example, the thin film, and/or coating that is deposited, within the context of such patterning, and between such deliberately exposed parts of the exposed layer surface of the underlying surface, itself substantially comprises a closed coating.

Those having ordinary skill in the relevant art will appreciate that, due to inherent variability in the deposition process, and in some non-limiting examples, to the existence of impurities in either, or both of, the deposited materials, in some non-limiting examples, the deposited material, and the exposed layer surface of the underlying material, deposition of a thin film, using various techniques and processes, including without limitation, those described herein, may nevertheless result in the formation of small apertures, including without limitation, pin-holes, tears, and/or cracks, therein. In the present disclosure, such thin films may nevertheless be considered to constitute a closed coating, if, by way of non-limiting example, the thin film, and/or coating that is deposited substantially comprises a closed coating and meets any specified percentage coverage criterion set out, despite the presence of such apertures.

In the present disclosure, for purposes of simplicity of description, the term "discontinuous layer" as used herein, may refer to a thin film structure, and/or coating of a material used for a deposited layer, in which a relevant part of a surface coated thereby, may be neither substantially devoid of such material, nor forms a closed coating thereof. In some non-limiting examples, a discontinuous layer of a deposited material may manifest as a plurality of discrete islands disposed on such surface.

In the present disclosure, for purposes of simplicity of description, the result of deposition of vapor monomers onto an exposed layer surface of an underlying material, that has not (yet) reached a stage where a closed coating has been formed, may be referred to as a "intermediate stage layer". In some non-limiting examples, such an intermediate stage layer may reflect that the deposition process has not been completed, in which such an intermediate stage layer may be considered as an interim stage of formation of a closed coating. In some non-limiting examples, an intermediate stage layer may be the result of a completed deposition process, and thus constitute a final stage of formation in and of itself.

In some non-limiting examples, an intermediate stage layer may more closely resemble a thin film than a discontinuous layer but may have apertures, and/or gaps in the surface coverage, including without limitation, at least one dendritic projection, and/or at least one dendritic recess. In some non-limiting examples, such an intermediate stage layer may comprise a fraction of a single monolayer of the deposited material such that it does not form a closed coating.

In the present disclosure, for purposes of simplicity of description, the term "dendritic", with respect to a coating, including without limitation, the deposited layer, may refer to feature(s) that resemble a branched structure when viewed in a lateral aspect. In some non-limiting examples, the deposited layer may comprise a dendritic projection, and/or a dendritic recess. In some non-limiting examples, a dendritic projection may correspond to a part of the deposited layer that exhibits a branched structure comprising a plurality of short projections that are physically connected and extend substantially outwardly. In some non-limiting examples, a dendritic recess may correspond to a branched structure of gaps, openings, and/or uncovered parts of the deposited layer that are physically connected and extend substantially outwardly. In some non-limiting examples, a dendritic recess may correspond to, including without limitation, a mirror image, and/or inverse pattern, to the pattern of a dendritic projection. In some non-limiting examples, a dendritic projection, and/or a dendritic recess may have a configuration that exhibits, and/or mimics a fractal pattern, a mesh, a web, and/or an interdigitated structure.

In some non-limiting examples, sheet resistance may be a property of a component, layer, and/or part that may alter a characteristic of an electric current passing through such component, layer, and/or part. In some non-limiting examples, a sheet resistance of a coating may generally correspond to a characteristic sheet resistance of the coating, measured, and/or determined in isolation from other components, layers, and/or parts of the device.

In the present disclosure, a deposited density may refer to a distribution, within a region, which in some non-limiting examples may comprise an area, and/or a volume, of a deposited material therein. Those having ordinary skill in the relevant art will appreciate that such deposited density may be unrelated to a density of mass or material within a particle structure itself that may comprise such deposited material. In the present disclosure, unless the context dictates otherwise, reference to a deposited density, and/or to a density, may be intended to be a reference to a distribution of such deposited material, including without limitation, as at least one particle, within an area.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, by way of non-limiting example, be determined based on known literature including without limitation, Luo, Yu-Ran, "*Bond Dissociation Energies*" (2010).

Without wishing to be bound by a particular theory, it is postulated that providing an NPC may facilitate deposition of the deposited layer onto certain surfaces.

Non-limiting examples of suitable materials for forming an NPC may comprise without limitation, at least one metal, including without limitation, alkali metals, alkaline earth metals, transition metals, and/or post-transition metals, metal fluorides, metal oxides, and/or fullerene.

Non-limiting examples of such materials may comprise Ca, Ag, Mg, Yb, ITO, IZO, ZnO, ytterbium fluoride ($YbF_3$), magnesium fluoride ($MgF_2$), and/or cesium fluoride (CsF).

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell, and which may be, without limitation, spherical, and/or semi-spherical in shape. In some non-limiting examples, a fullerene molecule may be designated as $C_n$, where n may be an integer corresponding to several carbon atoms included in a carbon skeleton of the fullerene molecule. Non-limiting examples of fullerene molecules include $C_n$, where n may be in the range of 50 to 250, such as, without limitation, $C_{60}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube, and/or a cylindrical shape, including without limitation, single-walled carbon nanotubes, and/or multi-walled carbon nanotubes.

Based on findings and experimental observations, it may be postulated that nucleation promoting materials, including without limitation, fullerenes, metals, including without limitation, Ag, and/or Yb, and/or metal oxides, including without limitation, ITO, and/or IZO, as discussed further herein, may act as nucleation sites for the deposition of a deposited layer, including without limitation Mg.

In some non-limiting examples, suitable materials for use to form an NPC, may include those exhibiting or characterized as having an initial sticking probability for a material of a deposited layer of at least one of at least about: 0.4, 0.5, 0.6, 0.7, 0.75, 0.8, 0.9, 0.93, 0.95, 0.98, or 0.99.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, no more than a monolayer of an NPC, including without limitation, fullerene, may be provided on the treated surface to act as nucleation sites for deposition of Mg.

In some non-limiting examples, treating a surface by depositing several monolayers of an NPC thereon may result in a higher number of nucleation sites and accordingly, a higher initial sticking probability.

Those having ordinary skill in the relevant art will appreciate than an amount of material, including without limitation, fullerene, deposited on a surface, may be more, or less than one monolayer. By way of non-limiting example, such surface may be treated by depositing at least one of about: 0.1, 1, 10, or more monolayers of a nucleation promoting material, and/or a nucleation inhibiting material.

In some non-limiting examples, an average layer thickness of the NPC deposited on an exposed layer surface of underlying material(s) may be at least one of between about: 1-5 nm, or 1-3 nm.

Where features or aspects of the present disclosure may be described in terms of Markush groups, it will be appreciated by those having ordinary skill in the relevant art that the present disclosure may also be thereby described in terms of any individual member of sub-group of members of such Markush group.

Terminology

References in the singular form may include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" may be used expansively and in an open-ended fashion, and thus should be interpreted to mean "including, but not limited to". The terms "example" and "exemplary" may be used simply to identify instances for illustrative purposes and should not be interpreted as limiting the scope of the invention to the stated instances. In particular, the term "exemplary" should not be interpreted to denote or confer any laudatory, beneficial, or other quality to the expression with which it is used, whether in terms of design, performance or otherwise.

Further, the term "critical", especially when used in the expressions "critical nuclei" "critical nucleation rate", "critical concentration" "critical cluster" "critical monomer" "critical particle structure size", and/or "critical surface tension" may be a term familiar to those having ordinary skill in the relevant art, including as relating to or being in a state in which a measurement or point at which some quality, property or phenomenon undergoes a definite change. As such, the term "critical" should not be interpreted to denote or confer any significance or importance to the expression with which it is used, whether in terms of design, performance, or otherwise.

The terms "couple" and "communicate" in any form may be intended to mean either a direct connection or indirect connection through some interface, device, intermediate component, or connection, whether optically, electrically, mechanically, chemically, or otherwise.

The terms "on" or "over" when used in reference to a first component relative to another component, and/or "covering" or which "covers" another component, may encompass situations where the first component is directly on (including without limitation, in physical contact with) the other component, as well as cases where at least one intervening component is positioned between the first component and the other component.

Directional terms such as "upward", "downward", "left" and "right" may be used to refer to directions in the drawings to which reference is made unless otherwise stated. Similarly, words such as "inward" and "outward" may be used to refer to directions toward and away from, respectively, the geometric center of the device, area or volume or designated parts thereof. Moreover, all dimensions described herein may be intended solely to be by way of example of purposes of illustrating certain examples and may not be intended to limit the scope of the disclosure to any examples that may depart from such dimensions as may be specified.

As used herein, the terms "substantially", "substantial", "approximately", and/or "about" may be used to denote and account for small variations. When used in conjunction with an event or circumstance, such terms may refer to instances in which the event or circumstance occurs precisely, as well as instances in which the event or circumstance occurs to a close approximation. By way of non-limiting example, when used in conjunction with a numerical value, such terms may refer to a range of variation of no more than about ±10% of such numerical value, such as no more than at least one of about: ±5%, ±4%, ±3%, ±2%, ±1%, ±0.5%, ±0.1%, or ±0.05%.

As used herein, the phrase "consisting substantially of" may be understood to include those elements specifically recited and any additional elements that do not materially affect the basic and novel characteristics of the described technology, while the phrase "consisting of" without the use of any modifier, may exclude any element not specifically recited.

As will be understood by those having ordinary skill in the relevant art, for any and all purposes, particularly in terms of providing a written description, all ranges disclosed herein may also encompass any and all possible sub-ranges, and/or combinations of sub-ranges thereof. Any listed range may be easily recognized as sufficiently describing, and/or enabling the same range being broken down at least into equal fractions thereof, including without limitation, halves, thirds, quarters, fifths, tenths etc. As a non-limiting example, each range discussed herein may be readily be broken down into a lower third, middle third, and/or upper third, etc.

As will also be understood by those having ordinary skill in the relevant art, all language, and/or terminology such as "up to", "at least", "greater than", "less than", and the like, may include, and/or refer the recited range(s) and may also refer to ranges that may be subsequently broken down into sub-ranges as discussed herein.

As will be understood by those having ordinary skill in the relevant art, a range may include each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are merely illustrative of the scope of the present disclosure.

It should be appreciated that the present disclosure, which is described by the claims and not by the implementation details provided, and which can be modified by varying, omitting, adding or replacing, and/or in the absence of any element(s), and/or limitation(s) with alternatives, and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in at least one of the above-described examples, whether or not described and illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects, and examples of the disclosure, as well as specific examples thereof, are intended to encompass both structural and functional equivalents thereof and to cover and embrace all suitable changes in technology. Additionally, it is intended that such equivalents include both currently known equivalents as well as equivalents developed in the future, i.e., any elements developed that perform the same function, regardless of structure.

Clauses

The present disclosure includes, without limitation, the following clauses:

The device according to at least one clause herein wherein the patterning coating comprises a patterning material.

The device according to at least one clause herein, wherein an initial sticking probability against deposition of the deposited material of the patterning coating is no more than an initial sticking probability against deposition of the deposited material of the exposed layer surface.

The device according to at least one clause herein, wherein the patterning coating is substantially devoid of a closed coating of the deposited material.

The device according to at least one clause herein, wherein at least one of the patterning coating and the patterning material has an initial sticking probability against deposition of the deposited material that is no more than at least one of about: 0.9, 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of at least one of silver (Ag) and magnesium (Mg) that is no more than at least one of about: 0.9, 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of the deposited material of at least one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, and 0.005-0.001.

The device according to at least one clause herein, wherein at least one of the patterning coating and the patterning material has an initial sticking probability against deposition of the deposited material that is no more than a threshold value that is at least one of about: 0.3, 0.2, 0.18, 0.15, 0.13, 0.1, 0.08, 0.05, 0.03, 0.02, 0.01, 0.008, 0.005, 0.003, and 0.001.

The device according to at least one clause herein, wherein at least one of the patterning coating and the patterning material has an initial sticking probability against the deposition of at least one of: Ag, Mg, ytterbium (Yb), cadmium (Cd), and zinc (Zn), that is no more than the threshold value.

The device according to at least one clause herein, wherein the threshold value has a first threshold value against the deposition of a first deposited material and a second threshold value against the deposition of a second deposited material.

The device according to at least one clause herein, wherein the first deposited material is Ag and the second deposited material is Mg.

The device according to at least one clause herein, wherein the first deposited material is Ag and the second deposited material is Yb.

The device according to at least one clause herein, wherein the first deposited material is Yb and the second deposited material is Mg.

The device according to at least one clause herein, wherein the first threshold value exceeds the second threshold value.

The device according to at least one clause herein, wherein at least one of the patterning coating and the patterning material has a transmittance for EM radiation of at least a threshold transmittance value after being subjected to a vapor flux 1832 of the deposited material.

The device according to at least one clause herein, wherein the threshold transmittance value is measured at a wavelength in the visible spectrum.

The device according to at least one clause herein, wherein the threshold transmittance value is at least one of at least about 60%, 65%, 70%, 75%, 80%, 85%, and 90% of incident EM power transmitted therethrough.

The device according to at least one clause herein, wherein at least one of the patterning coating and the patterning material has a surface energy of no more than at least one of about: 24 dynes/cm, 22 dynes/cm, 20 dynes/cm, 18 dynes/cm, 16 dynes/cm, 15 dynes/cm, 13 dynes/cm, 12 dynes/cm, and 11 dynes/cm.

The device according to at least one clause herein, wherein at least one of the patterning coating and the patterning material has a surface energy that is at least one of at least about: 6 dynes/cm, 7 dynes/cm, and 8 dynes/cm.

The device according to at least one clause herein, wherein at least one of the patterning coating and the patterning material has a surface energy that is at least one of between about: 10-20 dynes/cm, and 13-19 dynes/cm.

The device according to at least one clause herein, wherein at least one of the patterning coating and the patterning material has a refractive index for EM radiation at a wavelength of 550 nm that is no more than at least one of about: 1.55, 1.5, 1.45, 1.43, 1.4, 1.39, 1.37, 1.35, 1.32, and 1.3

The device according to at least one clause herein, wherein at least one of the patterning coating and the patterning material has an extinction coefficient that is no more than about 0.01 for photons at a wavelength that exceeds at least one of about: 600 nm, 500 nm, 460 nm, 420 nm, and 410 nm.

The device according to at least one clause herein, wherein at least one of the patterning coating and the patterning material has an extinction coefficient that is at least one of at least about: 0.05, 0.1, 0.2, 0.5 for EM radiation at a wavelength shorter than at least one of at least about: 400 nm, 390 nm, 380 nm, and 370 nm.

The device according to at least one clause herein, wherein at least one of the patterning coating and the patterning material has a glass transition temperature that is no more than at least one of about: 300° C., 150° C., 130° C., 30° C., 0° C., −30° C., and −50° C.

The device according to at least one clause herein, wherein the patterning material has a sublimation temperature of at least one of between about: 100-320° C., 120-300° C., 140-280° C., and 150-250° C.

The device according to at least one clause herein, wherein at least one of the patterning coating and the patterning material comprises at least one of a fluorine atom and a silicon atom.

The device according to at least one clause herein, wherein the patterning coating comprises fluorine and carbon.

The device according to at least one clause herein, wherein an atomic ratio of a quotient of fluorine by carbon is at least one of about: 1, 1.5, and 2.

The device according to at least one clause herein, wherein the patterning coating comprises an oligomer.

The device according to at least one clause herein, wherein the patterning coating comprises a compound having a molecular structure containing a backbone and at least one functional group bonded thereto.

The device according to at least one clause herein, wherein the compound comprises at least one of: a siloxane group, a silsesquioxane group, an aryl group, a heteroaryl group, a fluoroalkyl group, a hydrocarbon group, a phosphazene group, a fluoropolymer, and a metal complex.

The device according to at least one clause herein, wherein a molecular weight of the compound is no more than at least one of about: 5,000 g/mol, 4,500 g/mol, 4,000 g/mol, 3,800 g/mol, and 3,500 g/mol.

The device according to at least one clause herein, wherein the molecular weight is at least about: 1,500 g/mol, 1,700 g/mol, 2,000 g/mol, 2,200 g/mol, and 2,500 g/mol.

The device according to at least one clause herein, wherein the molecular weight is at least one of between about: 1,500-5,000 g/mol, 1,500-4,500 g/mol, 1,700-4,500 g/mol, 2,000-4,000 g/mol, 2,200-4,000 g/mol, and 2,500-3,800 g/mol.

The device according to at least one clause herein, wherein a percentage of a molar weight of the compound that is attributable to a presence of fluorine atoms, is at least one of between about: 40-90%, 45-85%, 50-80%, 55-75%, and 60-75%.

The device according to at least one clause herein, wherein fluorine atoms comprise a majority of the molar weight of the compound.

The device according to at least one clause herein, wherein the patterning material comprises an organic-inorganic hybrid material.

The device according to at least one clause herein, wherein the patterning coating has at least one nucleation site for the deposited material.

The device according to at least one clause herein, wherein the patterning coating is supplemented with a seed material that acts as a nucleation site for the deposited material.

The device according to at least one clause herein, wherein the seed material comprises at least one of: a nucleation promoting coating (NPC) material, an organic material, a polycyclic aromatic compound, and a material comprising a non-metallic element selected from at least one of oxygen (O), sulfur (S), nitrogen (N), I carbon (C).

The device according to at least one clause herein, wherein the patterning coating acts as an optical coating.

The device according to at least one clause herein, wherein the patterning coating modifies at least one of a property and a characteristic of EM radiation emitted by the device.

The device according to at least one clause herein, wherein the patterning coating comprises a crystalline material.

The device according to at least one clause herein, wherein the patterning coating is deposited as a non-crystalline material and becomes crystallized after deposition.

The device according to at least one clause herein, wherein the deposited layer comprises a deposited material.

The device according to at least one clause herein, wherein the deposited material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), and yttrium (Y).

The device according to at least one clause herein, wherein the deposited material comprises a pure metal.

The device according to at least one clause herein, wherein the deposited material is selected from at least one of pure Ag and substantially pure Ag.

The device according to at least one clause herein, wherein the substantially pure Ag has a purity of at least one of at least about: 95%, 99%, 99.9%, 99.99%, 99.999%, and 99.9995%.

The device according to at least one clause herein, wherein the deposited material is selected from at least one of pure Mg and substantially pure Mg.

The device according to at least one clause herein, wherein the substantially pure Mg has a purity of at least one of at least about: 95%, 99%, 99.9%, 99.99%, 99.999%, or 99.9995%.

The device according to at least one clause herein, wherein the deposited material comprises an alloy.

The device according to at least one clause herein, wherein the deposited material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the deposited material comprises at least one metal other than Ag.

The device according to at least one clause herein, wherein the deposited material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the deposited material comprises an Mg:Yb alloy.

The device according to at least one clause herein, wherein the deposited material comprises an Ag:Mg:Yb alloy.

The device according to at least one clause herein, wherein the deposited layer comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is no more than at least one of about: 1%, 0.1%, 0.01%, 0.001%, 0.0001%, 0.00001%, 0.000001%, and 0.0000001%.

The device according to at least one clause herein, wherein the deposited layer has a composition in which a combined amount of O and C is no more than at least one of about: 10%, 5%, 1%, 0.1%, 0.01%, 0.001%, 0.0001%, 0.00001%, 0.000001%, and 0.0000001%.

The device according to at least one clause herein, wherein the non-metallic element acts as a nucleation site for the deposited material on the NIC.

The device according to at least one clause herein, wherein the deposited material and the underlying layer comprise a common metal.

The device according to at least one clause herein, the deposited layer comprises a plurality of layers of the deposited material.

The device according to at least one clause herein, a deposited material of a first one of the plurality of layers is different from a deposited material of a second one of the plurality of layers.

The device according to at least one clause herein, wherein the deposited layer comprises a multilayer coating.

The device according to at least one clause herein, wherein the multilayer coating is at least one of: Yb/Ag, Yb/Mg, Yb/Mg:Ag, Yb/Yb:Ag, Yb/Ag/Mg, and Yb/Mg/Ag.

The device according to at least one clause herein, wherein the deposited material comprises a metal having a bond dissociation energy of no more than at least one of about: 300 kJ/mol, 200 kJ/mol, 165 kJ/mol, 150 kJ/mol, 100 kJ/mol, 50 kJ/mol, and 20 kJ/mol.

The device according to at least one clause herein, wherein the deposited material comprises a metal having an electronegativity of no more than at least one of about: 1.4, 1.3, and 1.2.

The device according to at least one clause herein, wherein a sheet resistance of the deposited layer is no more than at least one of about: 10Ω/□, 5Ω/□, 1Ω/□, 0.5Ω/□, 0.2Ω/□, and 0.1Ω/□.

The device according to at least one clause herein, wherein the deposited layer is disposed in a pattern defined by at least one region therein that is substantially devoid of a closed coating thereof.

The device according to at least one clause herein, wherein the at least one region separates the deposited layer into a plurality of discrete fragments thereof.

The device according to at least one clause herein, wherein at least two discrete fragments are electrically coupled.

The device according to at least one clause herein, wherein the patterning coating has a boundary defined by a patterning coating edge.

The device according to at least one clause herein, wherein the patterning coating comprises at least one patterning coating transition region and a patterning coating non-transition part.

The device according to at least one clause herein, wherein the at least one patterning coating transition region transitions from a maximum thickness to a reduced thickness.

The device according to at least one clause herein, wherein the at least one patterning coating transition region extends between the patterning coating non-transition part and the patterning coating edge.

The device according to at least one clause herein, wherein the patterning coating has an average film thickness in the patterning coating non-transition part that is in a range of at least one of between about: 1-100 nm, 2-50 nm, 3-30 nm, 4-20 nm, 5-15 nm, 5-10 nm, and 1-10 nm.

The device according to at least one clause herein, wherein a thickness of the patterning coating in the patterning coating non-transition part is within at least one of about: 95%, and 90% of the average film thickness of the NIC.

The device according to at least one clause herein, wherein the average film thickness is no more than at least one of about: 80 nm, 60 nm, 50 nm, 40 nm, 30 nm, 20 nm, 15 nm, and 10 nm.

The device according to at least one clause herein, wherein the average film thickness exceeds at least one of about: 3 nm, 5 nm, and 8 nm.

The device according to at least one clause herein, wherein the average film thickness is no more than about 10 nm.

The device according to at least one clause herein, wherein the patterning coating has a patterning coating thickness that decreases from a maximum to a minimum within the patterning coating transition region.

The device according to at least one clause herein, wherein the maximum is proximate to a boundary between the patterning coating transition region and the patterning coating non-transition part.

The device according to at least one clause herein, wherein the maximum is a percentage of the average film thickness that is at least one of about: 100%, 95%, and 90%.

The device according to at least one clause herein, wherein the minimum is proximate to the patterning coating edge.

The device according to at least one clause herein, wherein the minimum is in a range of between about: 0-0.1 nm.

The device according to at least one clause herein, wherein a profile of the patterning coating thickness is at least one of sloped, tapered, and defined by a gradient.

The device according to at least one clause herein, wherein the tapered profile follows at least one of a linear, non-linear, parabolic, and exponential decaying profile.

The device according to at least one clause herein, wherein a non-transition width along a lateral axis of the patterning coating non-transition region exceeds a transition width along the axis of the patterning coating transition region.

The device according to at least one clause herein, wherein a quotient of the non-transition width by the transition width is at least one of at least about: 5, 10, 20, 50, 100, 500, 1,000, 1,500, 5,000, 10,000, 50,000, or 100,000.

The device according to at least one clause herein, wherein at least one of the non-transition width and the transition width exceeds an average film thickness of the underlying layer.

The device according to at least one clause herein, wherein at least one of the non-transition width and the transition width exceeds the average film thickness of the patterning coating.

The device according to at least one clause herein, wherein the average film thickness of the underlying layer exceeds the average film thickness of the patterning coating.

The device according to at least one clause herein, wherein the deposited layer has a boundary defined by a deposited layer edge.

The device according to at least one clause herein, wherein the deposited layer comprises at least one deposited layer transition region and a deposited layer non-transition part.

The device according to at least one clause herein, wherein the at least one deposited layer transition region transitions from a maximum thickness to a reduced thickness.

The device according to at least one clause herein, wherein the at least one deposited layer transition region extends between the deposited layer non-transition part and the deposited layer edge.

The device according to at least one clause herein, wherein the deposited layer has an average film thickness in the deposited layer non-transition part that is in a range of at least one of between about: 1-500 nm, 5-200 nm, 5-40 nm, 10-30 nm, and 10-100 nm.

The device according to at least one clause herein, wherein the average film thickness exceeds at least one of about: 10 nm, 50 nm, and 100 nm.

The device according to at least one clause herein, wherein the average film thickness of is substantially constant thereacross.

The device according to at least one clause herein, wherein the average film thickness exceeds an average film thickness of the underlying layer.

The device according to at least one clause herein, wherein a quotient of the average film thickness of the deposited layer by the average film thickness of the underlying layer is at least one of at least about: 1.5, 2, 5, 10, 20, 50, and 100.

The device according to at least one clause herein, wherein the quotient is in a range of at least one of between about: 0.1-10, and 0.2-40.

The device according to at least one clause herein, wherein the average film thickness of the deposited layer exceeds an average film thickness of the patterning coating.

The device according to at least one clause herein, wherein a quotient of the average film thickness of the deposited layer by the average film thickness of the patterning coating is at least one of at least about: 1.5, 2, 5, 10, 20, 50, and 100.

The device according to at least one clause herein, wherein the quotient is in a range of at least one of between about: 0.2-10, and 0.5-40.

The device according to at least one clause herein, wherein a deposited layer non-transition width along a lateral axis of the deposited layer non-transition part exceeds a patterning coating non-transition width along the axis of the patterning coating non-transition part.

The device according to at least one clause herein, wherein a quotient of the patterning coating non-transition width by the deposited layer non-transition width is at least one of between about: 0.1-10, 0.2-5, 0.3-3, and 0.4-2.

The device according to at least one clause herein, wherein a quotient of the deposited layer non-transition width by the patterning coating non-transition width is at least one of at least: 1, 2, 3, and 4.

The device according to at least one clause herein, wherein the deposited layer non-transition width exceeds the average film thickness of the deposited layer.

The device according to at least one clause herein, wherein a quotient of the deposited layer non-transition width by the average film thickness is at least one of at least about: 10, 50, 100, and 500.

The device according to at least one clause herein, wherein the quotient is no more than about 100,000.

The device according to at least one clause herein, wherein the deposited layer has a deposited layer thickness that decreases from a maximum to a minimum within the deposited layer transition region.

The device according to at least one clause herein, wherein the maximum is proximate to a boundary between the deposited layer transition region and the deposited layer non-transition part.

The device according to at least one clause herein, wherein the maximum is the average film thickness.

The device according to at least one clause herein, wherein the minimum is proximate to the deposited layer edge.

The device according to at least one clause herein, wherein the minimum is in a range of between about: 0-0.1 nm.

The device according to at least one clause herein, wherein the minimum is the average film thickness.

The device according to at least one clause herein, wherein a profile of the deposited layer thickness is at least one of sloped, tapered, and defined by a gradient.

The device according to at least one clause herein, wherein the tapered profile follows at least one of a linear, non-linear, parabolic, and exponential decaying profile.

The device according to at least one clause herein, wherein the deposited layer comprises a discontinuous layer in at least a part of the deposited layer transition region.

The device according to at least one clause herein, wherein the deposited layer overlaps the patterning coating in an overlap portion.

The device according to at least one clause herein, wherein the patterning coating overlaps the deposited layer in an overlap portion.

The device according to at least one clause herein, further comprising at least one particle structure disposed on an exposed layer surface of an underlying layer.

The device according to at least one clause herein, wherein the underlying layer is the patterning coating.

The device according to at least one clause herein, wherein the at least one particle structure comprises a particle material.

The device according to at least one clause herein, wherein the particle material is the same as the deposited material.

The device according to at least one clause herein, wherein at least two of the particle material, the deposited material, and a material of which the underlying layer is comprised, comprises a common metal.

The device according to at least one clause herein, wherein the particle material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), and yttrium (Y).

The device according to at least one clause herein, wherein the particle material comprises a pure metal.

The device according to at least one clause herein, wherein the particle material is selected from at least one of pure Ag and substantially pure Ag.

The device according to at least one clause herein, wherein the substantially pure Ag has a purity of at least one of at least about: 95%, 99%, 99.9%, 99.99%, 99.999%, and 99.9995%.

The device according to at least one clause herein, wherein the particle material is selected from at least one of pure Mg and substantially pure Mg.

The device according to at least one clause herein, wherein the substantially pure Mg has a purity of at least one of at least about: 95%, 99%, 99.9%, 99.99%, 99.999%, or 99.9995%.

The device according to at least one clause herein, wherein the particle material comprises an alloy.

The device according to at least one clause herein, wherein the particle material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the particle material comprises at least one metal other than Ag.

The device according to at least one clause herein, wherein the particle material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the particle material comprises an Mg:Yb alloy.

The device according to at least one clause herein, wherein the particle material comprises an Ag:Mg:Yb alloy.

The device according to at least one clause herein, wherein the at least one particle structure comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is no more than at least one of about: 1%, 0.1%, 0.01%, 0.001%, 0.0001%, 0.00001%, 0.000001%, and 0.0000001%.

The device according to at least one clause herein, wherein the at least one particle structure has a composition in which a combined amount of O and C is no more than at least one of about: 10%, 5%, 1%, 0.1%, 0.01%, 0.001%, 0.0001%, 0.00001%, 0.000001%, and 0.0000001%.

The device according to at least one clause herein, wherein the at least one particle is disposed at an interface between the patterning coating and at least one covering layer in the device.

The device according to at least one clause herein, wherein the at least one particle is in physical contact with an exposed layer surface of the patterning coating.

The device according to at least one clause herein, wherein the at least one particle structure affects at least one optical property of the device.

The device according to at least one clause herein, wherein the at least one optical property is controlled by selection of at least one property of the at least one particle structure selected from at least one of: a characteristic size, a length, a width, a diameter, a height, a size distribution, a shape, a surface coverage, a configuration, a deposited density, a dispersity, and a composition.

The device according to at least one clause herein, wherein the at least one property of the at least one particle structure is controlled by selection of at least one of: at least one characteristic of the patterning material, an average film thickness of the patterning coating, at least one heterogeneity in the patterning coating, and a deposition environment for the patterning coating, selected from at least one of a temperature, pressure, duration, deposition rate, and deposition process.

The device according to at least one clause herein, wherein the at least one property of the at least one particle structure is controlled by selection of at least one of: at least one characteristic of the particle material, an extent to which the patterning coating is exposed to deposition of the particle material, a thickness of the discontinuous layer, and a deposition environment for the particle material, selected from at least one of a temperature, pressure, duration, deposition rate, and deposition process.

The device according to at least one clause herein, wherein the at least one particle structures are disconnected from one another.

The device according to at least one clause herein, wherein the at least one particle structure forms a discontinuous layer.

The device according to at least one clause herein, wherein the discontinuous layer is disposed in a pattern defined by at least one region therein that is substantially devoid of the at least one particle structure.

The device according to at least one clause herein, wherein a characteristic of the discontinuous layer is determined by an assessment according to at least one criterion selected from at least one of: a characteristic size, length, width, diameter, height, size distribution, shape, configuration, surface coverage, deposited distribution, dispersity, presence of aggregation instances, and extent of such aggregation instances.

The device according to at least one clause herein, wherein the assessment is performed by determining at least one attribute of the discontinuous layer by an applied imaging technique selected from at least one of: electron microscopy, atomic force microscopy, and scanning electron microscopy.

The device according to at least one clause herein, wherein the assessment is performed across an extent defined by at least one observation window.

The device according to at least one clause herein, wherein the at least one observation window is located at at least one of: a perimeter, interior location, and grid coordinate of the lateral aspect.

The device according to at least one clause herein, wherein the observation window corresponds to a field of view of the applied imaging technique.

The device according to at least one clause herein, wherein the observation window corresponds to a magnification level selected from at least one of: 2.00 μm, 1.00 μm, 500 nm, and 200 nm.

The device according to at least one clause herein, wherein the assessment incorporates at least one of: manual counting, curve fitting, polygon fitting, shape fitting, and an estimation technique.

The device according to at least one clause herein, wherein the assessment incorporates a manipulation selected from at least one of: an average, median, mode, maximum, minimum, probabilistic, statistical, and data calculation.

The device according to at least one clause herein, wherein the characteristic size is determined from at least one of: a mass, volume, diameter, perimeter, major axis, and minor axis of the at least one particle structure.

The device according to at least one clause herein, wherein the dispersity is determined from:

$$D = \frac{\overline{S_s}}{\overline{S_n}}$$

where:

$$\overline{S_s} = \frac{\sum_{i=1}^{n} S_i^2}{\sum_{i=1}^{n} S_i}, \quad \overline{S_n} = \frac{\sum_{i=1}^{n} S_i}{n},$$

n is the number of particles in a sample area, $S_i$ is the (area) size of the $I^{th}$ particle, $\overline{S}_n$ is the number average of the particle (area) sizes; and $\overline{S}_s$ is the (area) size average of the particle (area) sizes Accordingly, the specification and the examples disclosed therein are to be considered illustrative only, with a true scope of the disclosure being disclosed by the following numbered claims:

What is claimed is:

1. A layered semiconductor device comprising:

at least one first electrode;

at least one second electrode;

at least one semiconducting layer disposed between the first and second electrodes, and a compound comprising a silicon-oxygen backbone and at least one fluorine-containing moiety attached to the silicon-oxygen backbone.

2. The device of claim 1, wherein the compound comprises a unit represented by the following formula:

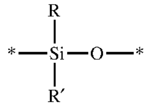

wherein:

R and R' each independently represents at least one of: a substituted alkyl, an unsubstituted alkyl, a substituted fluoroalkyl, an unsubstituted fluoroalkyl, a substituted alkoxy, an unsubstituted alkoxy, a substituted fluoroalkoxy, an unsubstituted fluoroalkoxy, a substituted siloxy, an unsubstituted siloxy, a substituted fluoroalkylsiloxy, an unsubstituted fluoroalkylsiloxy, a substituted cycloalkyl, an unsubstituted cycloalkyl, a substituted fluorocycloalkyl, an unsubstituted fluorocycloalkyl, a substituted aryl, an unsubstituted aryl, a substituted fluoroaryl, an unsubstituted fluoroaryl, a substituted heteroaryl, and an unsubstituted heteroaryl; and at least one of R and R' is the fluorine-containing moiety.

3. The device of claim 1, wherein the compound is represented by the following formula:

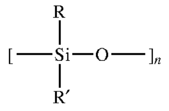

wherein:

R and R' each independently represents at least one of: a substituted alkyl, an unsubstituted alkyl, a substituted fluoroalkyl, an unsubstituted fluoroalkyl, a substituted alkoxy, an unsubstituted alkoxy, a substituted fluoroalkoxy, an unsubstituted fluoroalkoxy, a substituted siloxy, an unsubstituted siloxy, a substituted fluoroalkylsiloxy, an unsubstituted fluoroalkylsiloxy, a substituted cycloalkyl, an unsubstituted cycloalkyl, a substituted fluorocycloalkyl, an unsubstituted fluorocycloalkyl, a substituted aryl, an unsubstituted aryl, a substituted fluoroaryl, an unsubstituted fluoroaryl, a substituted heteroaryl, and an unsubstituted heteroaryl;

at least one of R and R' is the fluorine-containing moiety; and n is an integer of at least 3.

4. The device of claim 3, wherein n is an integer of between about 6-30.

5. The device of claim 1, wherein the silicon-oxygen backbone comprises a branching moiety.

6. The device of claim 1, wherein the silicon-oxygen backbone comprises a cyclic structure.

7. The device of claim 1, wherein the compound is represented by the following formula:

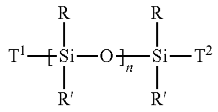

wherein:

$T^1$ and $T^2$ each independently represents at least one of: a substituted alkyl, an unsubstituted alkyl, a substituted fluoroalkyl, an unsubstituted fluoroalkyl, a substituted alkoxy, an unsubstituted alkoxy, a substituted fluoroalkoxy, an unsubstituted fluoroalkoxy, a substituted siloxy, an unsubstituted siloxy, a substituted fluoroalkylsiloxy, an unsubstituted fluoroalkylsiloxy, a substituted cycloalkyl, an unsubstituted cycloalkyl, a substituted fluorocycloalkyl, an unsubstituted fluorocycloalkyl, a substituted aryl, an unsubstituted aryl, a substituted heteroaryl, and an unsubstituted heteroaryl;

R and R' each independently represents: at least one of a substituted alkyl, an unsubstituted alkyl, a substituted fluoroalkyl, an unsubstituted fluoroalkyl, a substituted alkoxy, an unsubstituted alkoxy, a substituted fluoroalkoxy, an unsubstituted fluoroalkoxy, a substituted siloxy, an unsubstituted siloxy, a substituted fluoroalkylsiloxy, an unsubstituted fluoroalkylsiloxy, a substituted cycloalkyl, an unsubstituted cycloalkyl, a substituted fluorocycloalkyl, an unsubstituted fluorocycloalkyl, a substituted aryl, an unsubstituted aryl, a substituted fluoroaryl, an unsubstituted fluoroaryl, a substituted heteroaryl, and an unsubstituted heteroaryl;

at least one of R and R' is the fluorine-containing moiety; and n is an integer of at least 3.

8. The device of claim 7, wherein $T^1$ and $T^2$ each independently represents at least one of: H, $CF_3$, $CF_2H$, and $CH_3$.

9. The device of claim 1, wherein the silicon-oxygen backbone forms a caged structure.

10. The device of claim 9, wherein the compound is a silsesquioxane compound.

11. The device of claim 9, wherein the compound is represented by the formula $(RSiO_{1.5})_v$ wherein:

v is an integer of between about 6-12; and

R represents, upon each occurrence, at least one of: a substituted alkyl, an unsubstituted alkyl, a substituted fluoroalkyl, an unsubstituted fluoroalkyl, a substituted alkoxy, an unsubstituted alkoxy, a substituted fluoroalkoxy, an unsubstituted fluoroalkoxy, a substituted siloxy, an unsubstituted siloxy, a substituted fluoroalkylsiloxy, and an unsubstituted fluoroalkylsiloxy; and R, at least on one occurrence, is the fluorine-containing moiety.

12. The device of claim 11, wherein v is at least one of 6, 8, 10, or 12.

13. The device of claim 9, wherein the compound is represented by at least one of: Formula (PO-1), (PO-2), and (PO-3):

(PO-1)

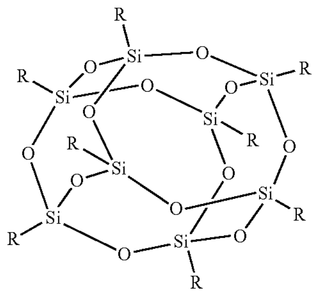

$(RSiO_{1.5})_8$ (PO-2)

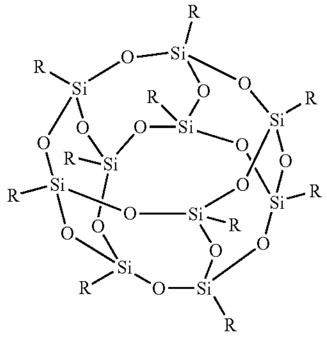

$(RSiO_{1.5})_{10}$ (PO-3)

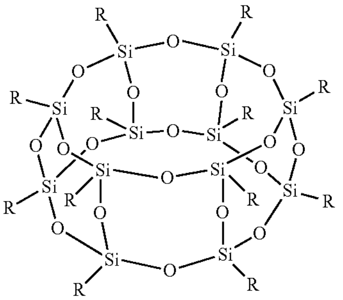

$(RSiO_{1.5})_{12}$ wherein in each formula, R represents, independently upon each occurrence, at least one of: a substituted alkyl, an unsubstituted alkyl, a substituted fluoroalkyl, an unsubstituted fluoroalkyl, a substituted alkoxy, an unsubstituted alkoxy, a substituted fluoroalkoxy, an unsubstituted fluoroalkoxy, a substituted siloxy, an unsubstituted siloxy, a substituted fluoroalkylsiloxy, an unsubstituted fluoroalkylsiloxy, a substituted cycloalkyl, an unsubstituted cycloalkyl, a substituted fluorocycloalkyl, an unsubstituted fluorocycloalkyl, a substituted aryl, an unsubstituted aryl, a substituted fluoroaryl, an unsubstituted fluoroaryl, a substituted heteroaryl, and an unsubstituted heteroaryl; and at least one R is the fluorine-containing moiety.

14. The device of claim 1, wherein the fluorine-containing moiety is at least one of: a substituted fluoroalkyl, an unsubstituted fluoroalkyl, a substituted fluoroalkoxy, an unsubstituted fluoroalkoxy, a substituted fluoroalkylsiloxy, an unsubstituted fluoroalkylsiloxy, a substituted fluorocycloalkyl, an unsubstituted fluorocycloalkyl, a substituted fluoroaryl, an unsubstituted fluoroaryl, and a heteroaryl containing a fluorinated substituent.

15. The device of claim 1, wherein the fluorine-containing moiety is represented by the following formula:

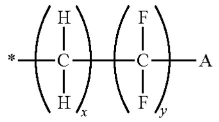

wherein x is an integer of between about 1-6; y is an integer of between about 1-12; and A is H or F.

16. The device of claim 15, wherein y is 1, and A is F.

17. The device of claim 1, wherein the fluorine-containing moiety comprises a $CH_2CF_3$ terminal group.

18. The device of claim 1, wherein the fluorine-containing moiety comprises a fluoroalkyl moiety comprising no more than 6 continuous fluorinated carbon atoms.

19. The device of claim 1, wherein the compound comprises a non-fluorinated moiety.

20. The device of claim 19, wherein the non-fluorinated moiety is at least one of: a substituted alkyl, an unsubstituted alkyl, a substituted alkoxy, an unsubstituted alkoxy, a substituted siloxy, an unsubstituted siloxy, a substituted cycloalkyl, an unsubstituted cycloalkyl, a substituted aryl, an unsubstituted aryl, a substituted heteroaryl, and an unsubstituted heteroaryl.

21. The device of claim 1, wherein the compound has a molecular weight of between about 1,000-5,000 g/mol.

22. The device of claim 1, comprising a patterning coating disposed on a first layer surface in a first portion of a lateral aspect of the device, and wherein the patterning coating comprises the compound.

23. The device of claim 22, wherein the surface energy of the patterning coating is no more than about 20 dynes/cm.

24. The device of claim 22, wherein a refractive index of the patterning coating is no more than about 1.4.

25. The device of claim 1, comprising an electrode coating disposed on a second layer surface in a second portion of the lateral aspect of the device.

26. The device of claim 25, wherein the electrode coating comprises silver (Ag), ytterbium (Yb), or magnesium (Mg).

27. The device of claim 1, comprising a plurality of layers disposed on a surface of a substrate and configured such that at least one of the plurality of layers lies: (i) between the substrate and the patterning coating in the first portion, and (ii) between the substrate and the electrode coating in the second portion.

28. The device of claim 27, wherein the at least one of the plurality of layers comprises at least one semiconducting layer.

29. The device of claim 28, wherein the at least one semiconducting layer comprises an electron transport layer (ETL).

30. The device of claim 27, wherein the at least one semiconducting layer comprises an emissive layer (EML).

31. The device of claim 30, wherein the EML lies between the ETL and the substrate.

32. The device of claim 29, wherein the plurality of layers comprises the at least one first electrode, which is disposed between the ETL and the substrate.

33. The device of claim 32, wherein the at least one first electrode is an anode.

34. The device of claim 25, wherein the at least one second electrode comprises the electrode coating.

35. The device of claim 34, wherein the at least one second electrode lies between the ETL and the patterning coating in the first portion.

36. The device of claim 1, wherein the at least one second electrode is a cathode.

37. The device of claim 25, wherein the second portion comprises at least one emissive region.

38. The device of claim 22, wherein the first portion comprises at least a part of a non-emissive region.

39. The device of claim 22, further comprising a discontinuous coating disposed on the patterning coating.

40. The device of claim 39, wherein the discontinuous coating comprises a plurality of islands.

41. The device of claim 39, wherein the electrode coating and the discontinuous coating comprise at least one material in common.

42. The device of claim 41, wherein the discontinuous coating covers less than about 25% of a surface of the patterning coating in the first portion.

* * * * *